US011731994B2

(12) United States Patent
Hwang et al.

(10) Patent No.: US 11,731,994 B2
(45) Date of Patent: Aug. 22, 2023

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Kyuyoung Hwang, Anyang-si (KR); Seungyeon Kwak, Suwon-si (KR); Yoonhyun Kwak, Seoul (KR); Kum Hee Lee, Suwon-si (KR); Sunghun Lee, Hwaseong-si (KR); Whail Choi, Seoul (KR); Aram Jeon, Suwon-si (KR); Byoungki Choi, Hwaseong-si (KR); Hyeonho Choi, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 711 days.

(21) Appl. No.: 16/695,443

(22) Filed: Nov. 26, 2019

(65) Prior Publication Data

US 2020/0181184 A1 Jun. 11, 2020

(30) Foreign Application Priority Data

Dec. 5, 2018 (KR) ........................ 10-2018-0155457

(51) Int. Cl.

*C07F 15/00* (2006.01)
*H01L 51/00* (2006.01)
*H10K 85/30* (2023.01)

(52) U.S. Cl.

CPC ........ *C07F 15/0086* (2013.01); *C07F 15/002* (2013.01); *C07F 15/0033* (2013.01); *C07F 15/0073* (2013.01); *H10K 85/342* (2023.02); *H10K 85/346* (2023.02); *H10K 85/348* (2023.02)

(58) Field of Classification Search

CPC ........ C07F 15/0033; C07F 7/02; H01L 51/50; H01L 51/00
USPC ................................ 546/2, 14; 313/504, 498
See application file for complete search history.

(56) References Cited

U.S. PATENT DOCUMENTS 9,490,437 B2 11/2016 Hwang et al.
9,882,149 B2 1/2018 Kim et al.
(Continued)

FOREIGN PATENT DOCUMENTS

| | | | |
|---|---|---|---|
| CN | 108164564 | A | 6/2018 |
| EP | 2730583 | A1 | 5/2014 |
| EP | 3000815 | A1 | 3/2016 |
| EP | 3010068 | A1 | 4/2016 |
| EP | 3026056 | A1 | 6/2016 |

(Continued)

OTHER PUBLICATIONS

Extended European search report issued by the European Patent Office dated Apr. 6, 2020 in the examination of the European Patent Application No. 19211446.0, which corresponds to the U.S. Appl. No. 16/695,443.

*Primary Examiner* — Charanjit Aulakh
(74) *Attorney, Agent, or Firm* — Cantor Colburn LLP

(57) ABSTRACT

An organometallic compound represented by Formula 1:

$$M(L_1)_{n1}(L_2)_{n2} \qquad \text{Formula 1}$$

wherein, in Formula 1, M is a transition metal, $L_1$ is a ligand represented by Formula 2A, $L_2$ is a ligand represented by Formula 2B, n1 is 1 or 2, wherein, when n1 is 2, two groups $L_1$ are identical to or different from each other, n2 is 1 or 2, wherein, when n2 is 2, two group $L_2$ are identical to or different from each other, the sum of n1 and n2 is 2 or 3, and $L_1$ and $L_2$ are different from each other Formula 2A

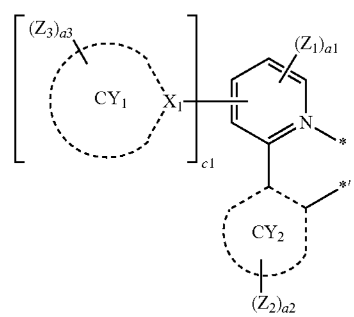

Formula 2B

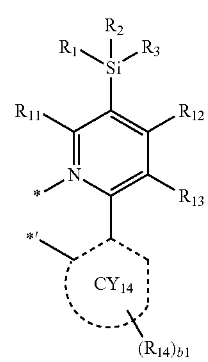

wherein $X_1$, ring $CY_1$, ring $CY_2$, ring $CY_{14}$, $R_1$ to $R_3$, $R_{11}$ to $R_{14}$, $Z_1$ to $Z_3$, a1, a2, a3, b1, and c1 are the same as described in the description, and * and *' in Formulae 2A and 2B each indicate a binding site to M in Formula 1.

19 Claims, 1 Drawing Sheet

(56) References Cited

U.S. PATENT DOCUMENTS

| | | | |
|---|---|---|---|
| 10,510,968 | B2 | 12/2019 | Beers et al. |
| 2014/0131676 | A1 | 5/2014 | Beers et al. |
| 2016/0111665 | A1 | 4/2016 | Kim et al. |
| 2016/0155962 | A1 | 6/2016 | Hwang et al. |
| 2016/0155963 | A1 | 6/2016 | Hwang et al. |
| 2017/0012226 | A1 | 1/2017 | Hwang et al. |
| 2017/0294597 | A1 | 10/2017 | Tsai et al. |
| 2018/0102487 | A1 | 4/2018 | Tsai et al. |
| 2018/0282356 | A1 | 10/2018 | Ji et al. |
| 2019/0245153 | A1 | 8/2019 | Kottas et al. |
| 2019/0296252 | A1 | 9/2019 | Xia et al. |

FOREIGN PATENT DOCUMENTS

| | | | | | |
|---|---|---|---|---|---|
| EP | 3067361 | A1 | * | 9/2016 | ............. C07F 15/00 |
| EP | 3305796 | A1 | | 4/2018 | |
| KR | 1020130110934 | A | | 10/2013 | |
| KR | 2016/0045508 | A | * | 4/2016 | ............ H01L 51/50 |
| KR | 1020170028268 | A | | 3/2017 | |
| KR | 1020180020878 | A | | 2/2018 | |
| WO | 2010111175 | A1 | | 9/2010 | |
| WO | 2014007565 | A1 | | 1/2014 | |

* cited by examiner

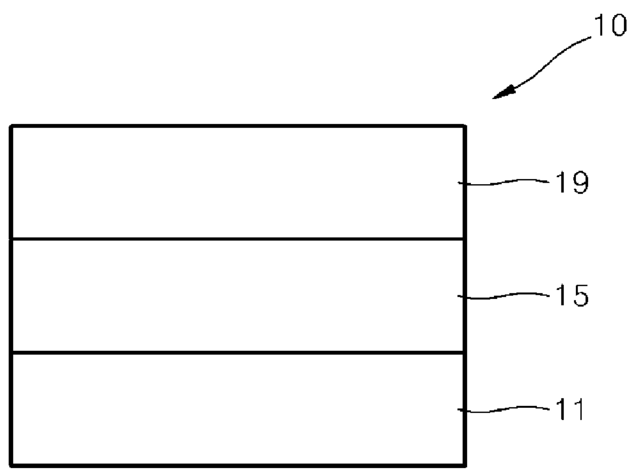
10
19
15
11

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims the benefit of and priority to Korean Patent Application No. 10-2018-0155457, filed on Dec. 5, 2018, in the Korean Intellectual Property Office, and all the benefits accruing therefrom under 35 U.S.C. § 119, the content of which is incorporated herein in its entirety by reference.

BACKGROUND

1. Field

One or more embodiments of the present disclosure relate to an organometallic compound, an organic light-emitting device including the organometallic compound, and a diagnostic composition including the organometallic compound.

2. Description of the Related Art

Organic light-emitting devices (OLEDs) are self-emission devices, which have better characteristics in terms of viewing angle, response time, brightness, driving voltage, and response speed, and produce full-color images.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Meanwhile, luminescence compounds may be used to monitor, sense, or detect a variety of biological materials including cells and proteins. An example of the luminescence compounds includes a phosphorescent luminescence compound.

Various types of organic light emitting devices are known. However, there still remains a need in OLEDs having low driving voltage, high efficiency, high brightness, and long lifespan.

SUMMARY

Provided are an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

According to an aspect of an embodiment, organometallic compounds are represented by Formula 1:

$$M(L_1)_{n1}(L_2)_{n2}$$ Formula 1

In Formula 1,

M may be a transition metal, $L_1$ may be a ligand represented by Formula 2A, n1 may be 1 or 2, wherein, when n1 is 2, two groups $L_1$ may be identical to or different from each other, $L_2$ may be a ligand represented by Formula 2B, n2 may be 1 or 2, wherein, when n2 is 2, two groups $L_2$ may be identical to or different from each other, the sum of n1 and n2 may be 2 or 3, and each $L_1$ and $L_2$ may be different from each other:

Formula 2A

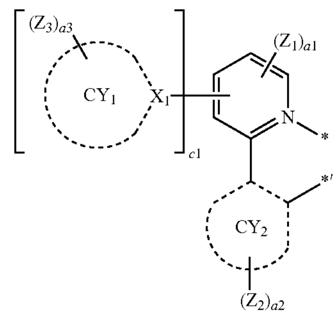

Formula 2B

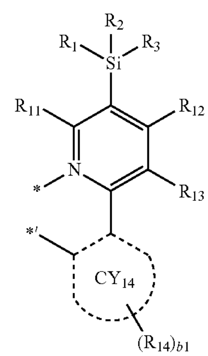

In Formulae 2A and 2B, $X_1$ may be C, N, Si, or P, ring $CY_1$, ring $CY_2$, and ring $CY_{14}$ may each independently be a $C_5$-$C_{30}$ carbocyclic group or a $C_1$-$C_{30}$ heterocyclic group, $R_1$ to $R_3$ may each independently be a $C_1$-$C_{60}$ alkyl group or a $C_6$-$C_{60}$ aryl group, each independently unsubstituted or substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{10}$ alkyl group, $Z_1$ to $Z_3$ and $R_{11}$ to $R_{14}$ may each independently be selected from hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), and —P(═O)($Q_8$)($Q_9$), a1 may be an integer from 0 to 3, wherein, when a1 is two or more, two or more groups $Z_1$ may be identical to or different from each other, a2, a3, and b1 may each independently be an integer from 0 to 20, wherein, when a2 is two or more, two or more groups $Z_2$ may be identical to or different from each other, when a3 is two or more, two or more groups $Z_3$ may be identical to or different from each other, and when b1 is two or more, two or more groups $R_{14}$ may be identical to or different from each other, c1 may be an integer from 1 to 4, wherein, when c1 is two or more, two or more groups represented by

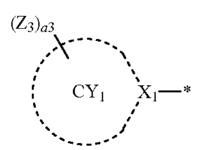

may be identical to or different from each other, when a1 is two or more, two or more groups $Z_1$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, when a2 is two or more, two or more groups $Z_2$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, when a3 is two or more, two or more groups $Z_3$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{12}$ and $R_{13}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, when b1 is two or more, two or more groups $R_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more substituents selected from $Z_1$ and $Z_2$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more substituents selected from $R_{11}$ to $R_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ may be selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), and —P(═O)($Q_8$)($Q_9$),

* and *' in Formulae 2A and 2B each indicate a binding site to M in Formula 1, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and substituted monovalent non-aromatic condensed heteropolycyclic group may each independently be selected from:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{11})(Q_{12})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{38})(Q_{37})$, or —$P(=O)(Q_{3a})(Q_{30})$, and $Q_1$ to $Q_9$, $Q_{11}$ to $Q_{19}$, $Q_{21}$ to $Q_{29}$, and $Q_{31}$ to $Q_{39}$ may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

Another aspect of the present disclosure provides an organic light-emitting device including: a first electrode; a second electrode; and an organic layer disposed between the first electrode and the second electrode and including an emission layer, wherein the organic layer includes at least one organometallic compound represented by Formula 1.

The organometallic compound in the emission layer of the organic layer may act as a dopant.

Another aspect of the present disclosure provides a diagnostic composition including at least one organometallic compound represented by Formula 1.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

An organometallic compound according to an embodiment is represented by Formula 1:

$$M(L_1)_{n1}(L_2)_{n2} \quad \text{Formula 1}$$

In Formula 1, M may be a transition metal. For example, M may be selected from a first-row transition metal, a second-row transition metal, and a third-row transition metal, of the Periodic Table of Elements.

In an embodiment, M may be iridium (Ir), platinum (Pt), osmium (Os), titanium (Ti), zirconium (Zr), hafnium (Hf), europium (Eu), terbium (Tb), thulium (Tm), or rhodium (Rh).

In an embodiment, M may be Ir, Pt, Os, or Rh, but embodiments of the present disclosure are not limited thereto.

In Formula 1, $L_1$ may be a ligand represented by Formula 2A. In Formula 1, n1 indicates the number of groups $L_1$, and may be 1 or 2. When n1 is two, two groups $L_1$ may be identical to or different from each other.

In Formula 1, $L_2$ may be a ligand represented by Formula 2B. In Formula 1, n2 indicates the number of groups $L_2$, and may be 1 or 2. When n2 is two, two groups $L_2$ may be identical to or different from each other.

Formula 2A

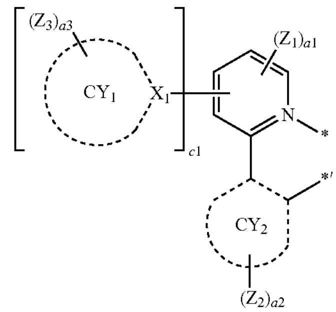

Formula 2B

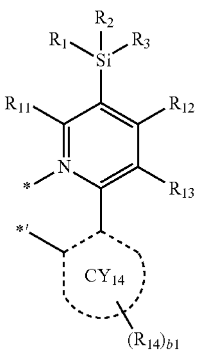

Formulae 2A and 2B will be described below.

In Formula 1, $L_1$ and $L_2$ may be different from each other.

In an embodiment, M may be Ir, and the sum of n1 and n2 may be 3; or M may be Pt, and the sum of n1 and n2 may be 2.

In Formula 2A, $X_1$ may be C, N, Si, or P. For example, $X_1$ may be C, but embodiments of the present disclosure are not limited thereto.

In Formulae 2A and 2B, ring $CY_1$, ring $CY_2$, and ring $CY_{14}$ may each independently be a $C_5$-$C_{30}$ carbocyclic group or a $C_1$-$C_{30}$ heterocyclic group.

For example, ring $CY_1$, ring $CY_2$, and ring $CY_{14}$ may each independently be i) a first ring, ii) a second ring, iii) a condensed ring in which at least two first rings are condensed, iv) a condensed ring in which at least two second rings are condensed, or v) a condensed ring in which at least one first ring and at least one second ring are condensed, wherein the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In an embodiment, ring $CY_1$, ring $CY_2$, and ring $CY_{14}$ may each independently be selected from a cyclopentane group, a cyclohexane group, a cycloheptane group, a cyclopentene group, a cyclohexene group, a cycloheptene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, and a 5,6,7,8-tetrahydroquinoline group, but embodiments of the present disclosure are not limited thereto.

In an embodiment, ring $CY_1$, ring $CY_2$, and ring $CY_{14}$ may each independently be selected from a benzene group, a naphthalene group, a 1,2,3,4-tetrahydronaphthalene group, a phenanthrene group, a pyridine group, a pyrimidine group, a pyrazine group, a triazine group, a benzofuran group, a benzothiophene group, a fluorene group, a carbazole group, a dibenzofuran group, a dibenzothiophene group, a dibenzosilole group, an azafluorene group, an azacarbazole group, an azadibenzofuran group, an azadibenzothiophene group, and an azadibenzosilole group, but embodiments of the present disclosure are not limited thereto.

In Formula 2B, $R_1$ to $R_3$ may each independently be a $C_1$-$C_{60}$ alkyl group or a $C_6$-$C_{60}$ aryl group, each unsubstituted or substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{10}$ alkyl group.

For example, $R_1$ to $R_3$ may each independently be selected from a $C_1$-$C_{10}$ alkyl group such as a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a biphenyl group, or a naphthyl group, each unsubstituted or substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof.

In an embodiment, $R_1$ to $R_3$ may each independently be $—CH_3$, $—CH_2CH_3$, $—CD_3$, $—CD_2H$, $—CDH_2$, $—CH_2CD_3$, or $—CD_2CH_3$.

In Formula 2B, $R_1$ to $R_3$ may be identical to or different from each other.

In an embodiment, $R_1$ to $R_3$ may be identical to each other, but embodiments of the present disclosure are not limited thereto.

In Formulae 2A and 2B, $Z_1$ to $Z_3$ and $R_{11}$ to $R_{14}$ may each independently be selected from hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_1$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_5$-$C_{60}$ arylthio group, a $C_7$-$C_{60}$ arylalkyl group, a substituted or unsubstituted $C_1$-$C_{60}$ heteroaryl group, a $C_1$-$C_{60}$ heteroaryloxy group, a $C_1$-$C_{10}$ heteroarylthio group, a $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, $—N(Q_1)(Q_2)$, $—Si(Q_3)(Q_4)(Q_5)$, $—Ge(Q_3)(Q_4)(Q_5)$, $—B(Q_6)(Q_7)$, and $—P(=O)(Q_8)(Q_9)$, and $Q_1$ to $Q_9$ are the same as described above.

In an embodiment, $Z_1$ to $Z_3$ and $R_{11}$ to $R_{14}$ may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a pyridinyl group, or a pyrimidinyl group;

a cyclopentyl group, a cyclohexyl group, a cycloheptyl group, a cycloctyl group, an adamantanyl group, a norbornanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, and $—Si(Q_{33})(Q_{34})(Q_{35})$; and $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_9)$, wherein $R_{12}$ is neither hydrogen nor a methyl group, and $Q_1$ to $Q_9$ and $Q_{33}$ to $Q_{35}$ may each independently be selected from:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; and an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one selected from deuterium, a $C_1$-$C_{10}$ alkyl group, and a phenyl group.

In an embodiment, in Formula 2B, $R_{12}$ may be selected from:

a $C_2$-$C_{20}$ alkyl group or a $C_2$-$C_{20}$ alkoxy group;

a methyl group or a methoxy group, each substituted with at least one selected from a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, and a monovalent non-aromatic condensed heteropolycyclic group;

a $C_2$-$C_{20}$ alkyl group or a $C_2$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, or a monovalent non-aromatic condensed heteropolycyclic group, each unsubstituted or substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{14}$ aryl group, a $C_1$-$C_{14}$ heteroaryl group, a monovalent non-aromatic condensed polycyclic group, and a monovalent non-aromatic condensed heteropolycyclic group; and —N($Q_{11}$)($Q_2$), —Si($Q_3$)($Q_4$)($Q_5$), —Ge($Q_3$)($Q_4$)($Q_5$), —B($Q_6$)($Q_7$), or —P(=O)($Q_8$)($Q_9$).

In an embodiment, in Formula 2B, $R_{12}$ may be selected from:

a $C_2$-$C_{20}$ alkyl group or a $C_2$-$C_{20}$ alkoxy group;

methyl group or a methoxy group, each substituted with at least one selected from a cyclopentyl group, a cyclohexyl group, a cycloheptyl group, a cycloctyl group, an adamantanyl group, a norbomanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a naphthyl group, a pyridinyl group, and a pyrimidinyl group;

a methyl group or a methoxy group, each substituted with i) at least one selected from a cyclopentyl group, a cyclohexyl group, a cycloheptyl group, a cycloctyl group, an adamantanyl group, a norbomanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a naphthyl group, a pyridinyl group, and a pyrimidinyl group, and ii) at least one deuterium;

a $C_2$-$C_{20}$ alkyl group or a $C_2$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a naphthyl group, a pyridinyl group, and a pyrimidinyl group; and a cyclopentyl group, a cyclohexyl group, a cycloheptyl group, a cycloctyl group, an adamantanyl group, a norbornanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or azadibenzothiophenyl group, each unsubstituted or substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbomenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, and an azadibenzothiophenyl group.

Examples of the $C_1$-$C_{60}$ alkyl group, the $C_1$-$C_{20}$ alkyl group, and the $C_1$-$C_{10}$ alkyl group include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, and examples of the $C_1$-$C_{60}$ alkoxy group, the $C_1$-$C_{20}$ alkoxy group, and the $C_1$-$C_{10}$ alkoxy group include a methoxy group, an ethoxy group, a propoxy group, a butoxy group, and a pentoxy group.

In an embodiment, in Formulae 2A and 2B, $Z_1$ to $Z_3$, $R_{11}$, $R_{13}$, and $R_{14}$ may each independently be selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-66, groups represented by Formulae 9-1 to 9-66 in which at least one hydrogen is substituted with deuterium, groups represented by Formulae 10-1 to 10-249, groups represented by Formulae 10-1 to 10-249 in which at least one hydrogen is substituted with deuterium, $—N(Q_1)(Q_2)$, $—Si(Q_3)(Q_4)(Q_5)$, and $—Ge(Q_3)(Q_4)(Q_5)$ (wherein $Q_1$ to $Q_5$ are each independently the same as described above); and/or $R_{12}$ in Formula 2B may be selected from groups represented by Formulae 9-1 to 9-66, groups represented by Formulae 9-1 to 9-66 in which at least one hydrogen is substituted with deuterium, groups represented by Formulae 10-1 to 10-249, and groups represented by Formulae 10-1 to 10-249 in which at least one hydrogen is substituted with deuterium.

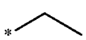
9-1

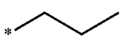
9-2

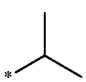
9-3

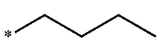
9-4

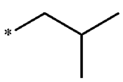
9-5

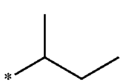
9-6

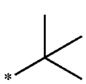
9-7

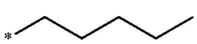
9-8

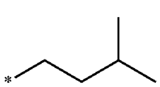
9-9

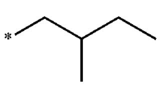
9-10

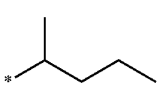
9-11

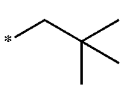
9-12

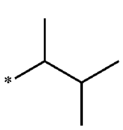
9-13

-continued

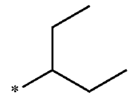
9-14

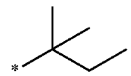
9-15

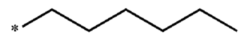
9-16

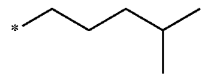
9-17

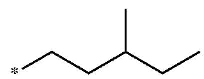
9-18

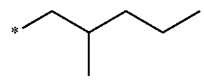
9-19

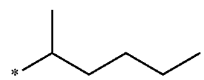
9-20

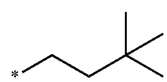
9-21

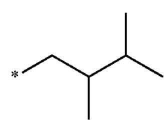
9-22

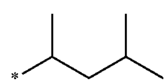
9-23

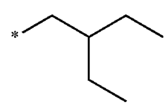
9-24

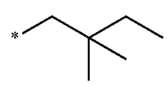
9-25

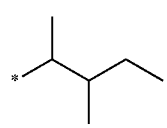
9-26

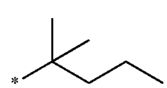
9-27

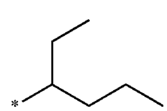
9-28

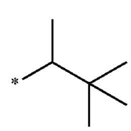
9-29

-continued
9-30
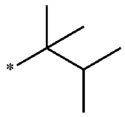
9-31
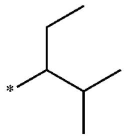
9-32
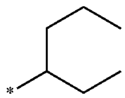
9-33
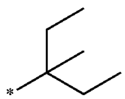
9-34
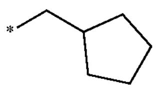
9-35
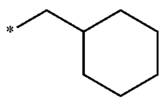
9-36
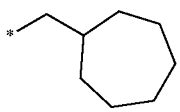
9-37
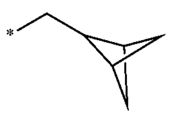
9-38
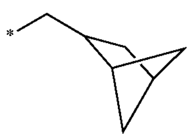
9-39
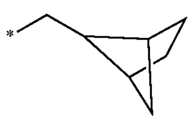
9-40
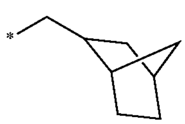
9-41
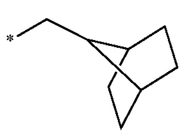
9-42
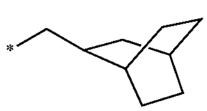
-continued
9-43
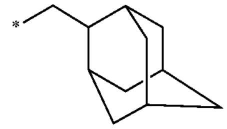
9-44
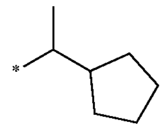
9-45
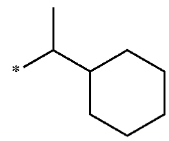
9-46
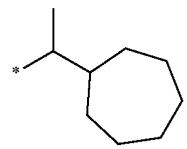
9-47
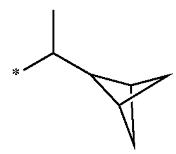
9-48
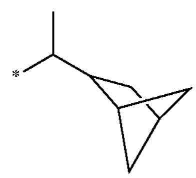
9-49
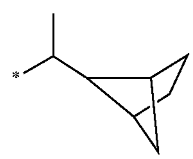
9-50
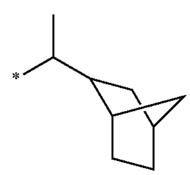
9-51
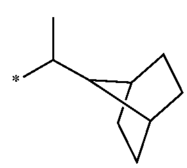
9-52
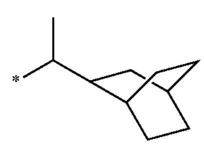

-continued
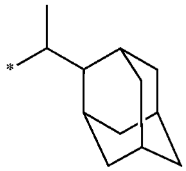
9-53
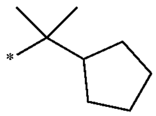
9-54
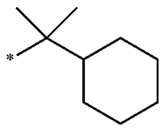
9-55
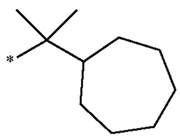
9-56
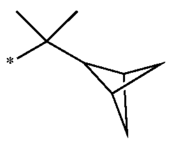
9-57
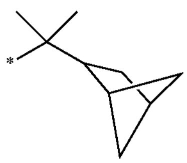
9-58
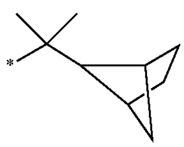
9-59
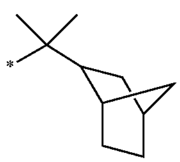
9-60
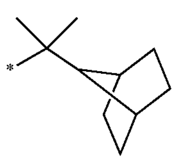
9-61
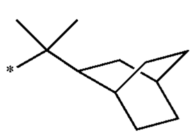
9-62
-continued
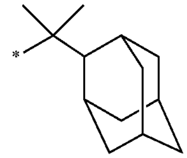
9-63
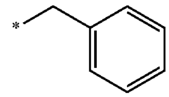
9-64
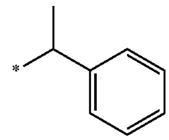
9-65
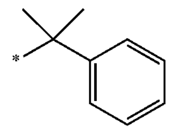
9-66
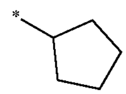
10-1
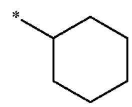
10-2
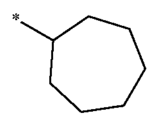
10-3
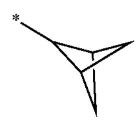
10-4
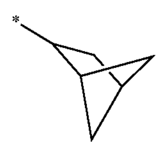
10-5
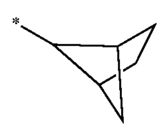
10-6
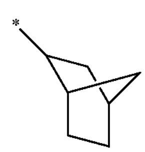
10-7
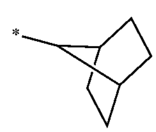
10-8

-continued
10-9
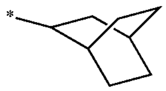
10-10
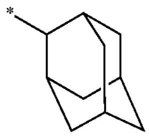
10-11
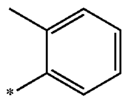
10-12
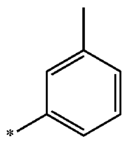
10-13
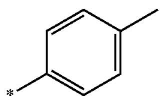
10-14
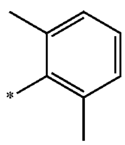
10-15
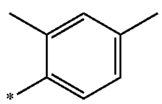
10-16
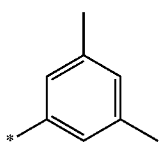
10-17
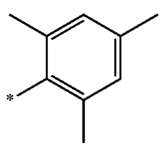
10-18
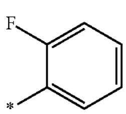
10-19
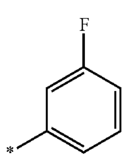
10-20
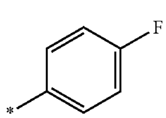
-continued
10-21
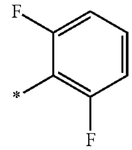
10-22
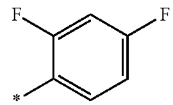
10-23
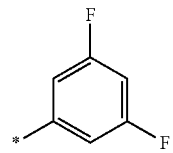
10-24
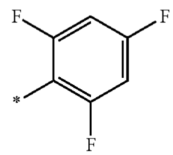
10-25
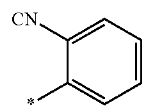
10-26
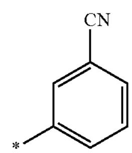
10-27
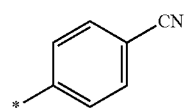
10-28
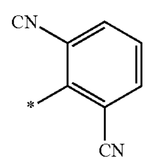
10-29
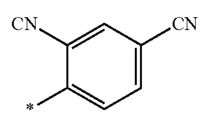
10-30
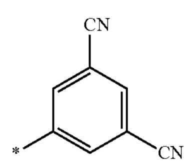
10-31
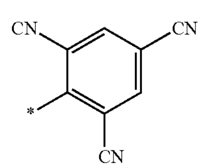

-continued
10-32
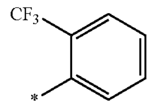
10-33
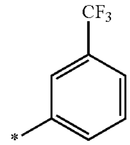
10-34
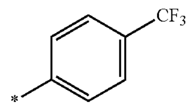
10-35
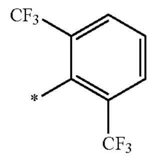
10-36
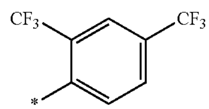
10-37
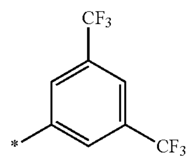
10-38
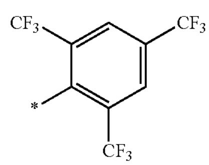
10-39
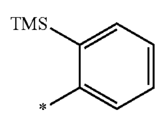
10-40
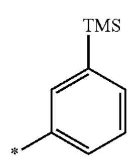
10-41
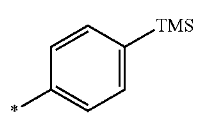
10-42
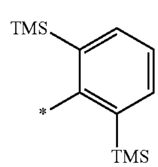
-continued
10-43
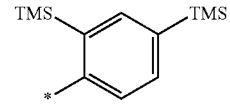
10-44
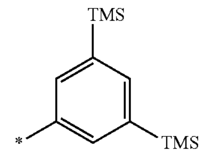
10-45
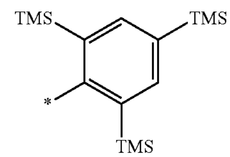
10-46
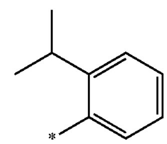
10-47
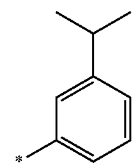
10-48
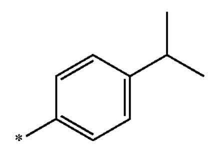
10-49
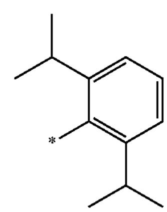
10-50
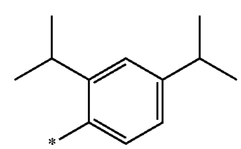
10-51
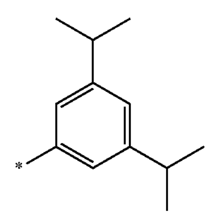

-continued
10-52
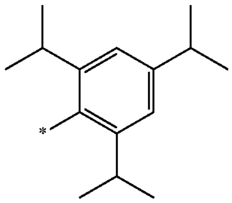
10-53
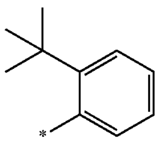
10-54
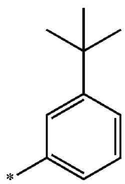
10-55
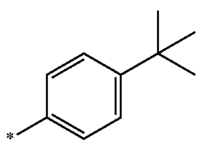
10-56
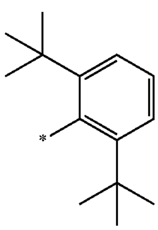
10-57
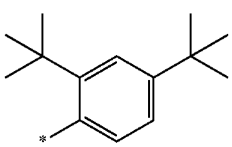
10-58
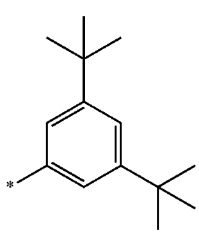
10-59
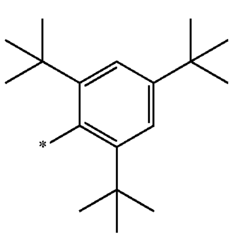
-continued
10-60
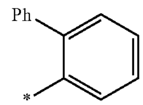
10-61
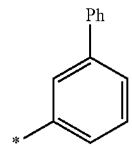
10-62
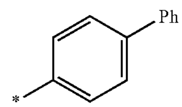
10-63
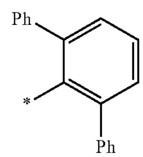
10-64
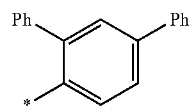
10-65
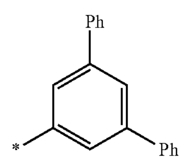
10-66
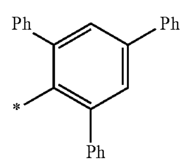
10-67
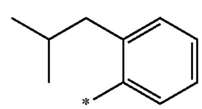
10-68
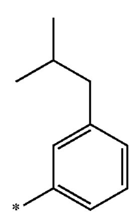
10-69
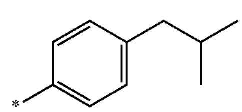

-continued
10-70
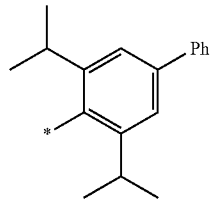
10-71
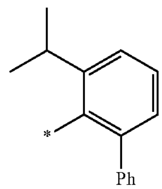
10-72
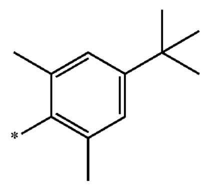
10-73
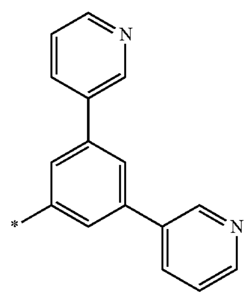
10-74
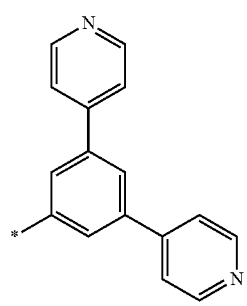
10-75
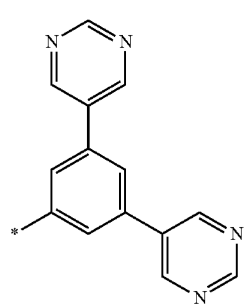
-continued
10-76
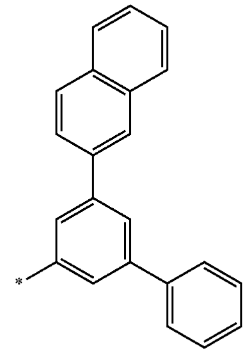
10-77
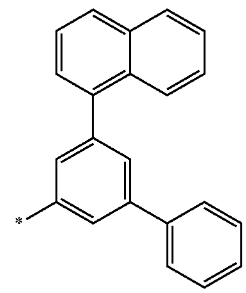
10-78
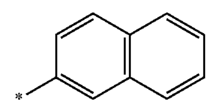
10-79
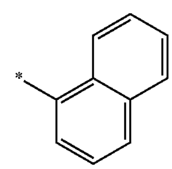
10-80
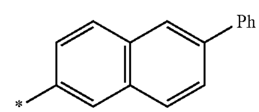
10-81
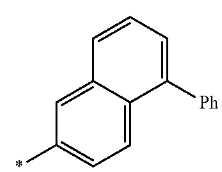
10-82
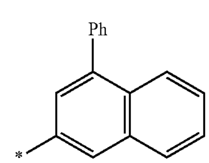
10-83
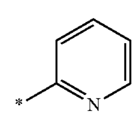
10-84
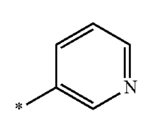

-continued
10-85
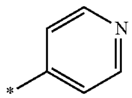
10-86
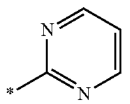
10-87
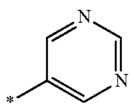
10-88
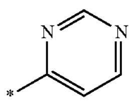
10-89
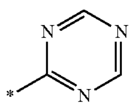
10-90
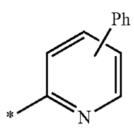
10-91
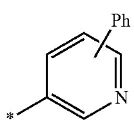
10-92
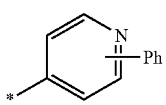
10-93
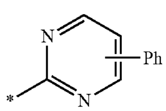
10-94
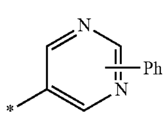
10-95
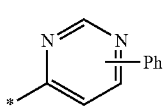
10-96
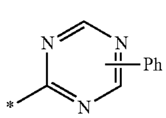
10-97
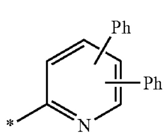
-continued
10-98
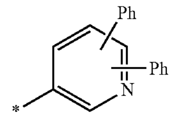
10-99
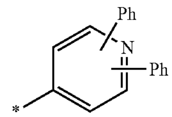
10-100
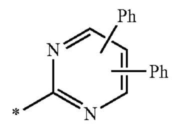
10-101
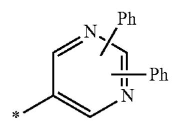
10-102
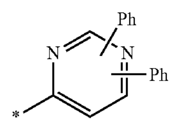
10-103
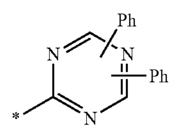
10-104
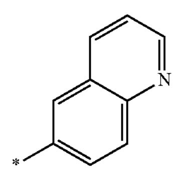
10-105
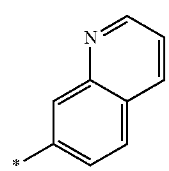
10-106
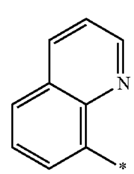
10-107
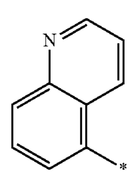

-continued
10-108
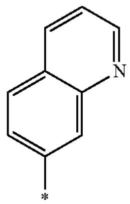
10-109
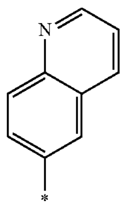
10-110
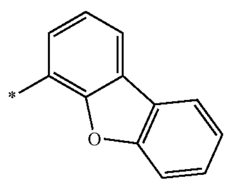
10-111
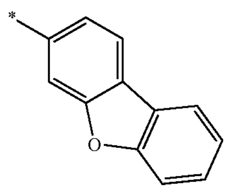
10-112
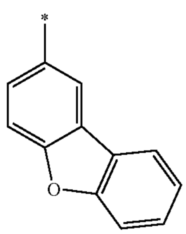
10-113
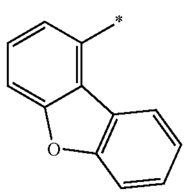
10-114
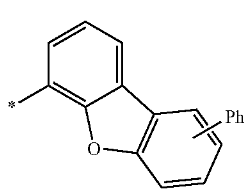
10-115
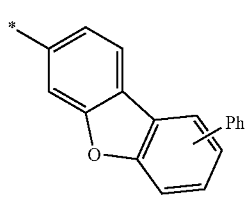
-continued
10-116
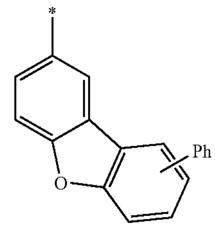
10-117
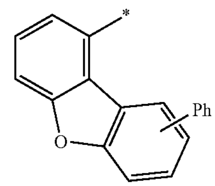
10-118
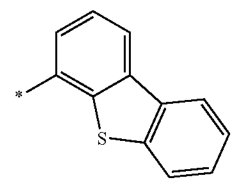
10-119
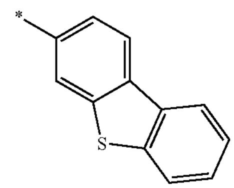
10-120
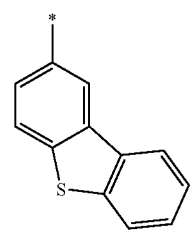
10-121
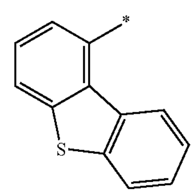
10-122
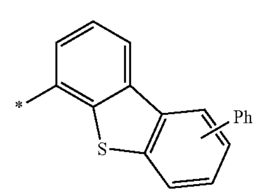
10-123
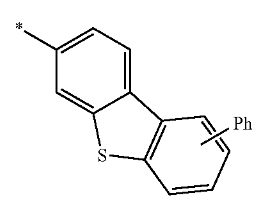

-continued
10-124
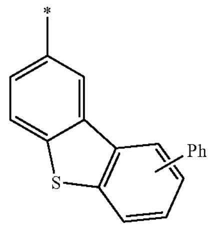
10-125
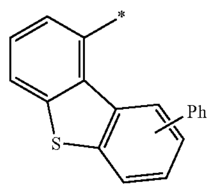
10-126
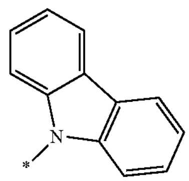
10-127
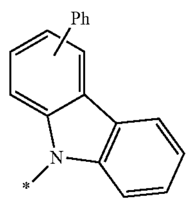
10-128
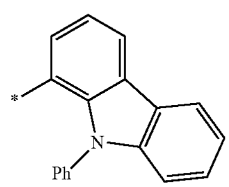
10-129
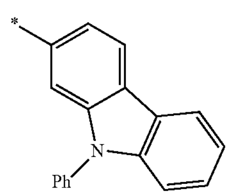
10-130
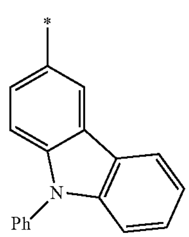
10-131
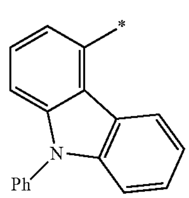
-continued
10-132
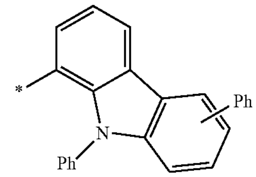
10-133
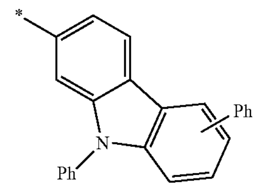
10-134
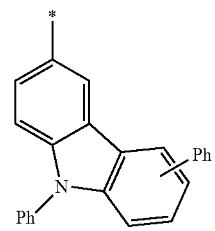
10-135
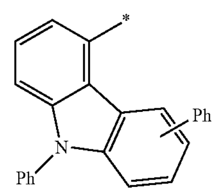
10-136
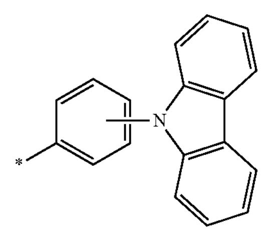
10-137
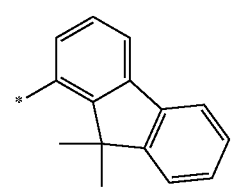
10-138
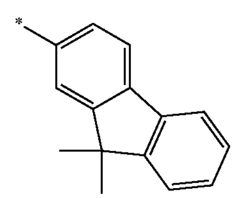

-continued
10-139
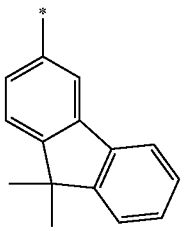
10-140
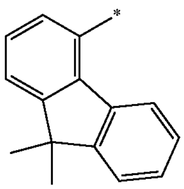
10-141
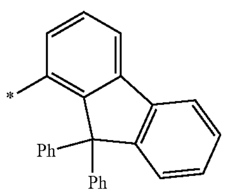
10-142
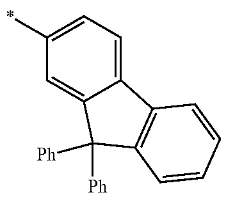
10-143
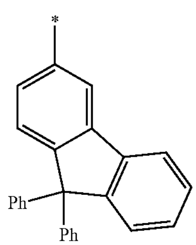
10-144
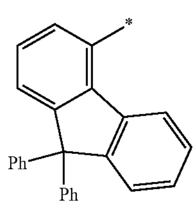
10-145
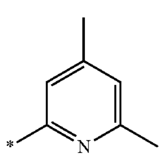
10-146
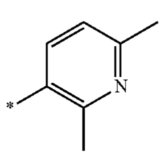
-continued
10-147
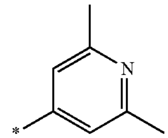
10-148
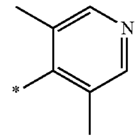
10-149
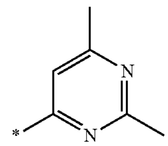
10-150
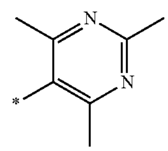
10-151
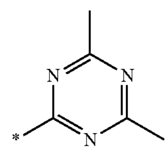
10-152
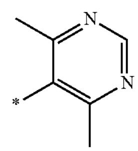
10-153
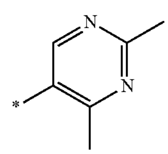
10-154
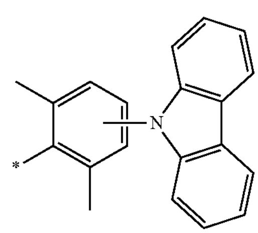
10-155
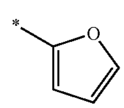
10-156
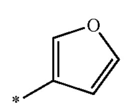
10-157
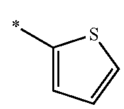

-continued
10-158
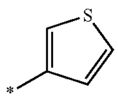
10-159
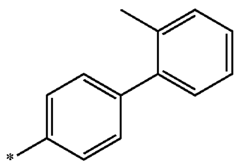
10-160
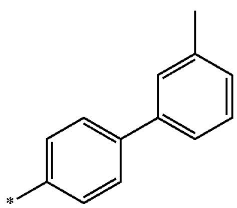
10-161
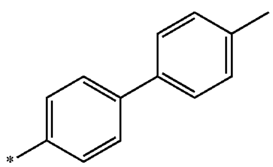
10-162
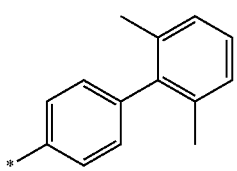
10-163
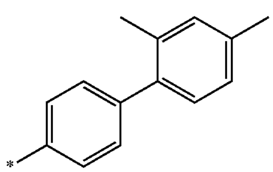
10-164
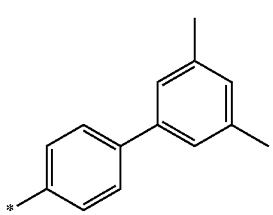
10-165
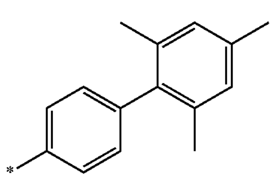
-continued
10-166
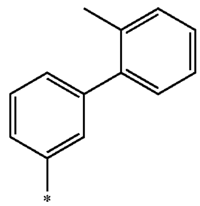
10-167
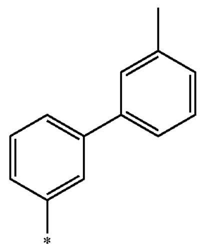
10-168
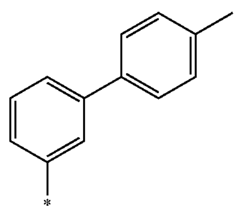
10-169
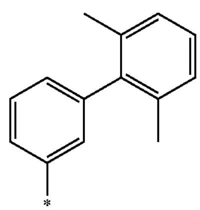
10-170
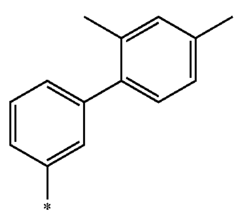
10-171
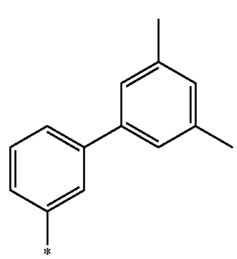
10-172
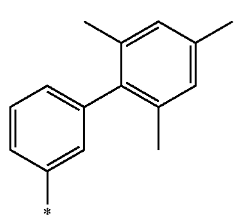

-continued
10-173
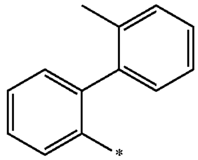
10-174
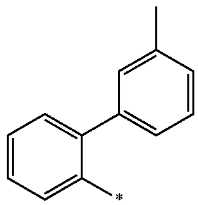
10-175
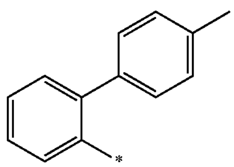
10-176
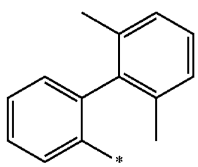
10-177
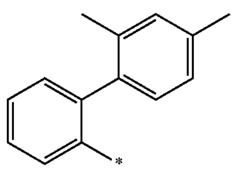
10-178
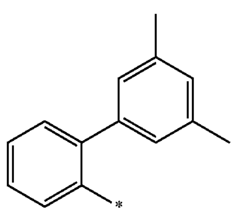
10-179
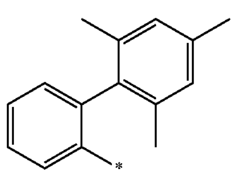
10-180
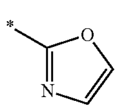
10-181
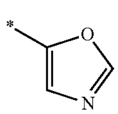
10-182
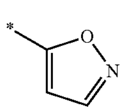
-continued
10-183
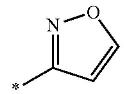
10-184
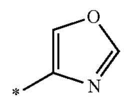
10-185
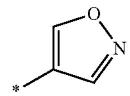
10-186
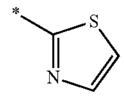
10-187
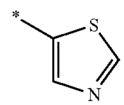
10-188
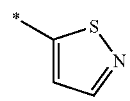
10-189
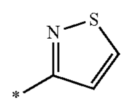
10-190
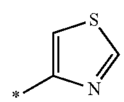
10-191
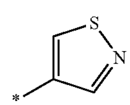
10-192
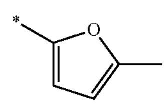
10-193
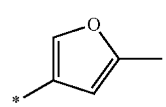
10-194
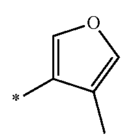
10-195
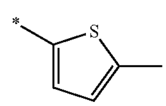
10-196
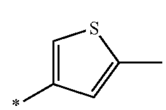

-continued
10-197
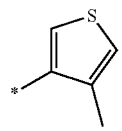
10-198
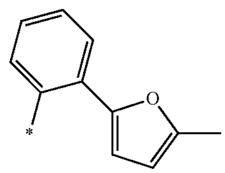
10-199
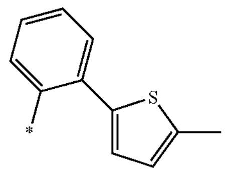
10-200
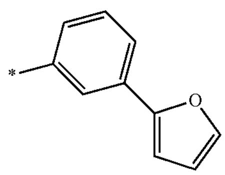
10-201
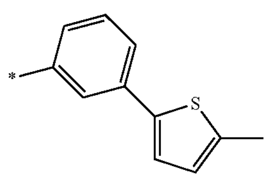
10-202
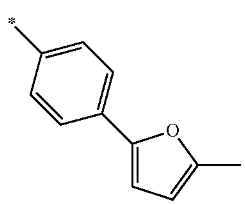
10-203
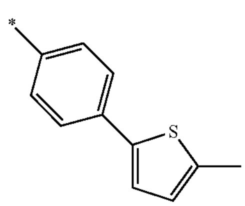
10-204
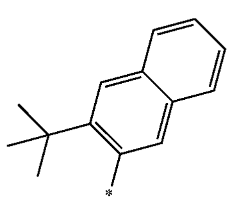
-continued
10-205
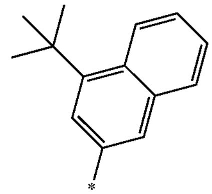
10-206
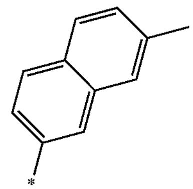
10-207
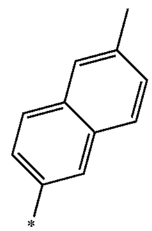
10-208
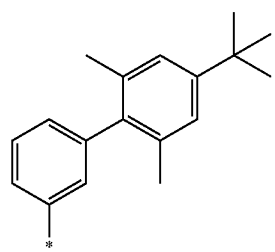
10-209
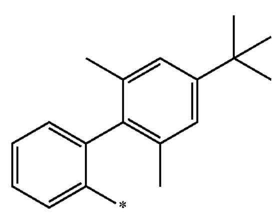
10-210
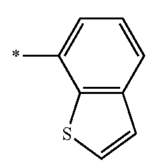
10-211
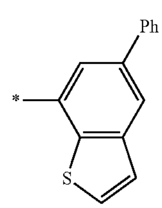

-continued
10-212
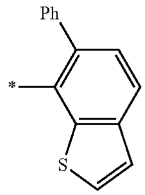
10-213
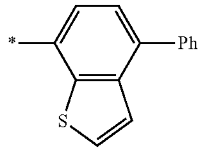
10-214
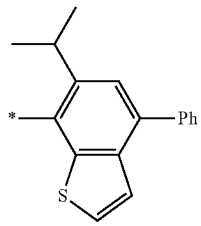
10-215
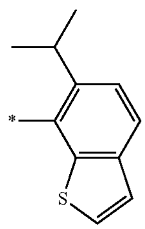
10-216
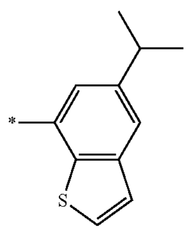
10-217
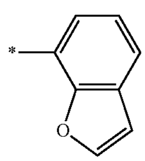
10-218
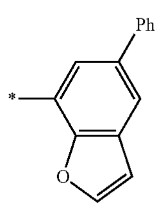
10-219
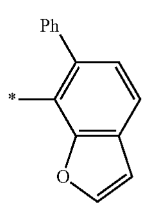
-continued
10-220
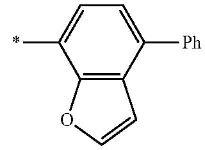
10-221
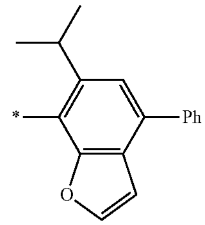
10-222
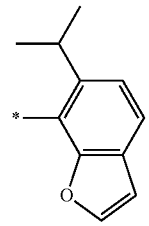
10-223
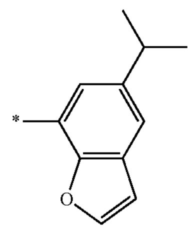
10-224
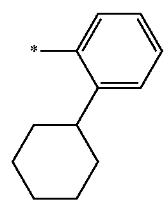
10-225
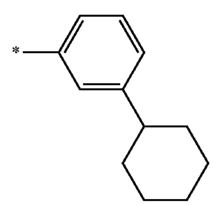
10-226
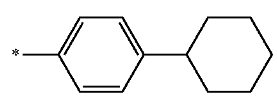
10-227
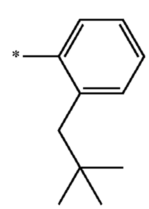

-continued
10-228
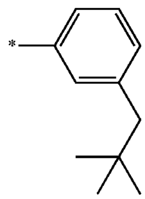
10-229
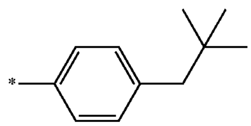
10-230
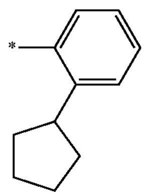
10-231
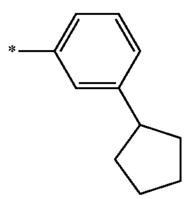
10-232
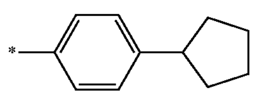
10-233
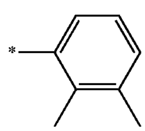
10-234
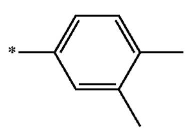
10-235
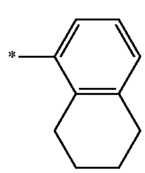
10-236
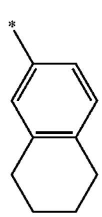
-continued
10-237
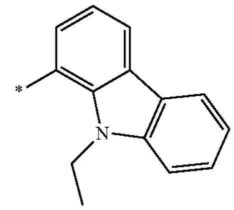
10-238
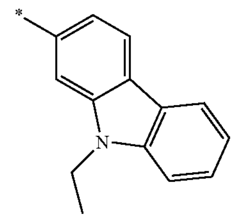
10-239
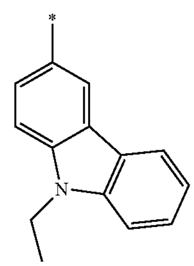
10-240
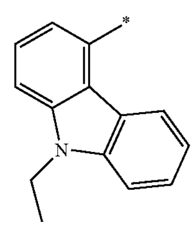
10-241
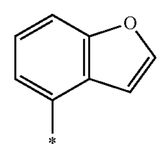
10-242
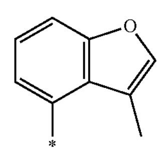
10-243
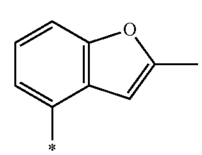
10-244
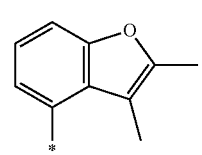

-continued
10-245
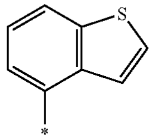
10-246
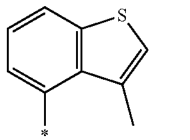
10-247
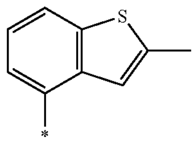
10-248
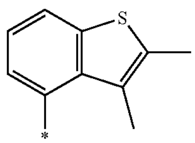
10-249
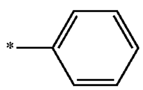
In Formulae 9-1 to 9-66 and Formulae 10-1 to 10-249, * indicates a binding site to a neighboring atom, Ph indicates a phenyl group, and TMS indicates a trimethylsilyl group. As used herein, "The groups represented by Formulae 9-1 to 9-66 in which at least one hydrogen is substituted with deuterium" may be, for example, groups represented by Formulae 9-501 to 9-552:
9-501
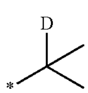
9-502
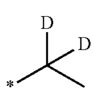
9-503
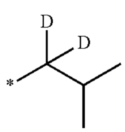
9-504
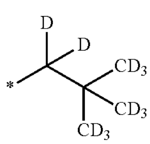
9-505
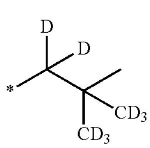
-continued
9-506
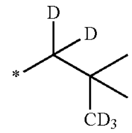
9-507
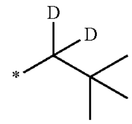
9-508
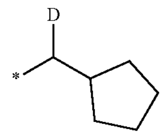
9-509
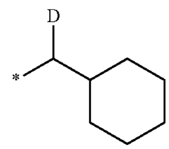
9-510
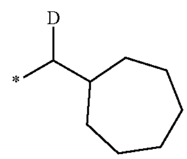
9-511
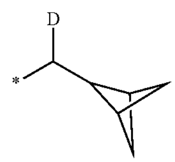
9-512
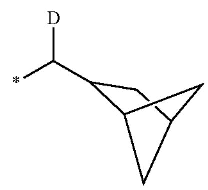
9-513
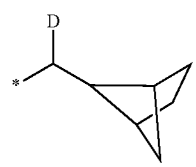
9-514
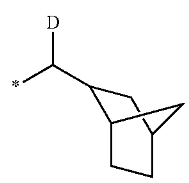
9-515
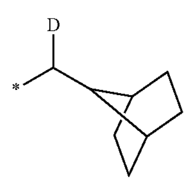

-continued
9-516
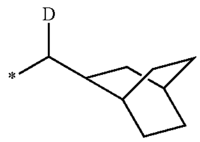
9-517
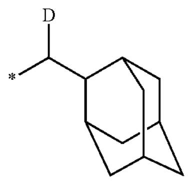
9-518
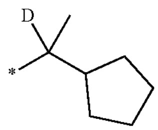
9-519
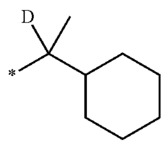
9-520
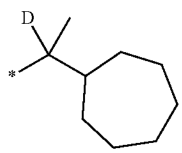
9-521
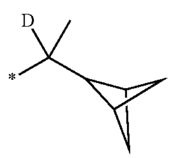
9-522
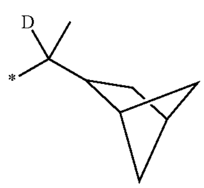
9-523
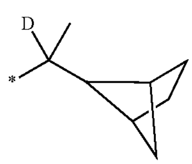
9-524
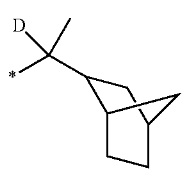
9-525
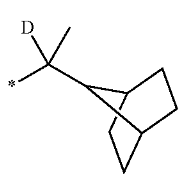
-continued
9-526
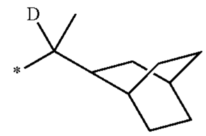
9-527
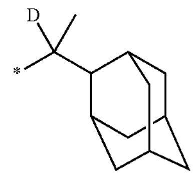
9-528
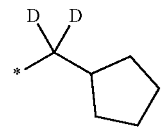
9-529
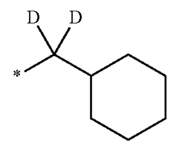
9-530
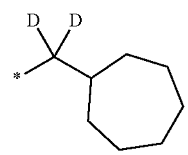
9-531
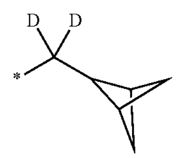
9-532
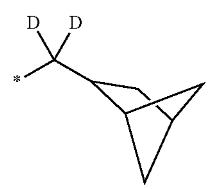
9-533
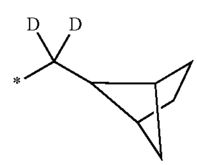
9-534
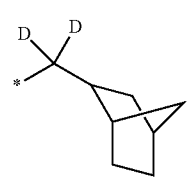
9-535
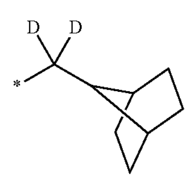

-continued
9-536
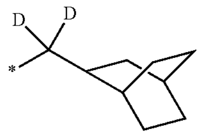
9-537
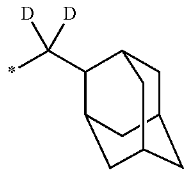
9-538
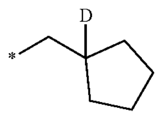
9-539
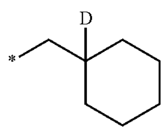
9-540
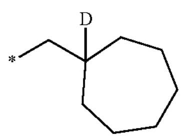
9-541
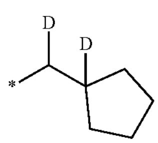
9-542
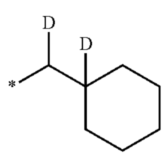
9-543
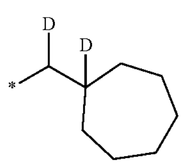
9-544
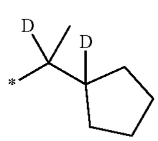
9-545
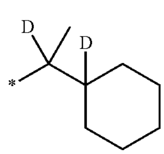
-continued
9-546
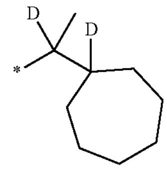
9-547
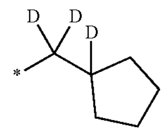
9-548
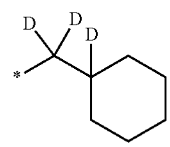
9-549
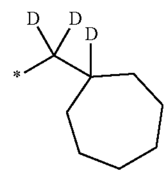
9-550
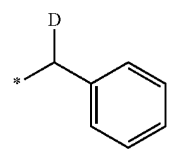
9-551
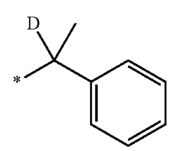
9-552
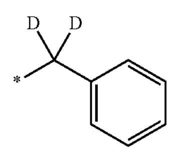
As used herein, "The groups represented by Formulae 10-1 to 10-249 in which at least one hydrogen is substituted with deuterium" may be, for example, groups represented by Formulae 10-501 to 10-510:
10-501
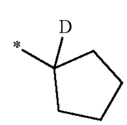
10-502
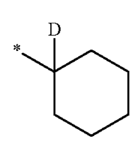

-continued 10-503

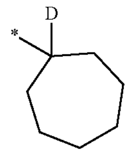

10-504

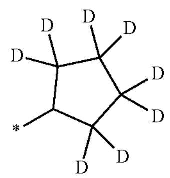

10-505

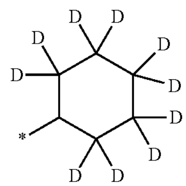

10-506

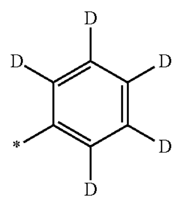

10-507

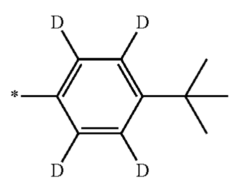

10-508

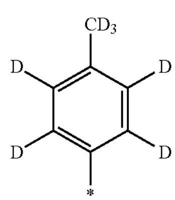

10-509

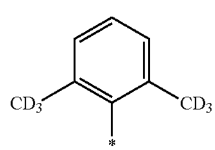

10-510

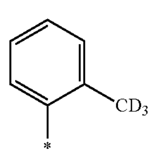

In an embodiment, in Formula 2A, $Z_1$ may be selected from hydrogen, deuterium, —F, a cyano group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, —N($Q_1$)($Q_2$), —Si($Q_3$)($Q_4$)($Q_5$), and —Ge($Q_3$)($Q_4$)($Q_5$), wherein $Q_1$ to $Q_5$ are the same as described above.

In Formula 2A, a1 indicates the number of groups $Z_1$, and may be an integer of 0 to 3. When a1 is two or more, two or more groups $Z_1$ may be identical to or different from each other.

In Formulae 2A and 2B, a2, a3, and b1 each indicate the number of groups $Z_2$, $Z_3$, and $R_{14}$, respectively, and may each independently be an integer of 0 to 20. When a2 is two or more, two or more groups $Z_2$ may be identical to or different from each other, when a3 is two or more, two or more groups $Z_3$ may be identical to or different from each other, and when b1 is two or more, two or more groups $R_{14}$ may be identical to or different from each other. For example, a2, a3, and b1 may each independently be an integer of 0 to 10, but embodiments of the present disclosure are not limited thereto.

c1 may be an integer of 1 to 4, wherein, when c1 is two or more, two or more groups represented by

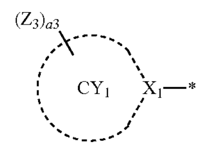

may be identical to or different from each other. For example, c1 may be 1 or 2.

In Formulae 2A and 2B, i) two or more groups selected from a plurality of groups $Z_1$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, ii) two or more groups selected from a plurality of groups $Z_2$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iii) two or more groups selected from a plurality of groups $Z_3$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, iv) $R_{12}$ and $R_{13}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, v) two or more groups selected from a plurality of groups $R_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, or vi) two or more groups selected from groups $Z_1$, $Z_2$, and $R_{11}$ to $R_{14}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$. Here, examples of the $C_5$-$C_{30}$ carbocyclic group that is unsubstituted or substituted with at least one $R_{10a}$ or the $C_1$-$C_{30}$ heterocyclic group that is unsubstituted or substituted with at least one $R_{10a}$ include a benzene group, a cyclopentane group, a cyclopentadiene group, a bicyclo[2.2.1]heptane group, a furan group, a thiophene group, a pyrrole group, a silole group, an indene group, a benzofuran group, a benzothiophene group, an indole group, or a benzosilole group, each unsubstituted or substituted with at least one $R_{10a}$, wherein $R_{10a}$ is defined the same as $Z_1$. The $C_5$-$C_{30}$ carbocyclic group and the $C_1$-$C_{30}$ heterocyclic group will be additionally described below.

In Formulae 2A and 2B, * and *' each indicate a binding site to M in Formula 1. In an embodiment, a group represented by

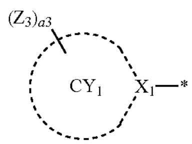

in Formula 2A may be selected from a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, each unsubstituted or substituted with group $Z_3$ in the number of a3.

a3, $Z_3$, and $X_1$ are the same as described above.

In an embodiment, the group represented by

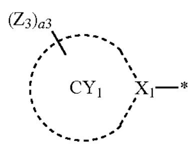

in Formula 2A may be selected from a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each unsubstituted or substituted with group $Z_3$ in the number of a3.

In an embodiment, a group represented by

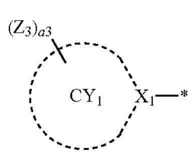

in Formula 2A may be a group represented by one selected from Formulae CY1(1) to CY1(20):

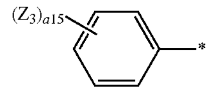

CY1(1)

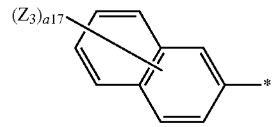

CY1(2)

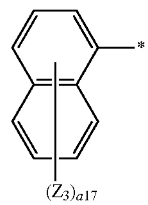

CY1(3)

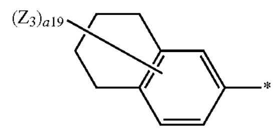

CY1(4)

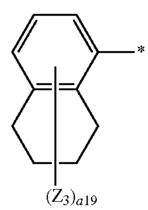

CY1(5)

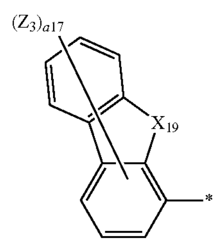

CY1(6)

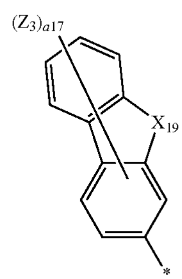

CY1(7)

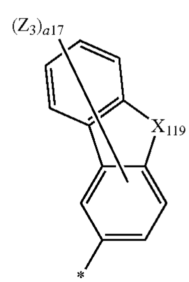

CY1(8)

-continued

CY1(9)

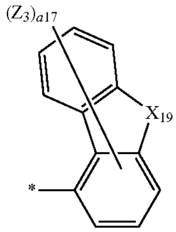

CY1(10)

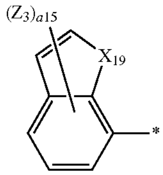

CY1(11)

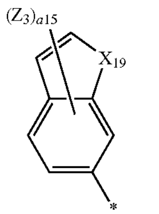

CY1(12)

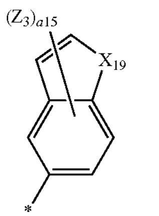

CY1(13)

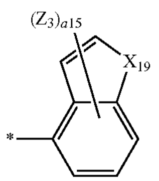

CY1(14)

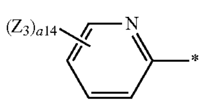

CY1(15)

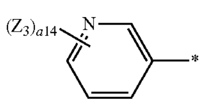

CY1(16)

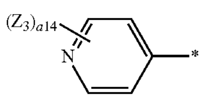

CY1(17)

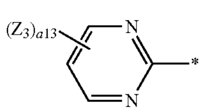

CY1(18)

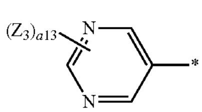

-continued

CY1(19)

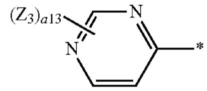

CY1(20)

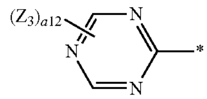

In Formulae CY1(1) to CY1(20), $Z_3$ may be the same as described above, $X_{19}$ may be O, S, $N(Z_4)$, $C(Z_4)(Z_5)$, or $Si(Z_4)(Z_5)$, $Z_4$ and $Z_5$ may each independently be the same as described in connection with $Z_3$, a12 may be an integer from 0 to 2, a13 may be an integer from 0 to 3, a14 may be an integer from 0 to 4, a15 may be an integer from 0 to 5, a17 may be an integer from 0 to 7, a19 may be an integer from 0 to 9, and

* indicates a binding site to a neighboring carbon atom.

In an embodiment, a group represented by

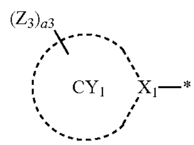

in Formula 2A may be a group represented by one selected from Formulae 10-10(1) to 10-10(18) and 10-249:

10-10(1)

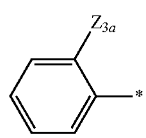

10-10(2)

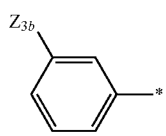

10-10(3)

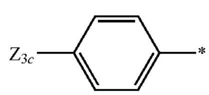

10-10(4)

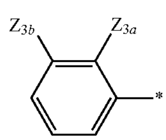

10-10(5)

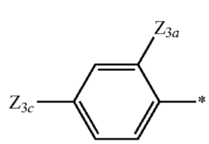

-continued 10-10(6)

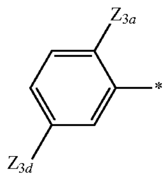

10-10(7)

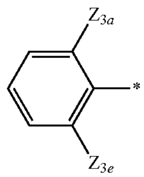

10-10(8)

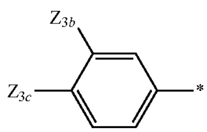

10-10(9)

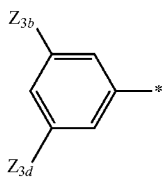

10-10(10)

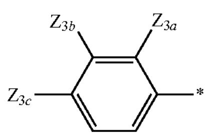

10-10(11)

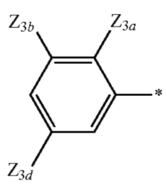

10-10(12)

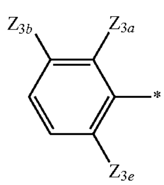

10-10(13)

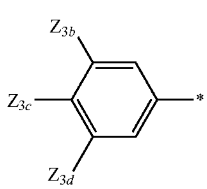

10-10(14)

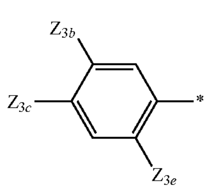

-continued 10-10(15)

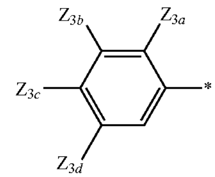

10-10(16)

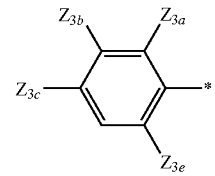

10-10(17)

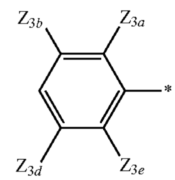

10-10(18)

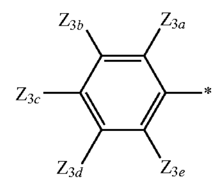

10-249

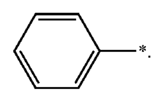

In Formulae 10-10(1) to 10-10(18), $Z_{3a}$ to $Z_{3e}$ may each independently be the same as described in connection with $Z_3$, wherein $Z_{3a}$ to $Z_{3e}$ may not be hydrogen, and * indicates a binding site to a neighboring carbon atom.

In an embodiment, a group represented by

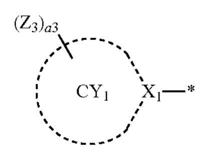

in Formula 2A may be selected from groups represented by Formulae 10-1 to 10-249 and groups represented by Formulae 10-1 to 10-249 in which at least one hydrogen is substituted with deuterium, but embodiments of the present disclosure are not limited thereto.

In an embodiment, a group represented by

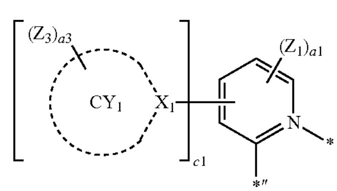

in Formula 2A may be a group represented by one selected from Formulae CY1-1 to $CY_1$-56:

-continued
CY1-1
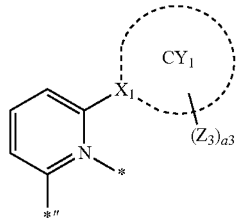
CY1-2
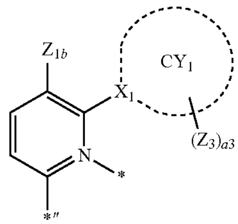
CY1-3
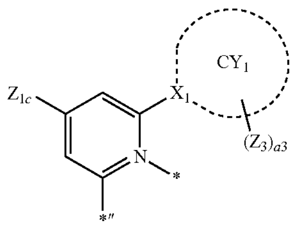
CY1-4
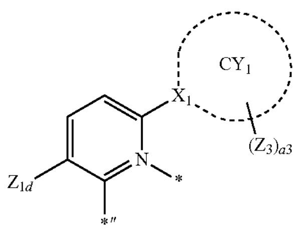
CY1-5
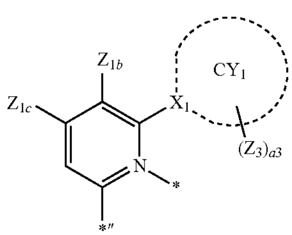
CY1-6
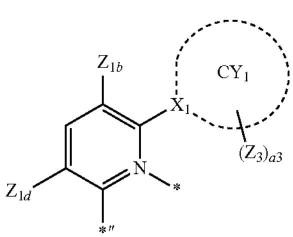
CY1-7
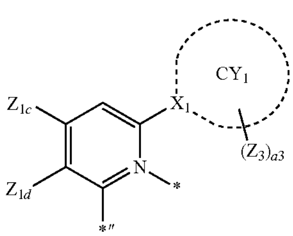
CY1-8
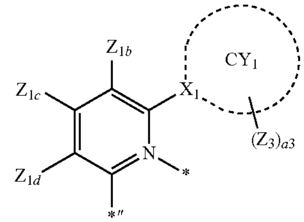
CY1-9
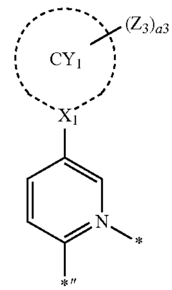
CY1-10
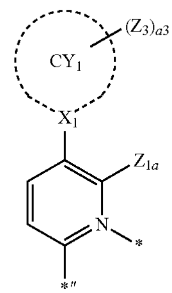
CY1-11
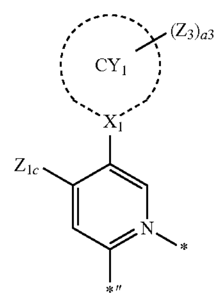
CY1-12
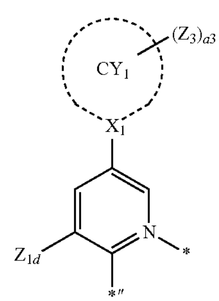

CY1-13
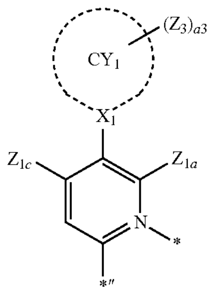
CY1-14
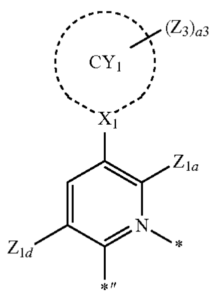
CY1-15
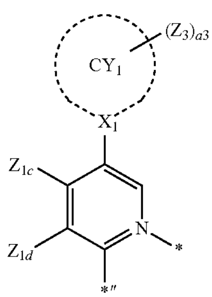
CY1-16
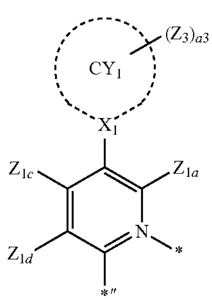
CY1-17
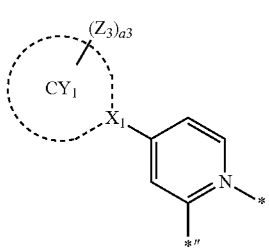
CY1-18
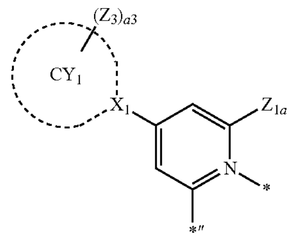
CY1-19
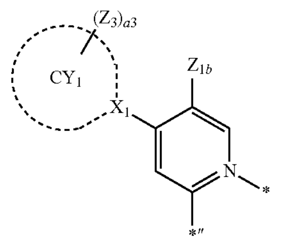
CY1-20
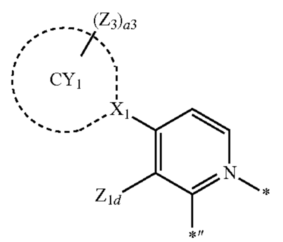
CY1-21
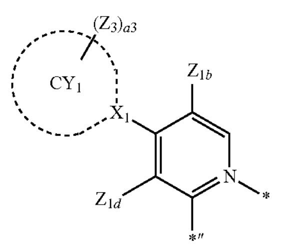
CY1-22
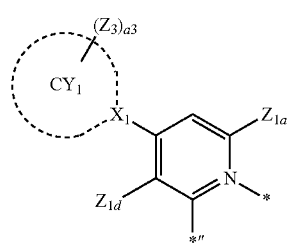
CY1-23
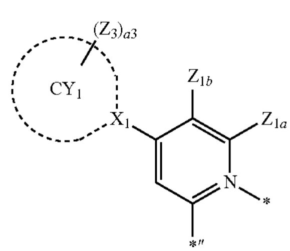

-continued
CY1-24
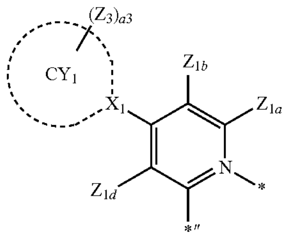
CY1-25
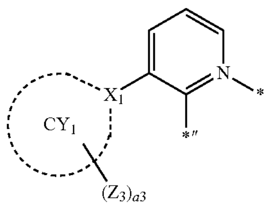
CY1-26
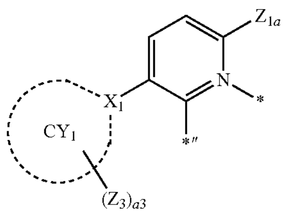
CY1-27
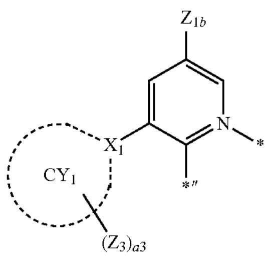
CY1-28
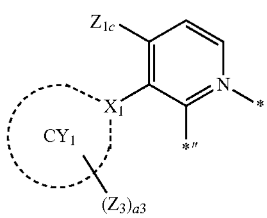
CY1-29
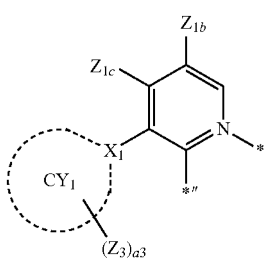
CY1-30
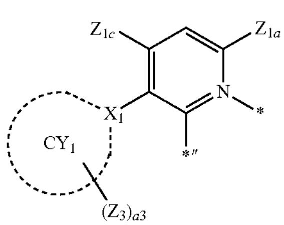
-continued
CY1-31
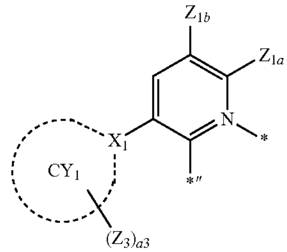
CY1-32
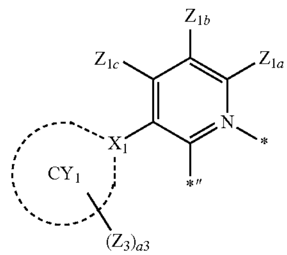
CY1-33
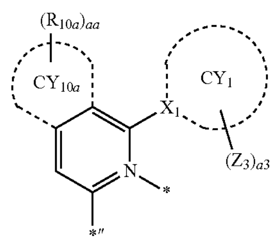
CY1-34
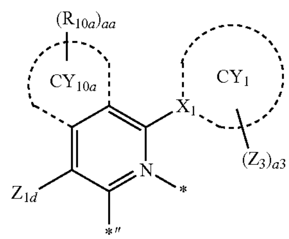
CY1-35
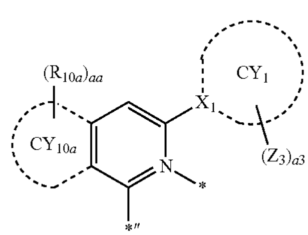
CY1-36
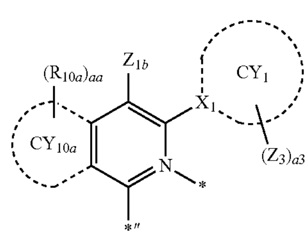

-continued
CY1-37
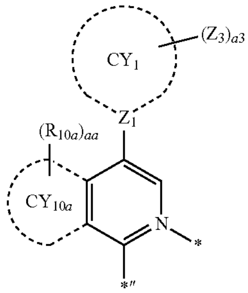
CY1-38
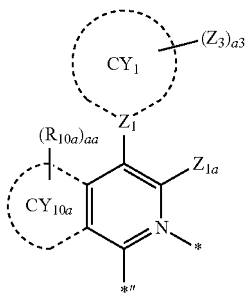
CY1-39
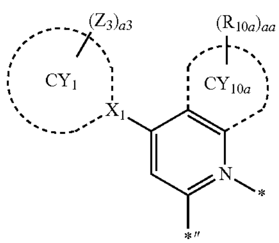
CY1-40
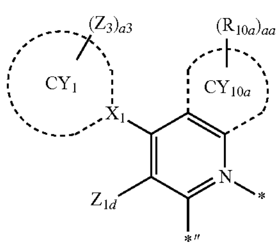
CY1-41
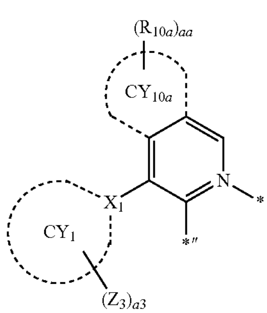
-continued
CY1-42
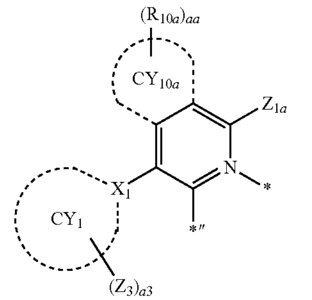
CY1-43
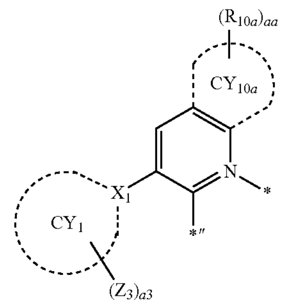
CY1-44
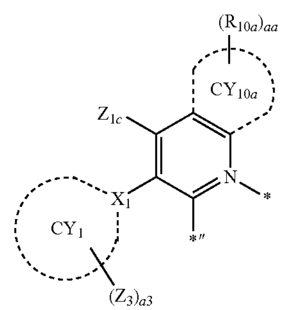
CY1-45
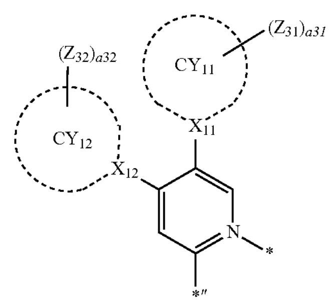
CY1-46
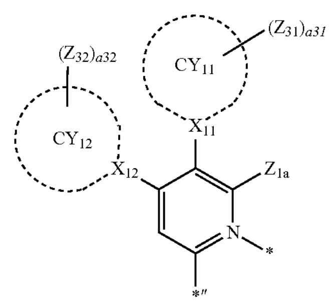

-continued
CY1-47
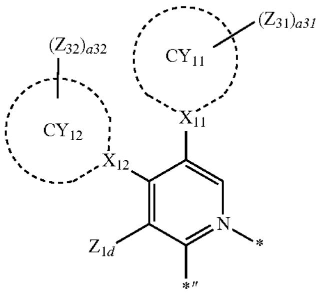
CY1-48
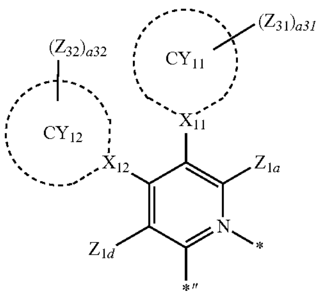
CY1-49
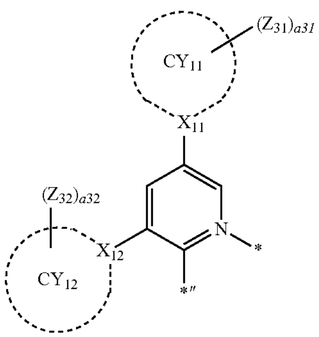
CY1-50
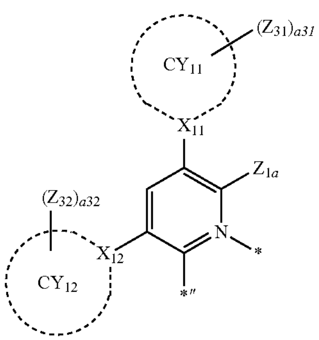
CY1-51
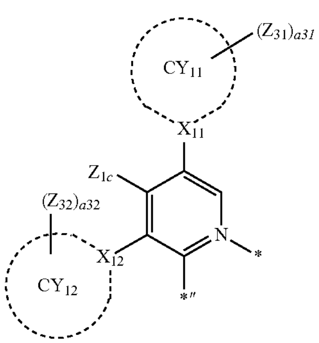
-continued
CY1-52
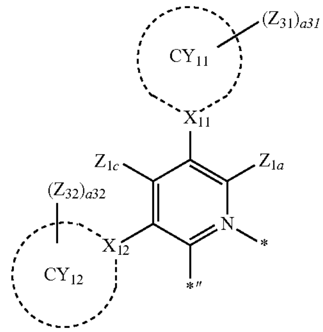
CY1-53
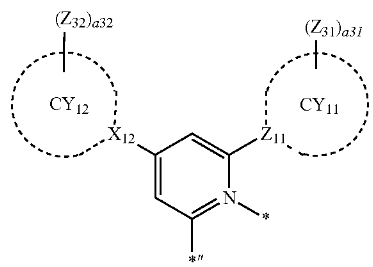
CY1-54
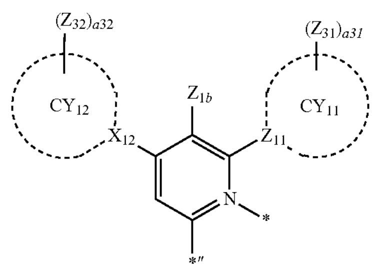
CY1-55
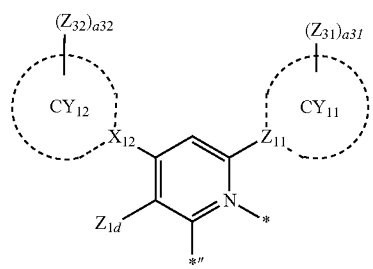
CY1-56
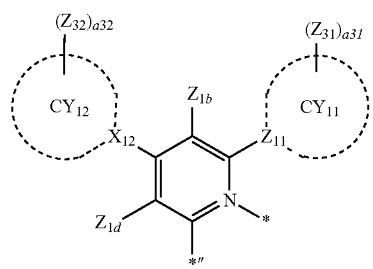
In Formulae CY1-1 to CY1-56,
$X_1$, ring $CY_1$, $Z_3$, and a3 may each independently be the same as described herein,
$Z_{1a}$ to $Z_{1d}$ may each independently be the same as described in connection with $Z_1$, wherein $Z_{1a}$ to $Z_{1d}$ may not be hydrogen,
$X_{11}$ and $X_{12}$ may each independently be the same as described in connection with $X_1$, ring $CY_{11}$ and ring $CY_{12}$ may each independently be the same as described in connection with ring $CY_1$, $Z_{31}$ and $Z_{32}$ may each independently be the same as described in connection with $Z_3$, a31 and a32 may each independently be the same as described in connection with a3, ring $CY_{10a}$ may be a $C_5$-$C_{30}$ carbocyclic group or a $C_1$-$C_{30}$ heterocyclic group, $R_{10a}$ may be the same as described above, aa may be an integer from 0 to 10, and

* indicates a binding site to M in Formula 1, and *' indicates a binding site to ring $CY_2$ in Formula 2A.

In an embodiment, a group represented by

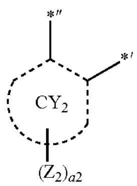

in Formula 2A may be a group represented by one selected from Formulae CY2-1 to CY2-64:

CY2-1

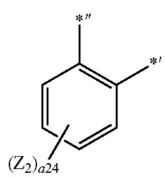

CY2-2

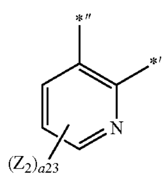

CY2-3

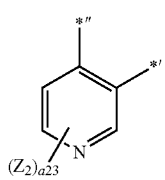

CY2-4

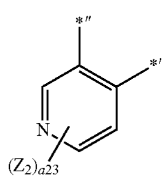

CY2-5

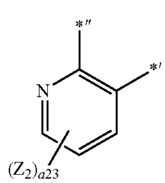

-continued

CY2-6

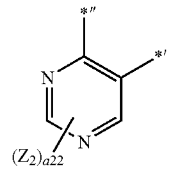

CY2-7

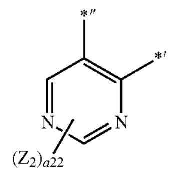

CY2-8

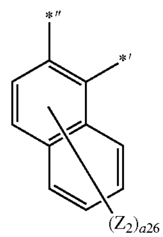

CY2-9

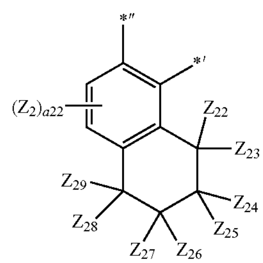

CY2-10

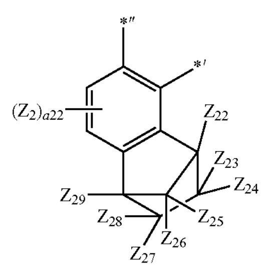

CY2-11

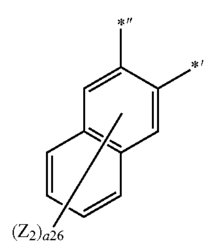

CY2-12

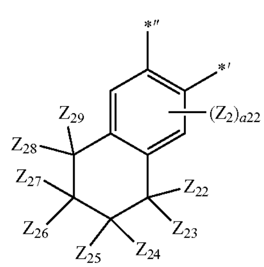

-continued
CY2-13
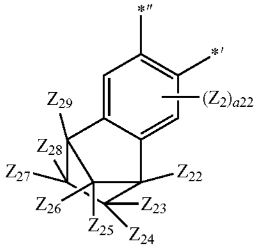
CY2-14
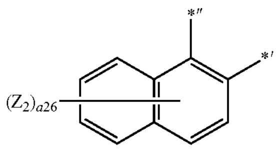
CY2-15
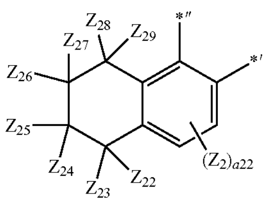
CY2-16
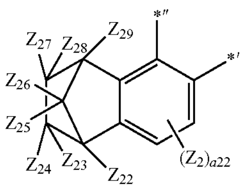
CY2-17
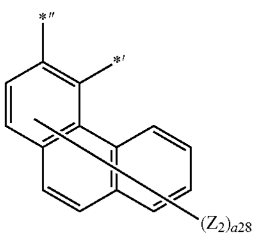
CY2-18
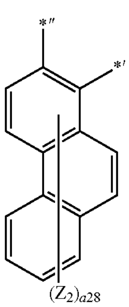
CY2-19
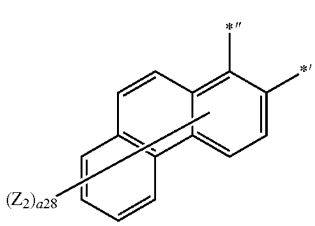
-continued
CY2-20
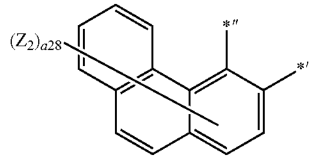
CY2-21
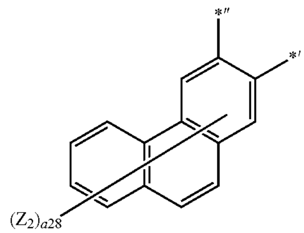
CY2-22
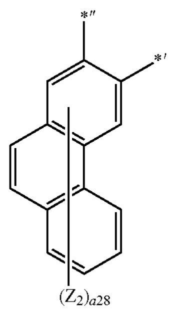
CY2-23
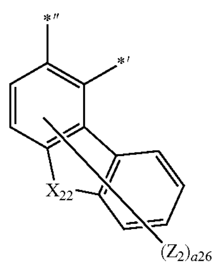
CY2-24
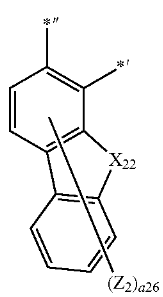
CY2-25
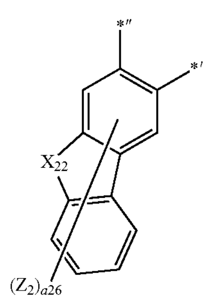

-continued
CY2-26
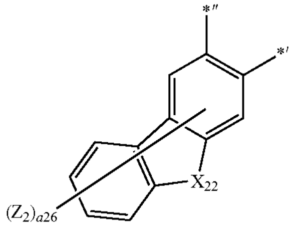
CY2-27
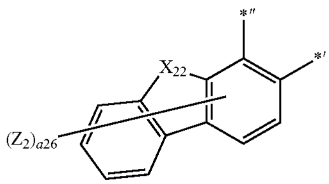
CY2-28
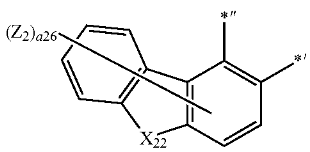
CY2-29
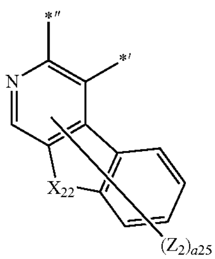
CY2-30
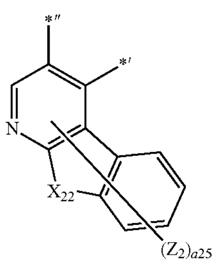
CY2-31
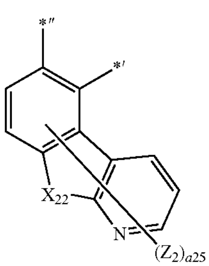
CY2-32
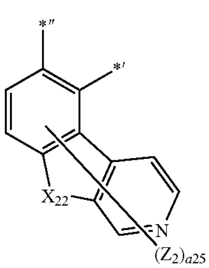
-continued
CY2-33
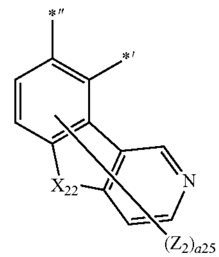
CY2-34
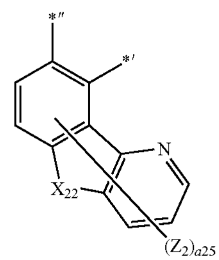
CY2-35
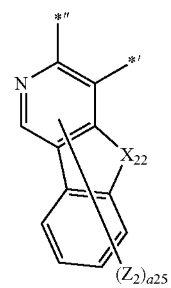
CY2-36
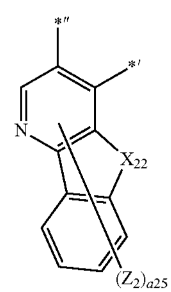
CY2-37
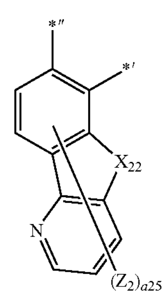

-continued
CY2-38
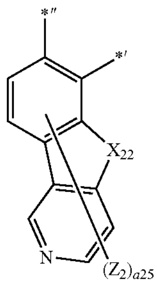
CY2-39
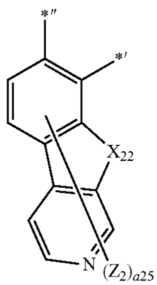
CY2-40
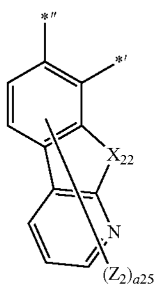
CY2-41
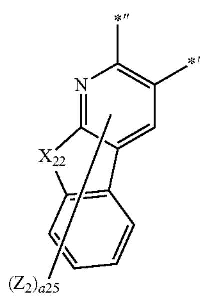
CY2-42
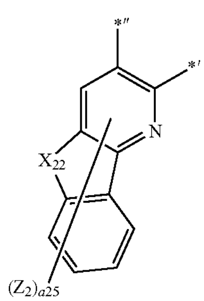
-continued
CY2-43
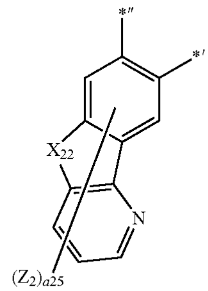
CY2-44
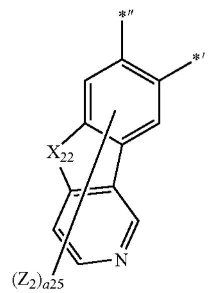
CY2-45
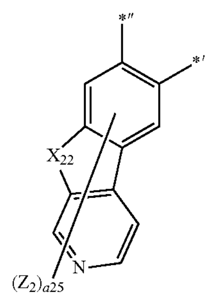
CY2-46
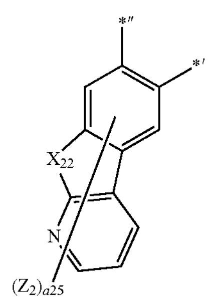
CY2-47
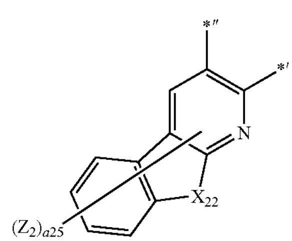

-continued
CY2-48
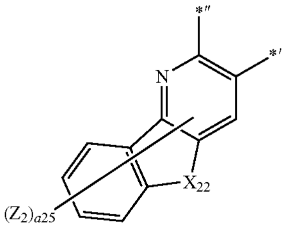
CY2-49
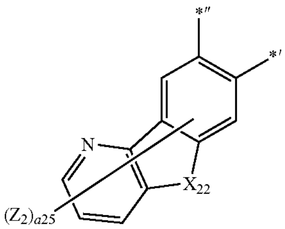
CY2-50
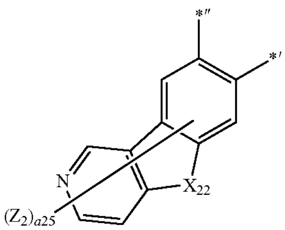
CY2-51
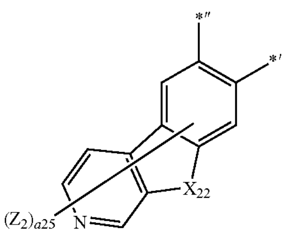
CY2-52
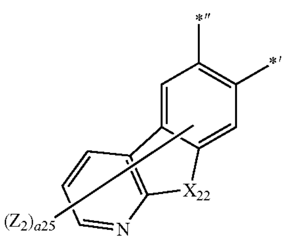
CY2-53
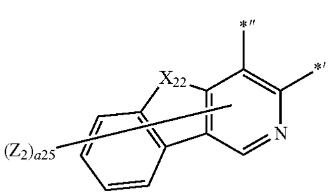
CY2-54
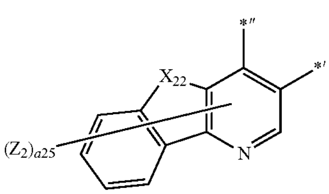
-continued
CY2-55
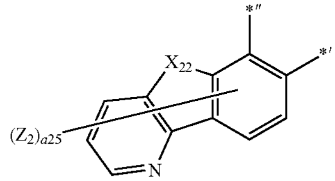
CY2-56
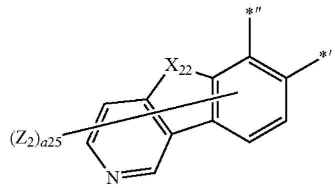
CY2-57
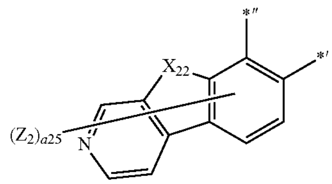
CY2-58
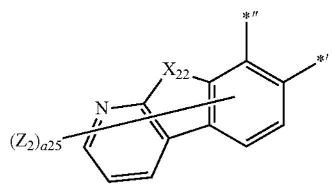
CY2-59
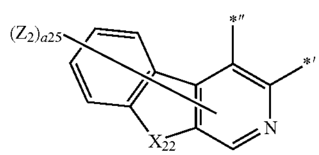
CY2-60
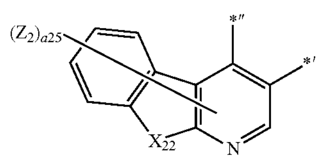
CY2-61
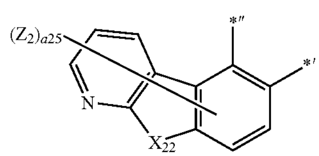
CY2-62
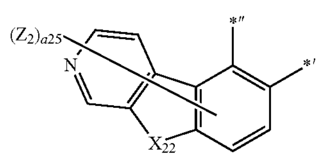
CY2-63
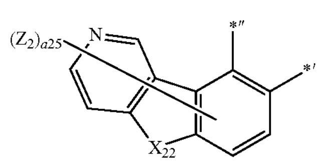

-continued

CY2-64

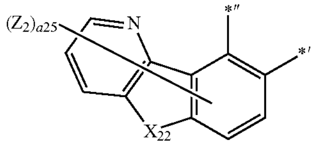

In Formulae CY2-1 to CY2-64, $Z_2$ may be the same as described above, $X_{22}$ may be $C(Z_{22})(Z_2)$, $N(Z_{22})$, O, S, or $Si(Z_{22})(Z_{23})$, $Z_{22}$ to $Z_{29}$ may each independently be the same as described in connection with $Z_2$, a28 may be an integer from 0 to 8, a26 may be an integer from 0 to 6, a25 may be an integer from 0 to 5, a24 may be an integer from 0 to 4, a23 may be an integer from 0 to 3, a22 may be an integer from 0 to 2,

*' indicates a binding site to a carbon atom of a neighboring pyridine ring in Formula 2A, and

* indicates a binding site to M in Formula 1.

In an embodiment, a group represented by

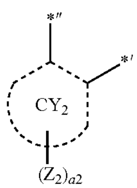

in Formula 2A may be a group represented by one selected from Formulae CY2(1) to CY2(16):

CY2(1)

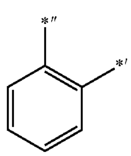

CY2(2)

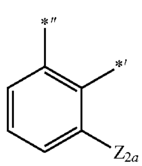

CY2(3)

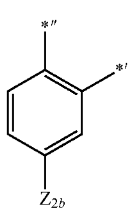

CY2(4)

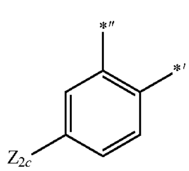

-continued

CY2(5)

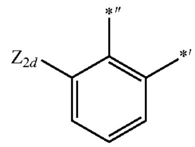

CY2(6)

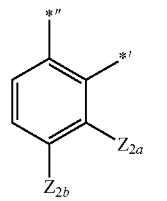

CY2(7)

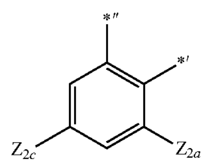

CY2(8)

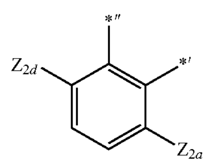

CY2(9)

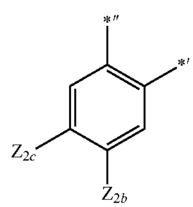

CY2(10)

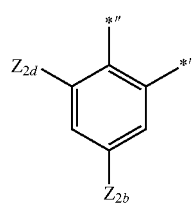

CY2(11)

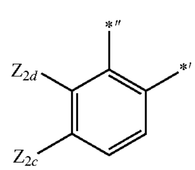

CY2(12)

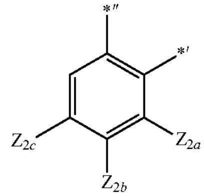

-continued

CY2(13)

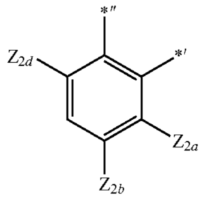

CY2(14)

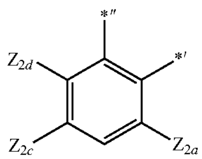

CY2(15)

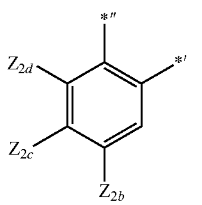

CY2(16)

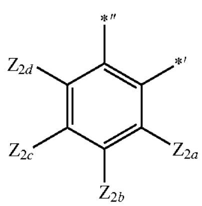

In Formulae CY2(1) to CY2(16), $Z_{2a}$ to $Z_{2d}$ may each independently be the same as described in connection with $Z_2$, wherein $Z_2$ to $Z_{2d}$ may not be hydrogen,

*' indicates a binding site to a carbon atom of a neighboring pyridine ring in Formula 2A, and

*' indicates a binding site to M in Formula 1.

In an embodiment, a group represented by

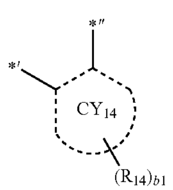

in Formula 2B may be a group represented by one selected from Formulae CY14-1 to CY14-64:

CY14-1

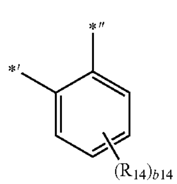

-continued

CY14-2

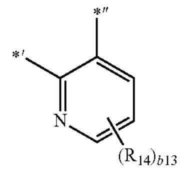

CY14-3

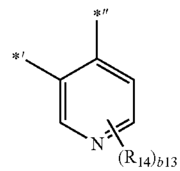

CY14-4

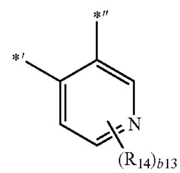

CY14-5

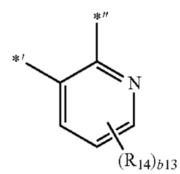

CY14-6

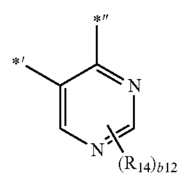

CY14-7

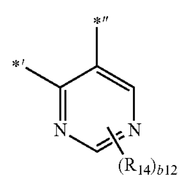

CY14-8

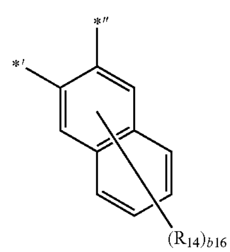

CY14-9

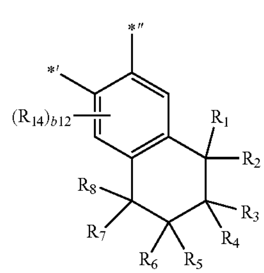

-continued
CY14-10
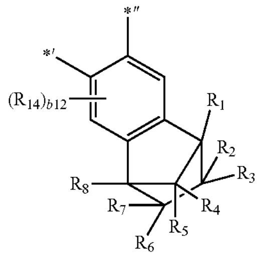
CY14-11
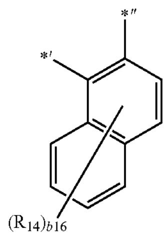
CY14-12
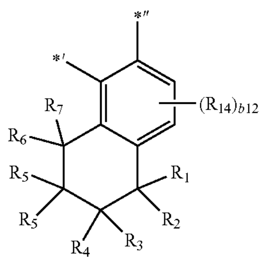
CY14-13
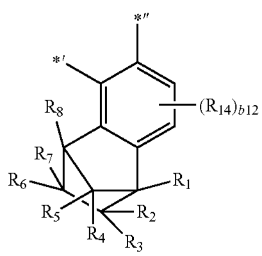
CY14-14
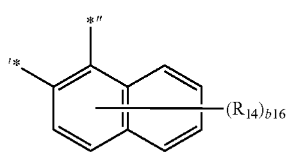
CY14-15
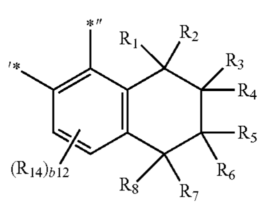
CY14-16
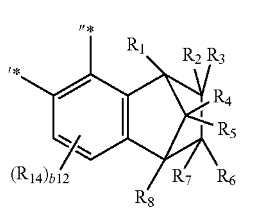
-continued
CY14-17
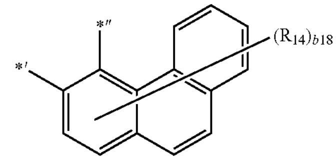
CY14-18
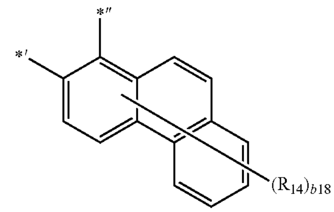
CY14-19
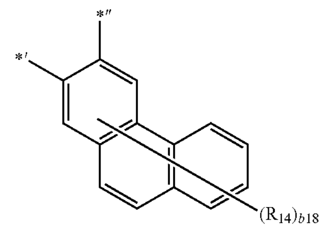
CY14-20
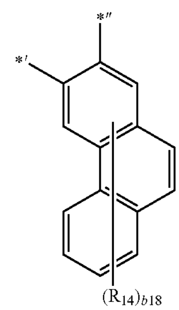
CY14-21
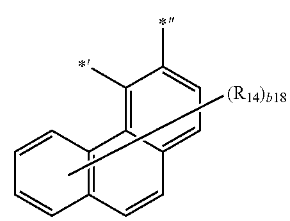
CY14-22
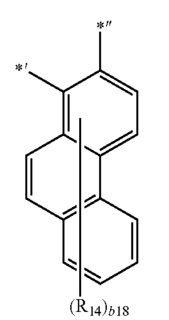

-continued
CY14-23
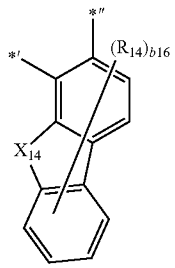
CY14-24
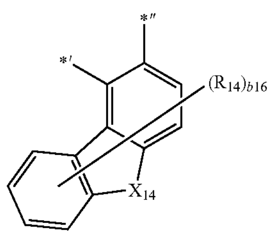
CY14-25
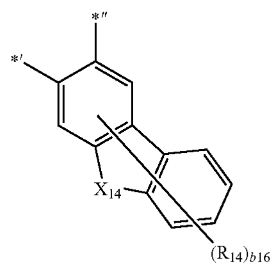
CY14-26
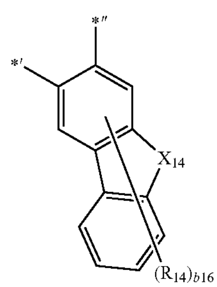
CY14-27
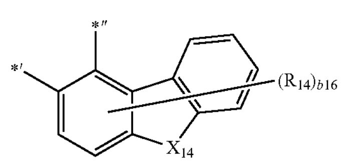
CY14-28
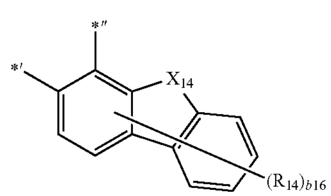
-continued
CY14-29
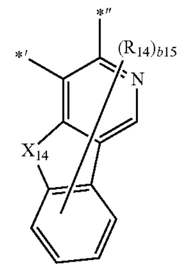
CY14-30
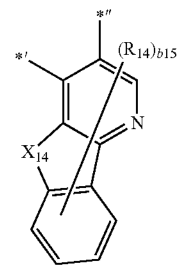
CY14-31
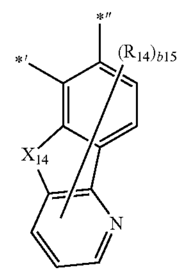
CY14-32
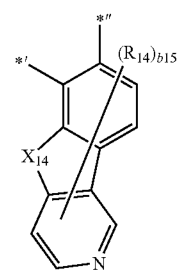
CY14-33
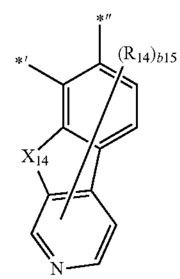
CY14-34
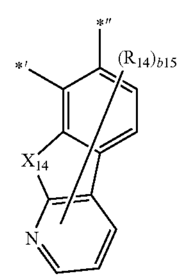

-continued
CY14-35
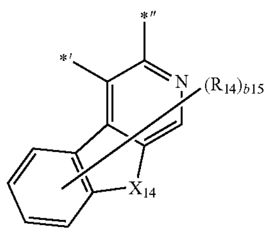
CY14-36
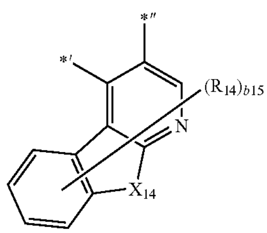
CY14-37
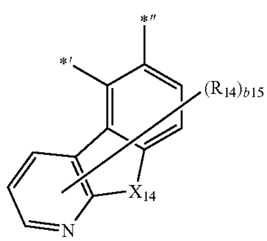
CY14-38
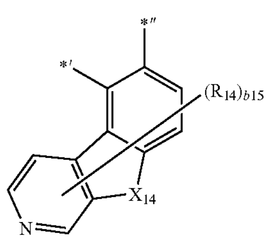
CY14-39
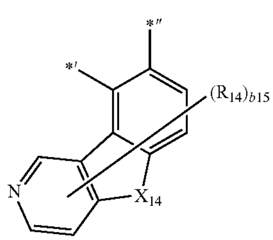
CY14-40
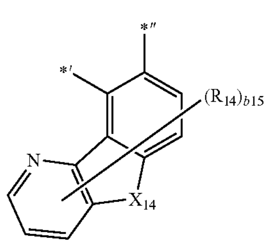
-continued
CY14-41
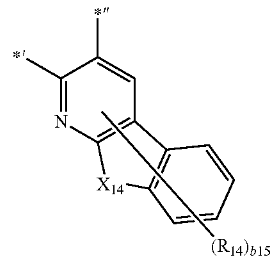
CY14-42
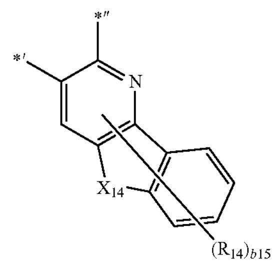
CY14-43
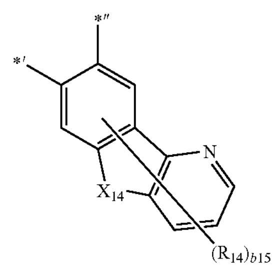
CY14-44
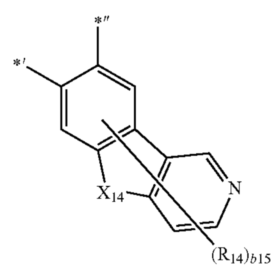
CY14-45
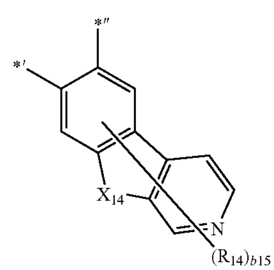
CY14-46
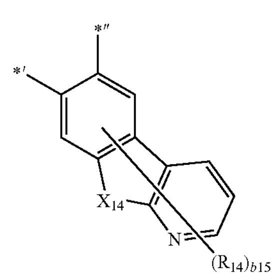

-continued
CY14-47
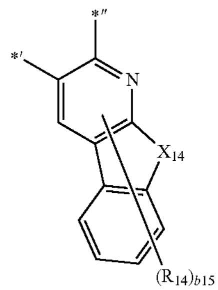
CY14-48
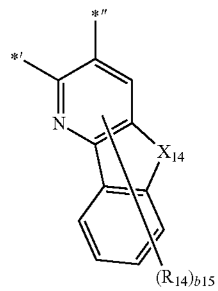
CY14-49
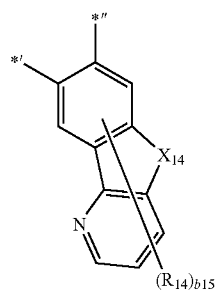
CY14-50
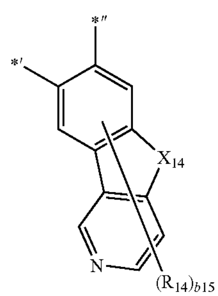
CY14-51
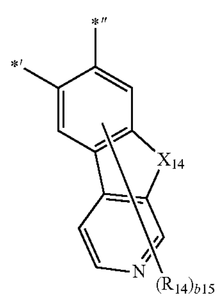
-continued
CY14-52
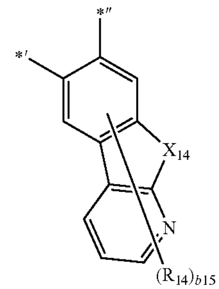
CY14-53
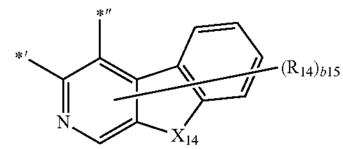
CY14-54
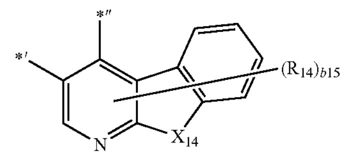
CY14-55
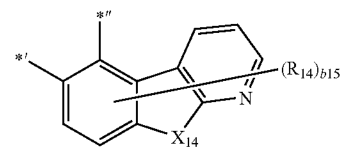
CY14-56
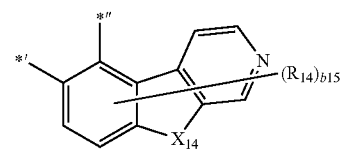
CY14-57
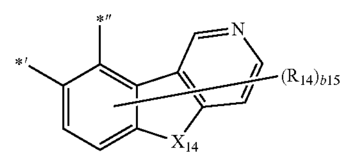
CY14-58
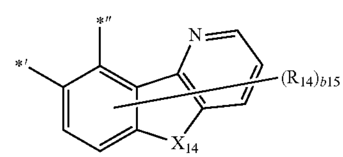
CY14-59
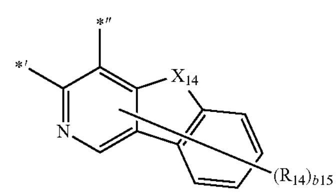
CY14-60
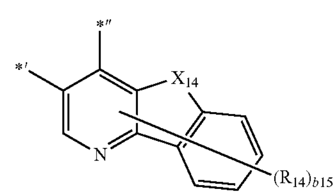

-continued

CY14-61

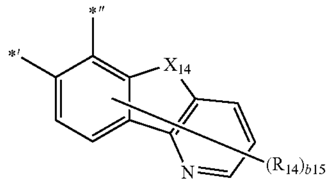

CY14-62

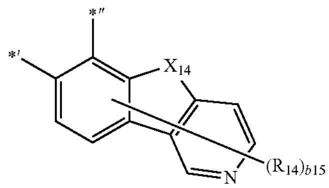

CY14-63

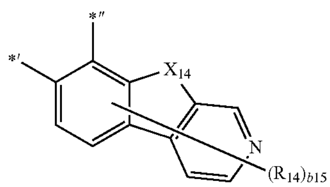

CY14-64

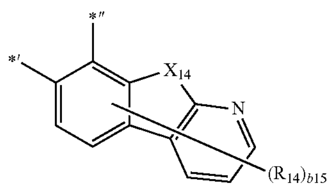

In Formulae CY14-1 to CY14-64, $R_{14}$ may be the same as described above, $X_{14}$ may be $C(R_1)(R_2)$, $N(R_1)$, O, S, or $Si(R_1)(R_2)$, $R_1$ to $R_8$ may each independently be the same as described in connection with $R_{14}$, b18 may be an integer from 0 to 8, b16 may be an integer from 0 to 6, b15 may be an integer from 0 to 5, b14 may be an integer from 0 to 4, b13 may be an integer from 0 to 3, b12 may be an integer from 0 to 2,

*' indicates a binding site to a carbon atom of a neighboring pyridine ring in Formula 2B, and

* indicates a binding site to M in Formula 1.

In an embodiment, a group represented by

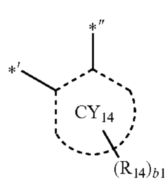

in Formula 2B may be a group represented by one selected from Formulae CY14(1) to CY14(16):

CY14(1)

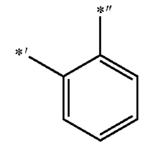

CY14(2)

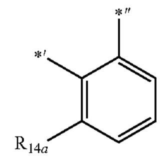

CY14(3)

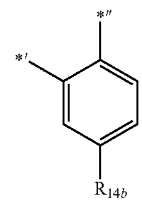

CY14(4)

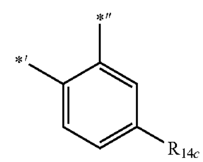

CY14(5)

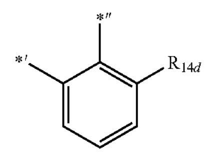

CY14(6)

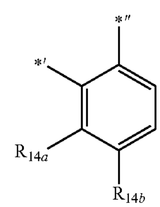

CY14(7)

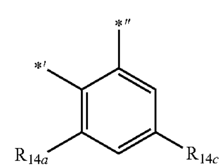

CY14(8)

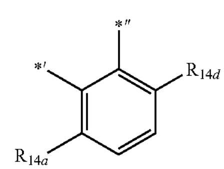

CY14(9)

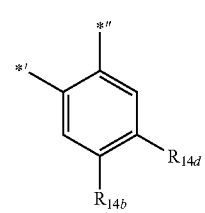

-continued

CY14(10)

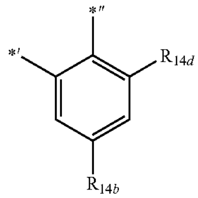

CY14(11)

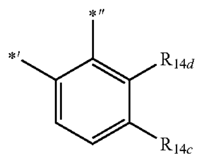

CY14(12)

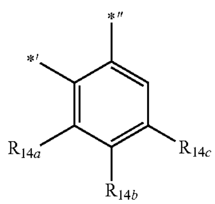

CY14(13)

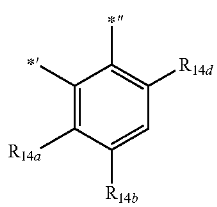

-continued

CY14(14)

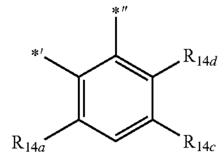

CY14(15)

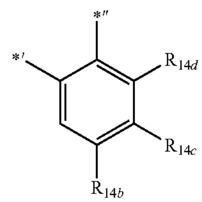

CY14(16)

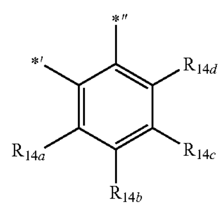

In Formulae CY14(1) to CY14(16), $R_{14a}$ to $R_{14d}$ may each independently be the same as described in connection with $R_{14}$, wherein $R_{14a}$ to $R_{14d}$ may not be hydrogen,

*" indicates a binding site to a carbon atom of a neighboring pyridine ring in Formula 2B, and

*' indicates a binding site to M in Formula 1.

In an embodiment, the organometallic compound may be represented by Formula 1A:

Formula 1A

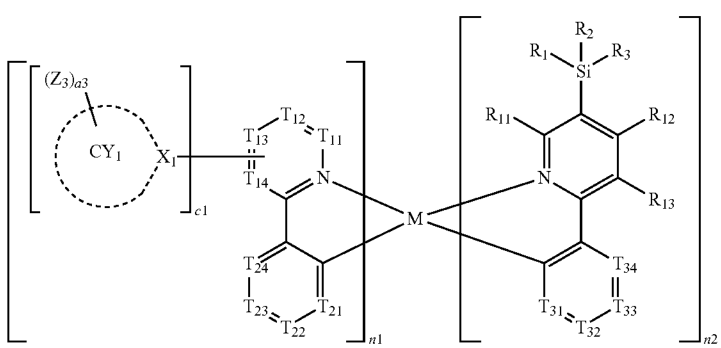

In Formula 1A,

M, n1, n2, $X_1$, ring $CY_1$, $R_1$ to $R_3$, $Z_3$, $R_{11}$ to $R_{13}$, and c1 may each independently be the same as described herein, $T_{11}$ may be N, $C(Z_{1a})$, or carbon linked to ring $CY_1$, $T_{12}$ may be N, $C(Z_{1b})$, or carbon linked to ring $CY_1$, $T_{13}$ may be N, $C(Z_{1c})$, or carbon linked to ring $CY_1$, $T_{14}$ may be N, $C(Z_{1d})$, or carbon linked to ring $CY_1$, at least one selected from $T_{11}$ to $T_{14}$ may be carbon linked to ring $CY_1$, and $Z_{1a}$ to $Z_{1d}$ may each independently be the same as described in connection with $Z_1$, $T_{21}$ may be N or $C(Z_{2a})$, $T_{22}$ may be N or $C(Z_{2b})$, $T_{23}$ may be N or $C(Z_{2c})$, $T_{24}$ may be N or $C(Z_{2d})$, and $Z_{2a}$ to $Z_{2d}$ may each independently be the same as described in connection with $Z_2$, $T_{31}$ may be N or $C(R_{14a})$, $T_{32}$ may be N or $C(R_{14b})$, $T_{33}$ may be N or $C(R_{14c})$, $T_{34}$ may be N or $C(R_{14d})$, and $R_{14a}$ to $R_{14d}$ may each independently be the same as described in connection with $R_{14}$, two or more groups $Z_{1a}$ to $Z_{1d}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more groups $Z_{2a}$ to $Z_{2d}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more groups $Z_3$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{12}$ and $R_{13}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more groups $R_{14a}$ to $R_{14d}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more groups $Z_{1a}$ to $Z_{1d}$, $Z_{2a}$ to $Z_{2d}$, $R_{11}$ to $R_{13}$, and $R_{14a}$ to $R_{14d}$ may optionally be linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, and $R_{10a}$ may be the same as described above.

In an embodiment, the organometallic compound represented by Formula 1 may satisfy at least one selected from Condition 1 to Condition 5:

$Z_1$ in Formula 2A is not —$Si(Q_3)(Q_4)(Q_5)$ Condition 1

$Z_2$ in Formula 2A is not —$Si(Q_3)(Q_4)(Q_5)$ Condition 2

$Z_3$ in Formula 2A is not —$Si(Q_3)(Q_4)(Q_5)$ Condition 3

None of $R_{11}$ to $R_{13}$ in Formula 2B is $Si(Q_3)(Q_4)(Q_5)$ Condition 4

$R_{14}$ in Formula 2B is not —$Si(Q_3)(Q_4)(Q_5)$. Condition 5

In an embodiment, the number of silicon (Si) atoms in the organometallic compound represented by Formula 1 may be 1, 2, or 3.

In an embodiment, the number of silicon (Si) atoms in the organometallic compound represented by Formula 1 may be 1 or 2.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein each refer to a heterocyclic group having the same structural backbone as that of each of "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group", respectively, wherein at least one of ring-forming carbons of the rings above is substituted with nitrogen.

For example, the organometallic compound may be one selected from Compounds 1 to 420, but embodiments of the present disclosure are not limited thereto:

1

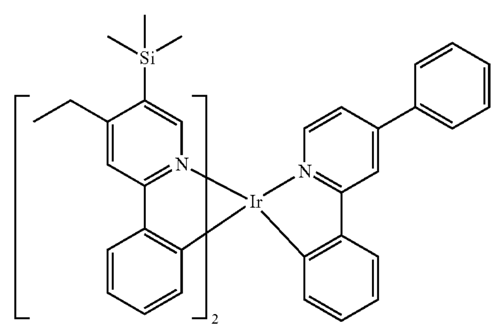

2

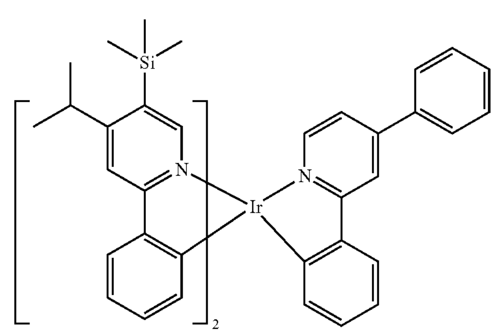

3
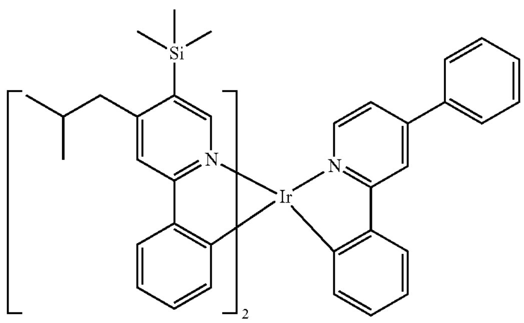
4
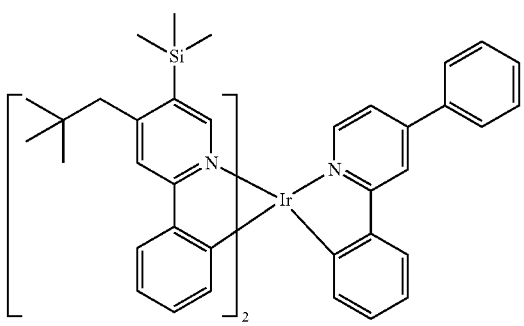
5
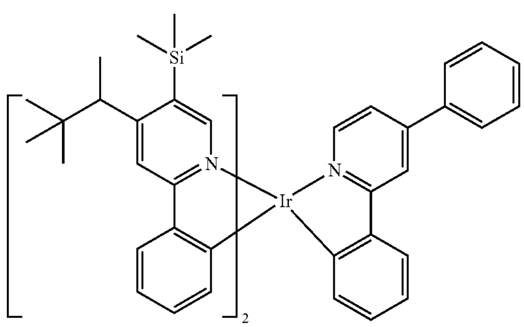
6
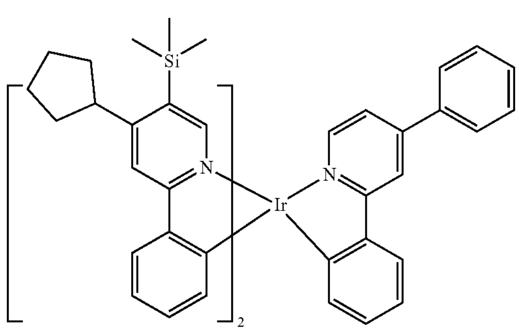
7
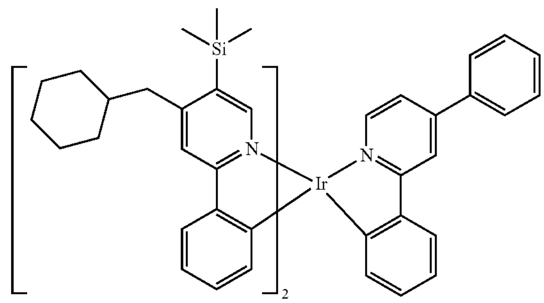
8
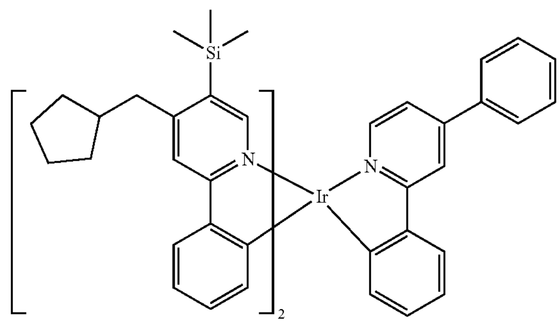
9
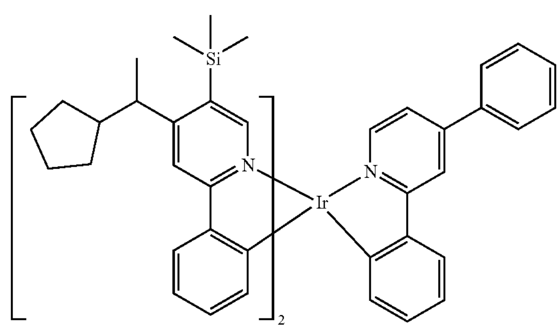
10
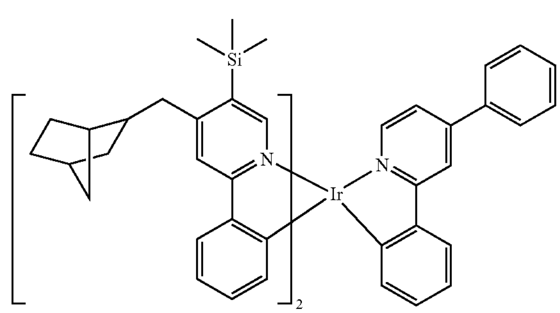

-continued
11
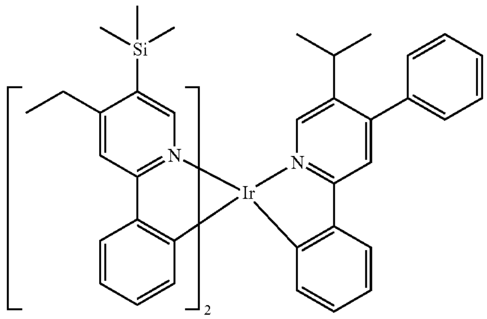
12
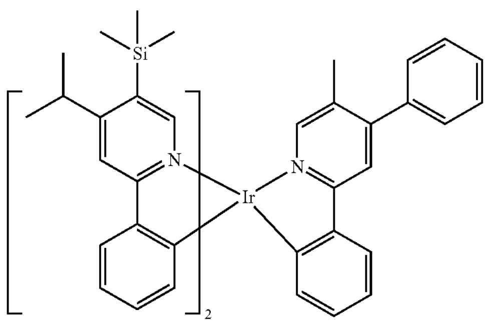
13
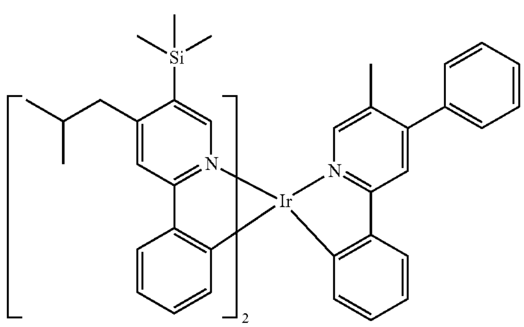
14
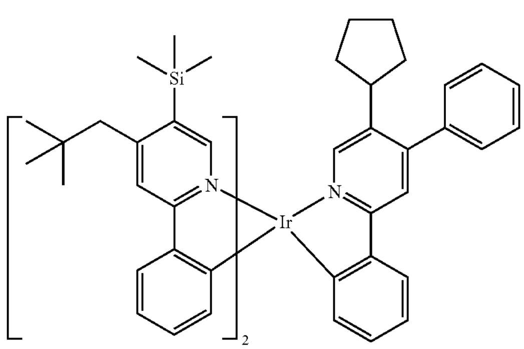
-continued
15
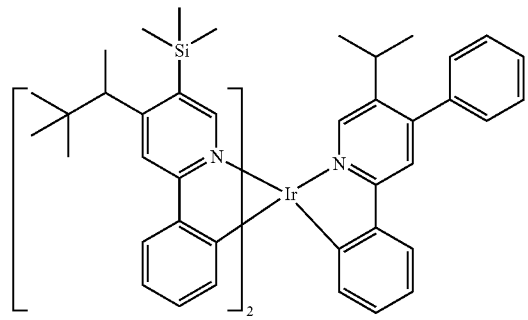
16
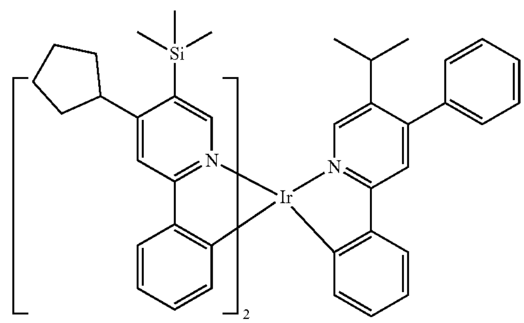
17
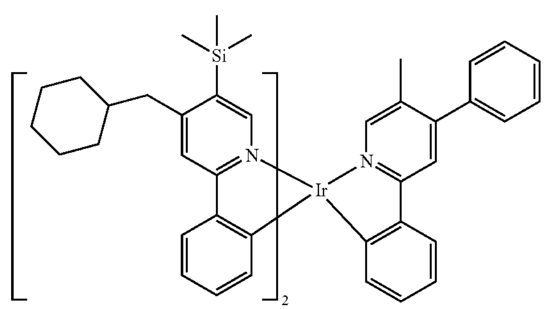
18
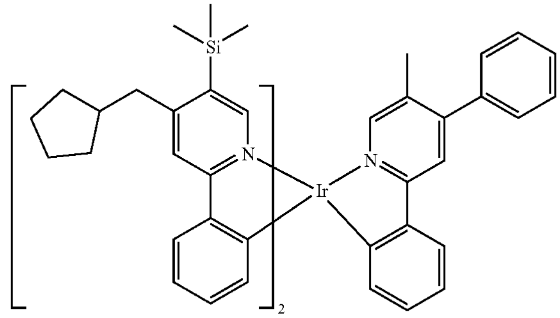

-continued
19
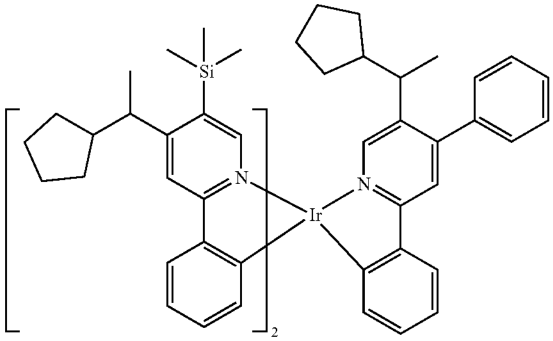
20
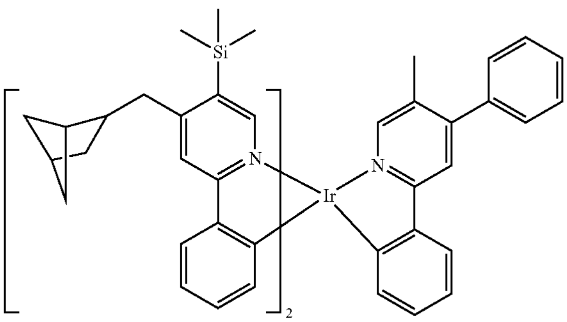
21
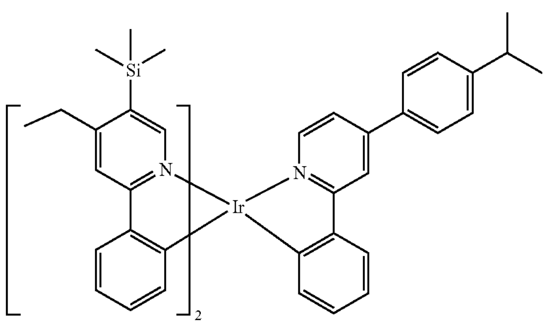
22
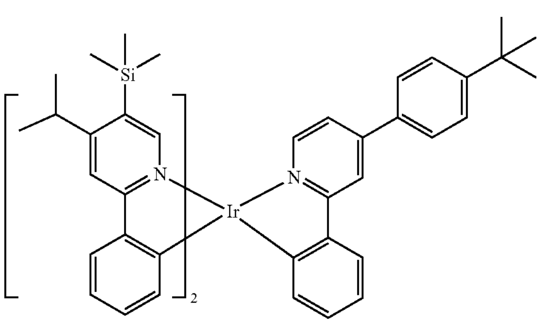
-continued
23
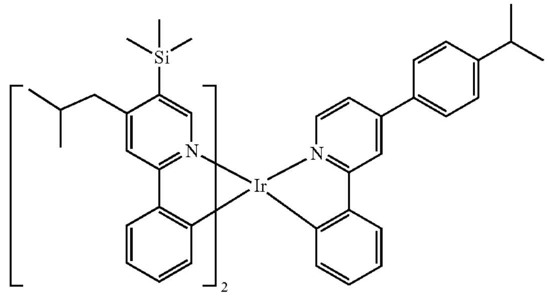
24
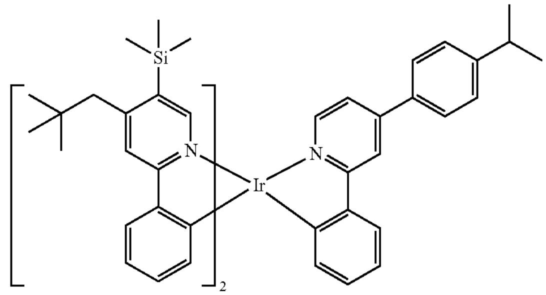
25
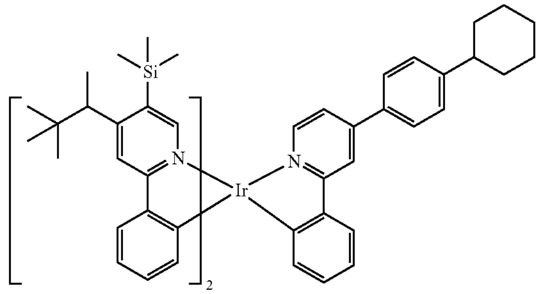
26
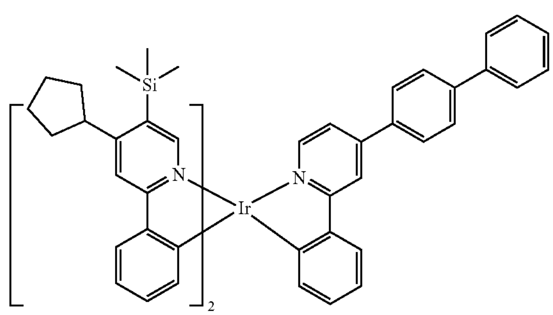
27
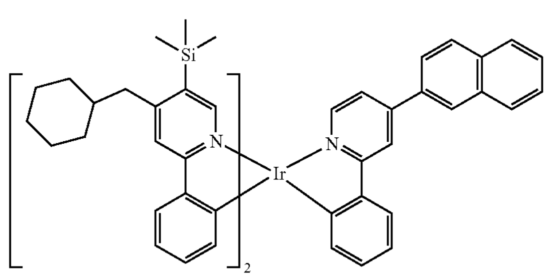

28
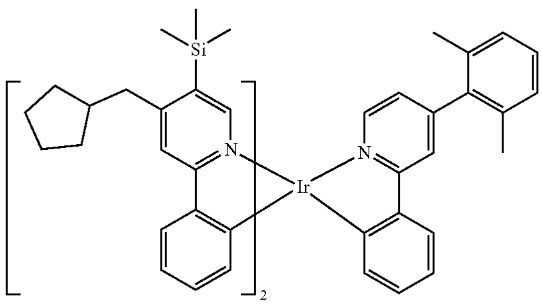
29
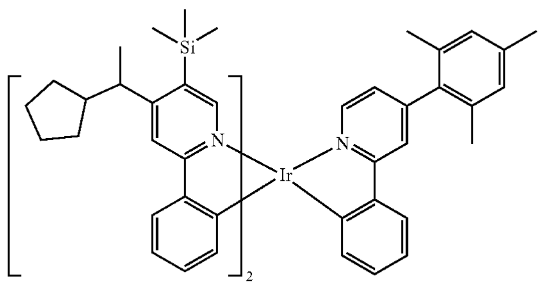
30
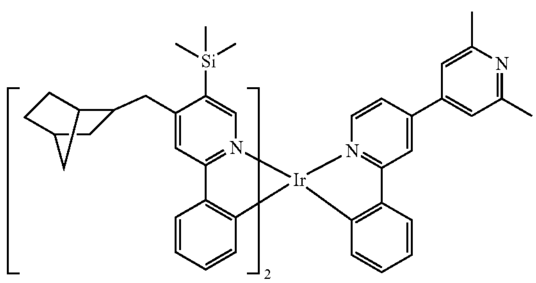
31
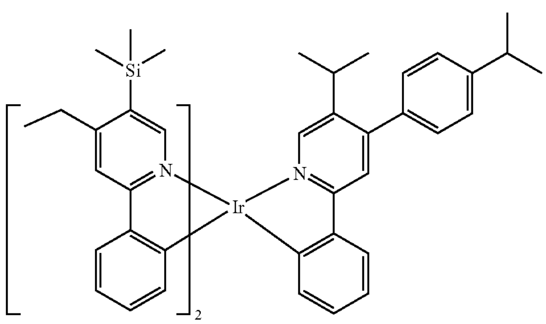
32
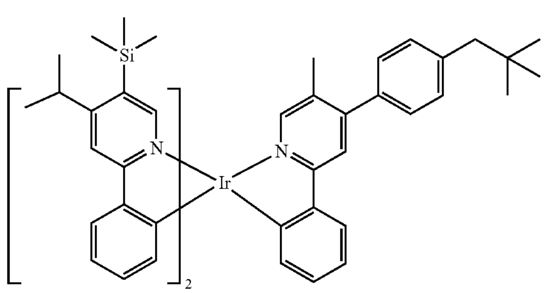
33
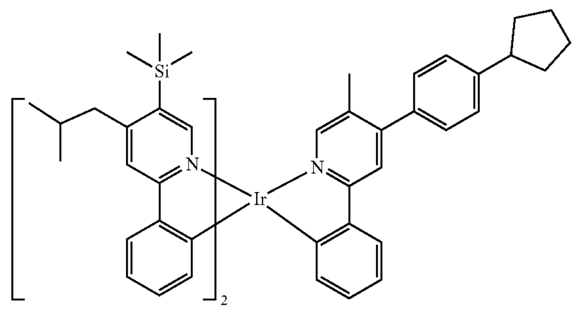
34
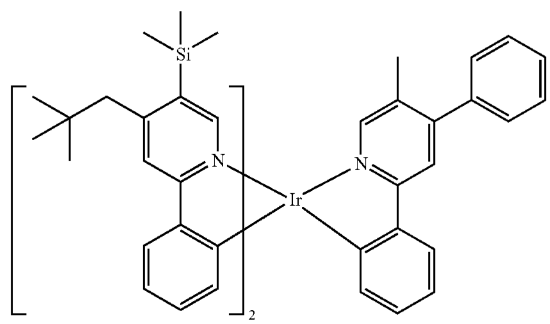
35
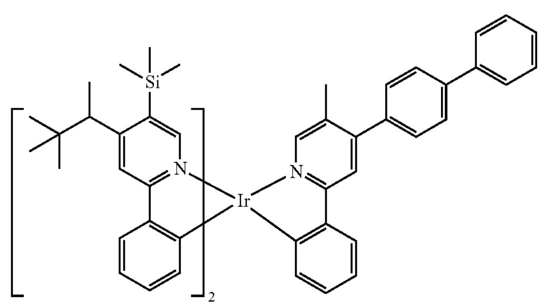
36
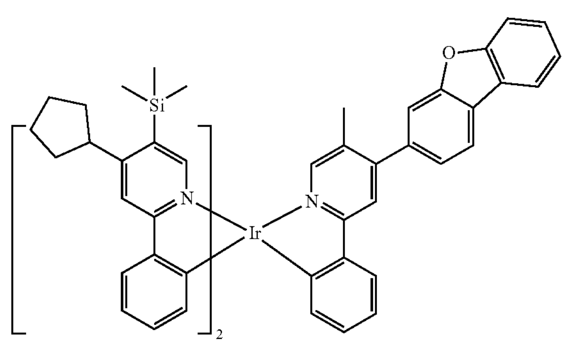

-continued
37
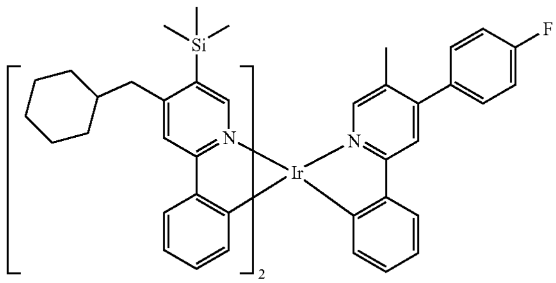
38
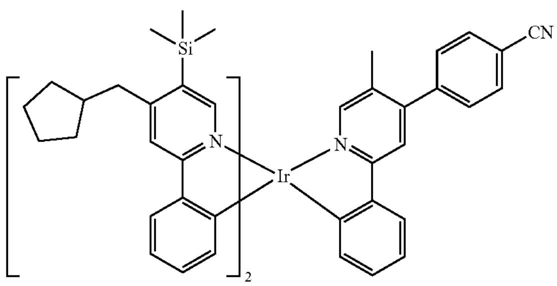
39
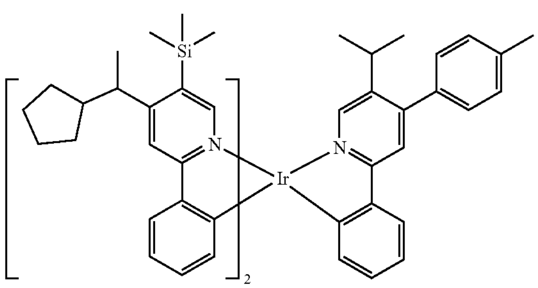
40
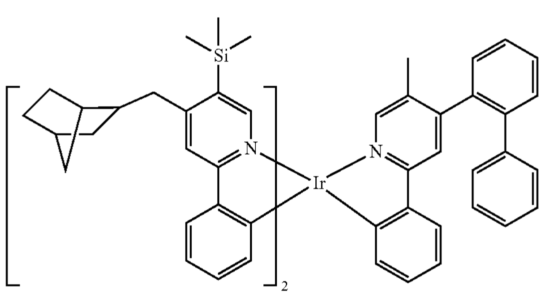
41
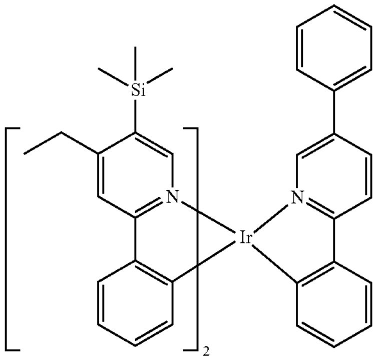
-continued
42
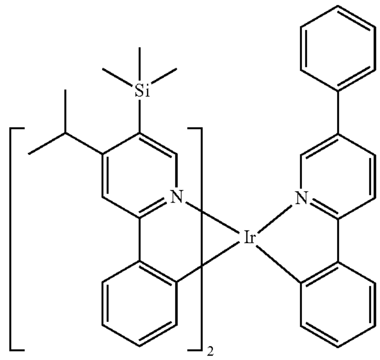
43
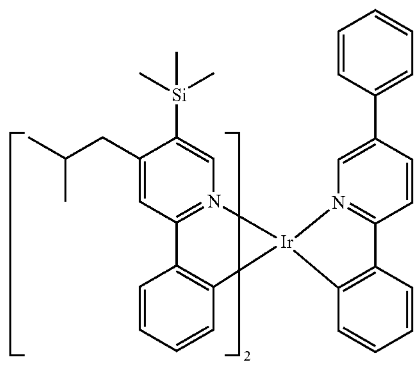
44
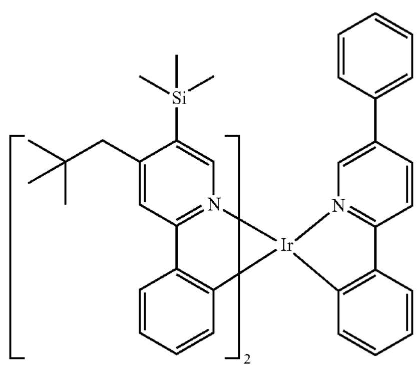
45
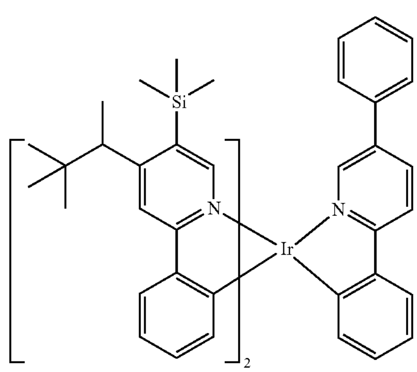

-continued
46
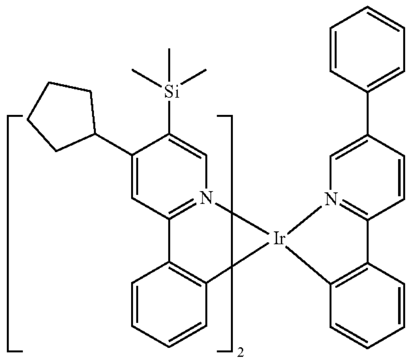
47
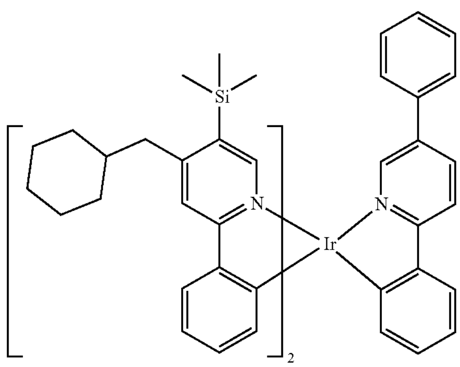
48
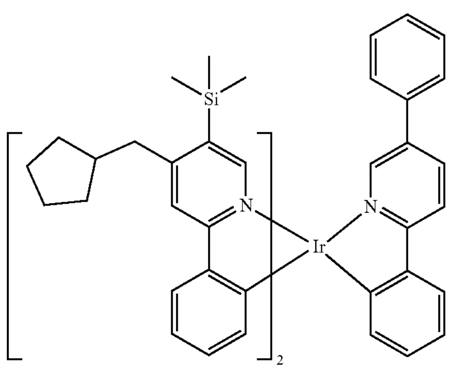
49
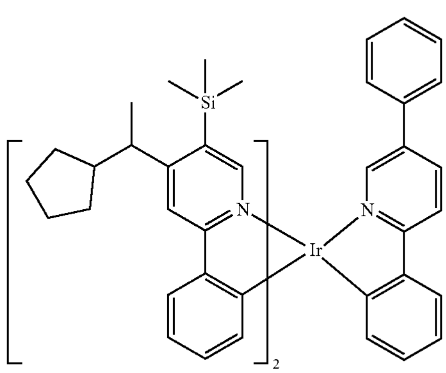
-continued
50
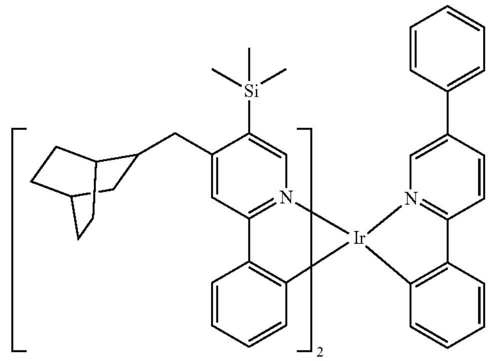
51
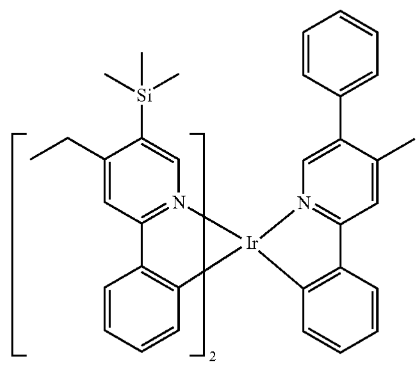
52
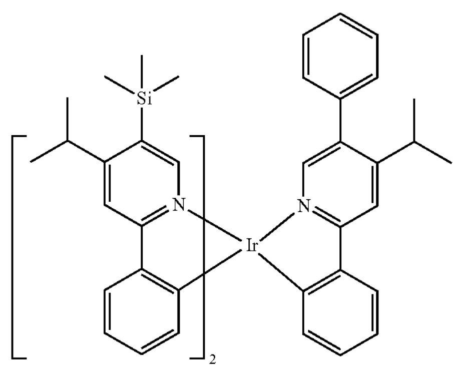
53
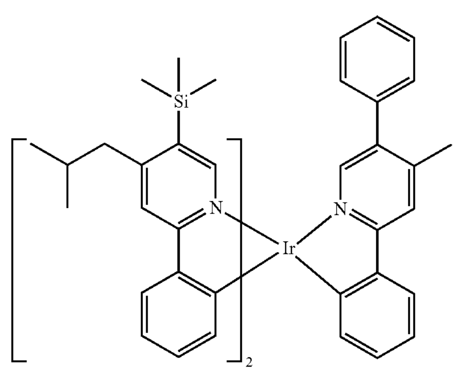

-continued
54
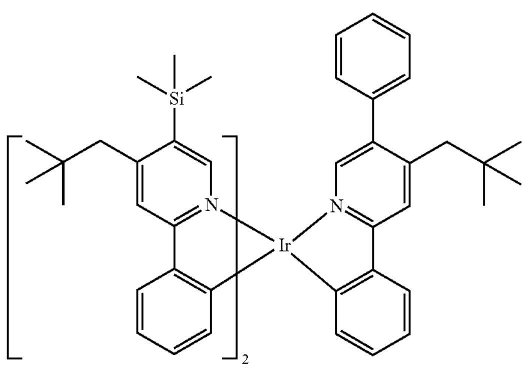
58
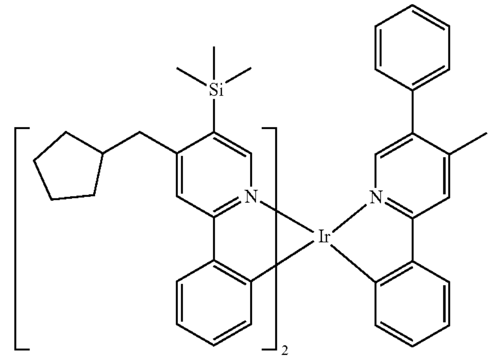
55
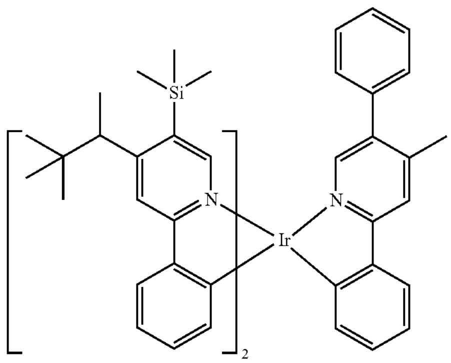
59
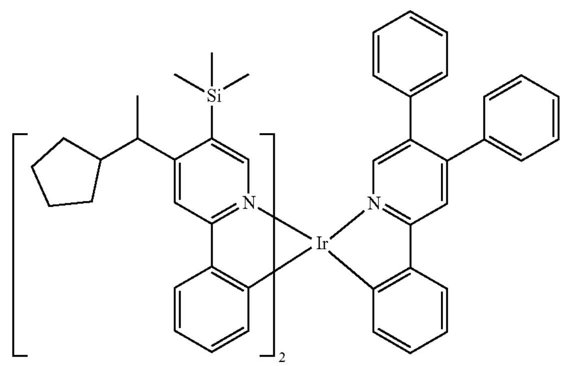
56
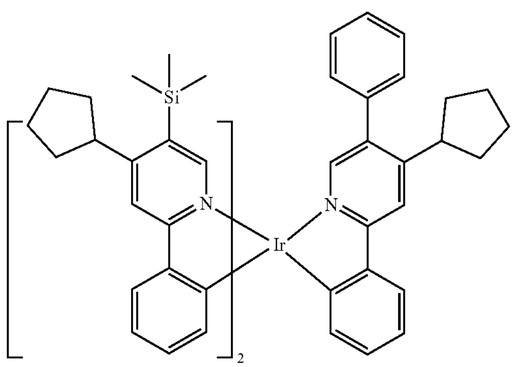
60
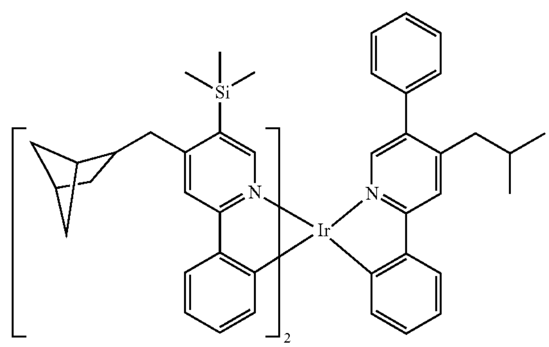
57
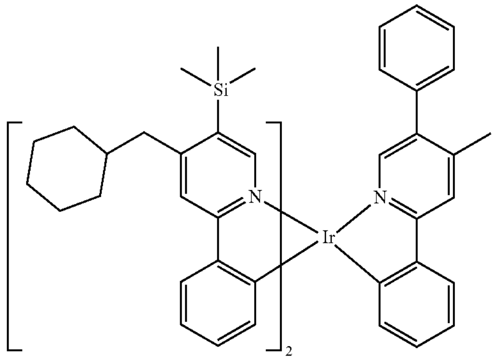
61
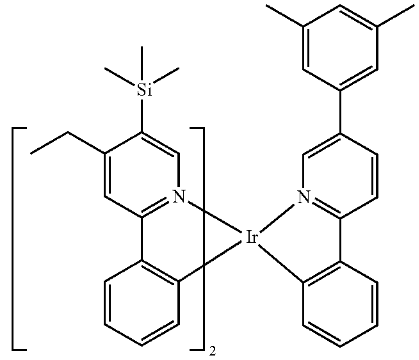

62
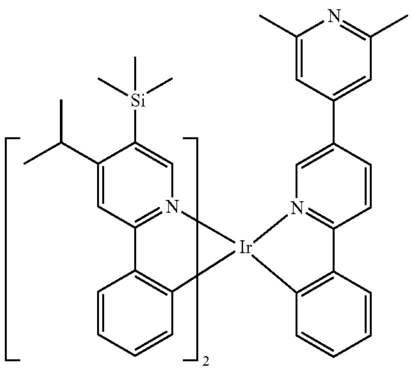
63
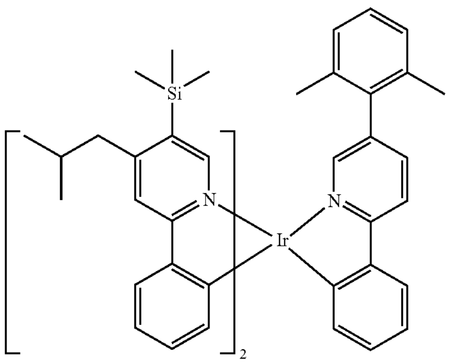
64
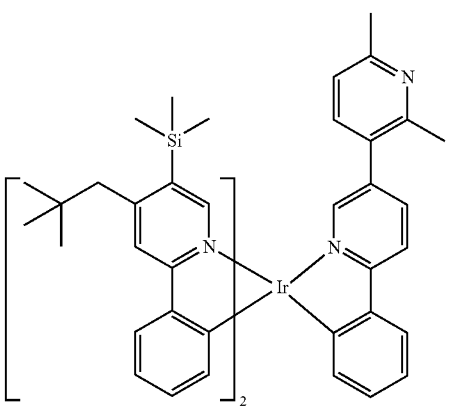
65
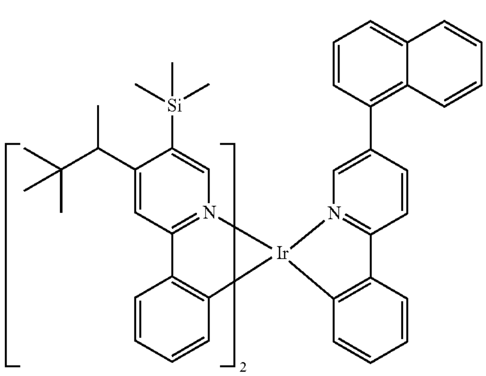
66
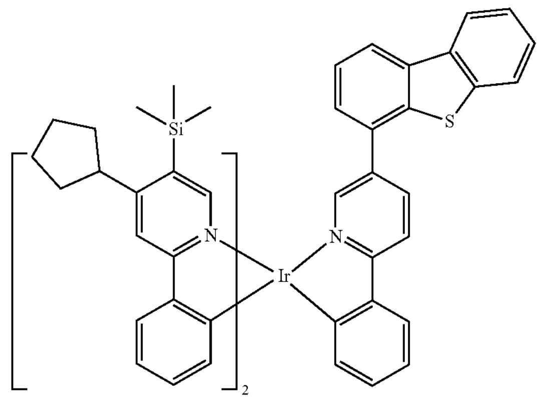
67
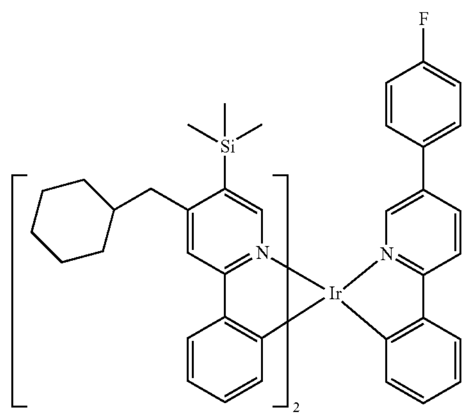
68
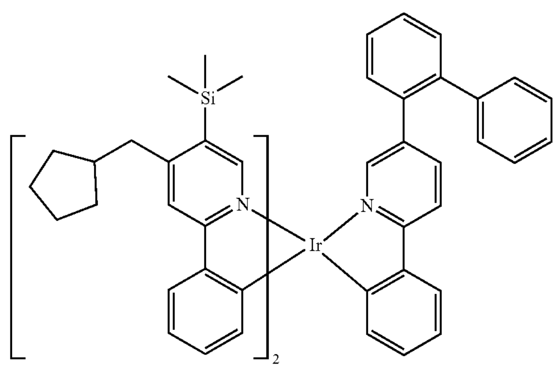
69
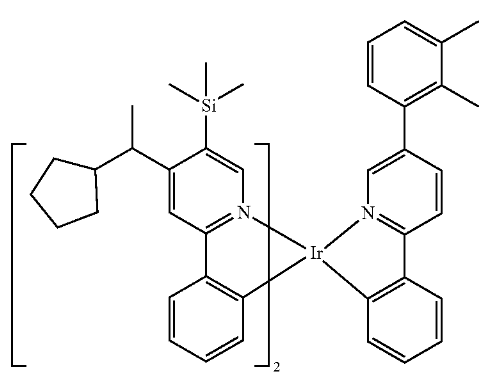

-continued
70
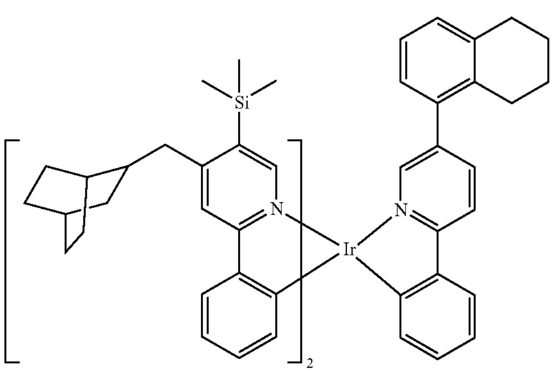
71
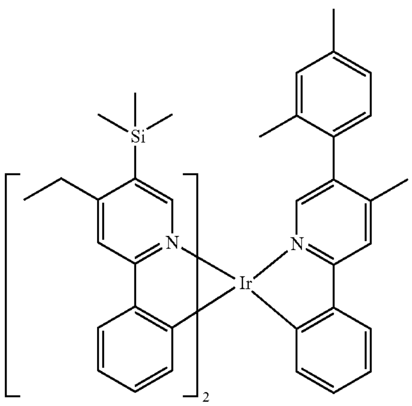
72
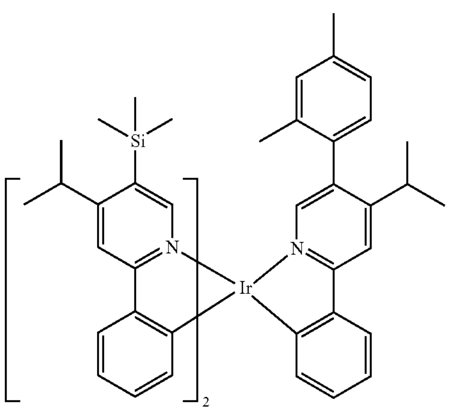
73
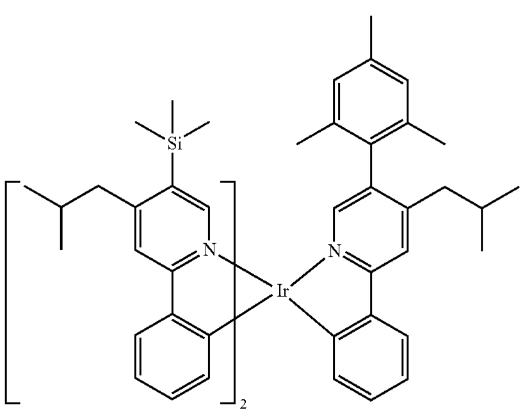
-continued
74
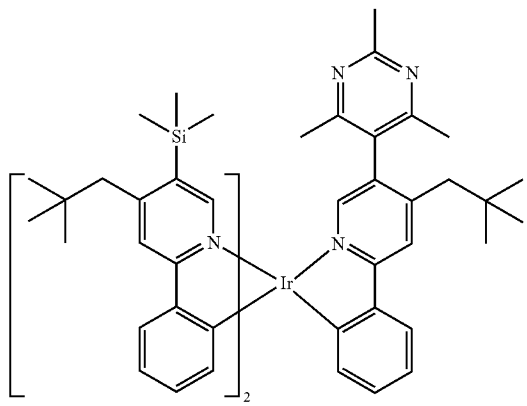
75
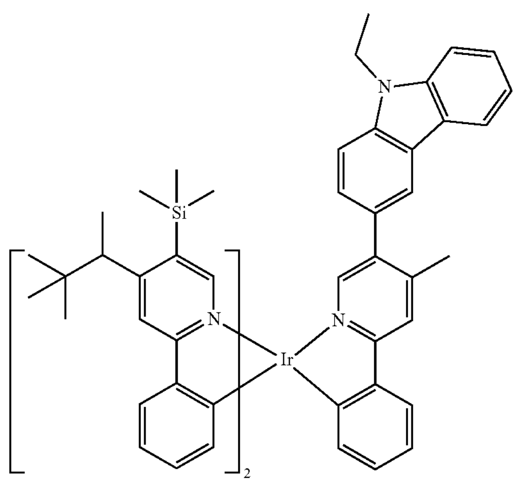
76
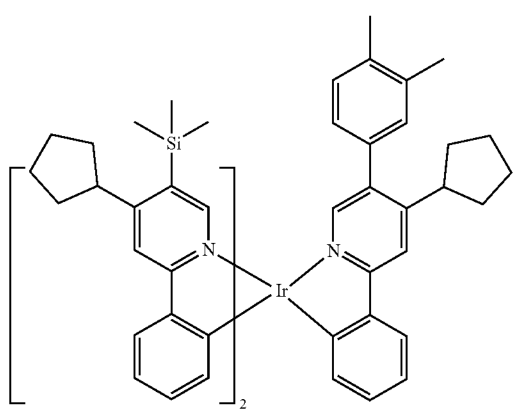

77
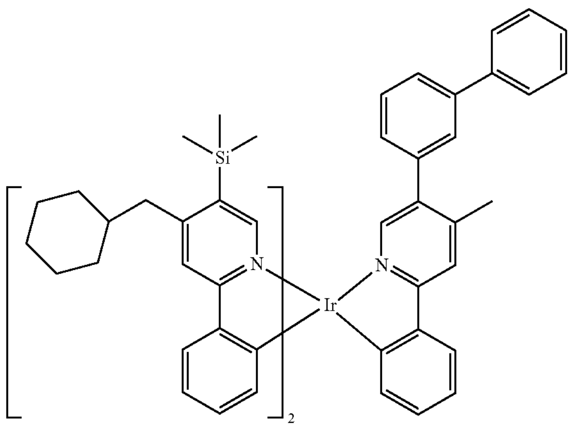
78
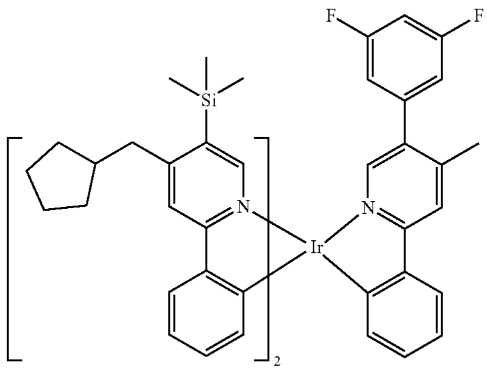
79
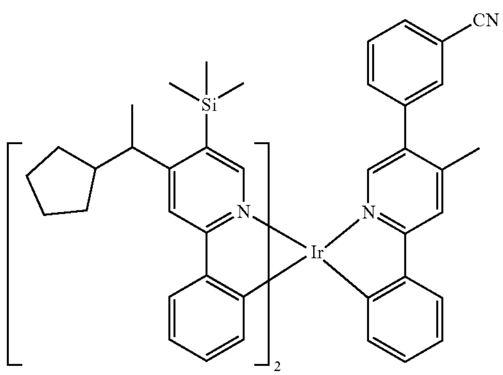
80
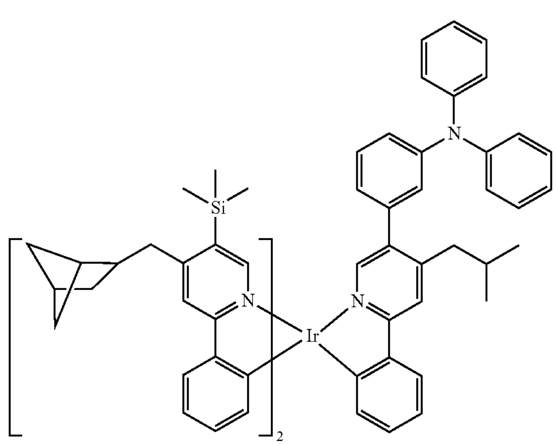
81
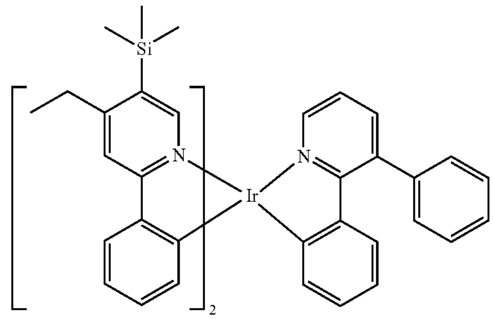
82
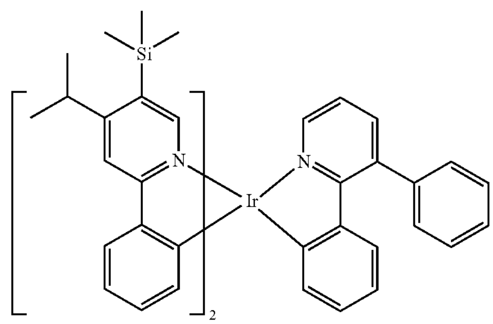
83
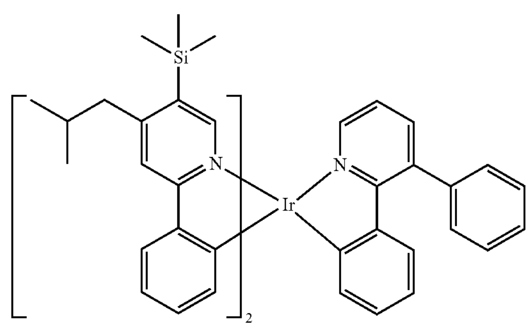
84
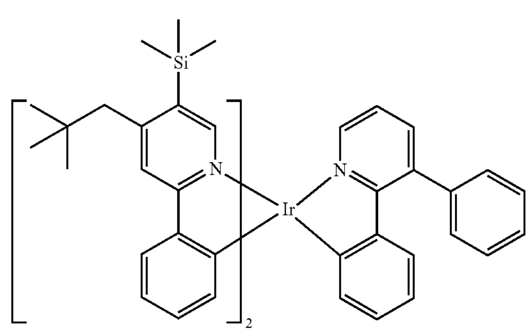

-continued
85
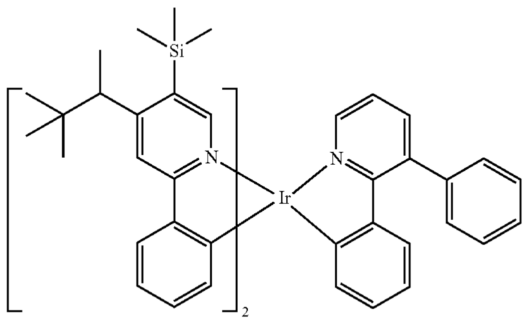
86
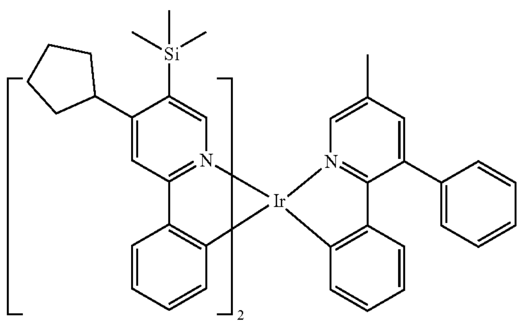
87
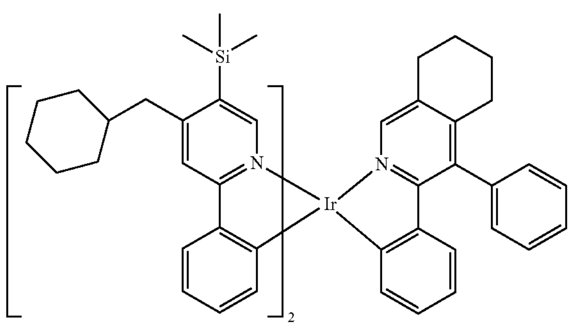
88
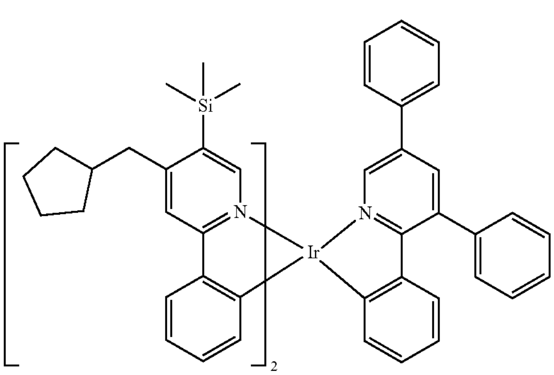
-continued
89
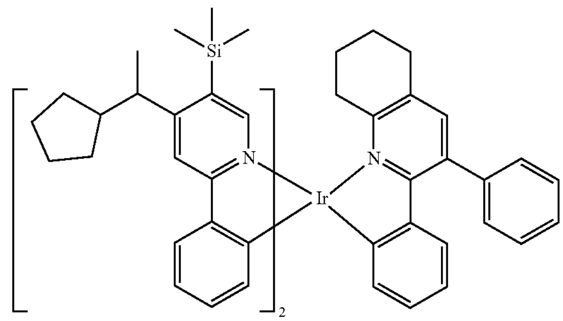
90
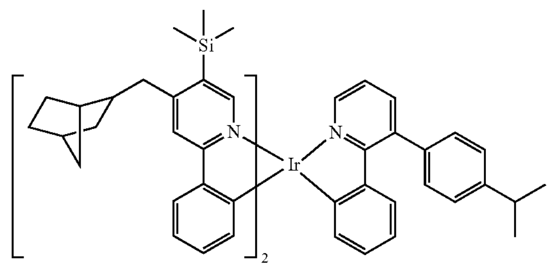
91
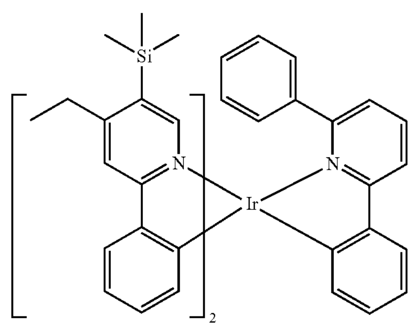
92
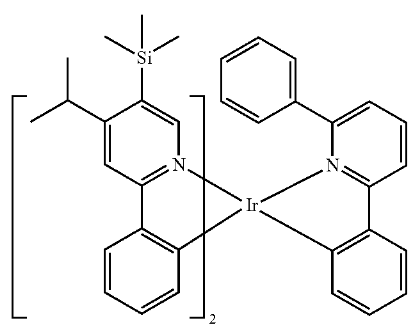
93
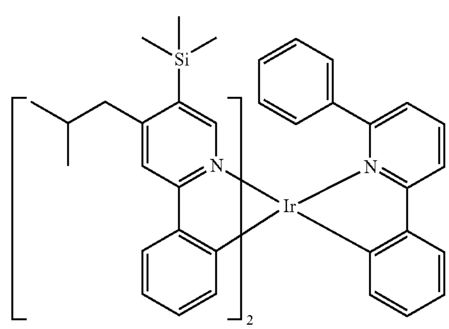

-continued
94
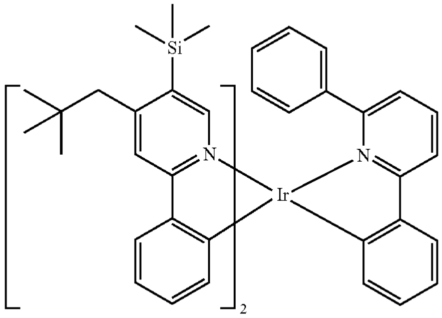
95
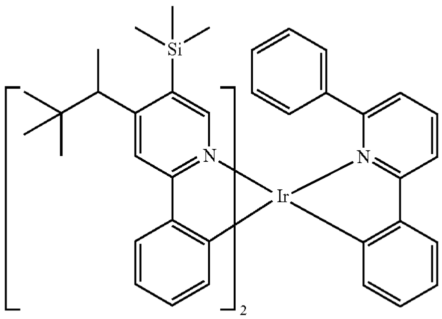
96
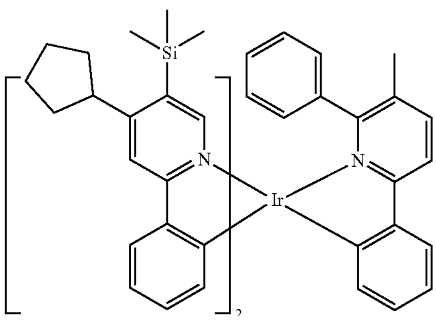
97
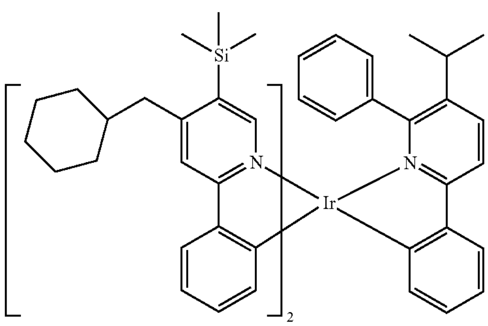
98
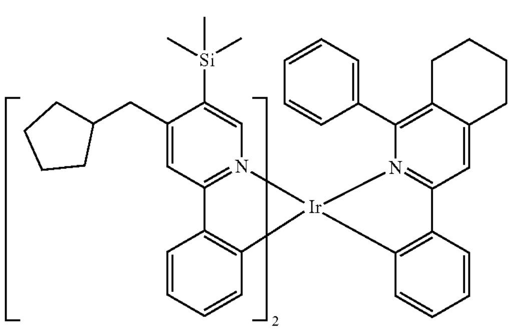
-continued
99
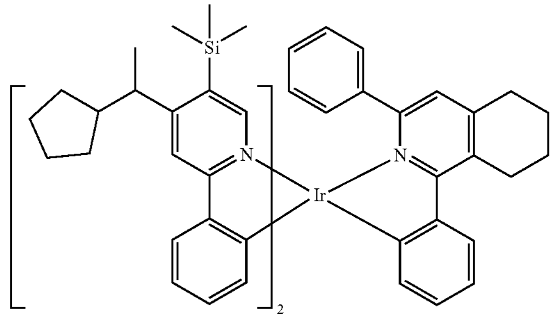
100
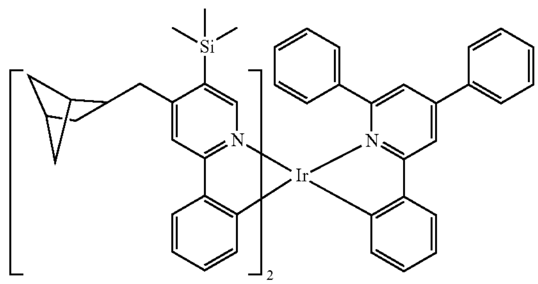
101
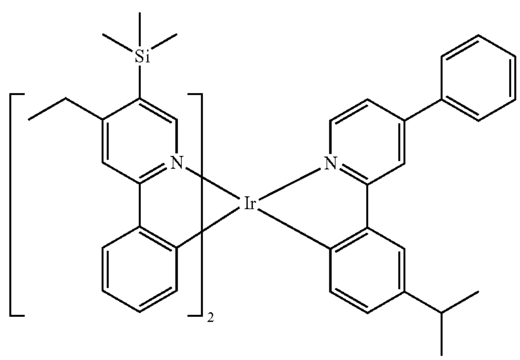
102
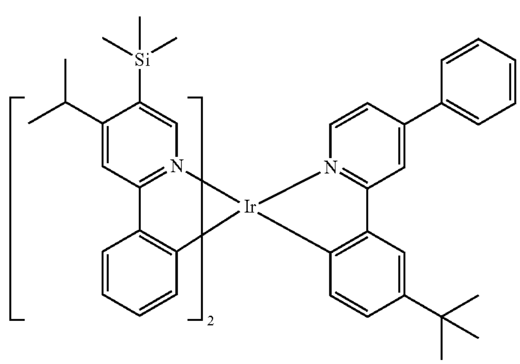

-continued
103
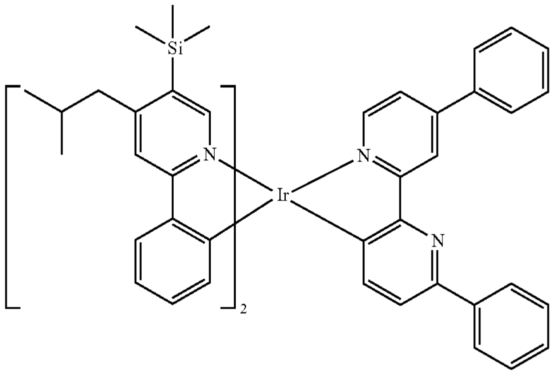
104
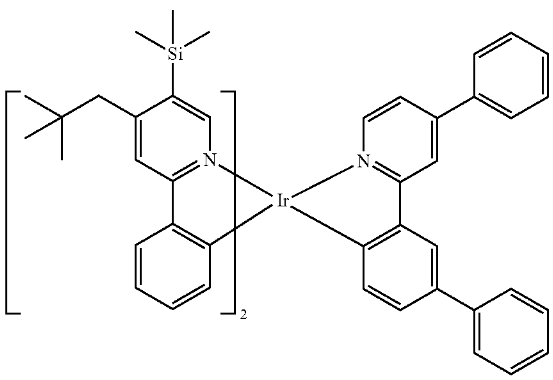
105
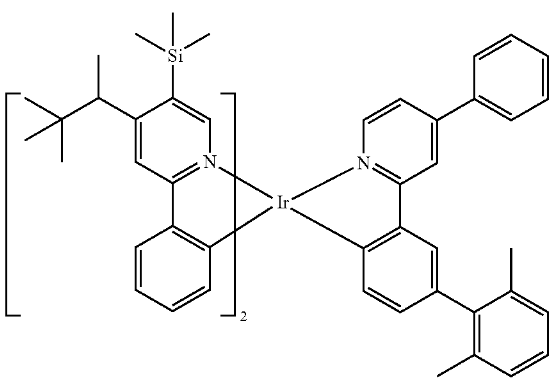
106
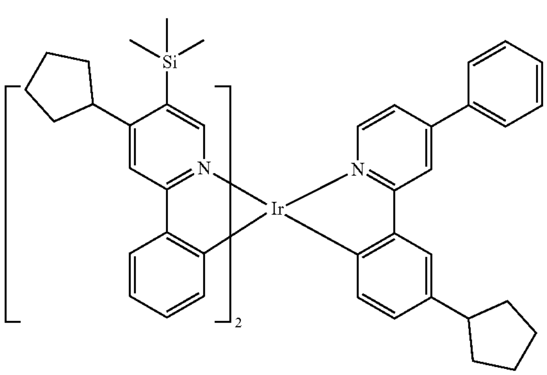
-continued
107
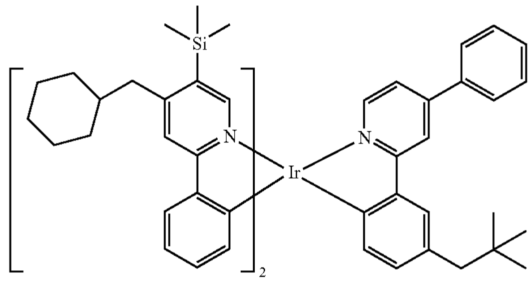
108
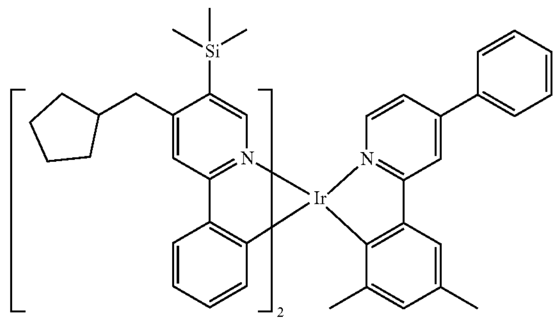
109
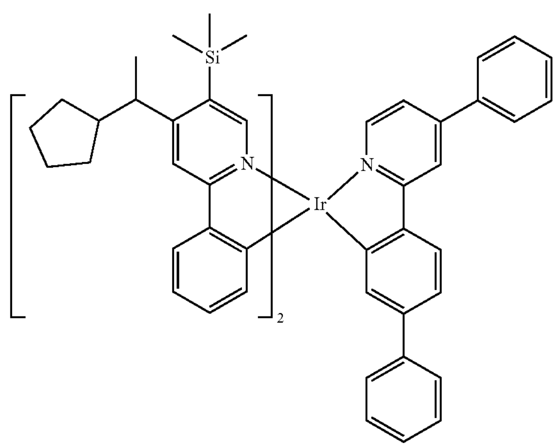
110
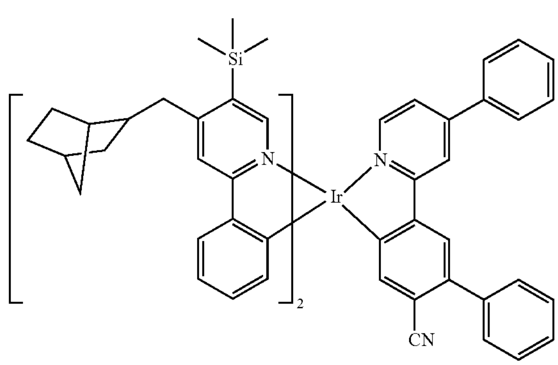

111
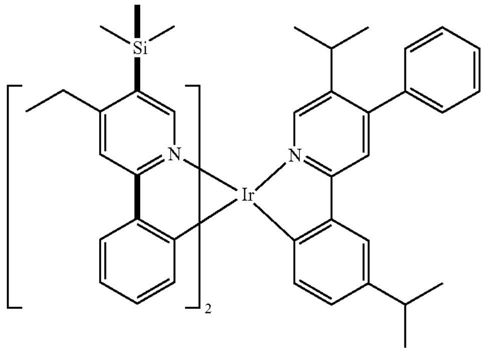
112
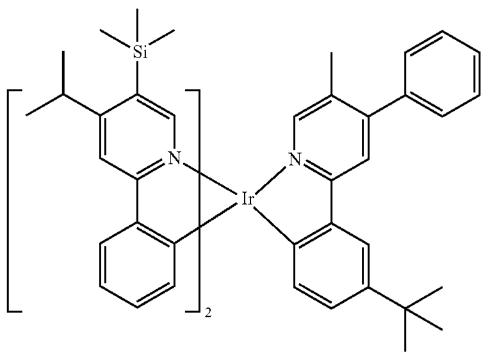
113
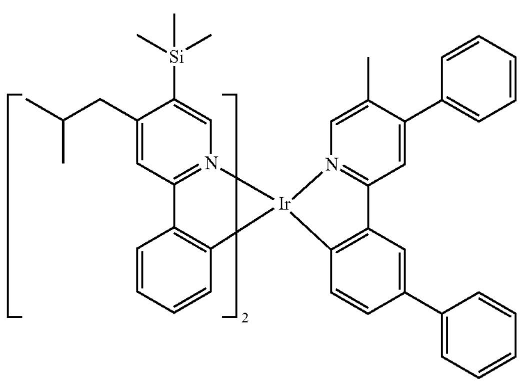
114
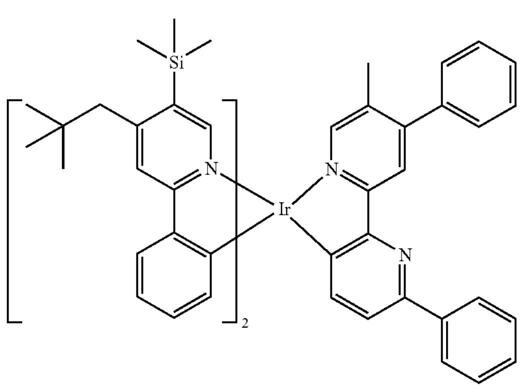
115
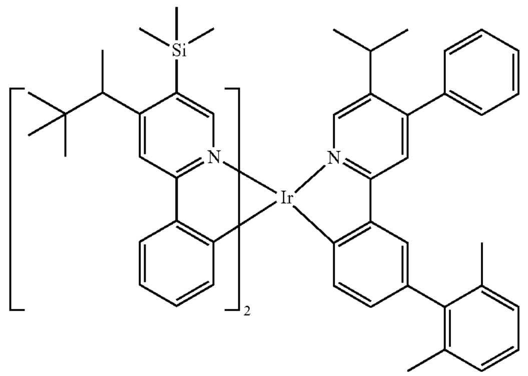
116
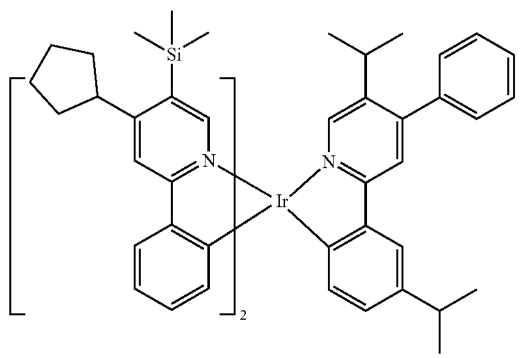
117
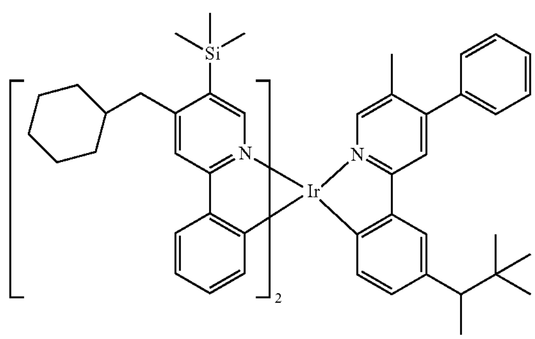
118
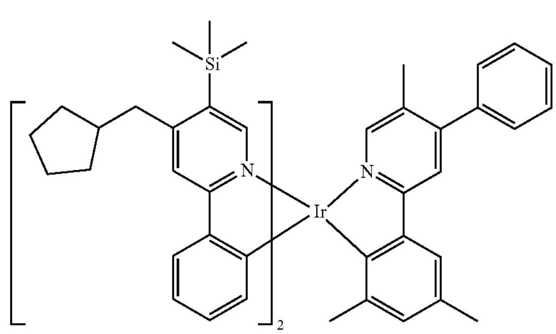

-continued
119
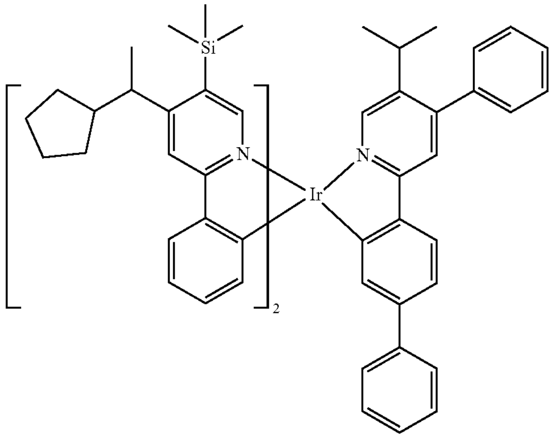
120
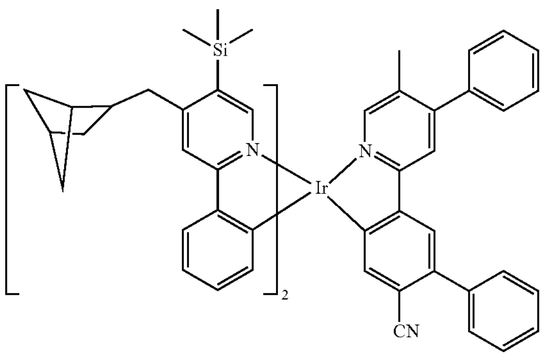
121
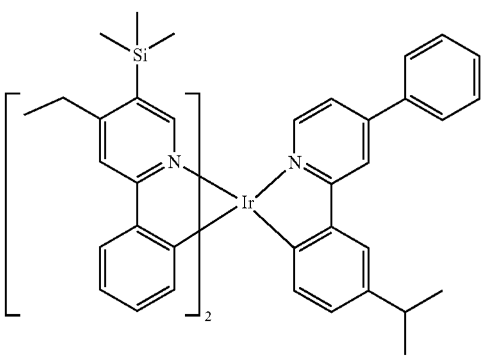
122
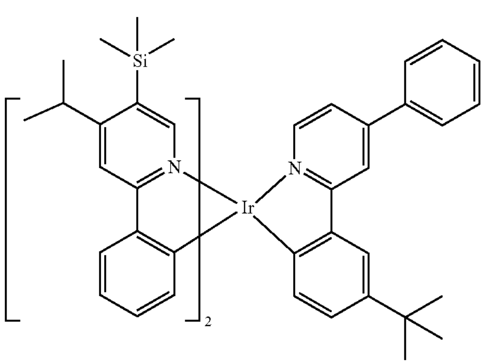
-continued
123
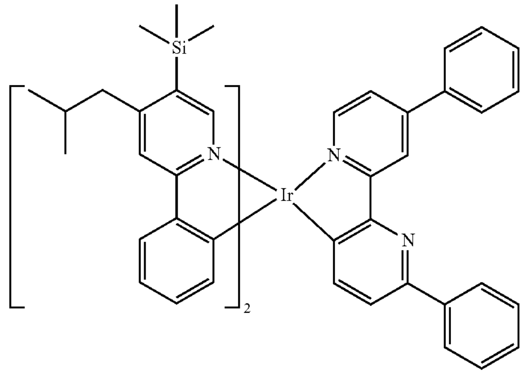
124
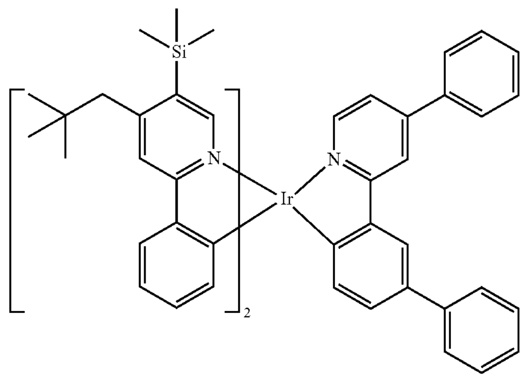
125
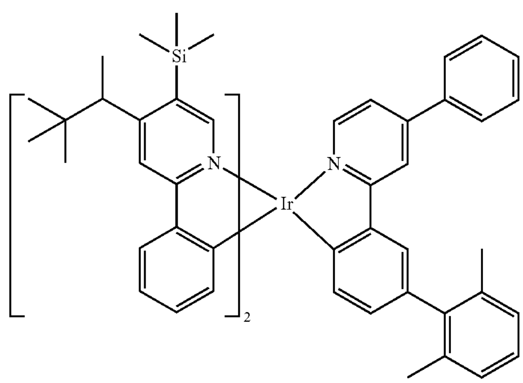
126
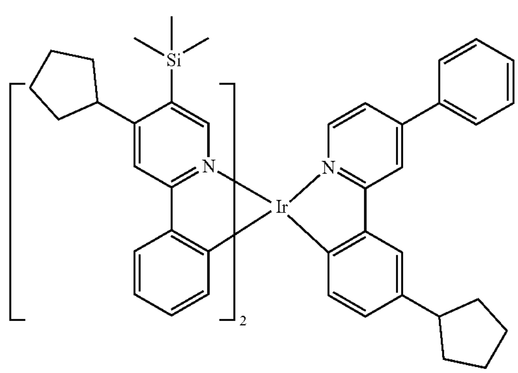

-continued
127
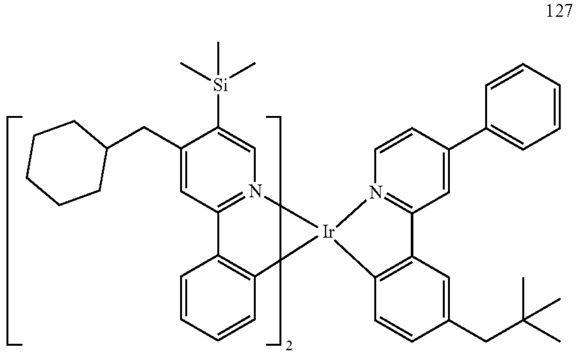
128
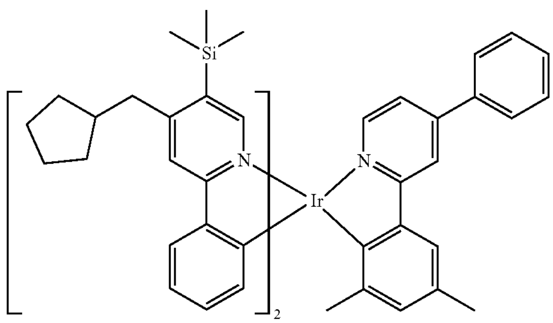
129
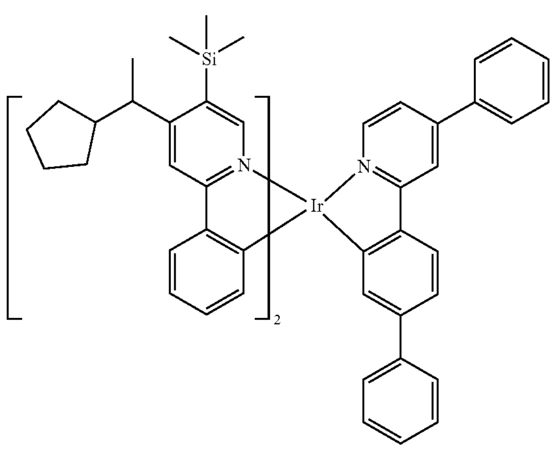
130
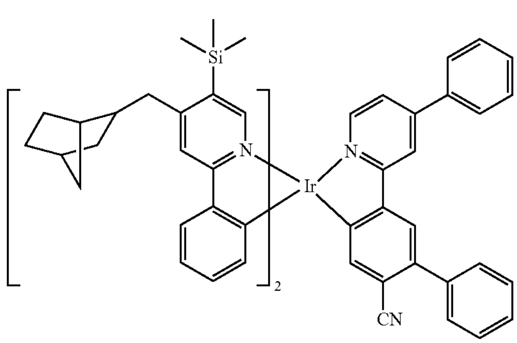
-continued
131
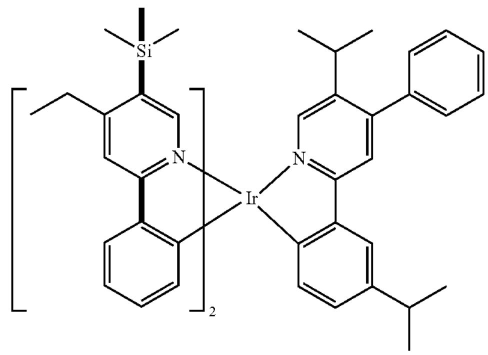
132
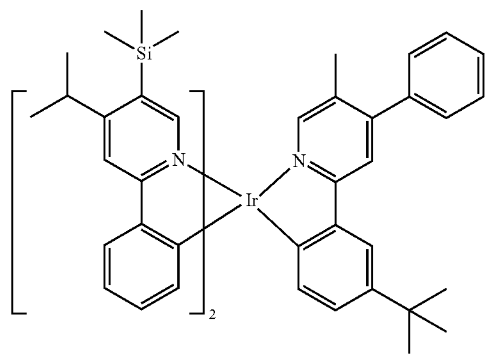
133
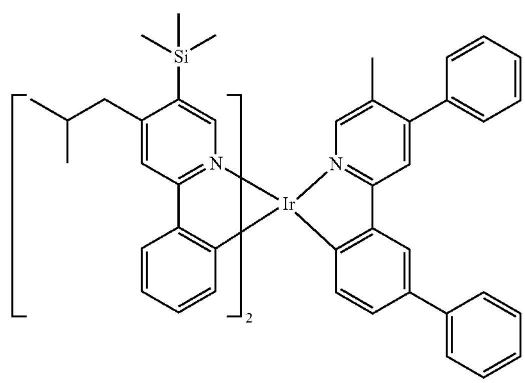
134
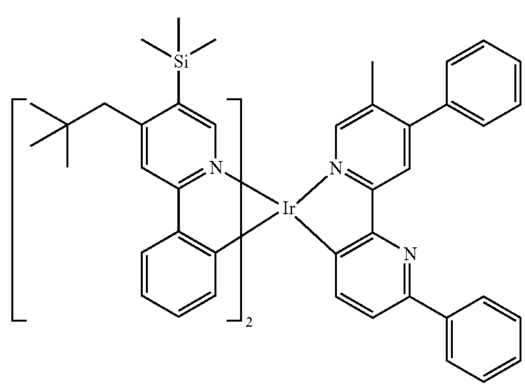

-continued
135
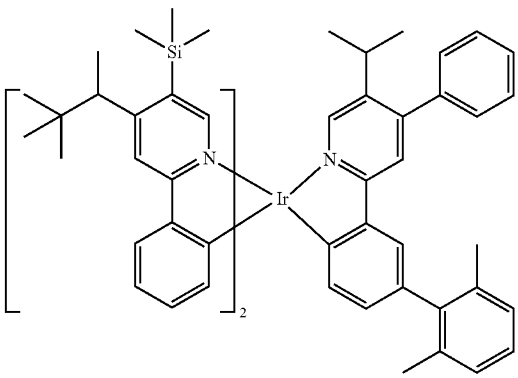
136
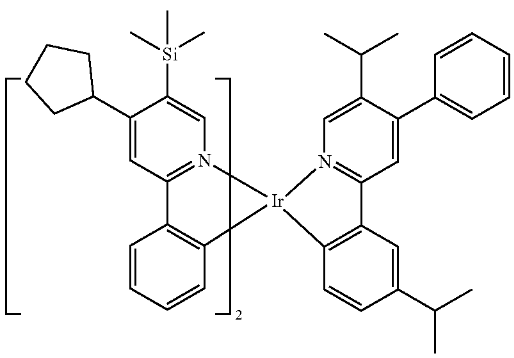
137
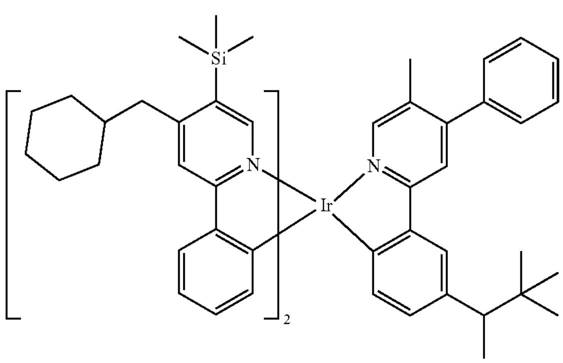
138
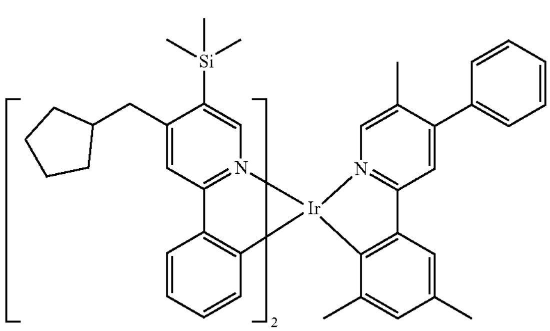
-continued
139
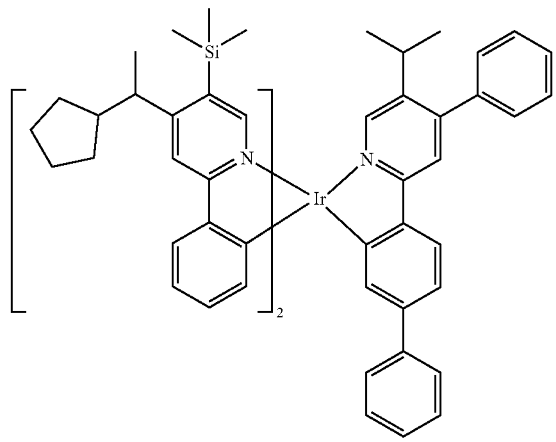
140
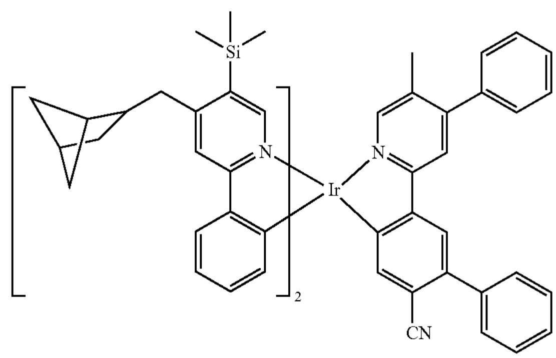
141
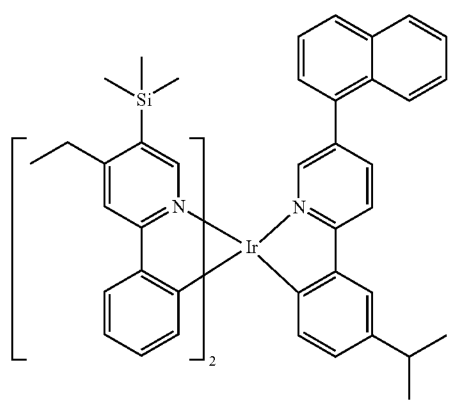
142
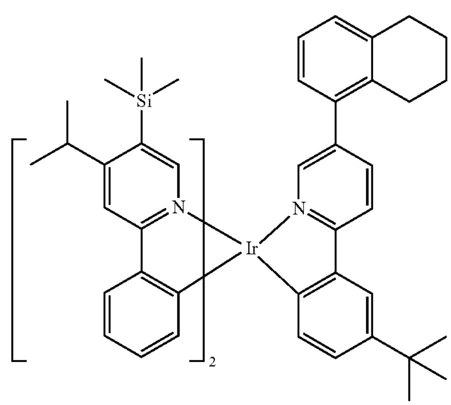

-continued
143
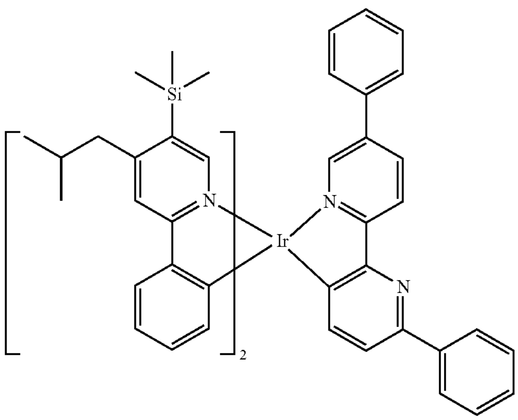
144
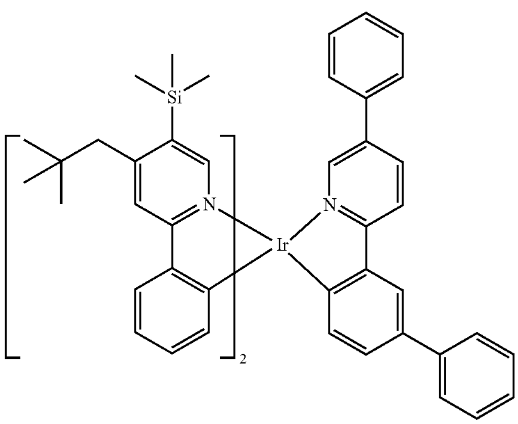
145
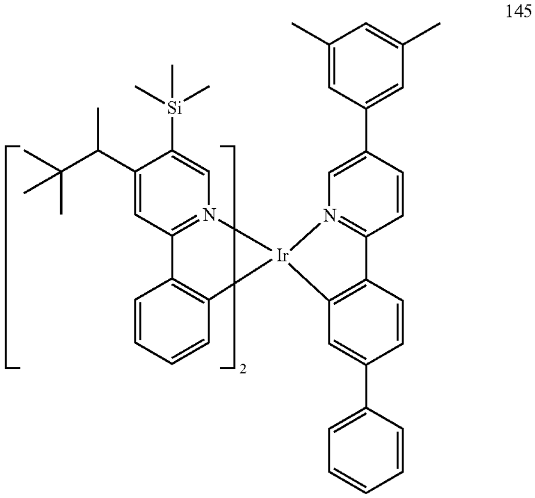
-continued
146
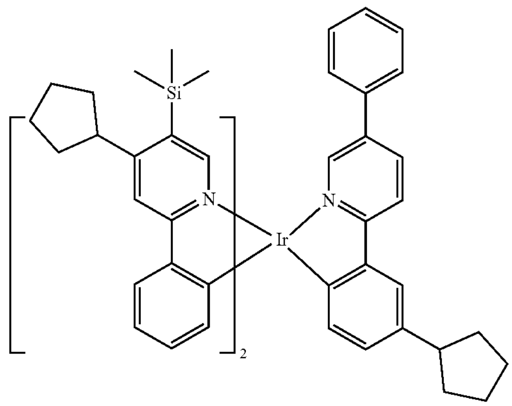
147
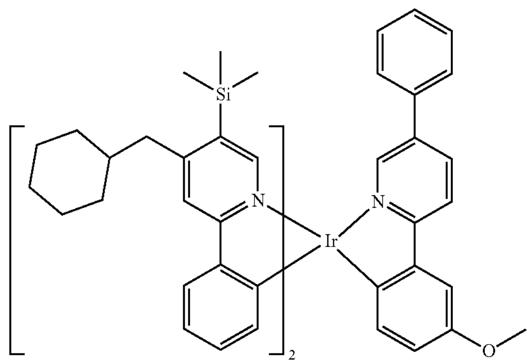
148
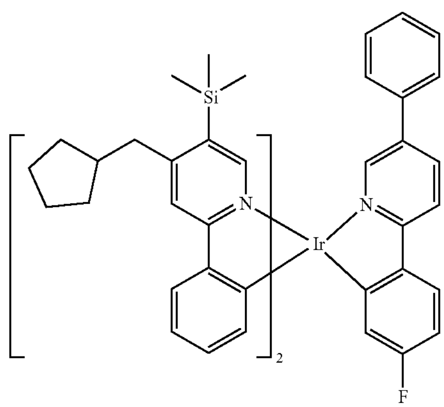
149
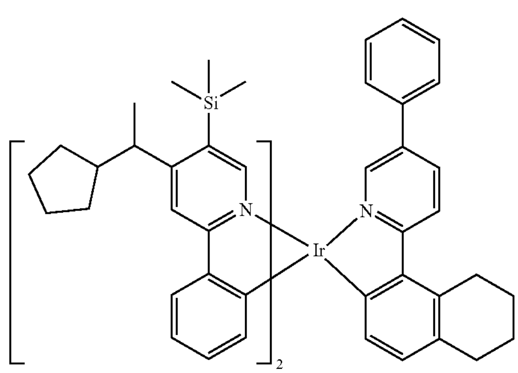

-continued
150
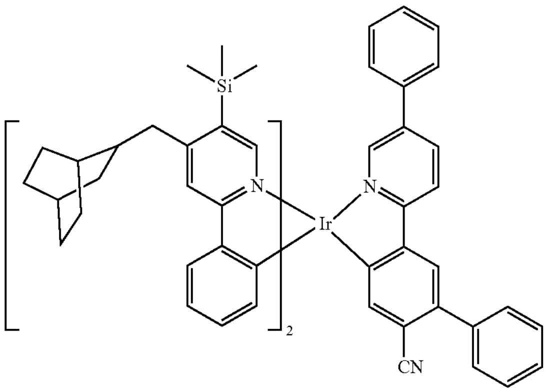
151
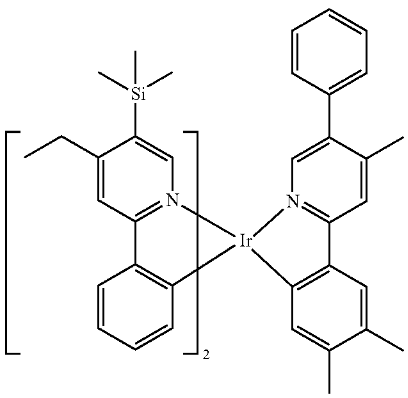
152
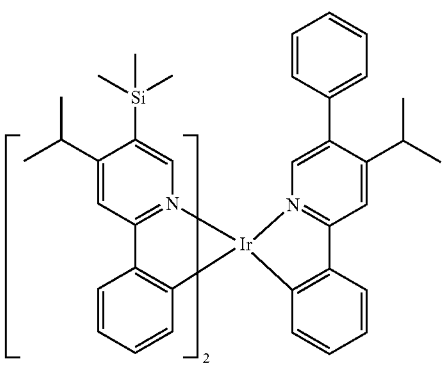
153
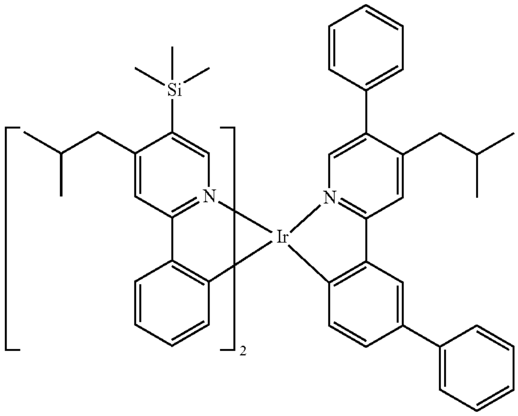
-continued
154
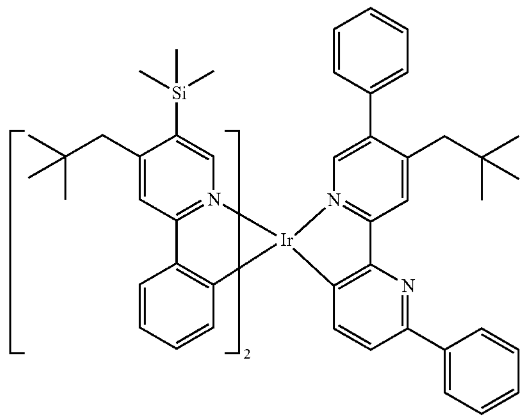
155
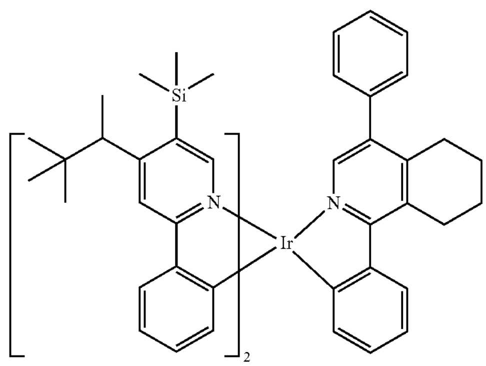
156
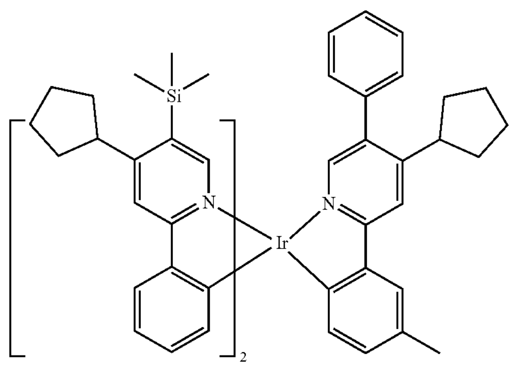
157
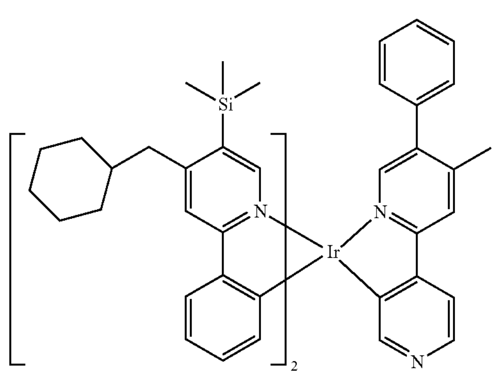

158
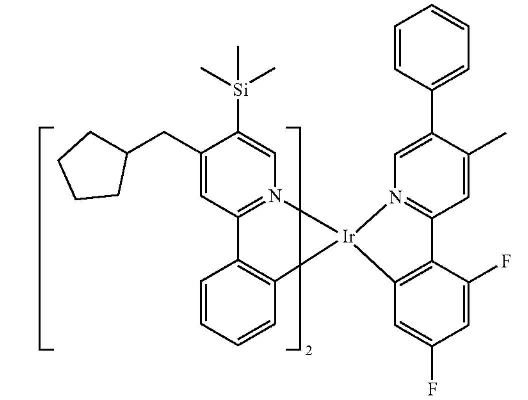
159
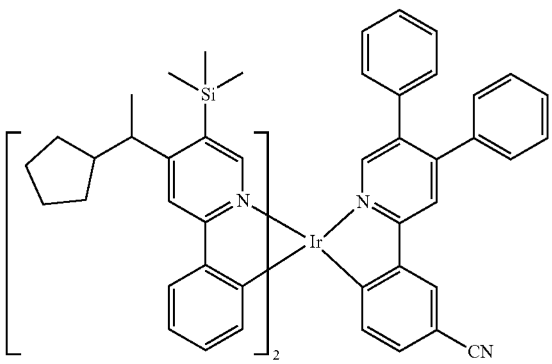
160
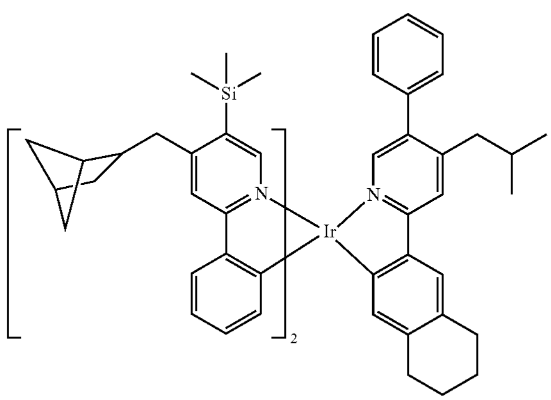
161
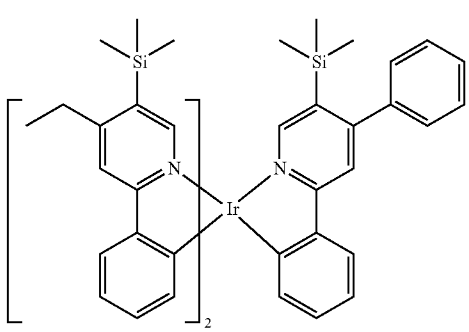
162
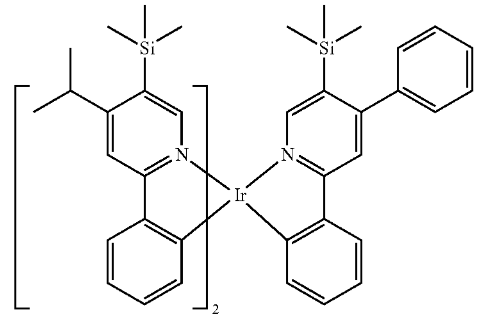
163
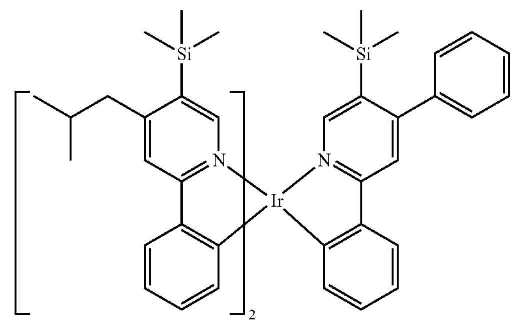
164
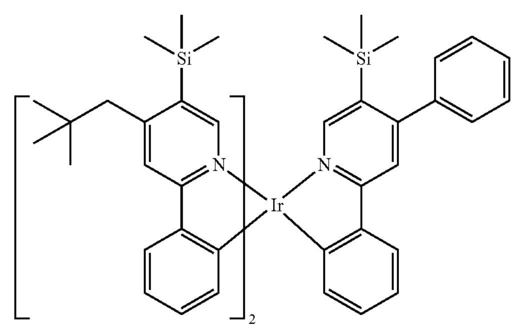
165
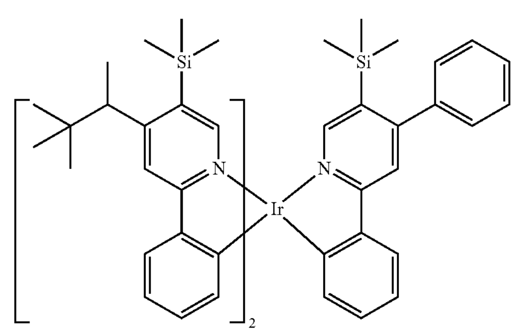

-continued
166
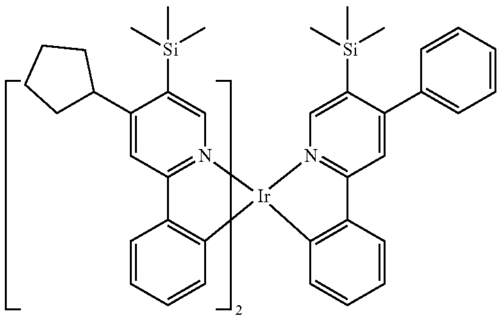
167
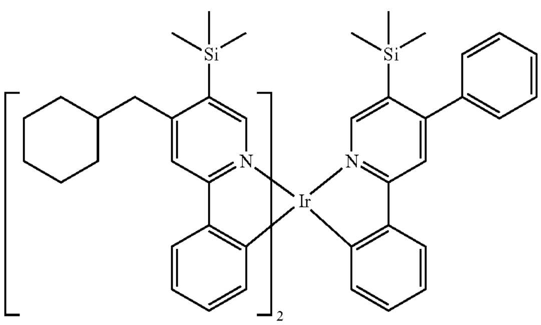
168
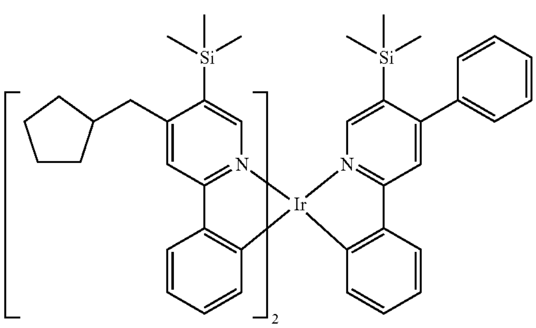
169
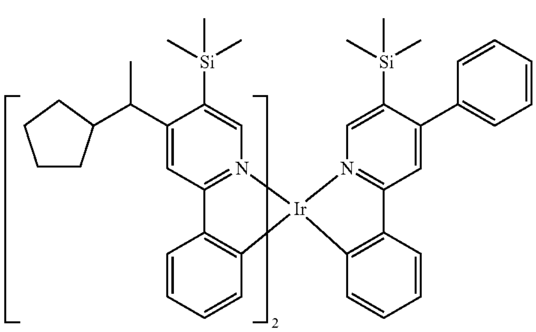
-continued
170
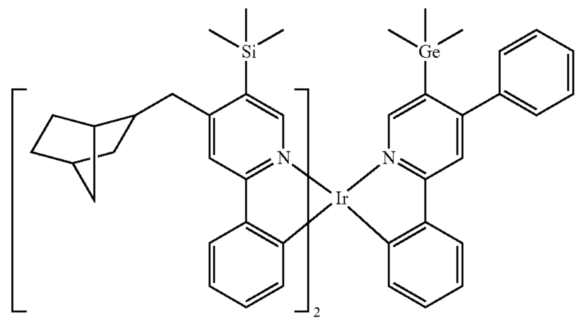
171
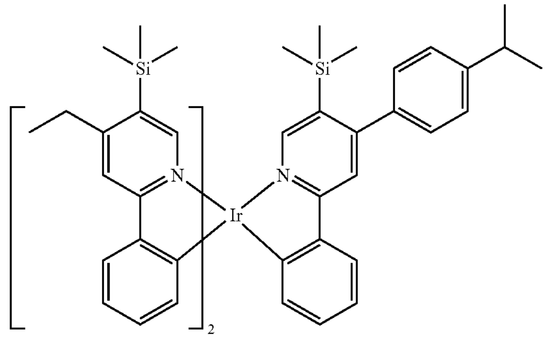
172
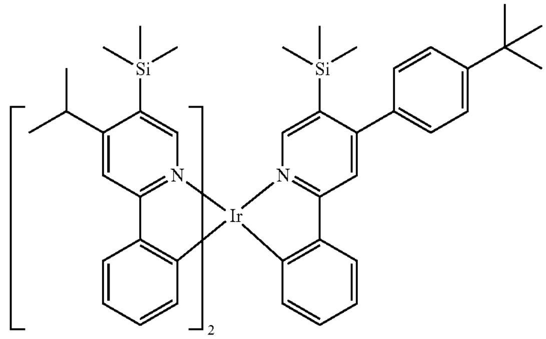
173
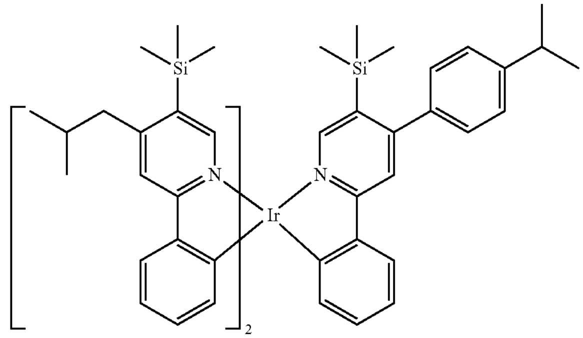

-continued
174
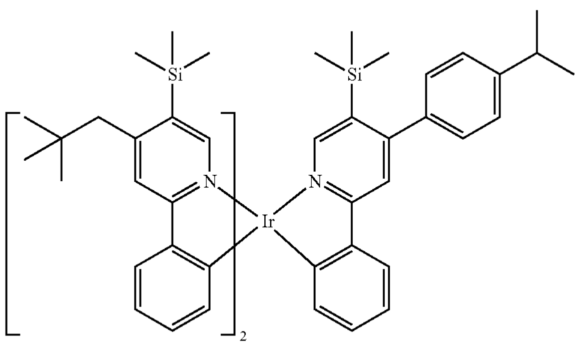
175
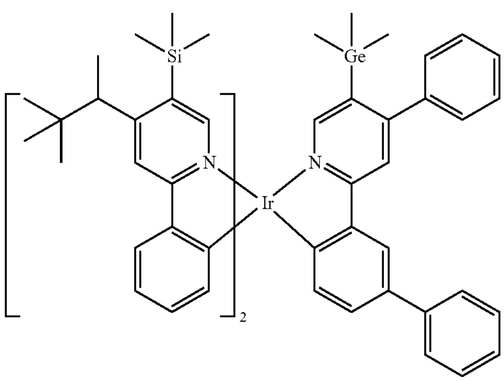
176
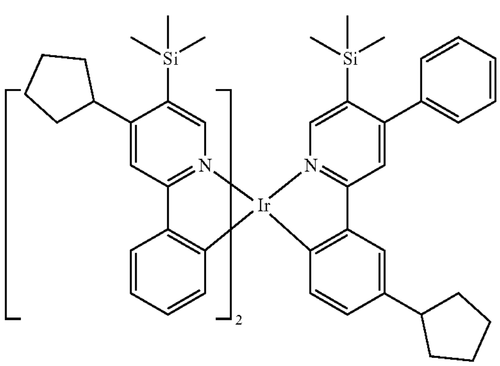
177
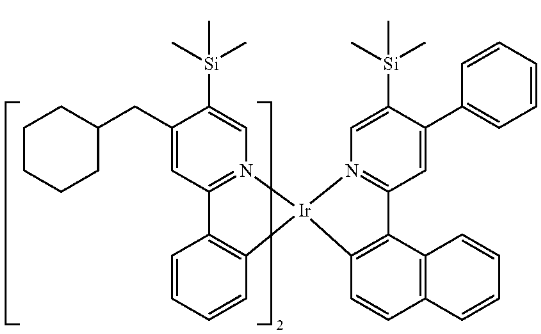
-continued
178
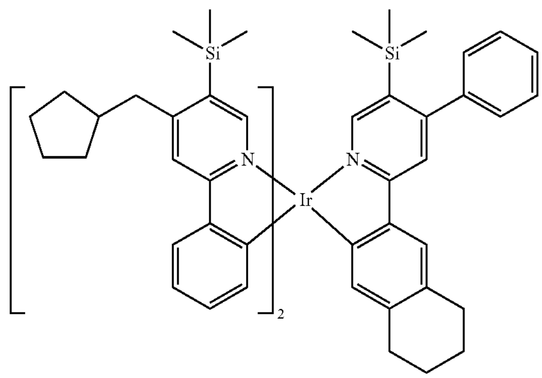
179
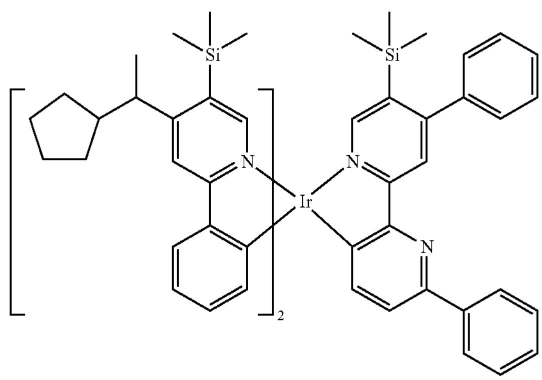
180
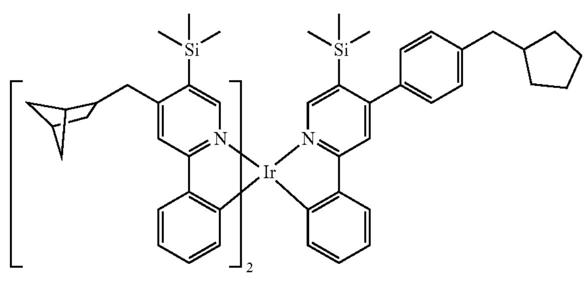
181
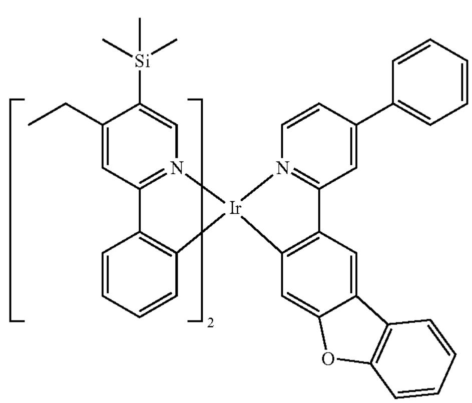

182
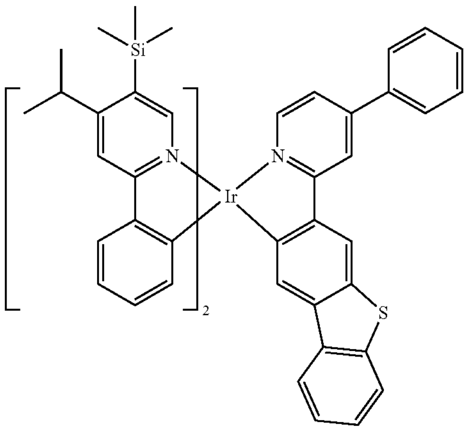
183
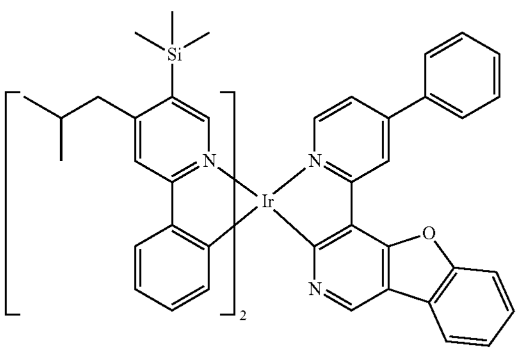
184
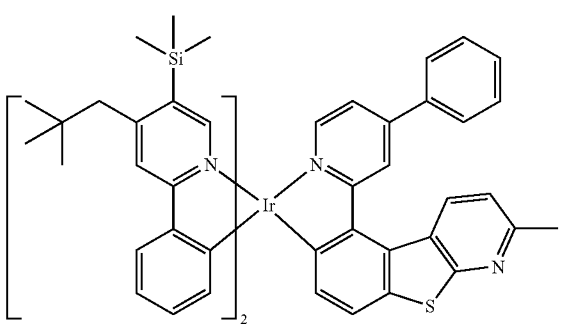
185
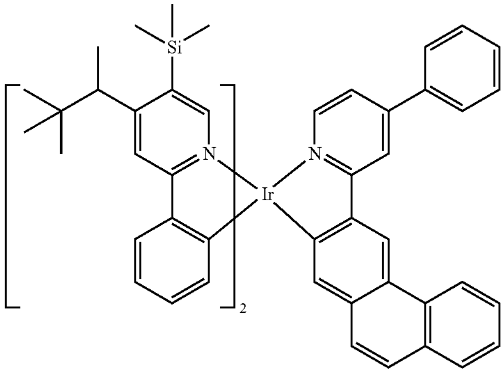
186
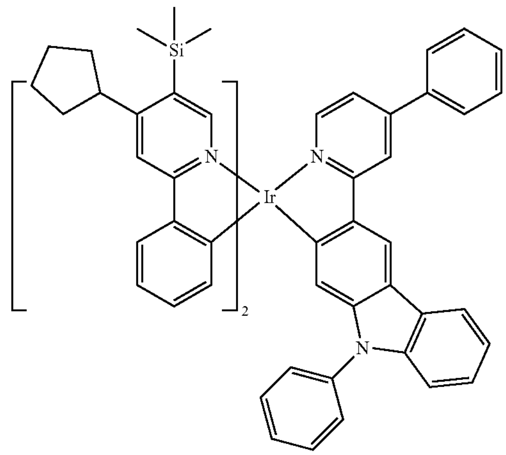
187
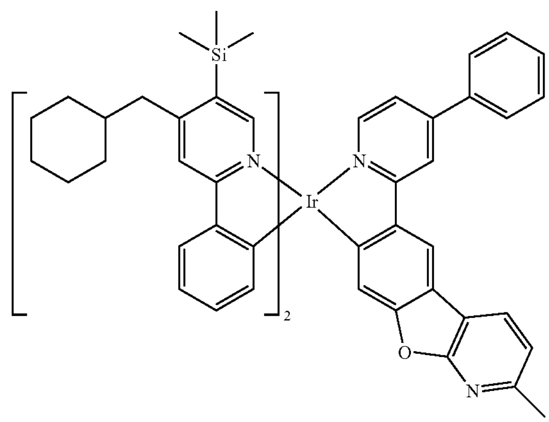
188
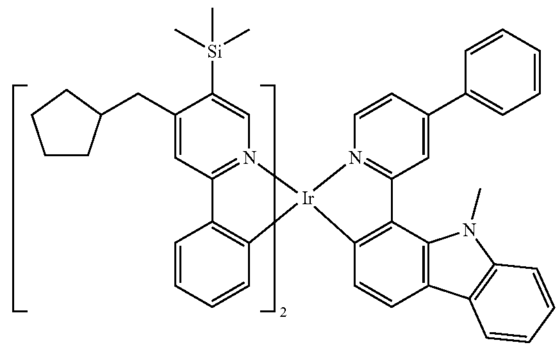

-continued
189
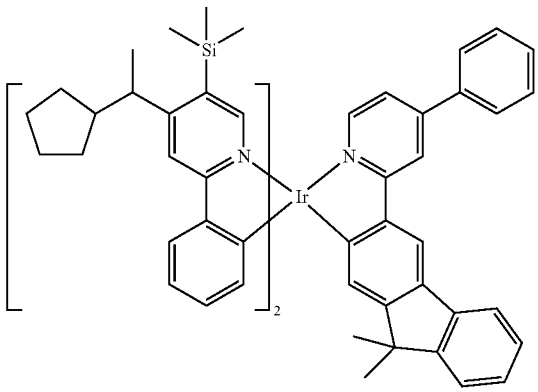
190
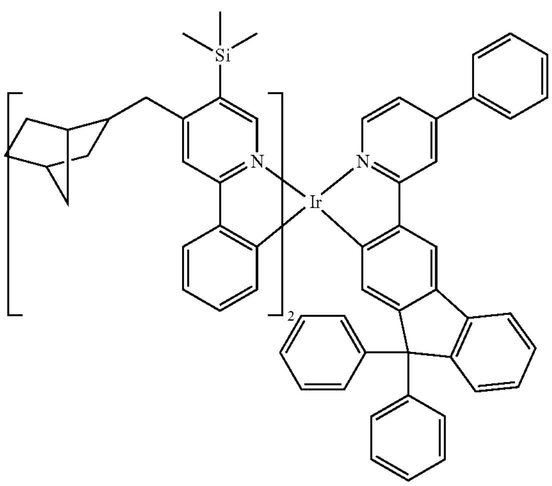
191
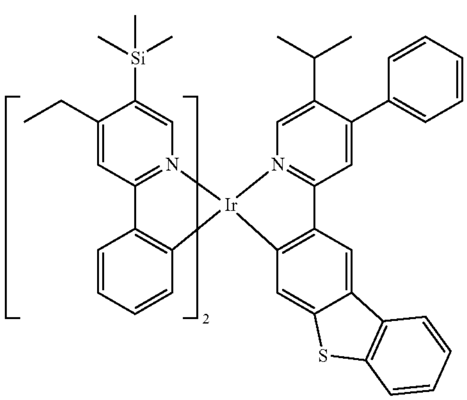
-continued
192
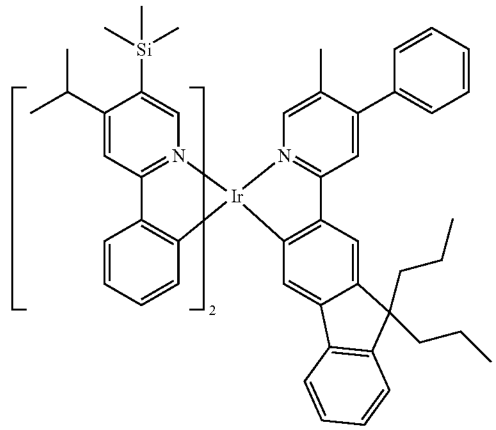
193
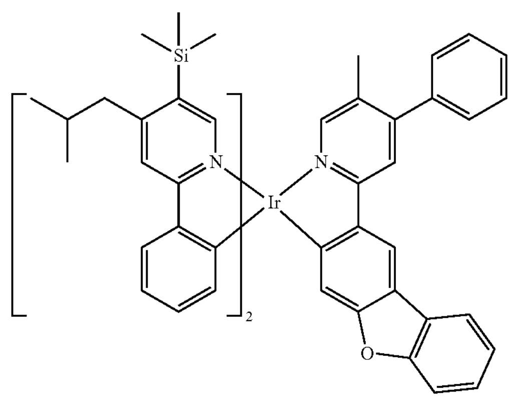
194
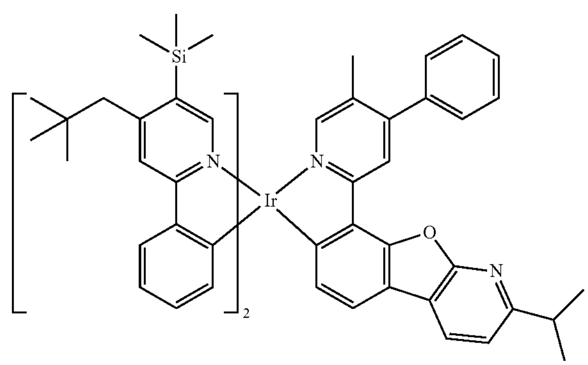

195
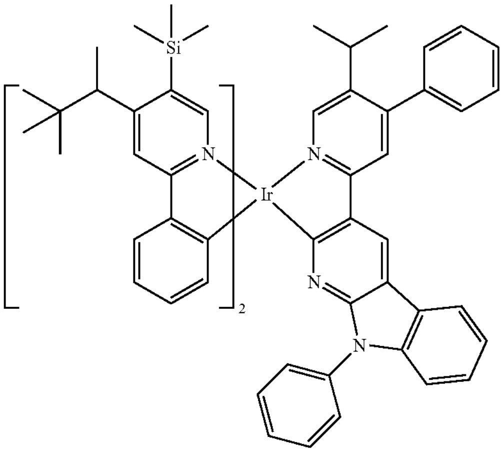
196
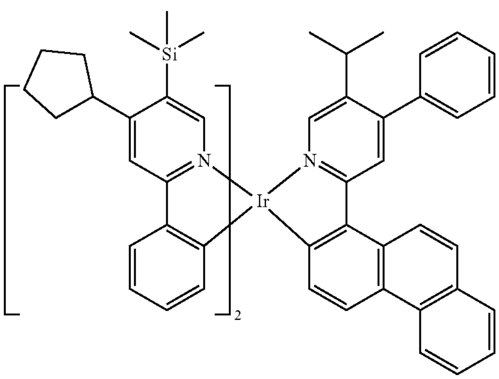
197
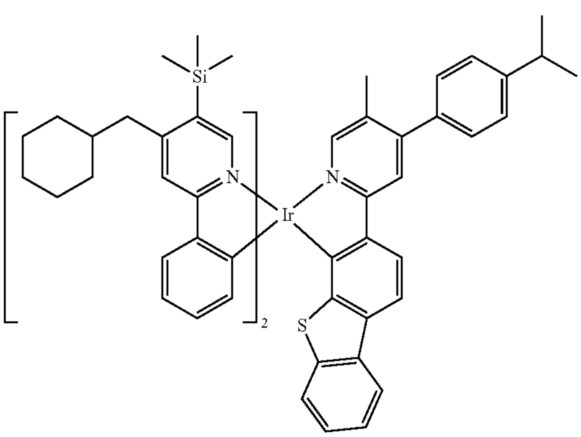
198
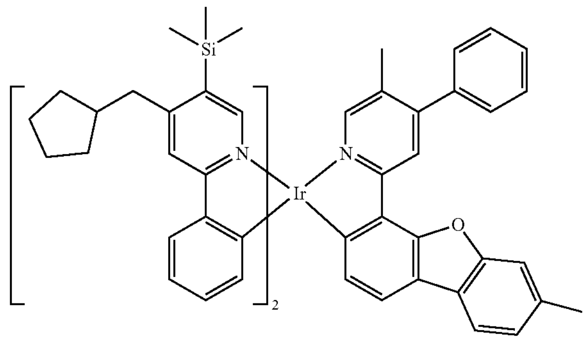
199
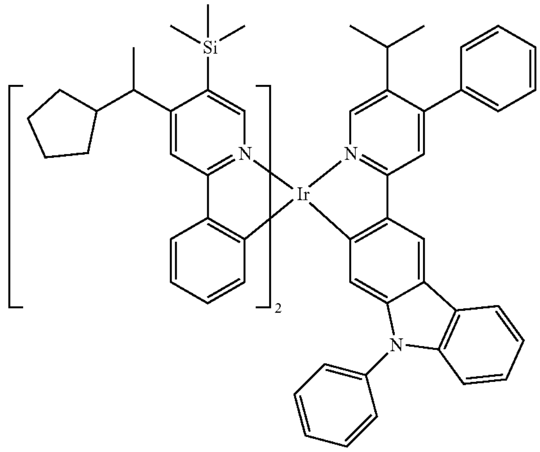
200
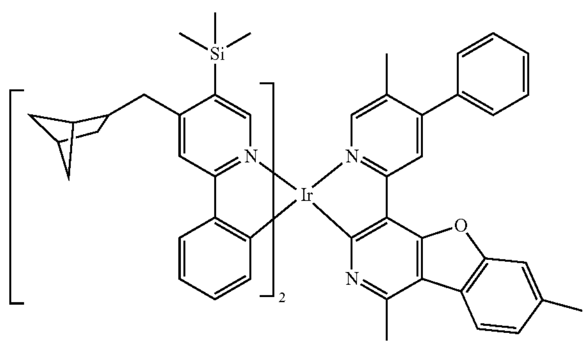
201
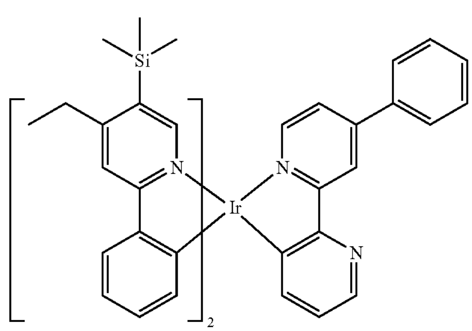

-continued
202
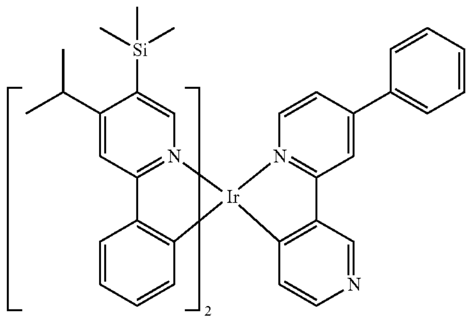
203
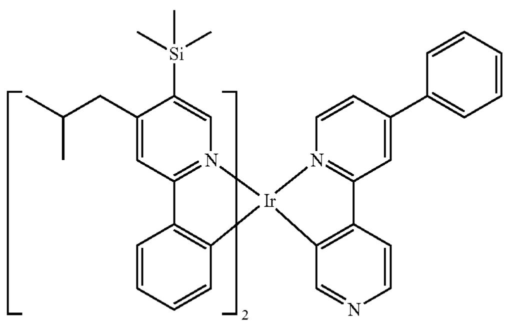
204
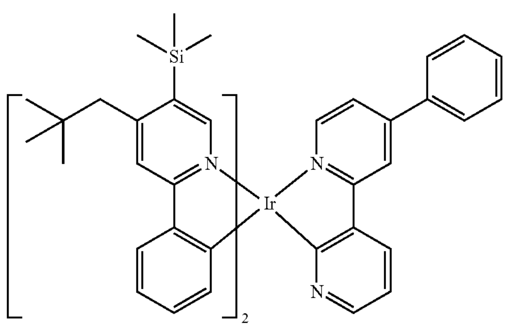
205
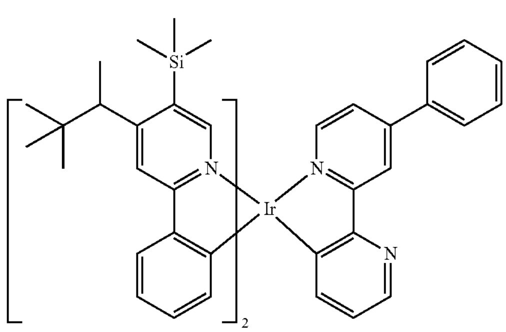
-continued
206
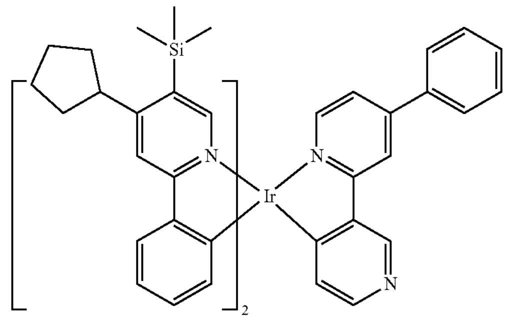
207
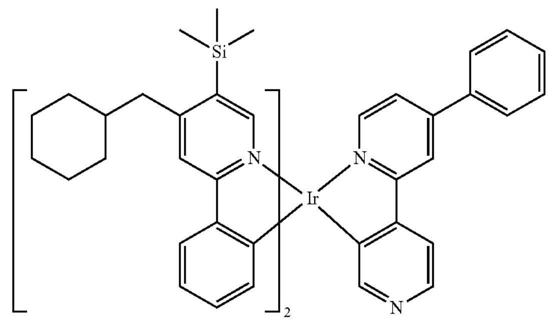
208
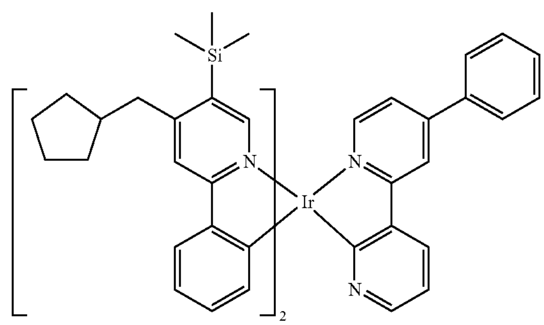
209
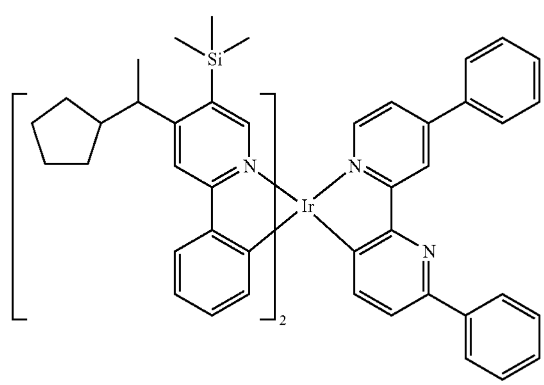

-continued
210
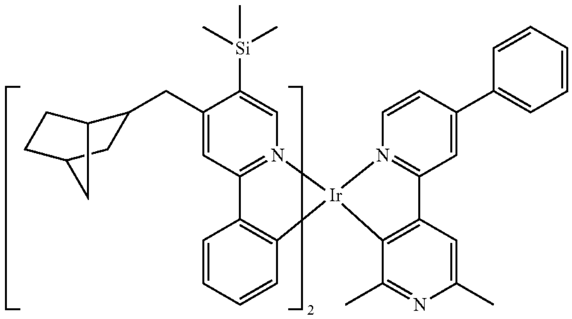
211
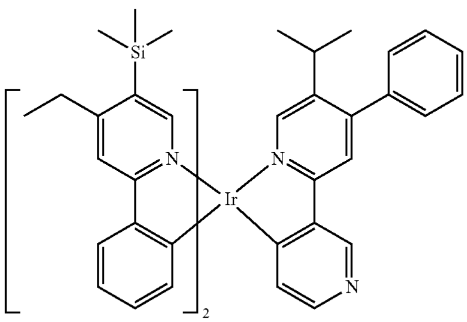
212
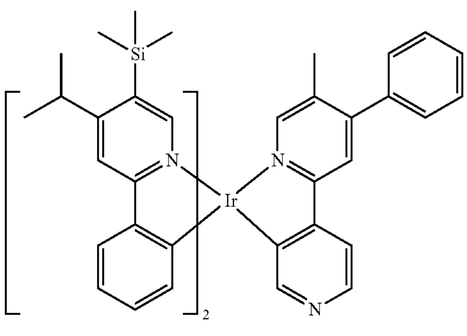
213
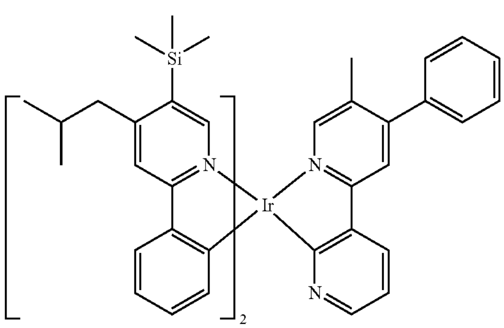
-continued
214
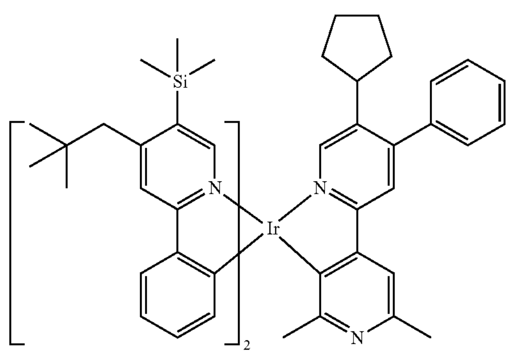
215
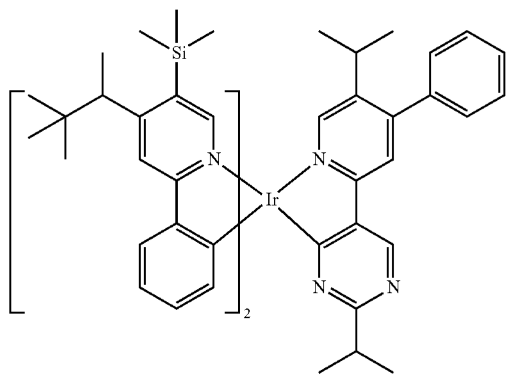
216
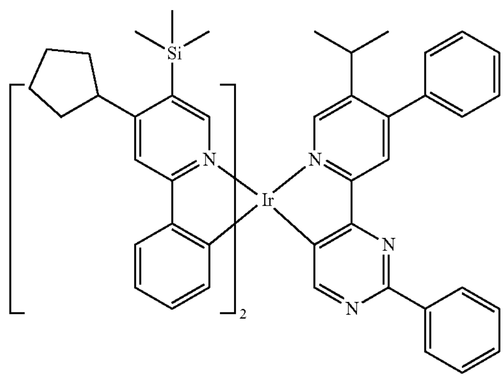
217
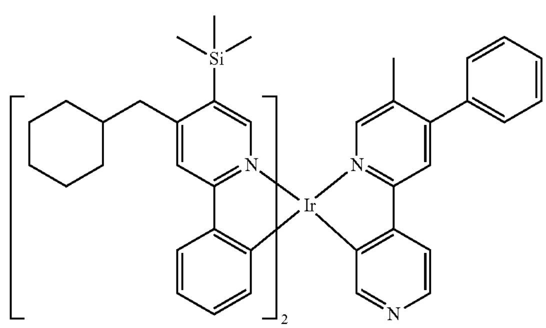

-continued
218
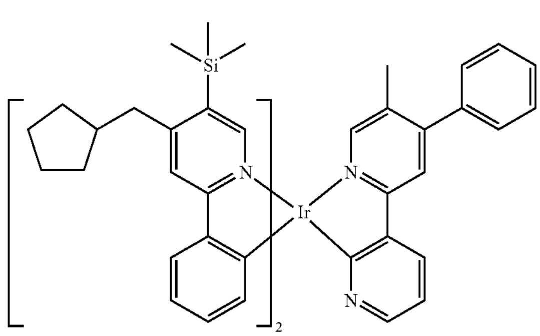
219
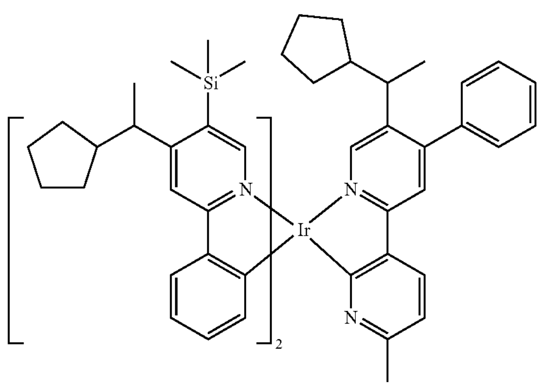
220
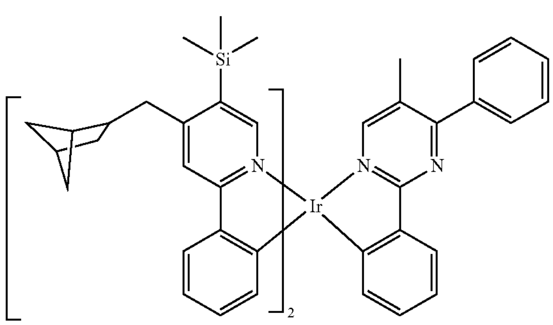
221
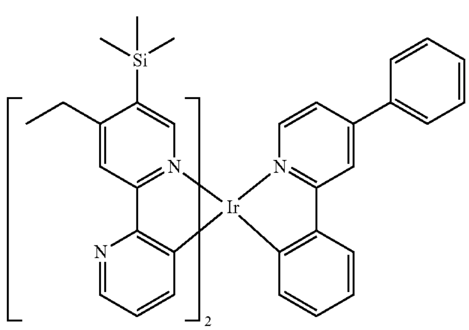
-continued
222
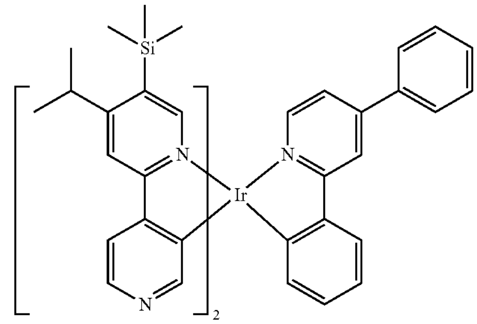
223
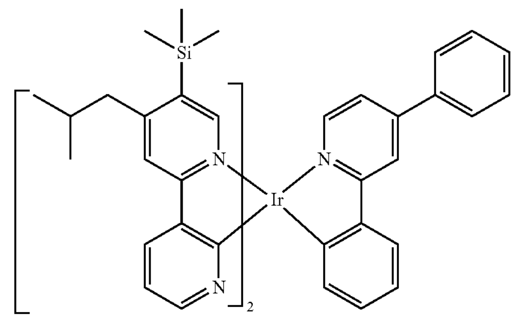
224
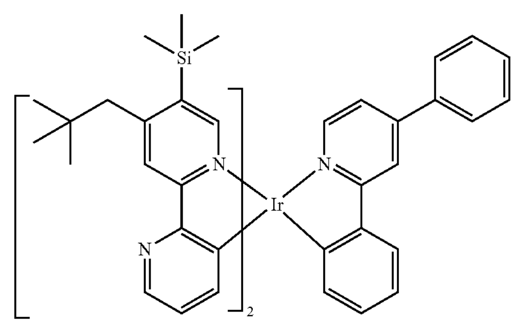
225
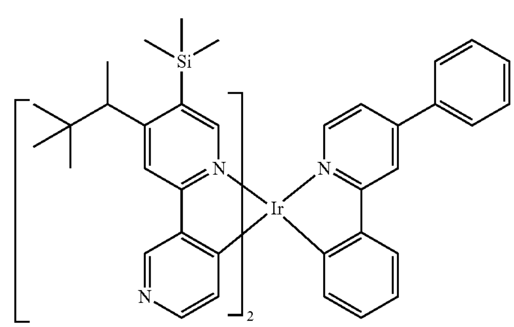

-continued
226
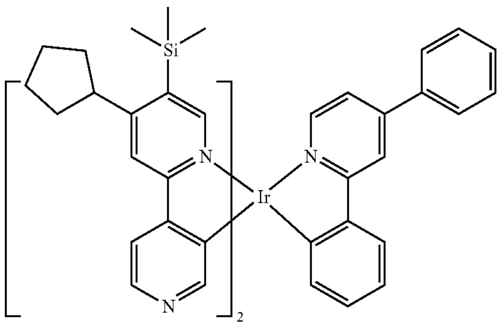
227
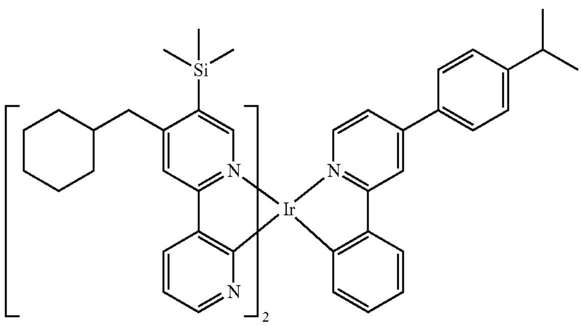
228
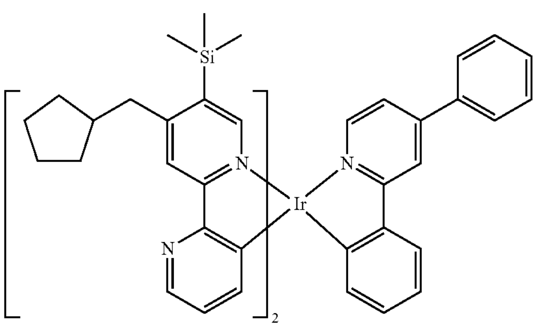
229
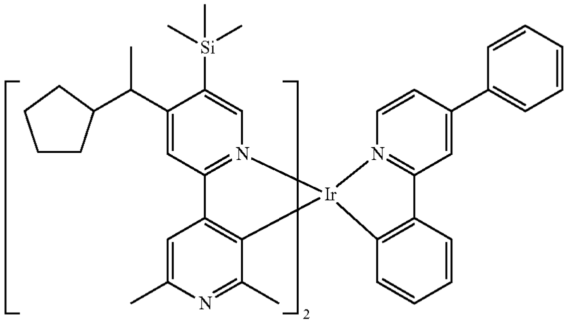
-continued
230
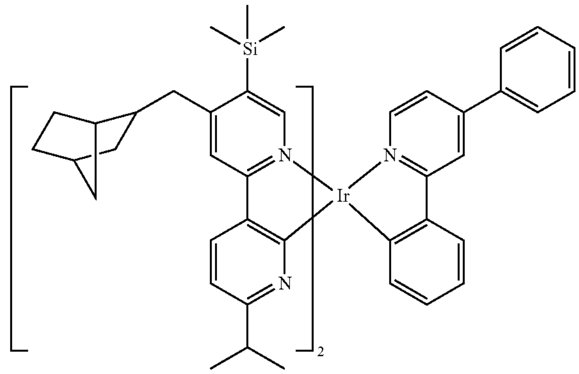
231
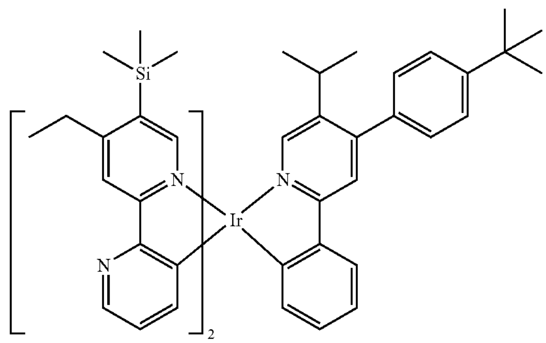
232
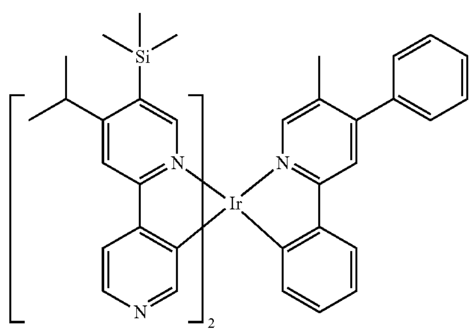
233
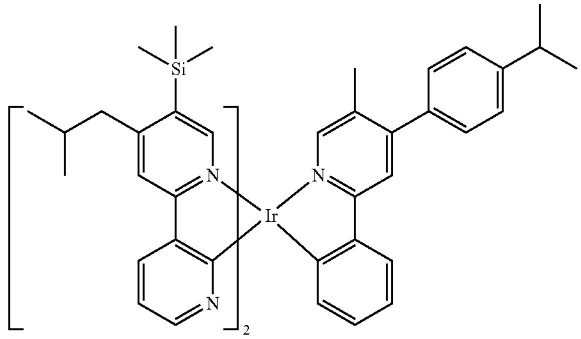

-continued
234
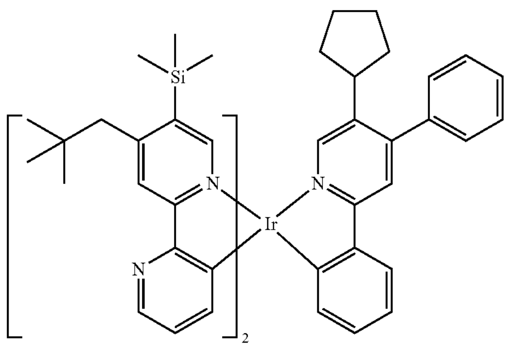
235
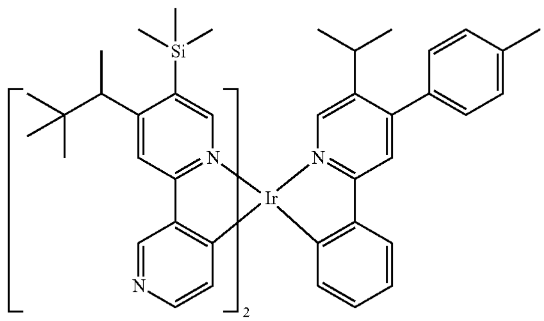
236
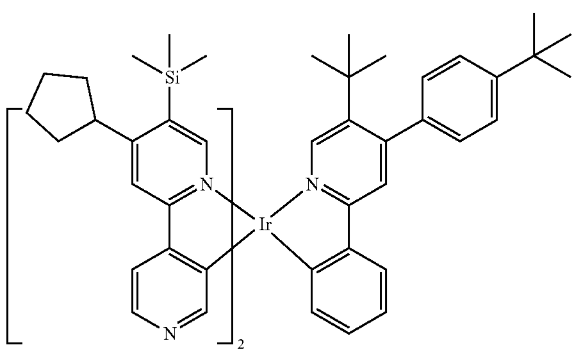
237
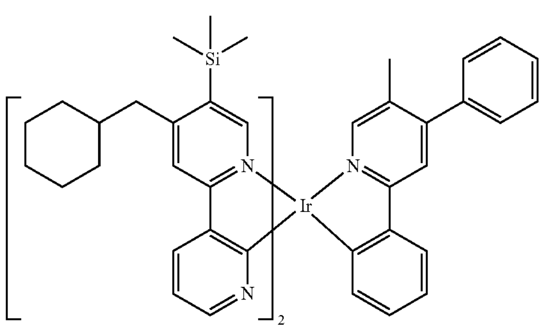
-continued
238
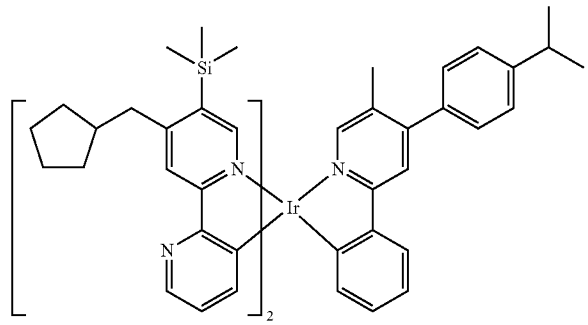
239
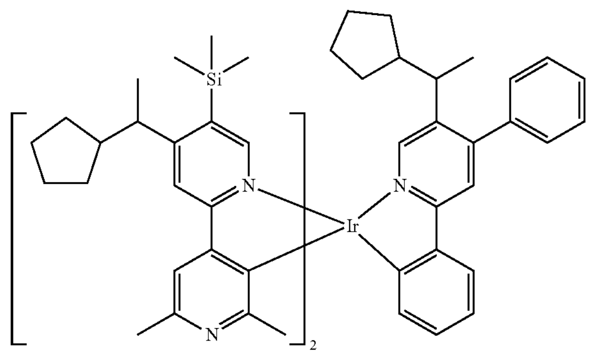
240
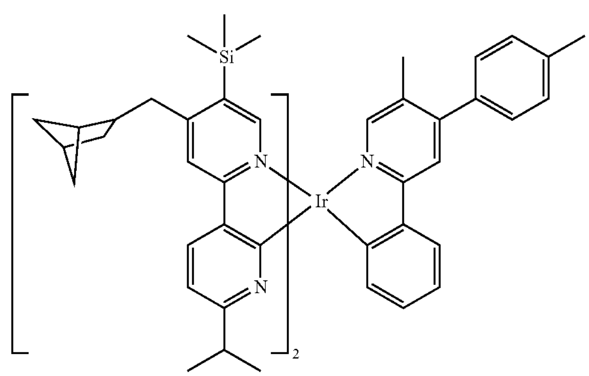
241
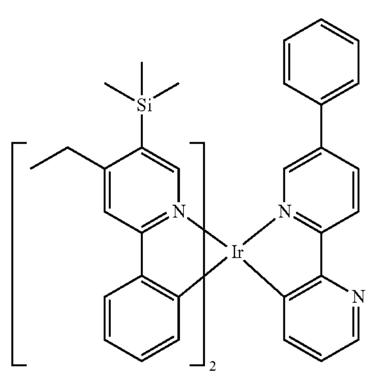

-continued
242
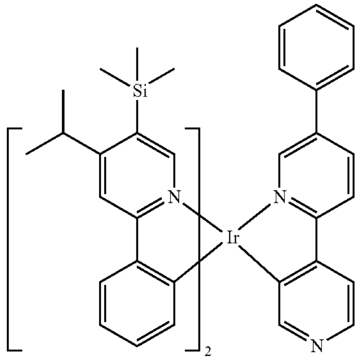
243
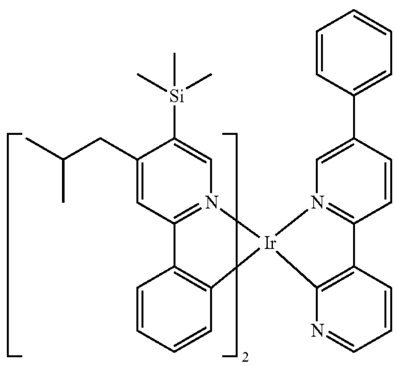
244
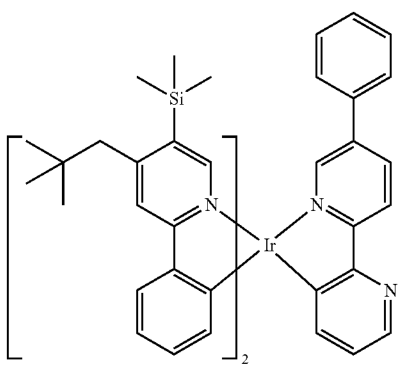
245
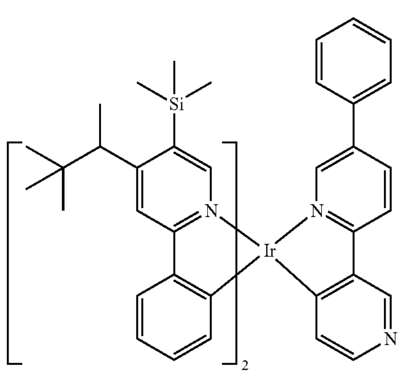
-continued
246
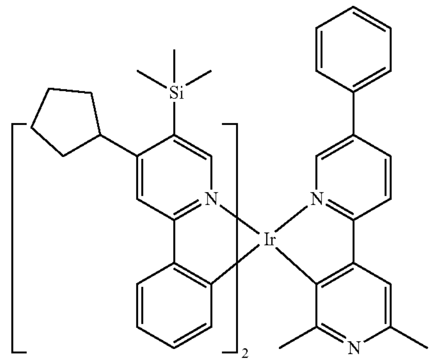
247
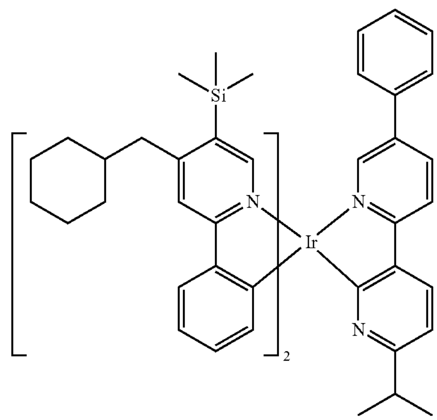
248
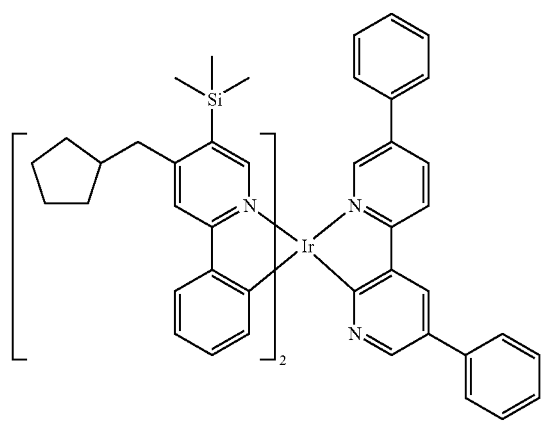
249
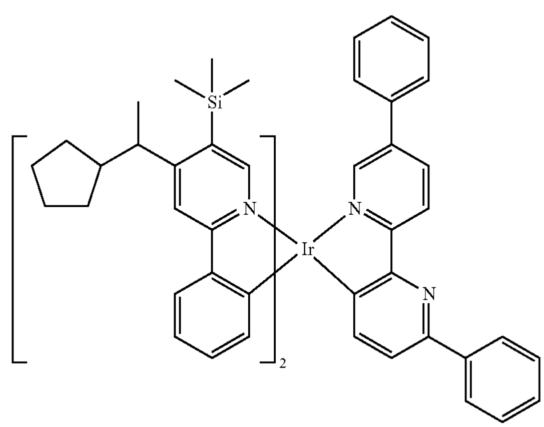

250
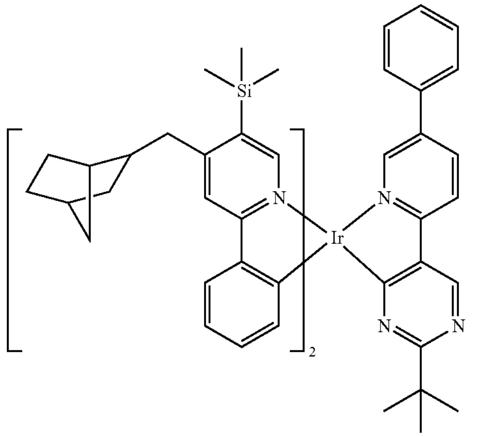
251
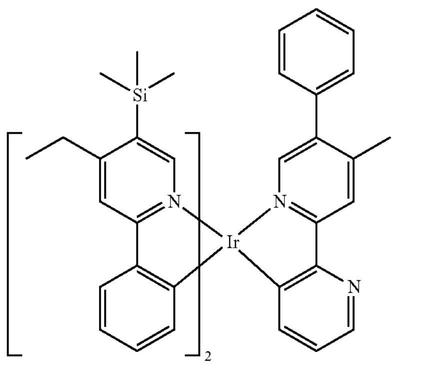
252
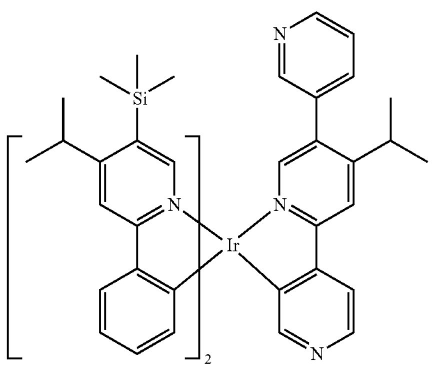
253
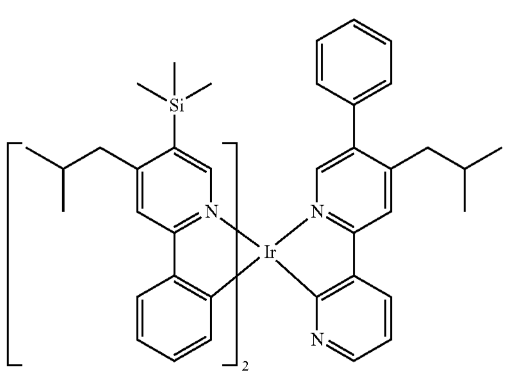
254
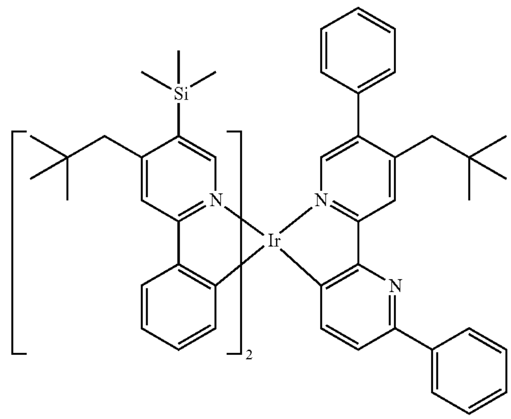
255
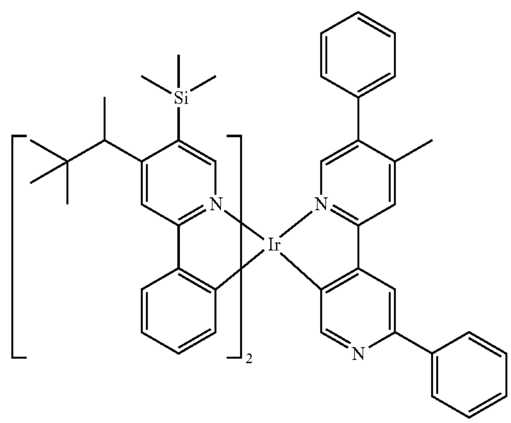
256
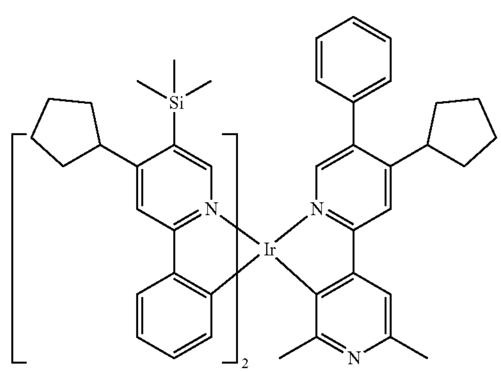

-continued
257
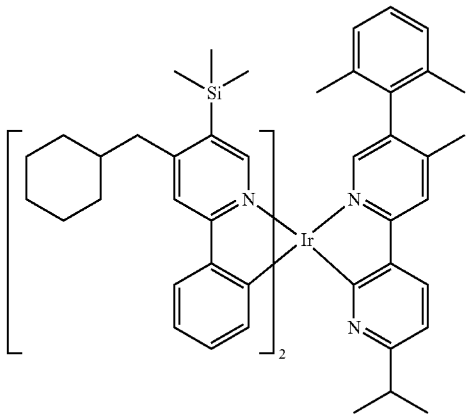
258
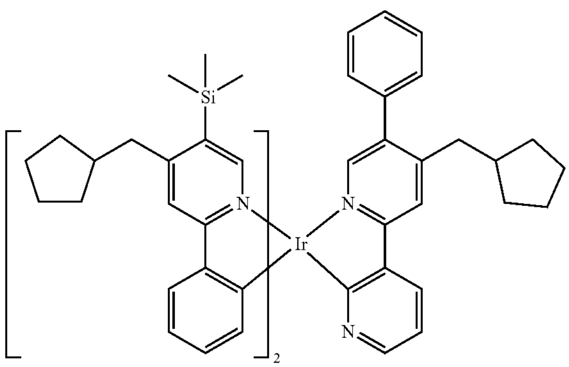
259
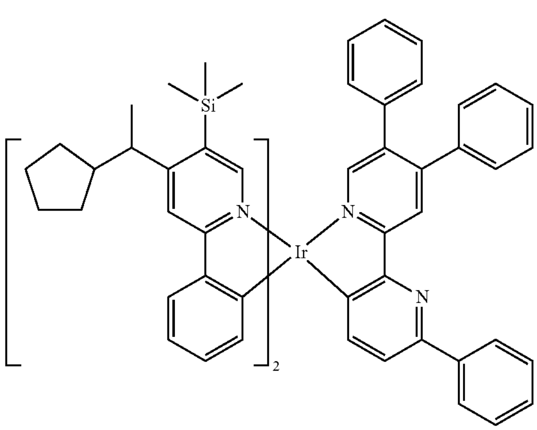
-continued
260
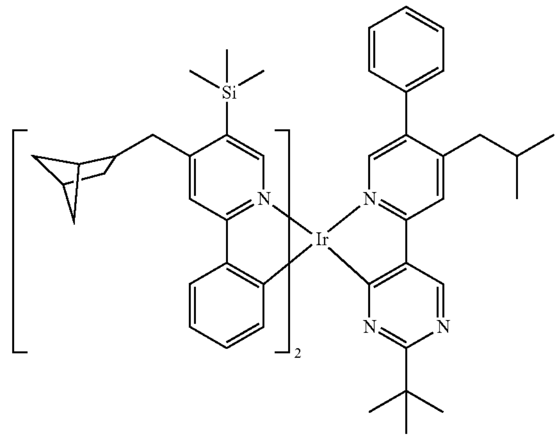
261
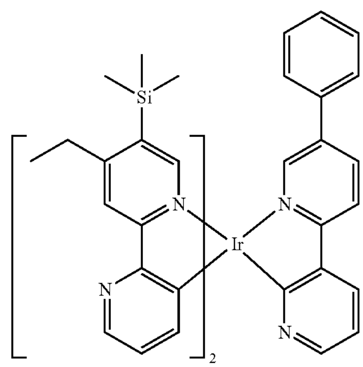
262
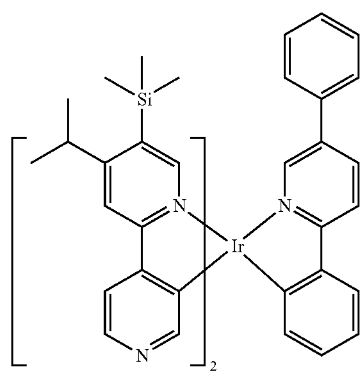
263
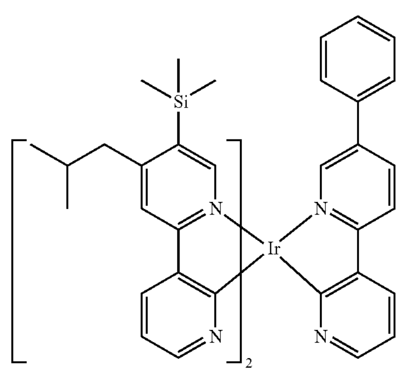

-continued
264
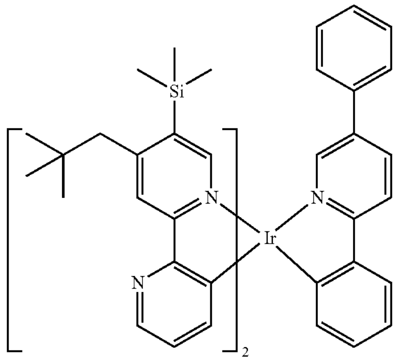
265
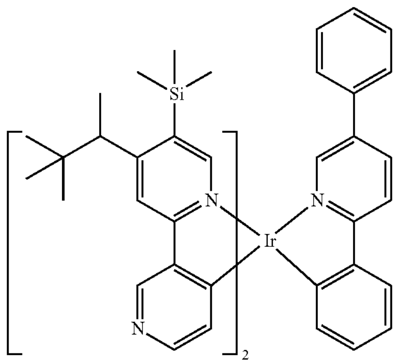
266
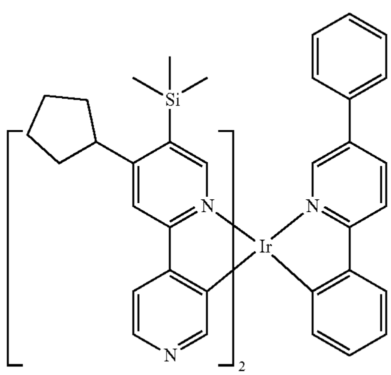
267
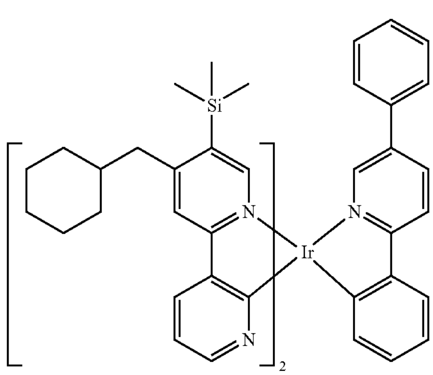
-continued
268
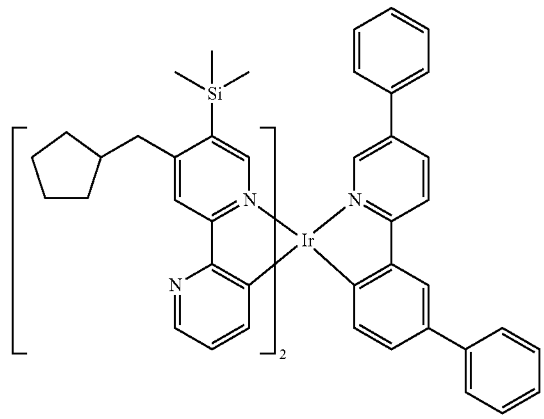
269
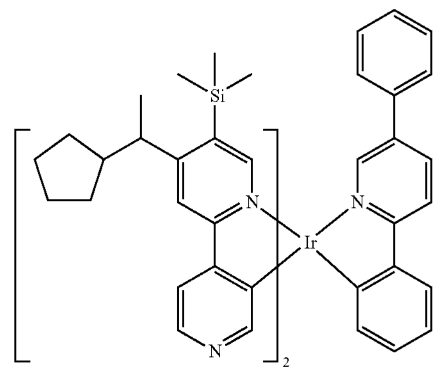
270
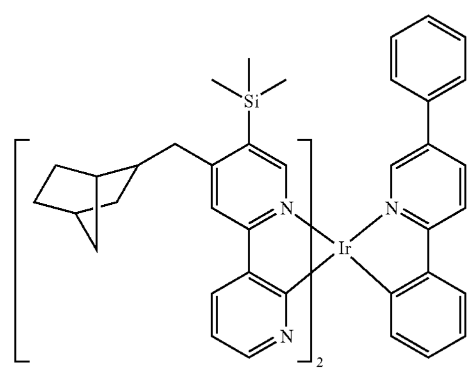
271
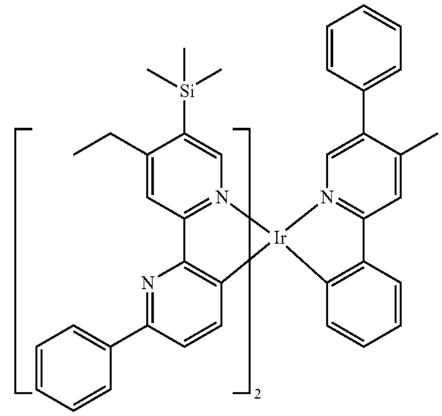

-continued
272
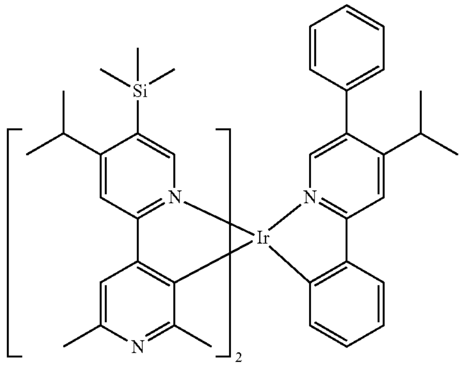
273
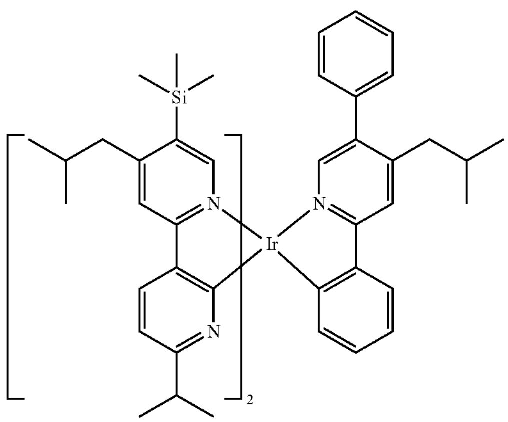
274
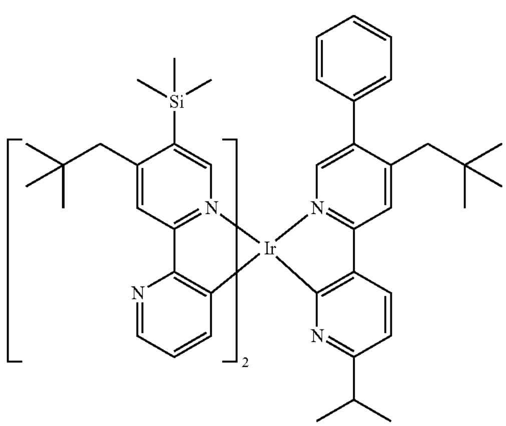
275
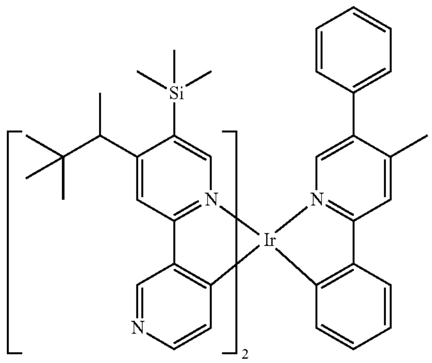
-continued
276
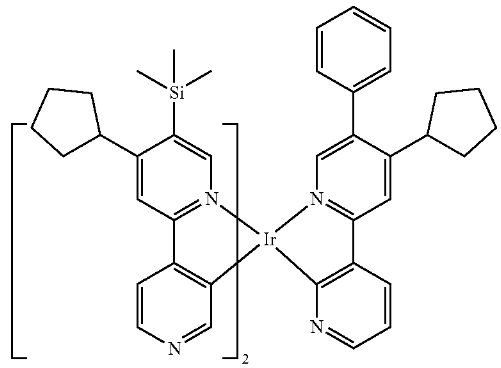
277
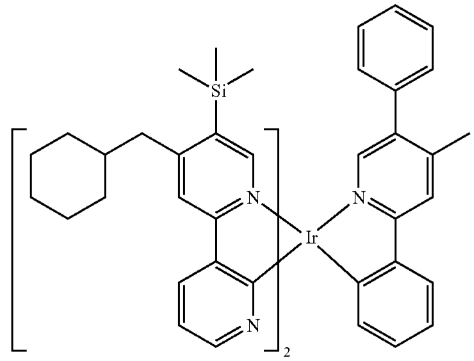
278
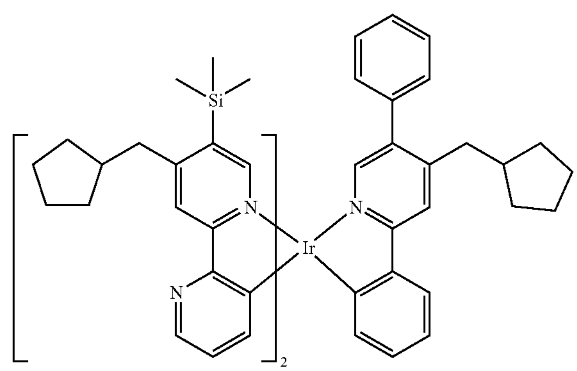
279
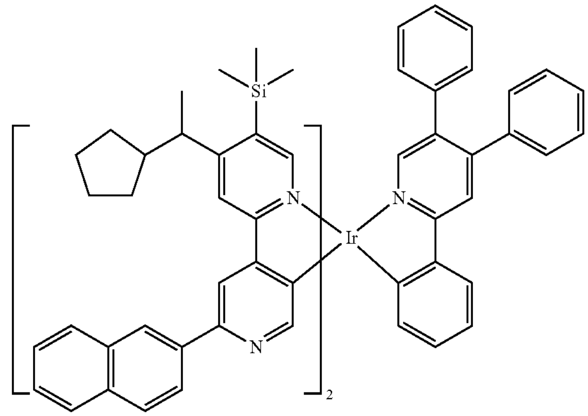

-continued
280
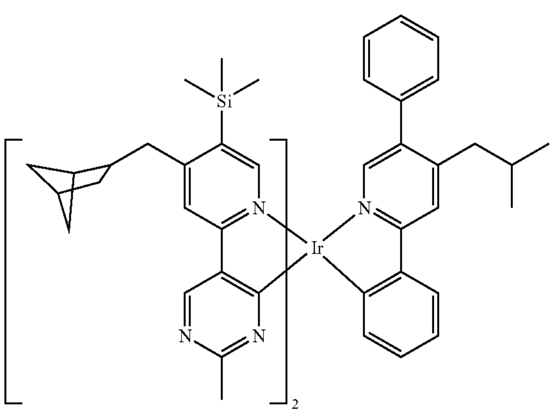
281
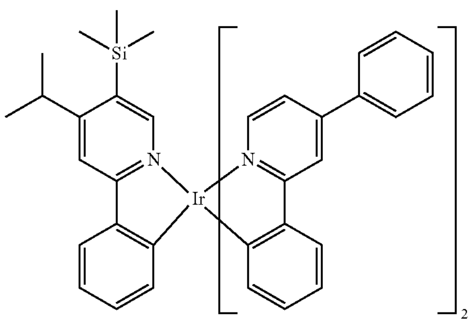
282
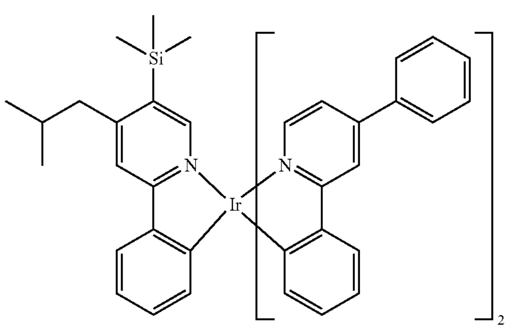
283
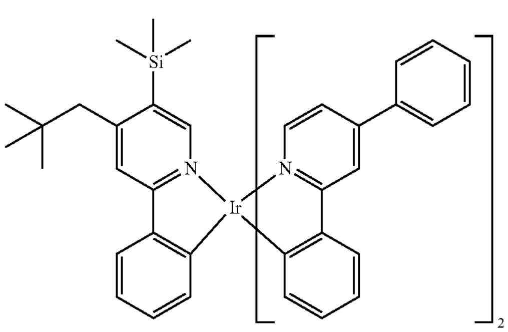
-continued
284
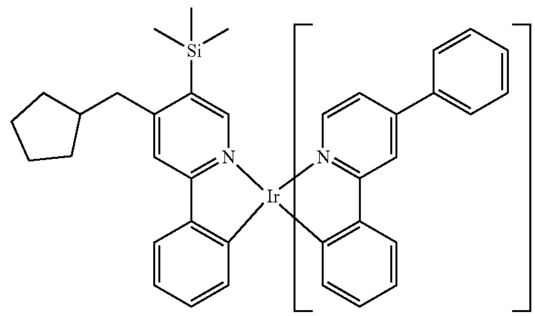
285
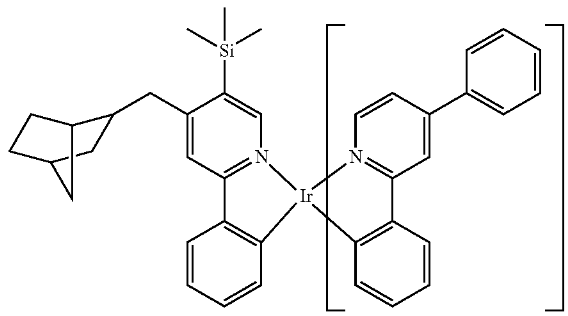
286
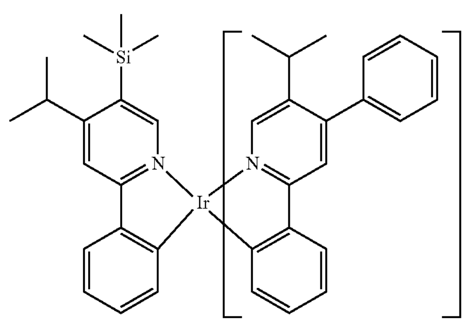
287
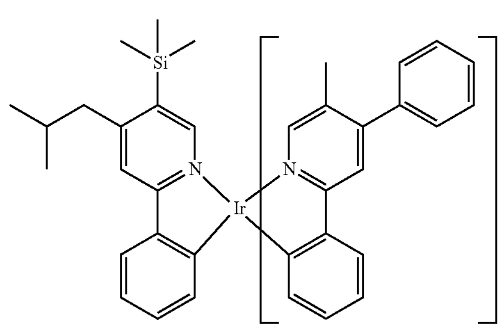

-continued
288
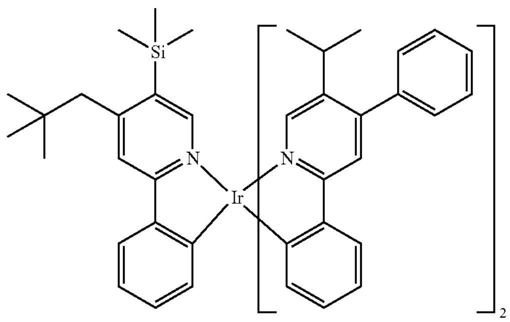
289
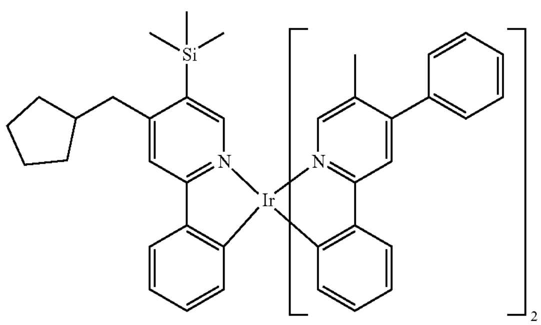
290
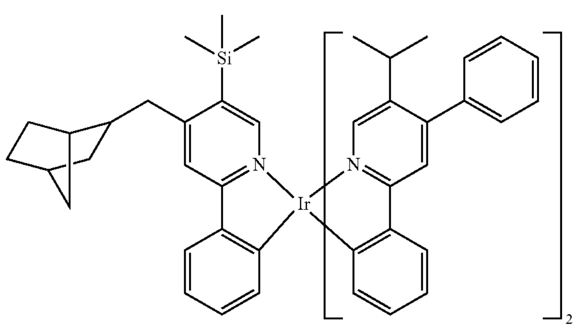
291
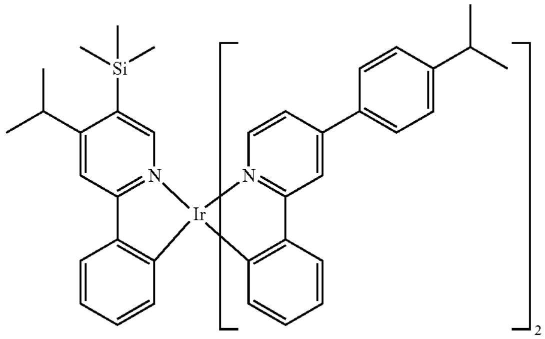
-continued
292
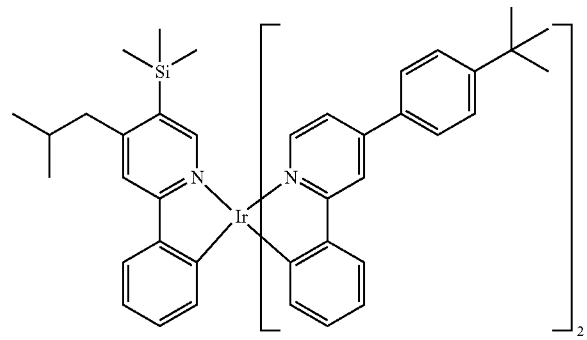
293
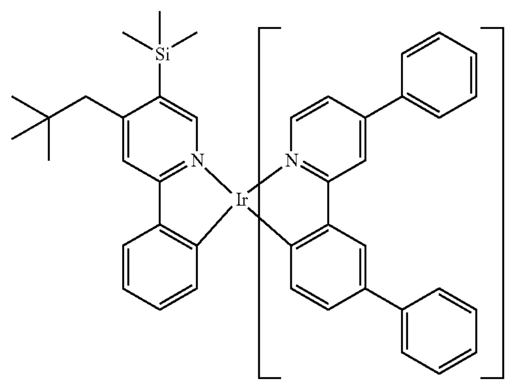
294
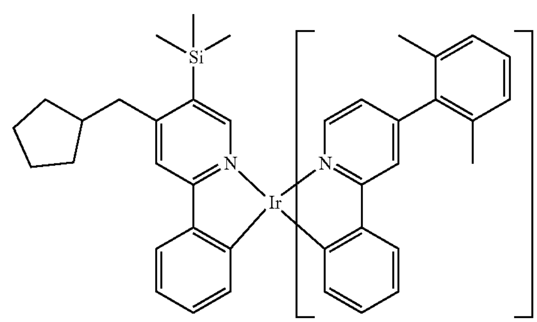
295
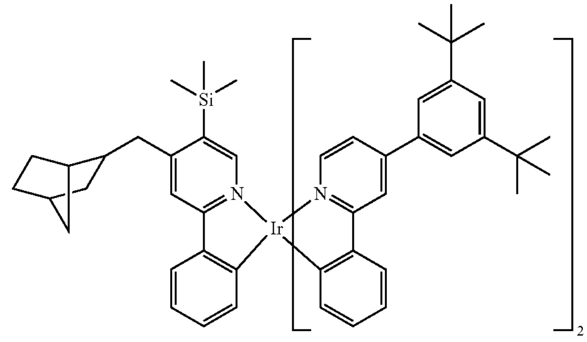

-continued
296
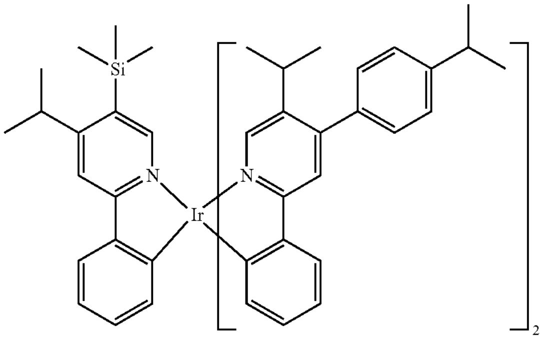
297
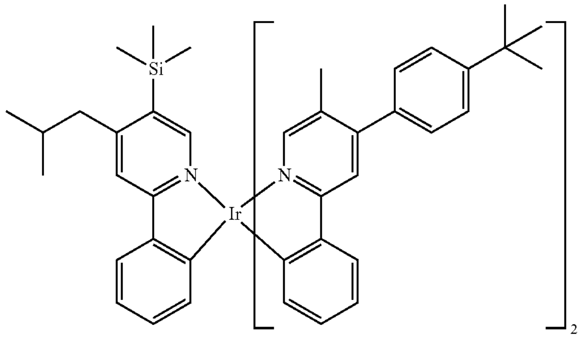
298
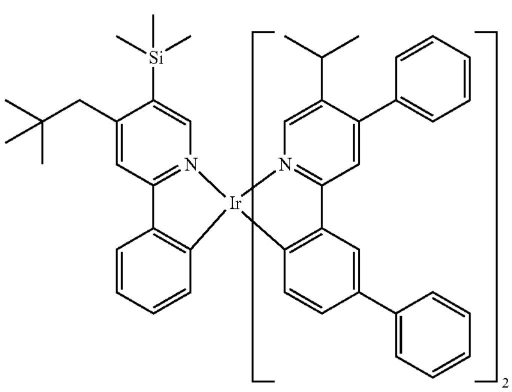
299
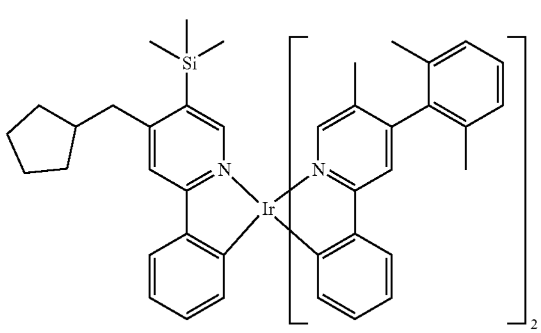
-continued
300
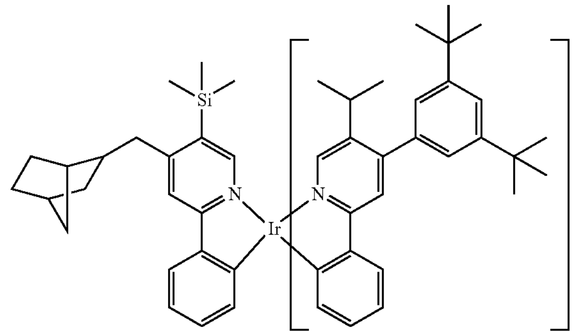
301
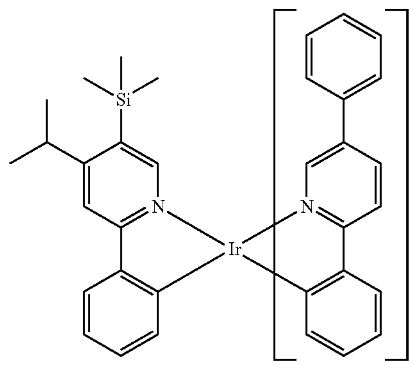
302
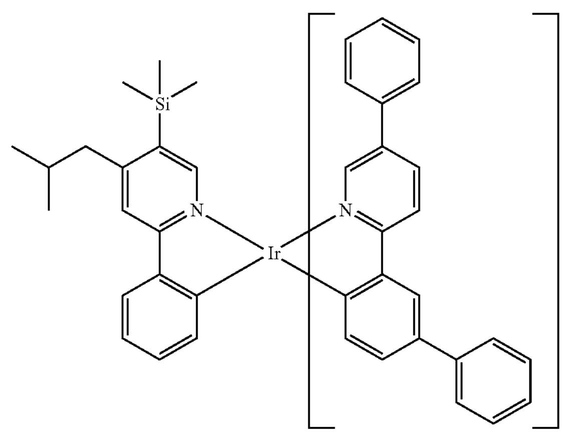
303
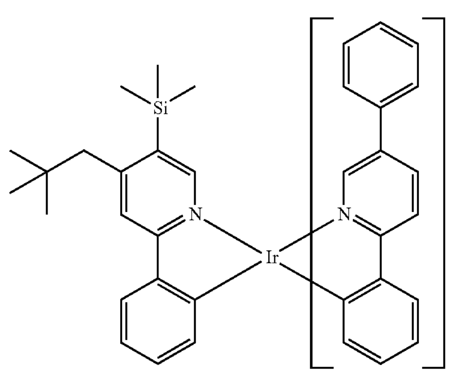

-continued
304
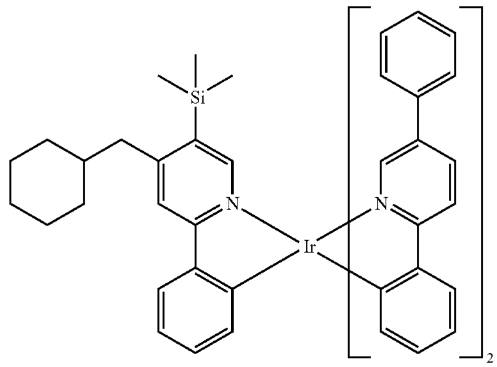
305
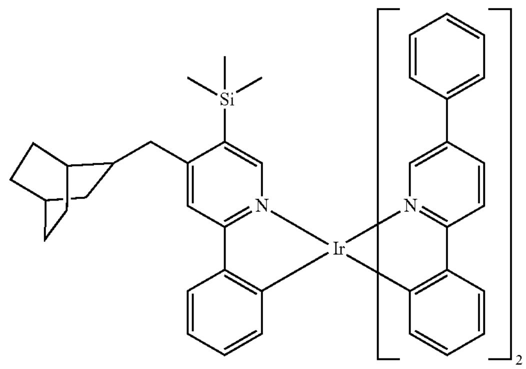
306
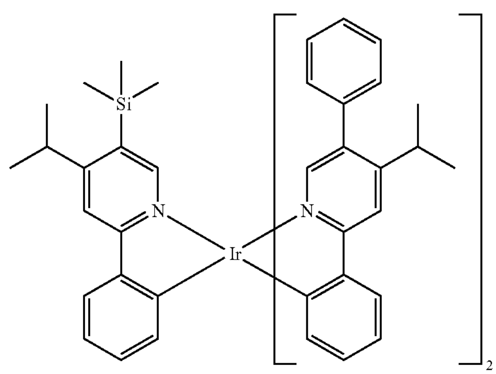
307
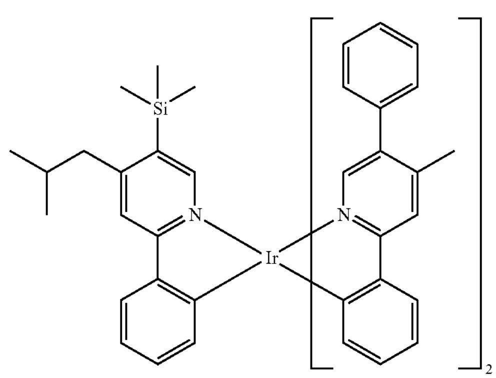
-continued
308
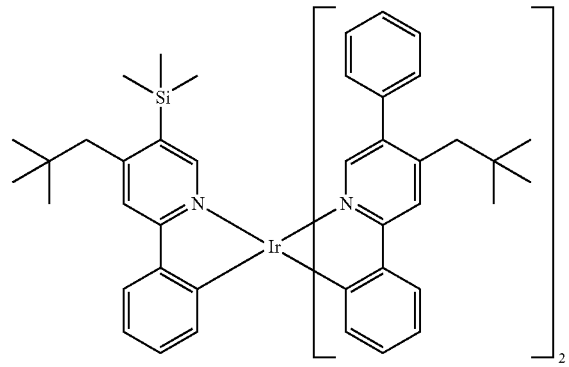
309
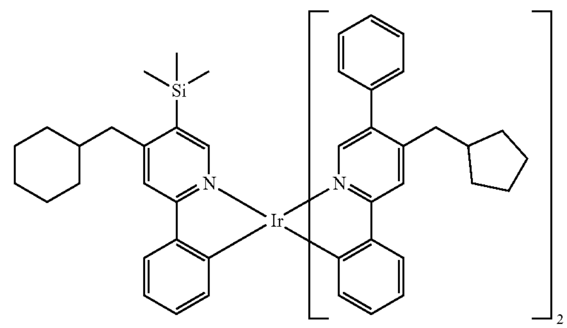
310
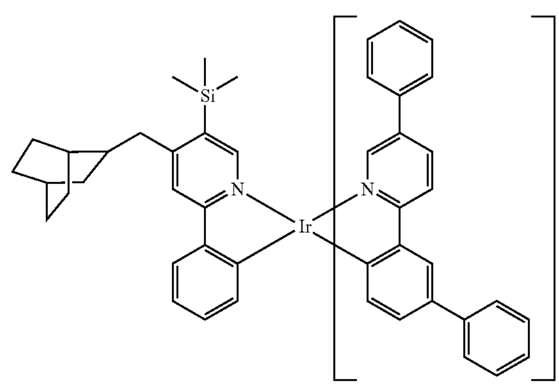
311
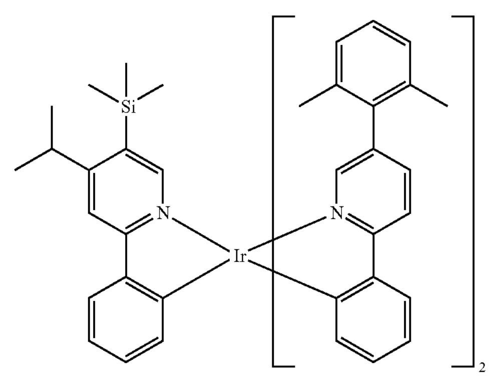

-continued
312
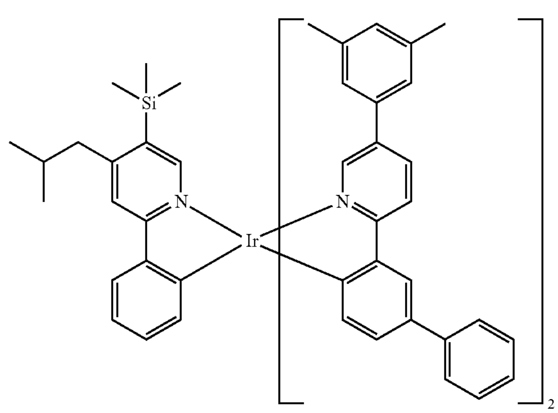
313
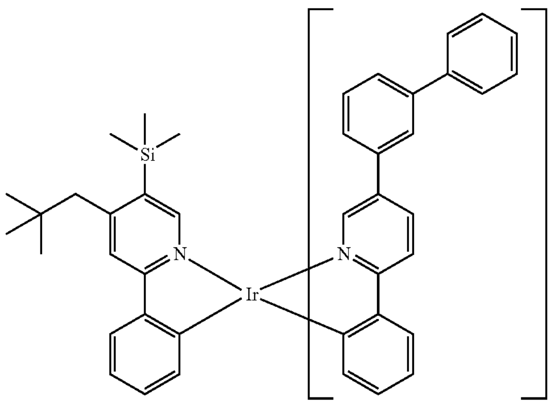
314
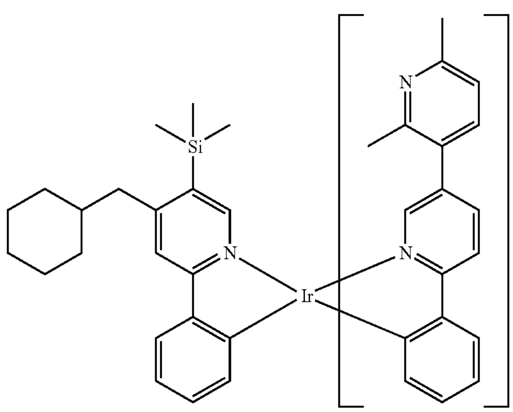
315
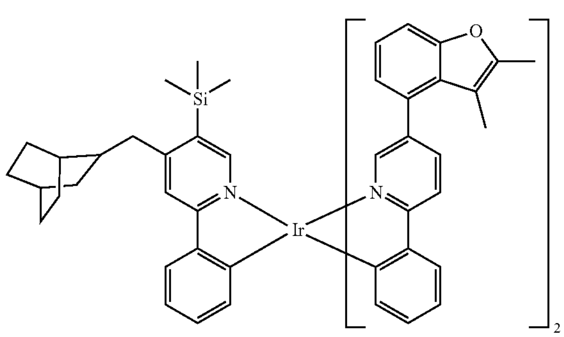
-continued
316
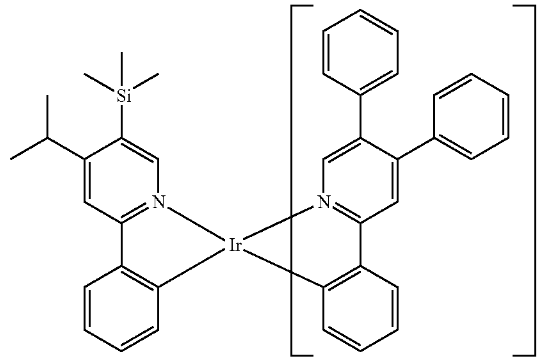
317
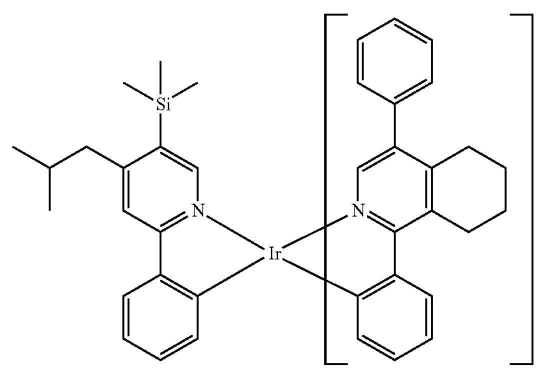
318
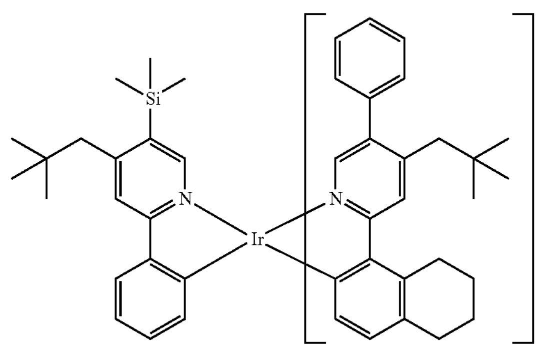
319
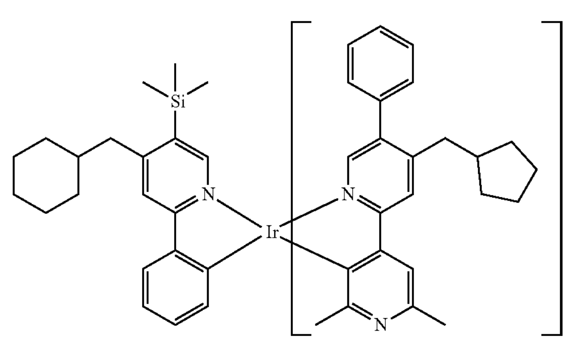

320
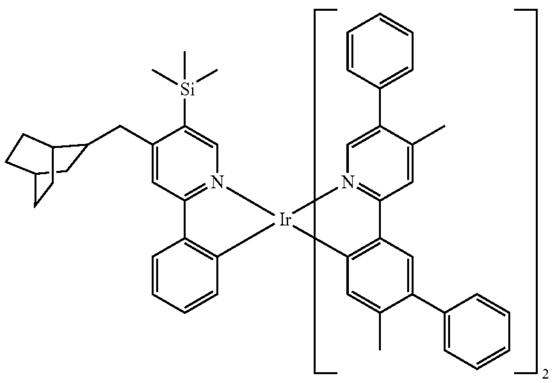
321
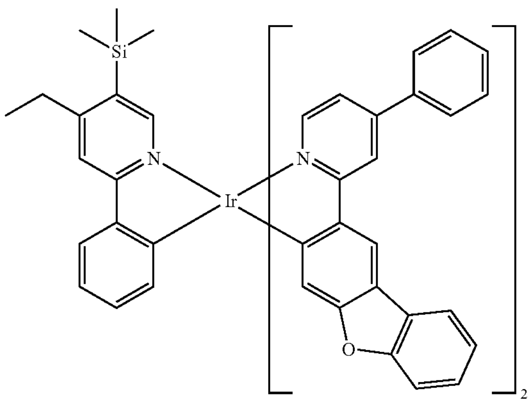
322
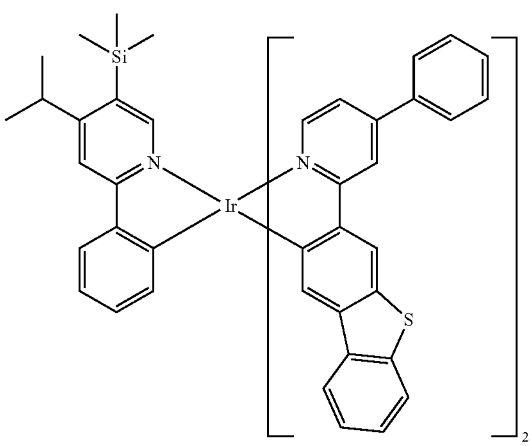
323
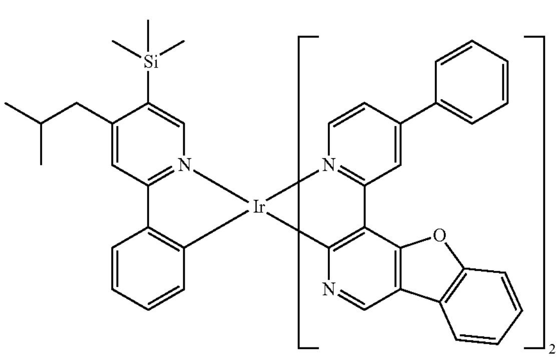
324
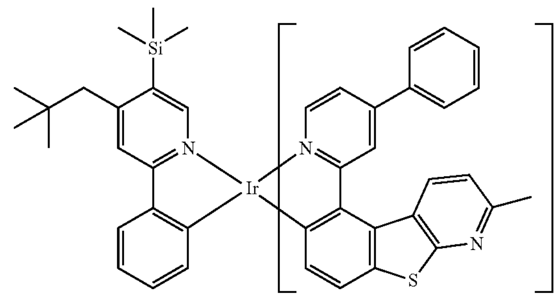
325
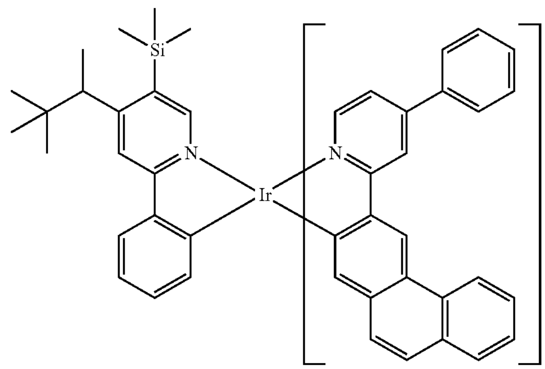
326
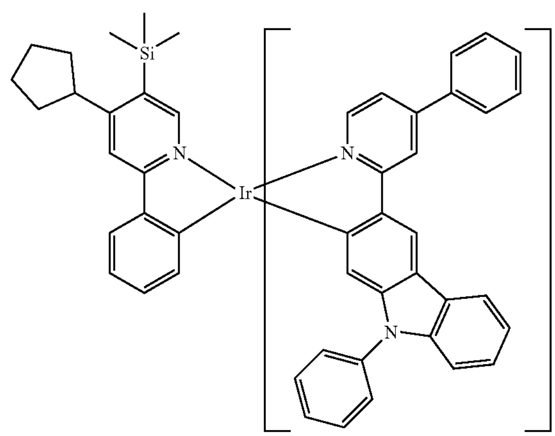
327
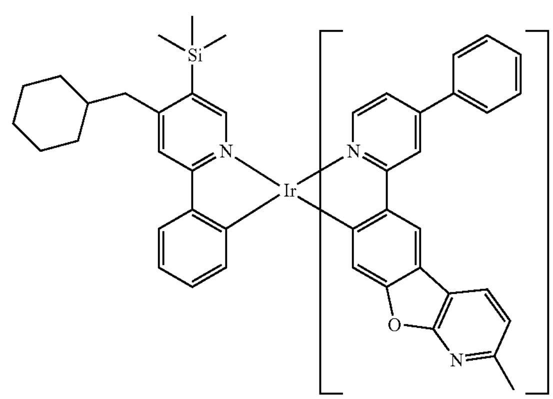

-continued
328
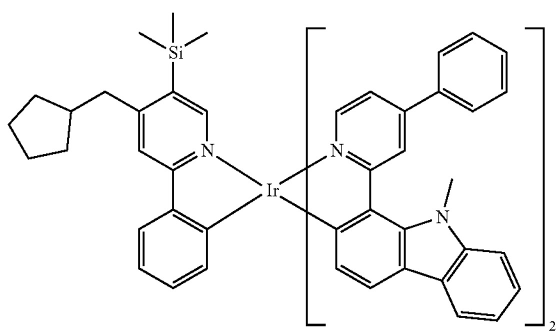
329
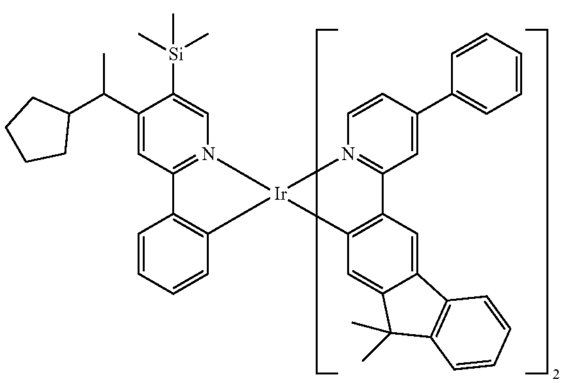
330
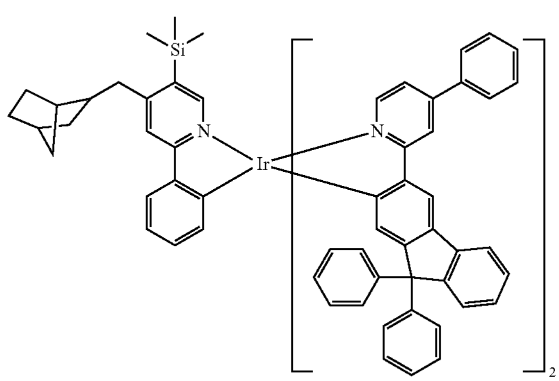
331
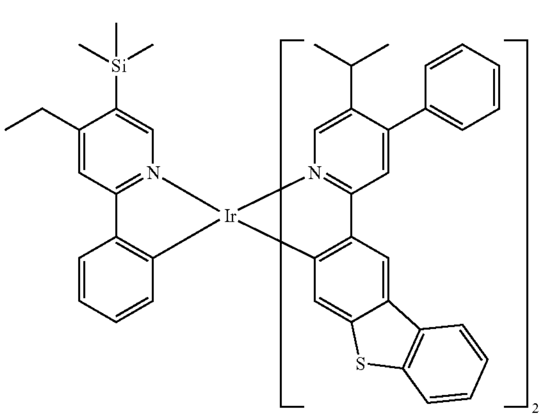
-continued
332
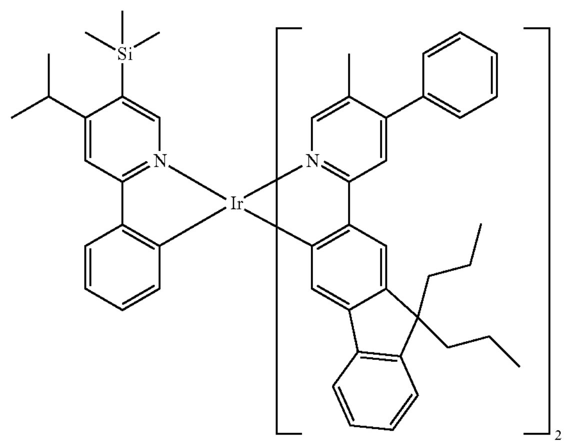
333
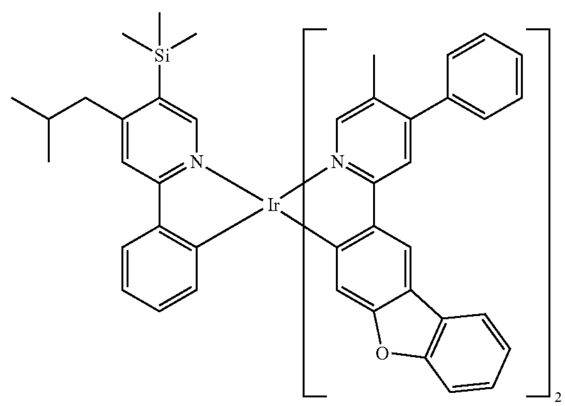
334
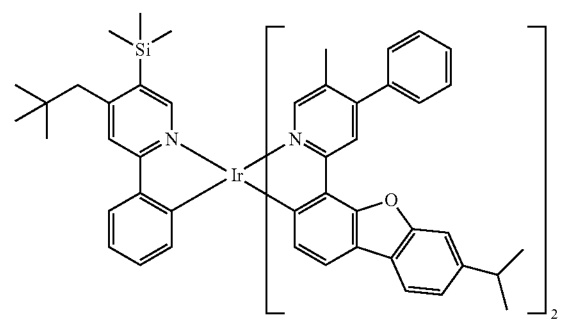
335
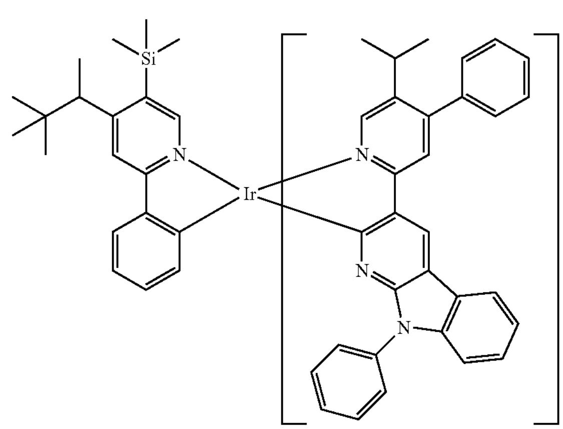

336
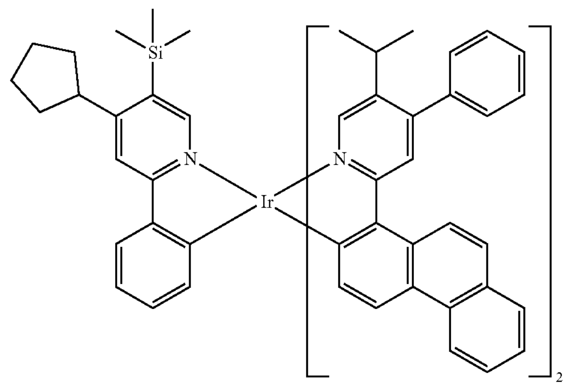
337
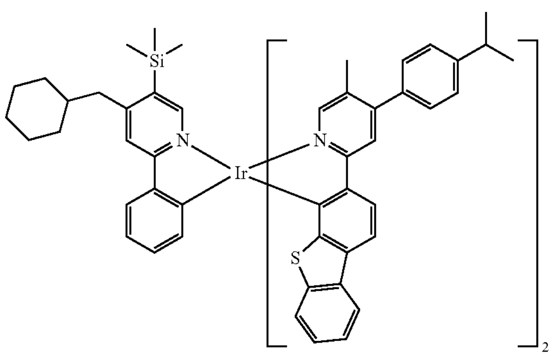
338
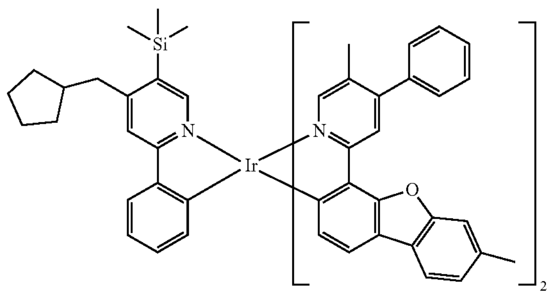
339
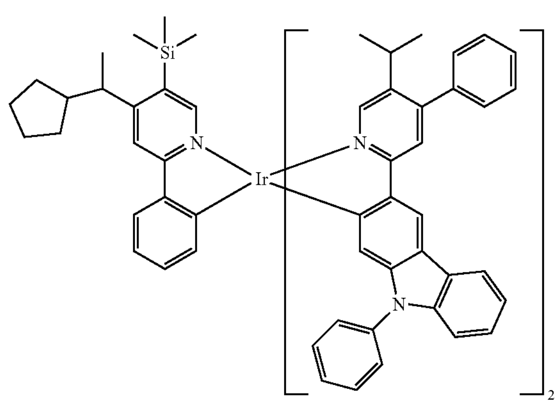
340
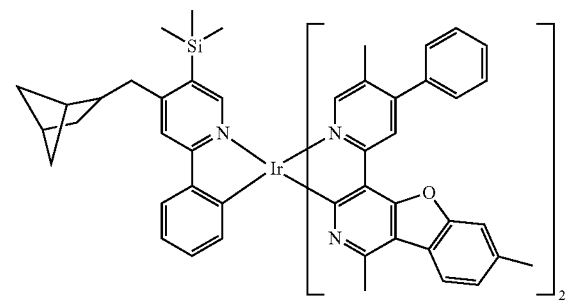
341
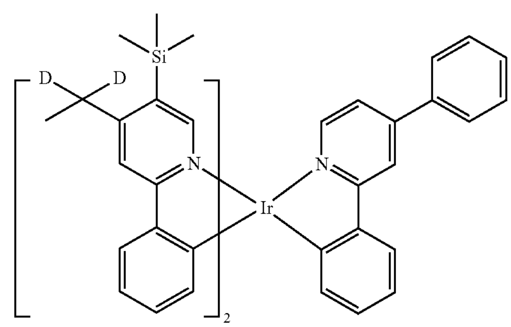
342
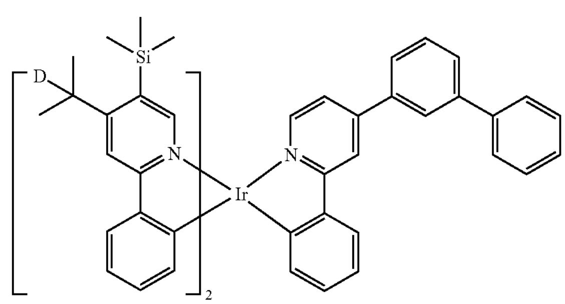
343
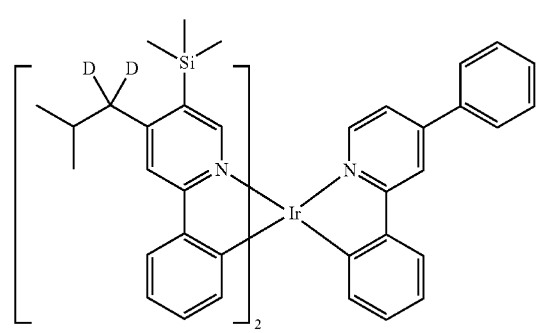

-continued
344
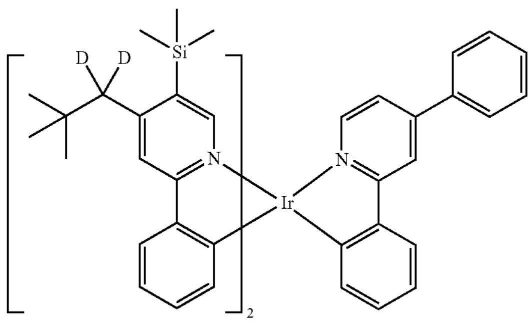
345
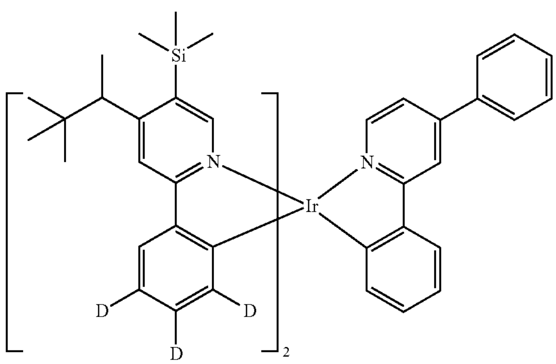
346
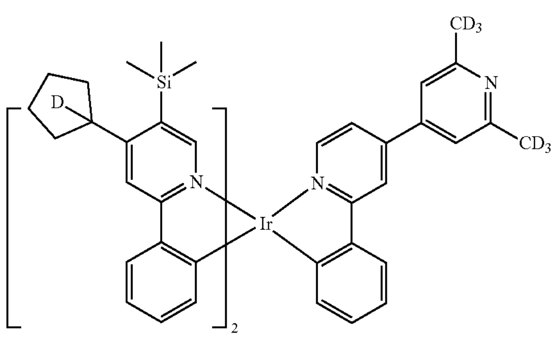
347
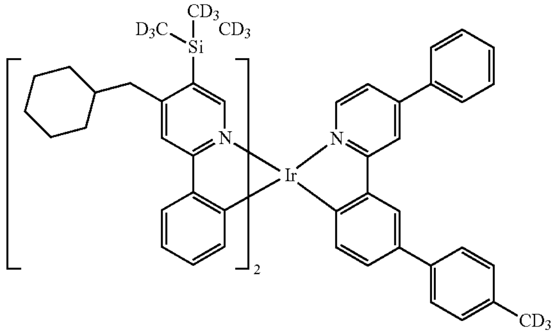
-continued
348
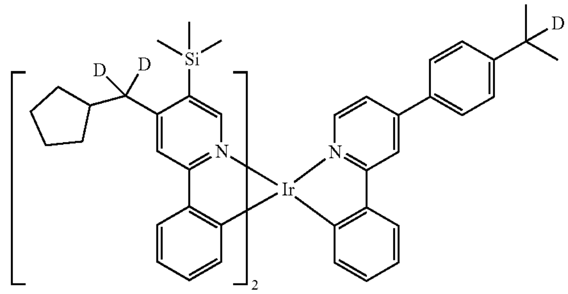
349
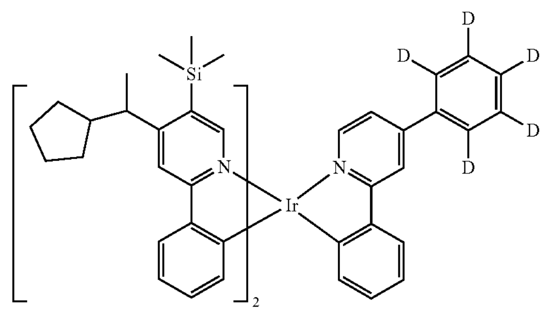
350
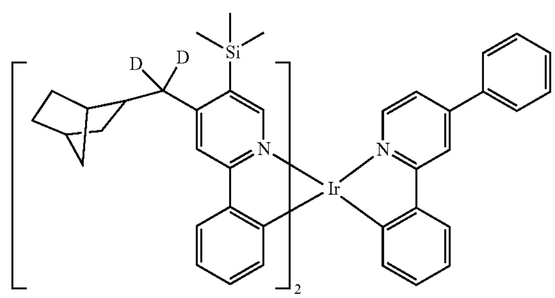
351
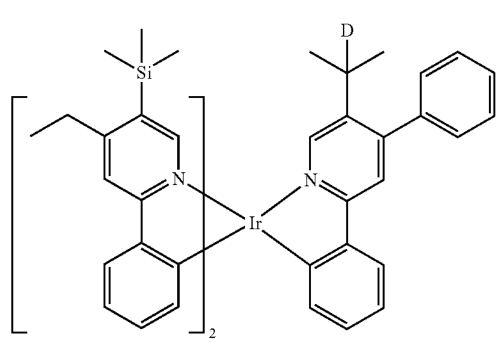

352
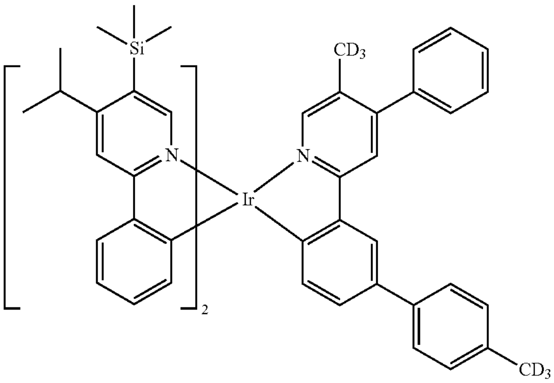
353
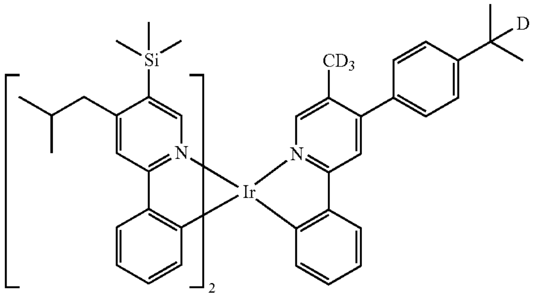
354
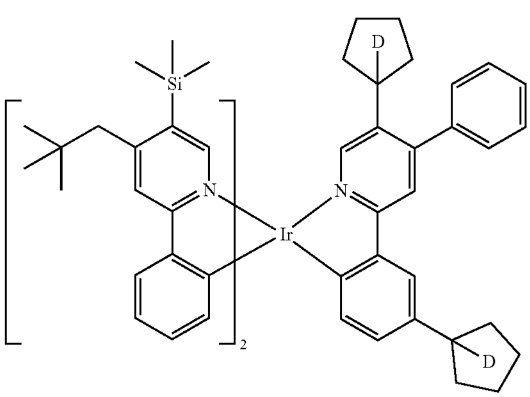
355
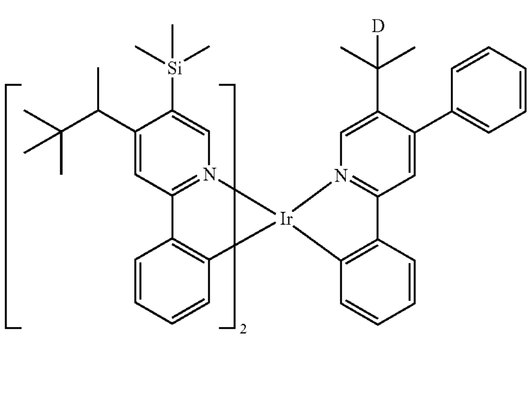
356
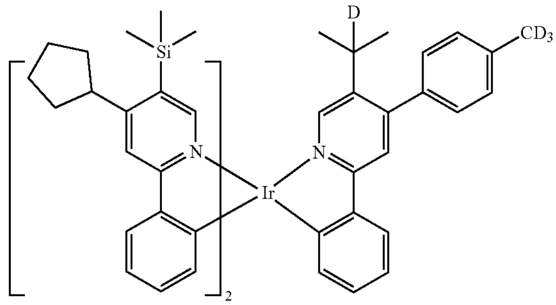
357
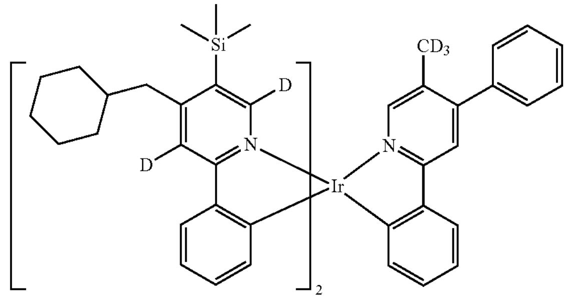
358
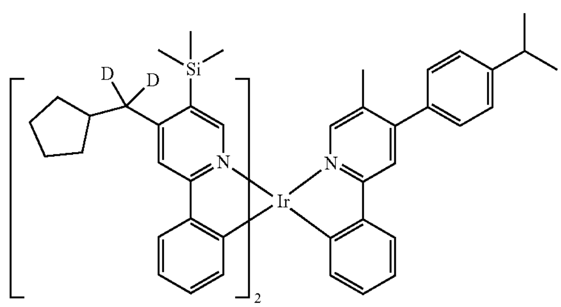
359
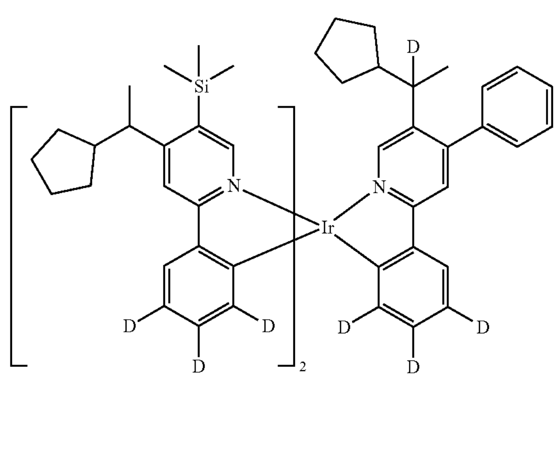

-continued
360
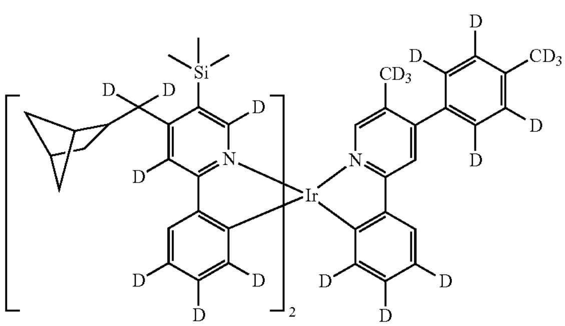
361
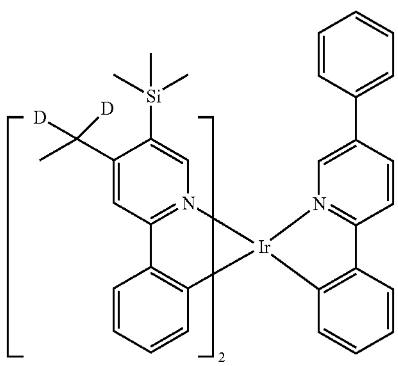
362
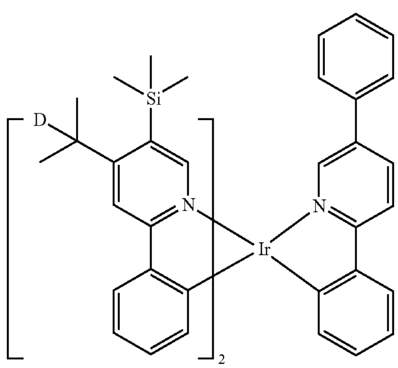
363
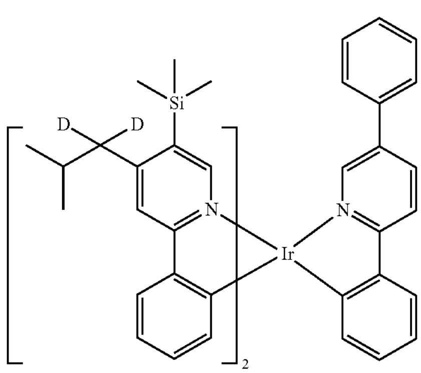
-continued
364
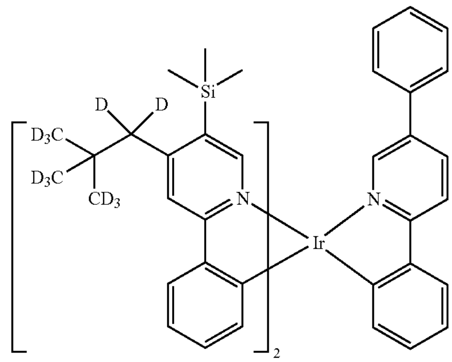
365
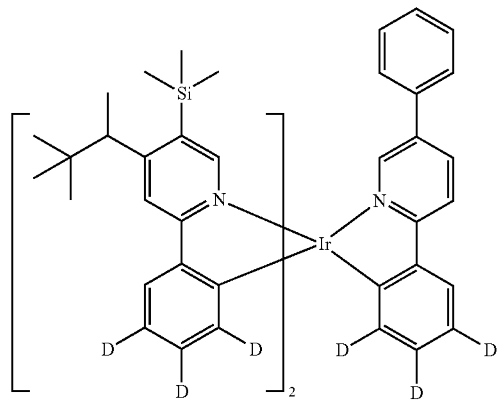
366
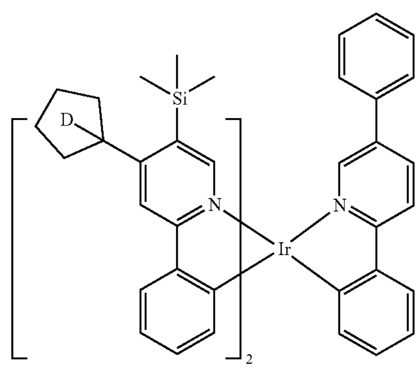
367
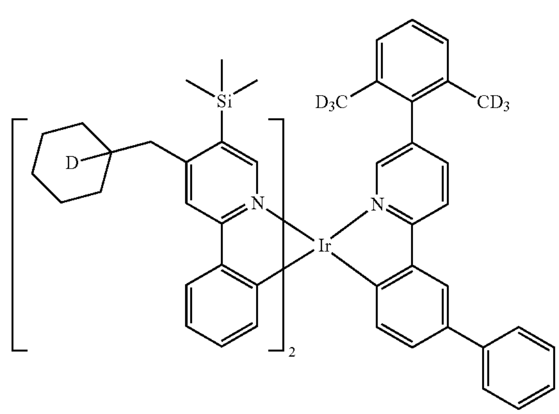

368
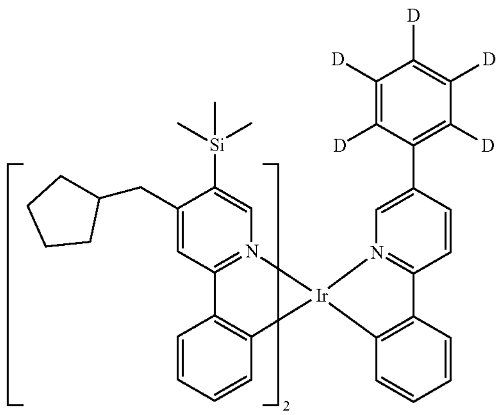
369
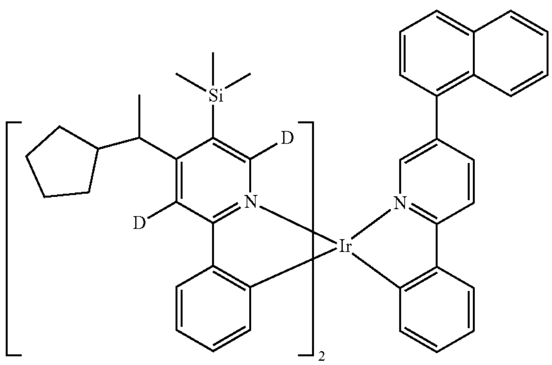
370
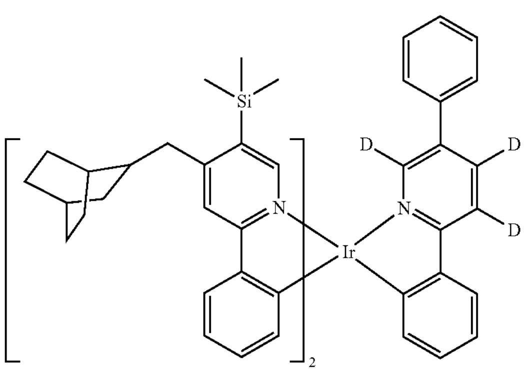
371
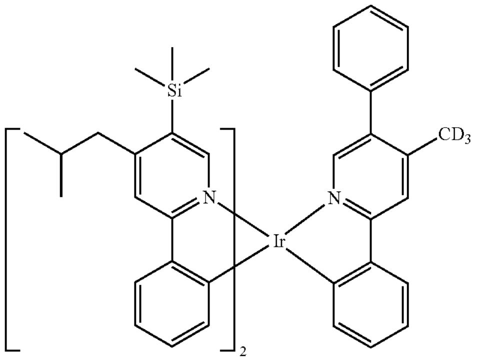
372
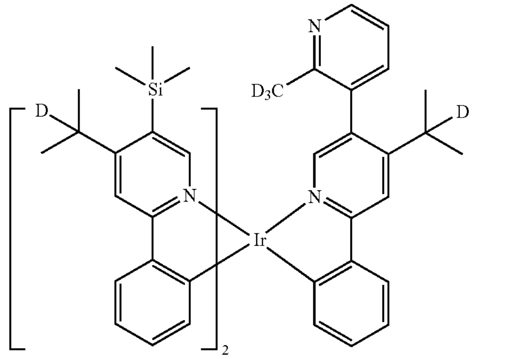
373
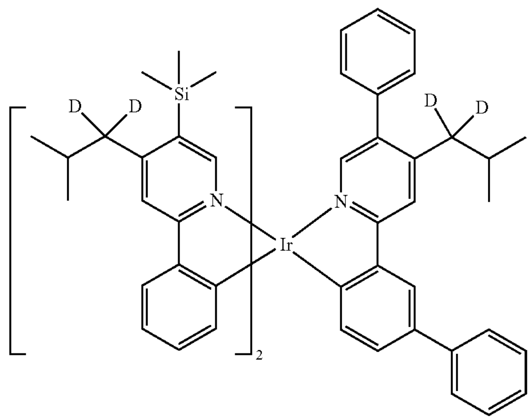
374
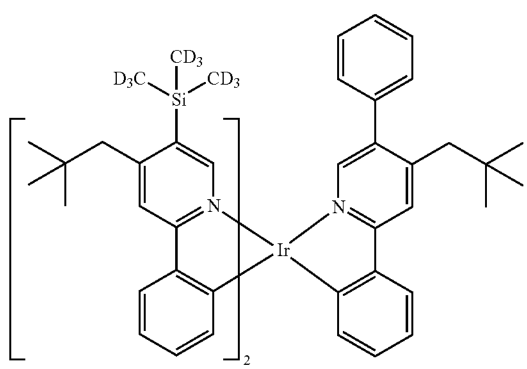
375
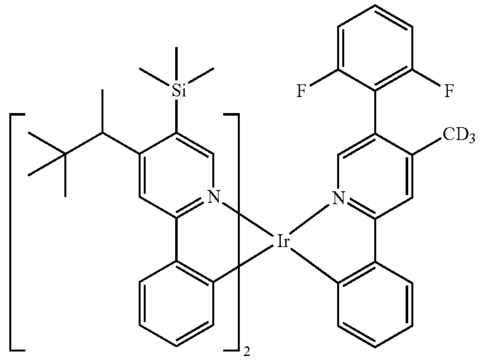

-continued
376
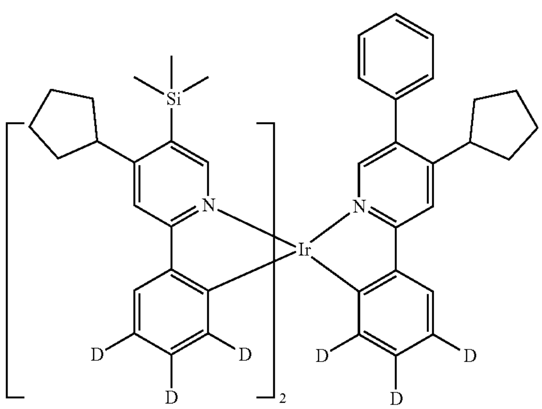
377
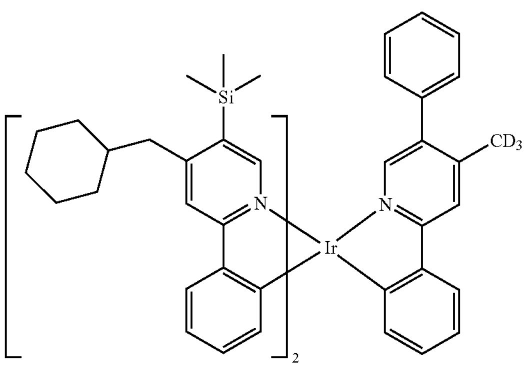
378
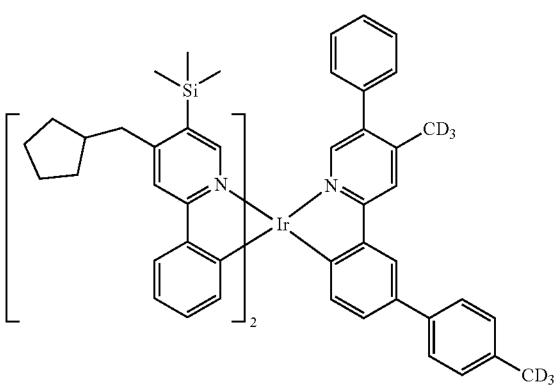
379
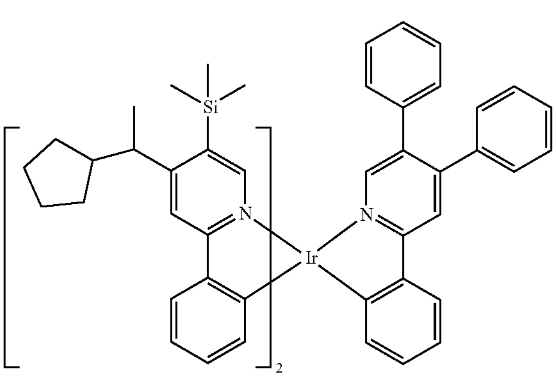
-continued
380
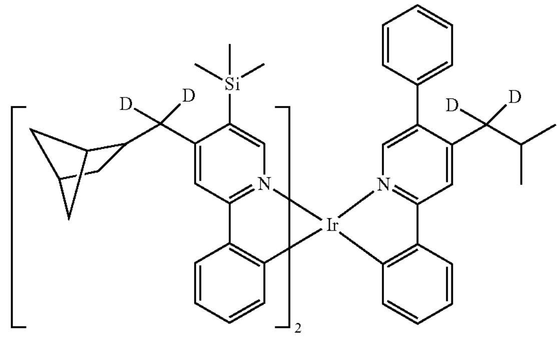
381
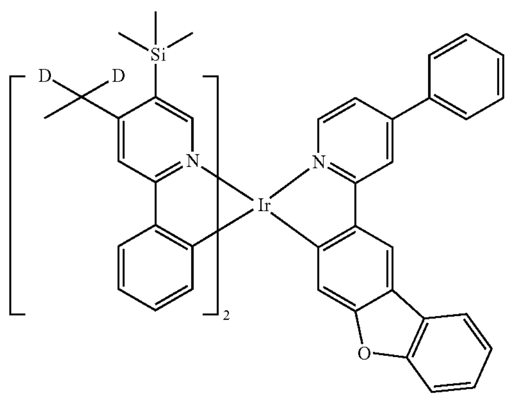
382
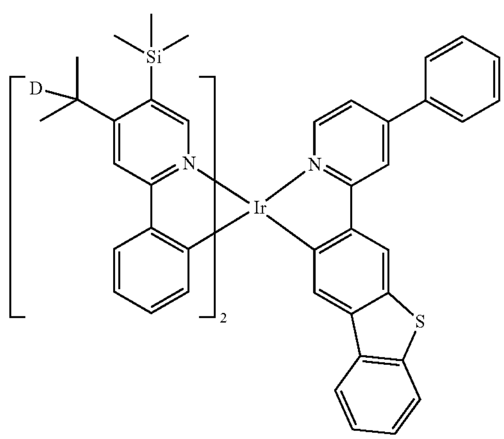
383
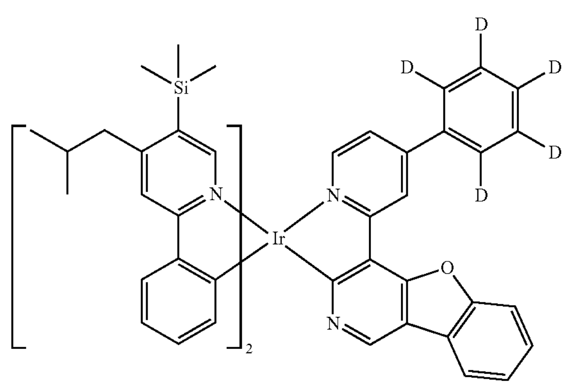

-continued
384
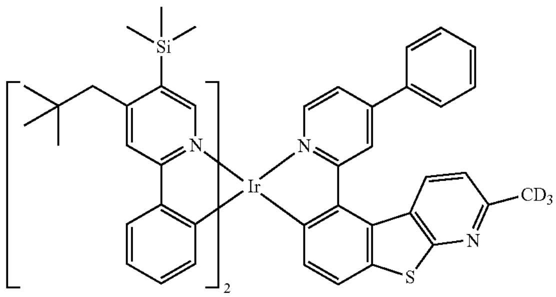
385
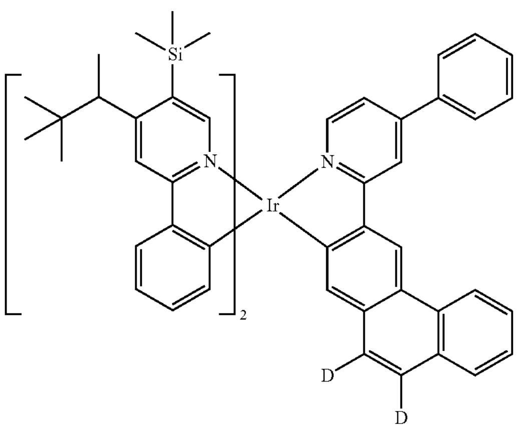
386
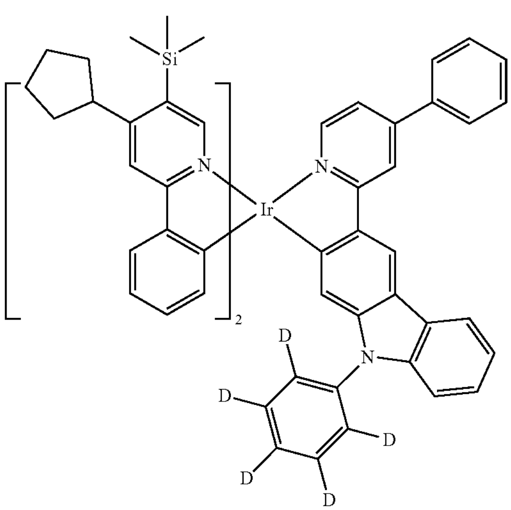
-continued
387
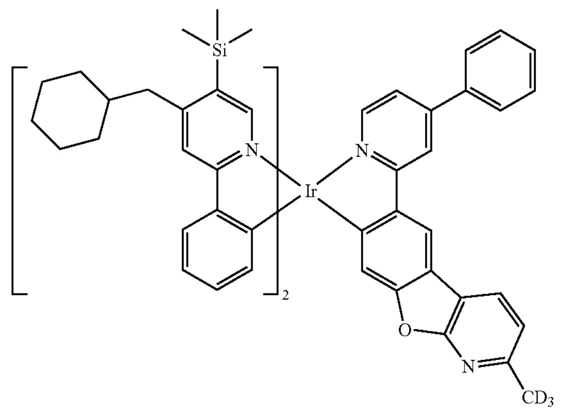
388
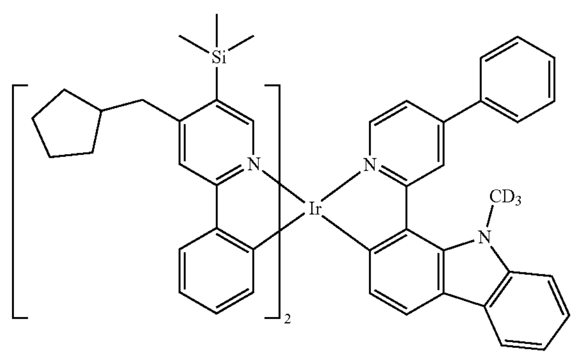
389
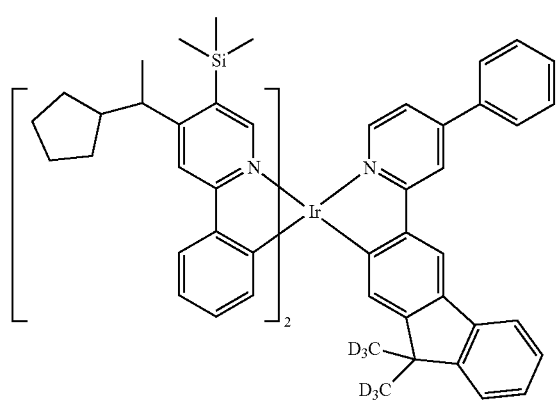

-continued
390
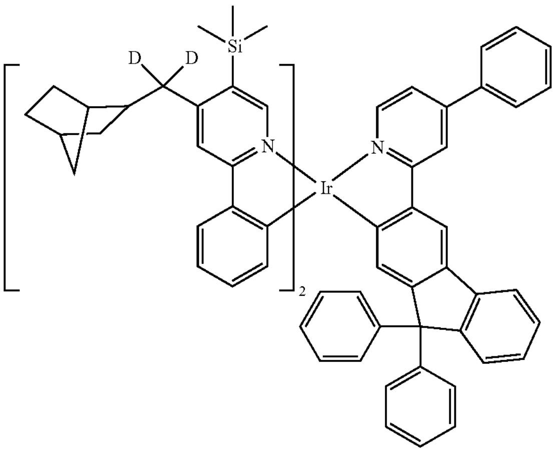
391
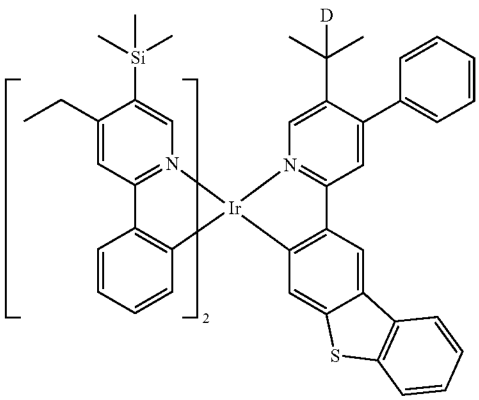
392
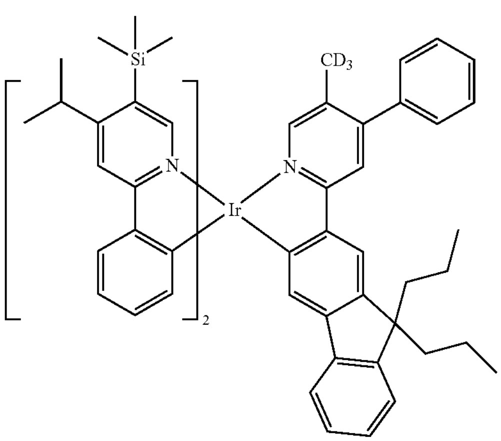
-continued
393
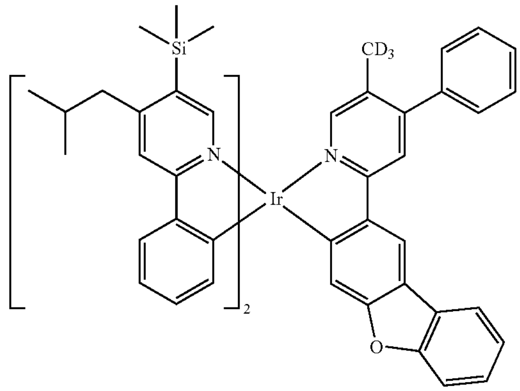
394
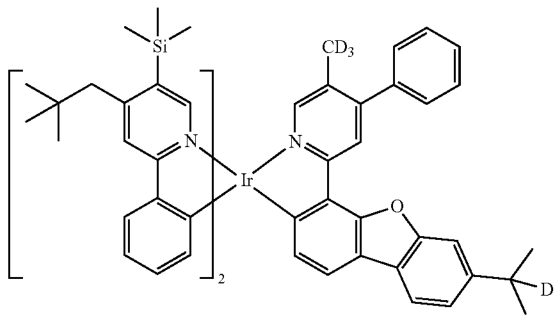
395
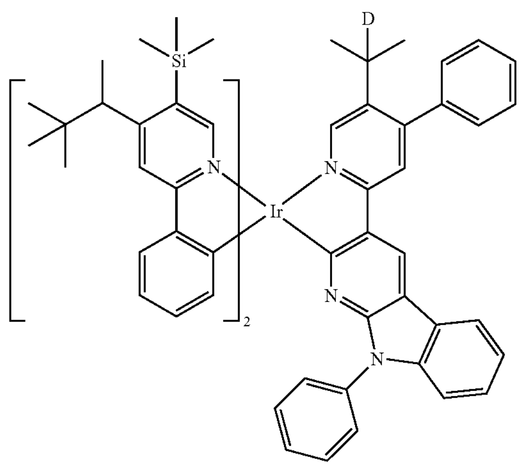
396
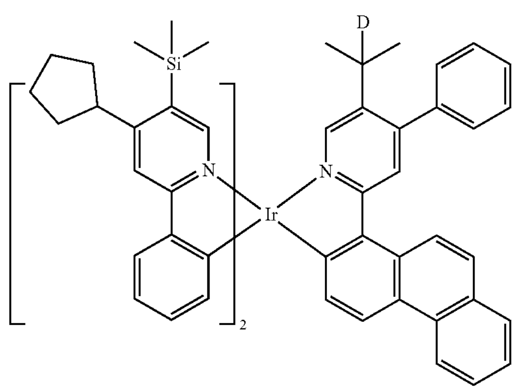

-continued
397
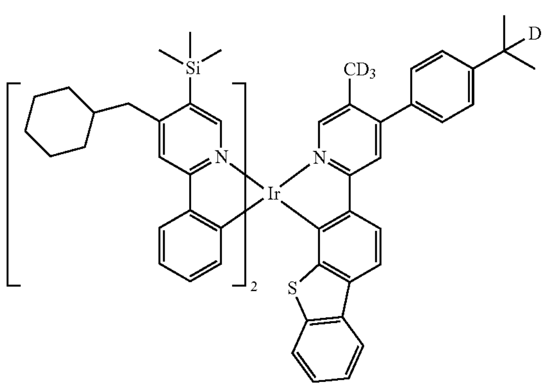
398
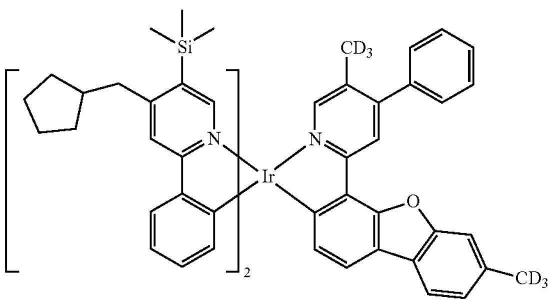
399
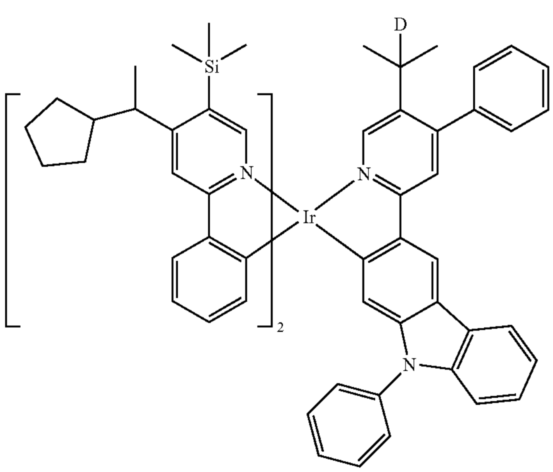
400
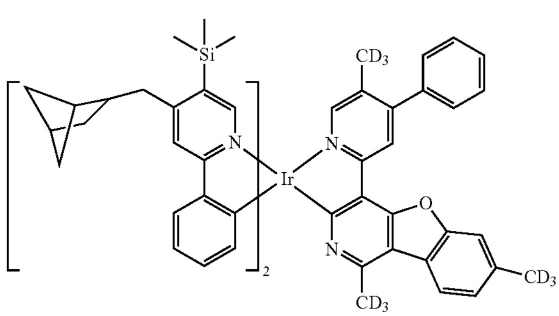
-continued
401
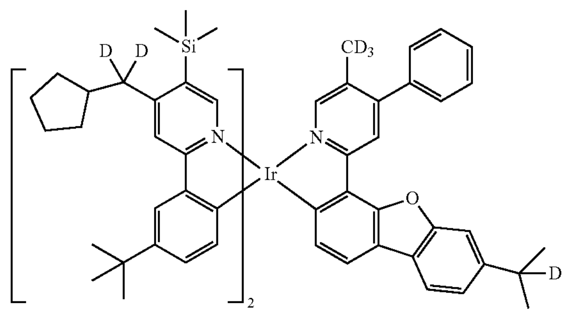
402
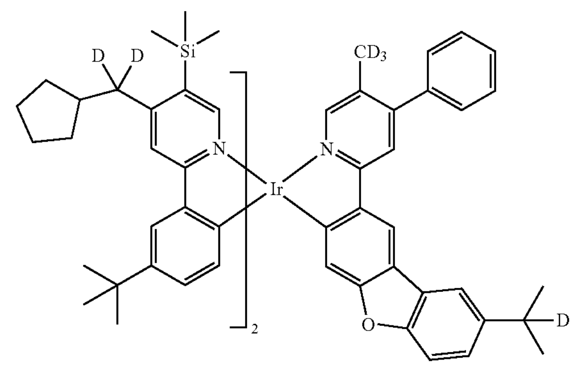
403
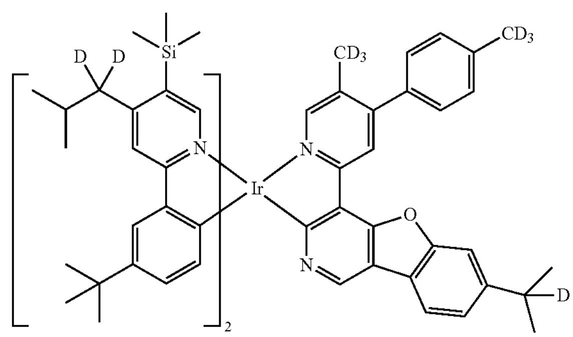
404
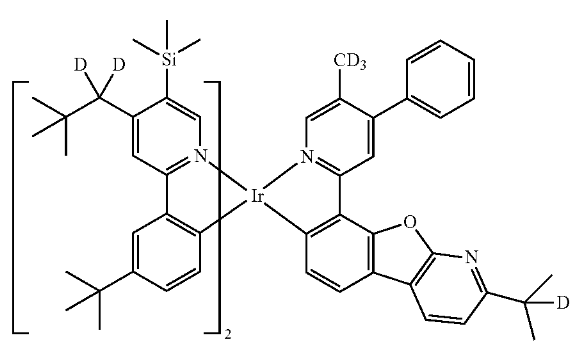

-continued
405
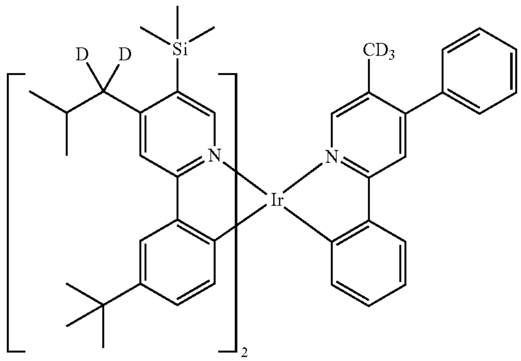
406
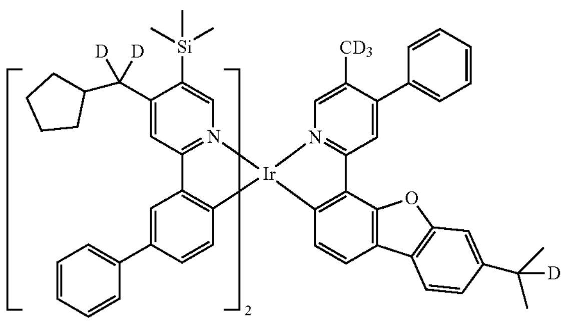
407
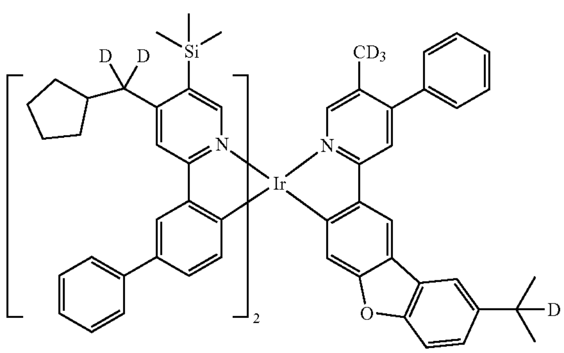
408
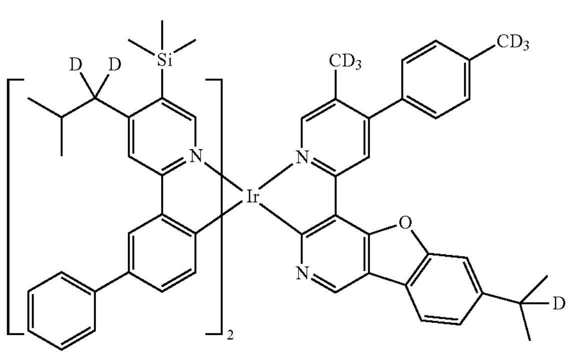
-continued
409
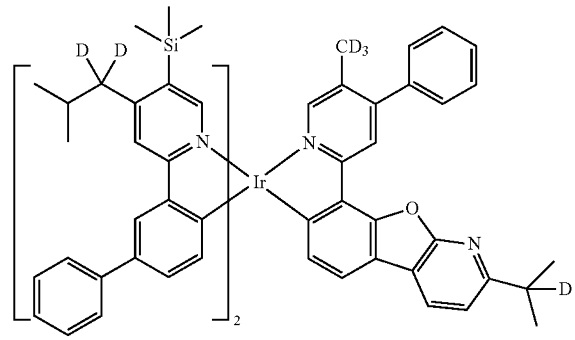
410
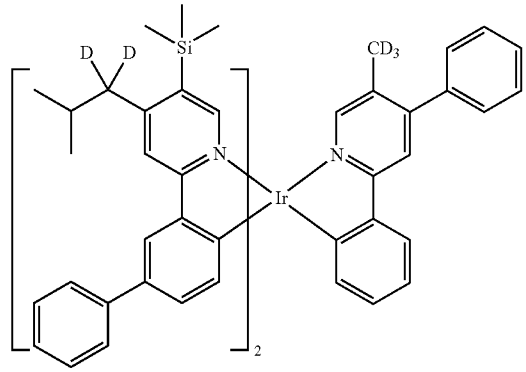
411
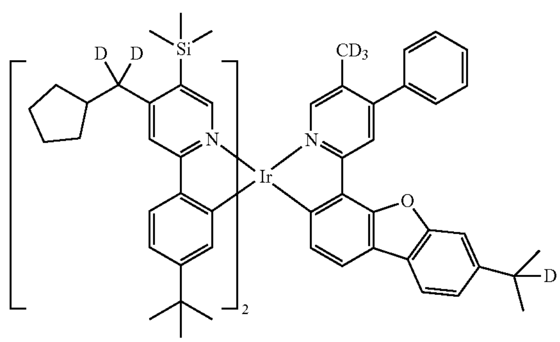
412
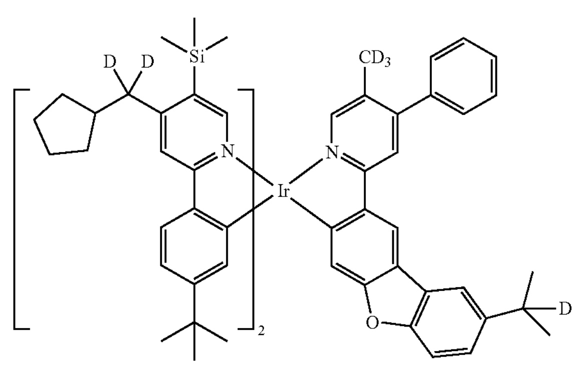

-continued

413

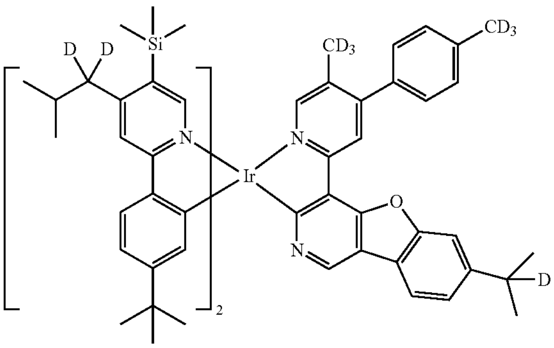

414

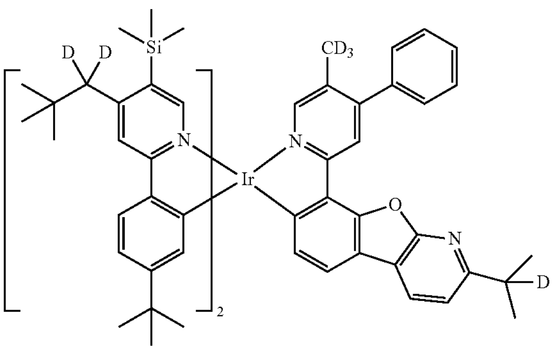

415

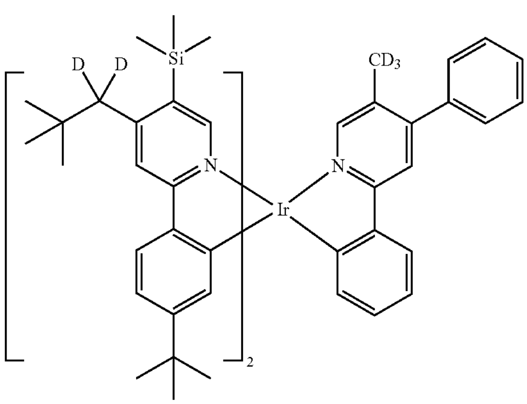

416

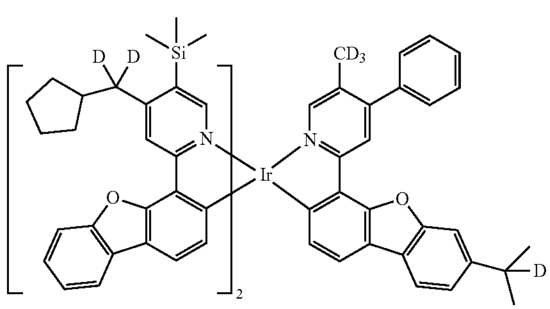

-continued

417

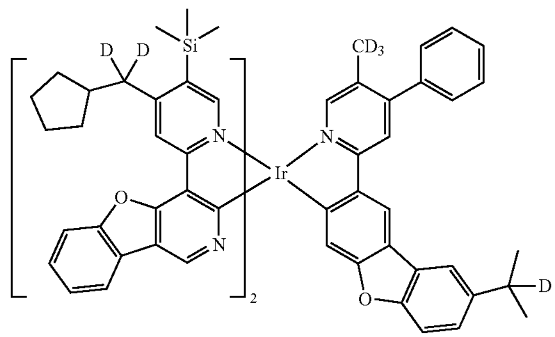

418

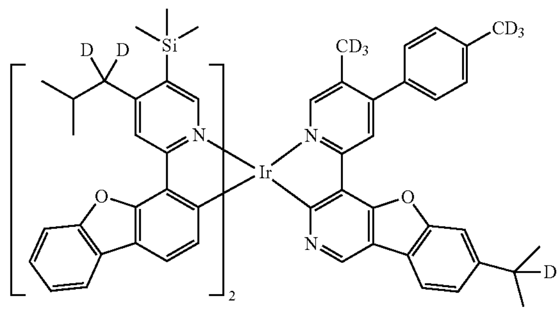

419

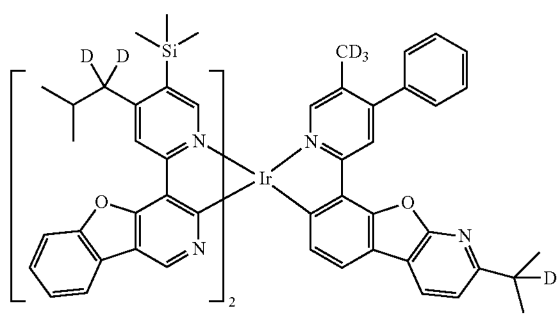

420

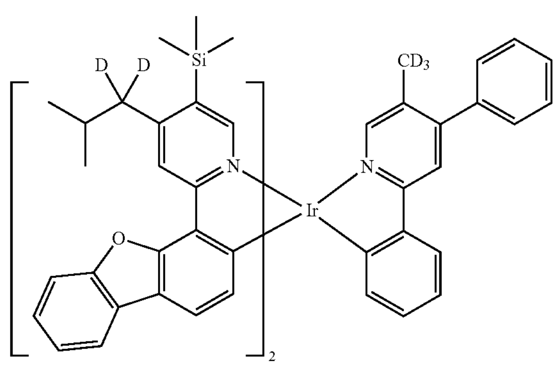

$L_1$ in the organometallic compound represented by Formula 1 may be a ligand represented by Formula 2A, n1 is the number of groups $L_1$ and may be 1 or 2, $L_2$ may be a ligand represented by Formula 2B, n2 is the number of groups $L_2$ and may be 1 or 2, and $L_1$ and $L_2$ may be different from each other. That is, the organometallic compound may be a heteroleptic complex essentially including at least one ligand represented by Formula 2A and at least one ligand represented by Formula 2B as a ligand linked to a metal M.

Without wishing to be bound by theory, since $L_2$ in Formula 1 is a ligand represented by Formula 2B, the organometallic compound represented by Formula 1 may have a highest occupied molecular orbital (HOMO) energy level, a lowest unoccupied molecular orbital (LUMO) energy level, and a Ti energy level that are suitable for a material for an electronic device, for example, a material for an organic light-emitting device. Therefore, an electronic device, for example, an organic light-emitting device, which includes the organometallic compound represented by Formula 1, may have excellent luminescence efficiency and lifespan characteristics.

$R_{12}$ in Formula 2B is neither hydrogen nor a methyl group. As such, the organometallic compound represented by Formula 1 may emit light that is shifted toward relatively shorter wavelengths, for example, blue light, green light, or greenish blue light, and an electronic device, for example, an organic light-emitting device, including the organometallic compound may have an excellent out-coupling effect as well as high emission efficiency.

In Formula 2B, a silyl group is bonded to the fifth position of a pyridine ring (see Formula 2B). Without wishing to be bound by theory, due to this bonding, the organometallic compound including the ligand represented by Formula 2B has excellent heat resistance and decomposition resistance characteristics. Accordingly, an electronic device, for example, an organic light-emitting device, including the organometallic compound has high stability during manufacturing, preserving, and/or driving, and a long lifespan.

Furthermore, the pyridine ring in Formula 2A may be substituted with ring $CY_1$(s) in the number of c1. Accordingly, the orientation characteristics of the organometallic compound represented by Formula 1 are improved, thereby providing high luminescence efficiency for an electronic device, for example, an organic light-emitting device, which includes the organometallic compound.

Highest occupied molecular orbital (HOMO) energy level, lowest unoccupied molecular orbital (LUMO) energy level, singlet ($S_1$) energy level, and triplet ($T_1$) energy level of some of the organometallic compound represented by Formula 1 was evaluated by using a Gaussian 09 program accompanied with optimization of molecular structure according to B3LYP-based density functional theory (DFT). Results thereof are shown in Table 1, where the values are in electron volts (eV).

TABLE 1

| Compound No. | HOMO (eV) | LUMO (eV) | $S_1$ (eV) | $T_1$ (eV) |
|---|---|---|---|---|
| 13 | −4.712 | −1.232 | 2.783 | 2.555 |
| 53 | −4.717 | −1.197 | 2.827 | 2.559 |
| 163 | −4.735 | −1.232 | 2.787 | 2.543 |
| 405 | −4.657 | −1.228 | 2.746 | 2.534 |

From Table 1, it is confirmed that the organometallic compound represented by Formula 1 has such electric characteristics that are suitable for use in an electronic device, for example, for use as a dopant for an organic light-emitting device.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an emission layer, wherein the organic layer includes at least one organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, and excellent color purity.

The organometallic compound of Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit, for example, green light or blue light.

The expression "(an organic layer) includes at least one organometallic compounds" used herein may include a case in which "(an organic layer) includes identical organometallic compounds represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In another embodiment, the organic layer may include, as the organometallic compound, Compound 1 and Compound 2. In this regard, Compound 1 and Compound 2 may exist in the same layer (for example, Compound 1 and Compound 2 all may exist in the emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In an embodiment, in the organic light-emitting device, the first electrode is an anode, and the second electrode is a cathode, and the organic layer further includes a hole transport region disposed between the first electrode and the emission layer and an electron transport region disposed between the emission layer and the second electrode, and the hole transport region includes a hole injection layer, a hole transport layer, an electron blocking layer, a buffer layer, or any combination thereof, and the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including a metal.

FIGURE is a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed, for example, by depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), and zinc oxide (ZnO). In an embodiment, magnesium (Mg), aluminum (Al), aluminum-lithium (Al—Li), calcium (Ca), magnesium-indium (Mg—In), or magnesium-silver (Mg—Ag) may be used as the material for forming the first electrode.

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only one of a hole injection layer or a hole transport layer. In another embodiment, the hole transport region may have a hole injection layer/hole transport layer structure or a hole injection layer/hole transport layer/electron blocking layer structure, which are sequentially stacked in this stated order in a direction extending from the first electrode 11.

A hole injection layer may be formed on the first electrode 11 by using one or more exemplary methods selected from vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about 10-8 torr to about 10-3 torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, and a compound represented by Formula 202 below:

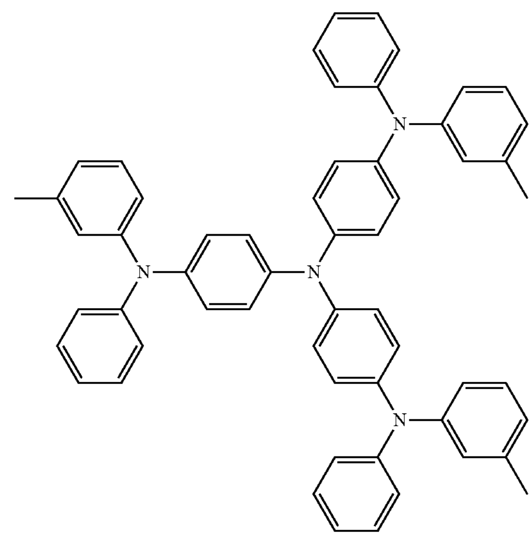

m-MTDATA

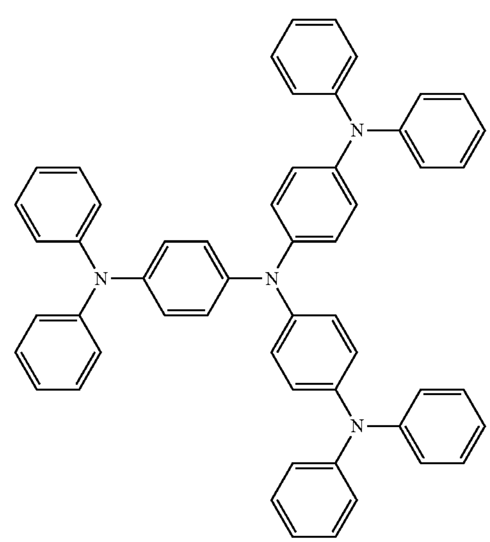

TDATA

-continued
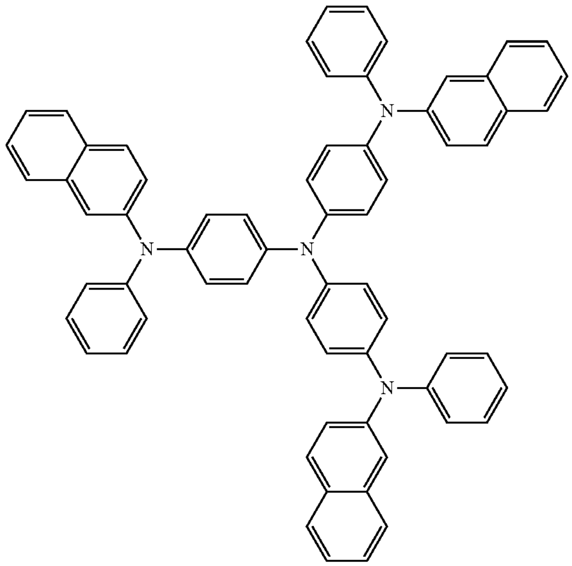
2-TNATA
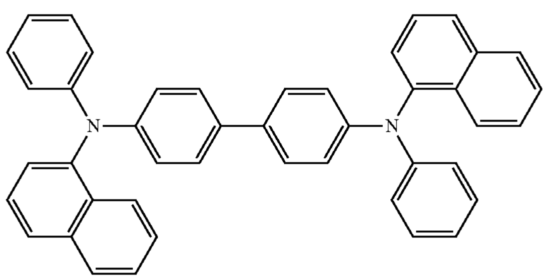
NPB
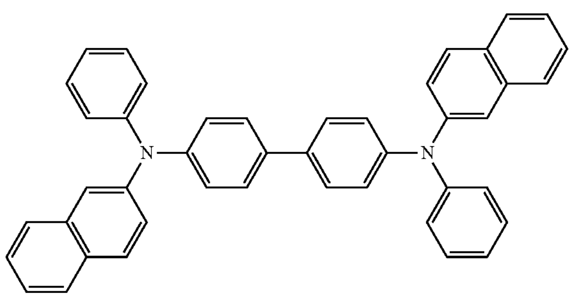
β-NPB
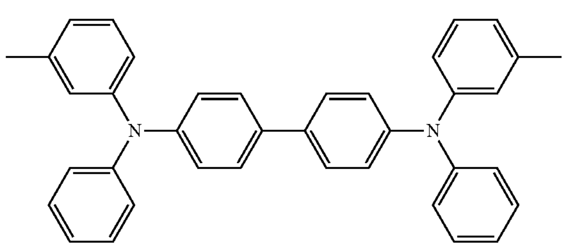
TPD
-continued
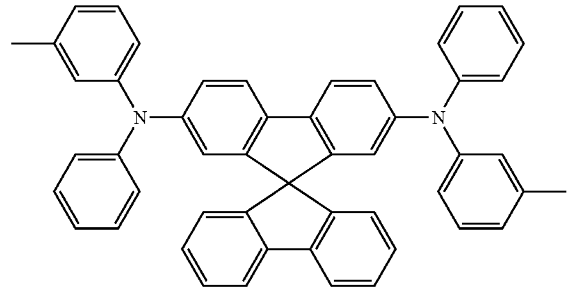
Spiro-TPD
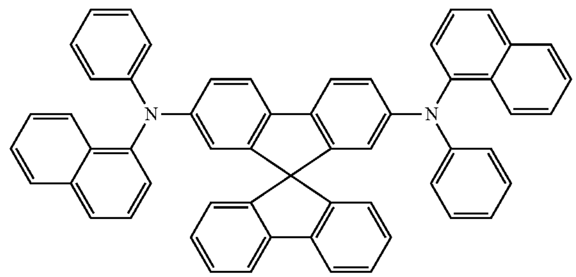
Spiro-NPB
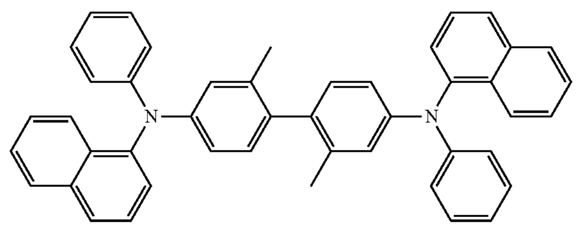
methylated NPB
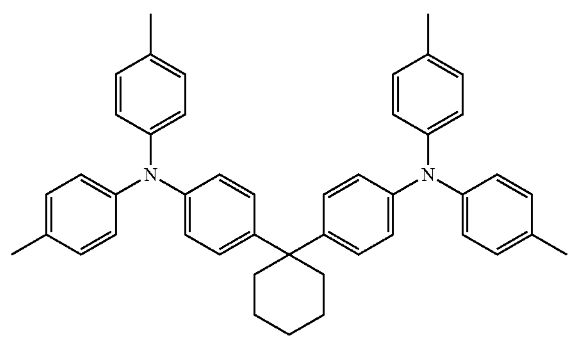
TAPC
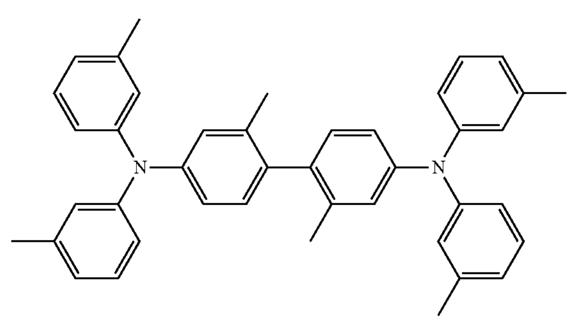
HMTPD -continued Formula 201

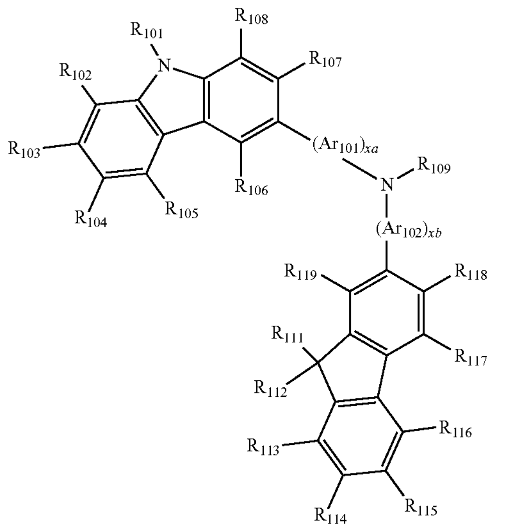

Formula 202

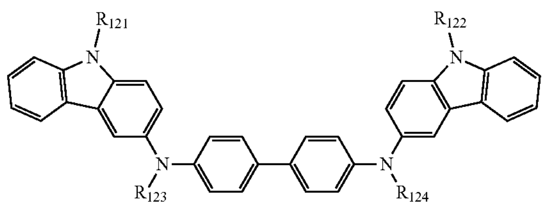

$Ar_{101}$ and $Ar_{102}$ in Formula 201 may each independently be selected from:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylfuorantenylene group, or a pentacenyene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_5$-$C_{60}$ aryl group, a $C_5$-$C_{60}$ aryloxy group, a $C_5$-$C_{60}$ arylthio group, a $C_1$-$C_{60}$ heteroaryl group, a monovalent non-aromatic condensed polycyclic group, or a monovalent non-aromatic condensed heteropolycyclic group.

In Formula 201, xa and xb may each independently be an integer of 0 to 5, or may be 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may each independently be selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and the like), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; and a phenyl group, a naphthyl group, an anthracenyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments of the present disclosure are not limited thereto.

$R_{109}$ in Formula 201 may be selected from:

a phenyl group, a naphthyl group, an anthracenyl group, or a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

In an embodiment, the compound represented by Formula 201 may be represented by Formula 201A, but embodiments of the present disclosure are not limited thereto:

Formula 201A
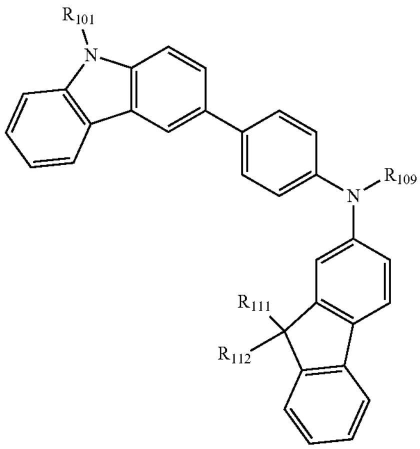
$R_{101}$, $R_{111}$, $R_{112}$, and $R_{109}$ in Formula 201A may be understood by referring to the description provided herein.
For example, the compound represented by Formula 201, and the compound represented by Formula 202 may include compounds HT1 to HT20 illustrated below, but are not limited thereto.
HT1
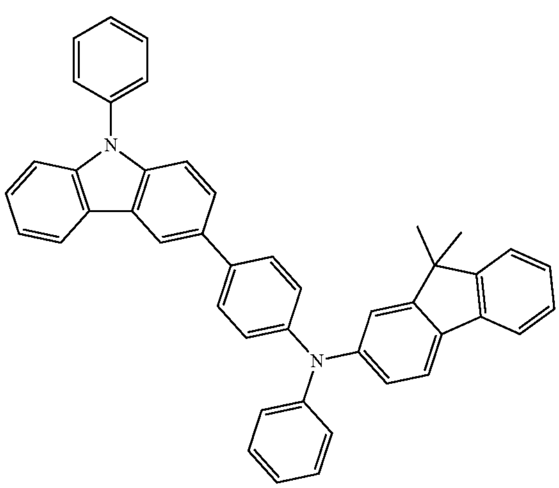
-continued
HT2
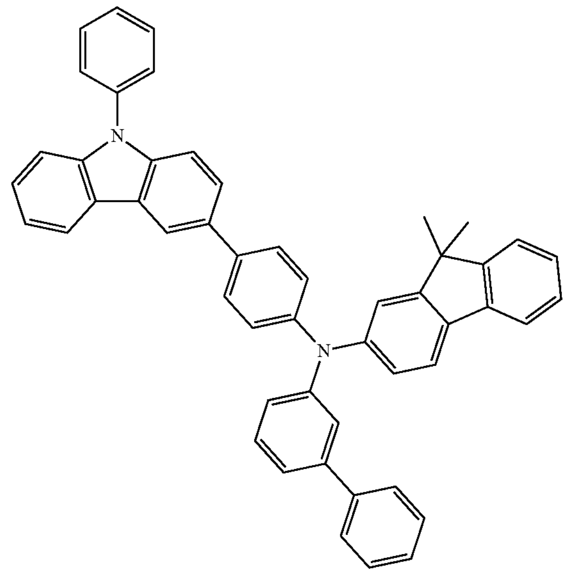
HT3
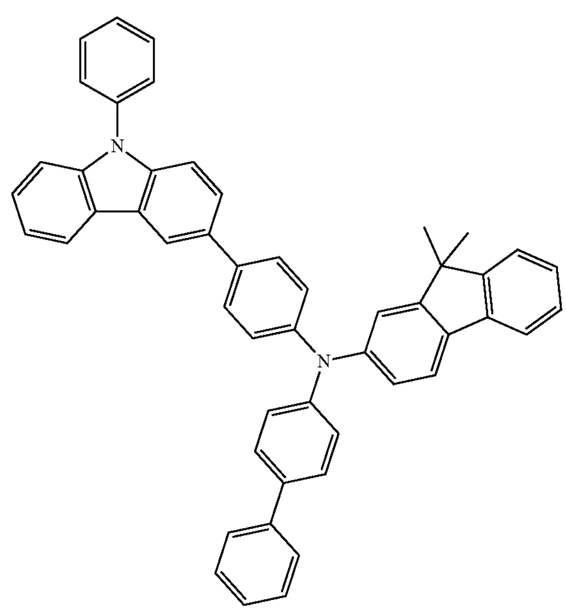

-continued
HT4
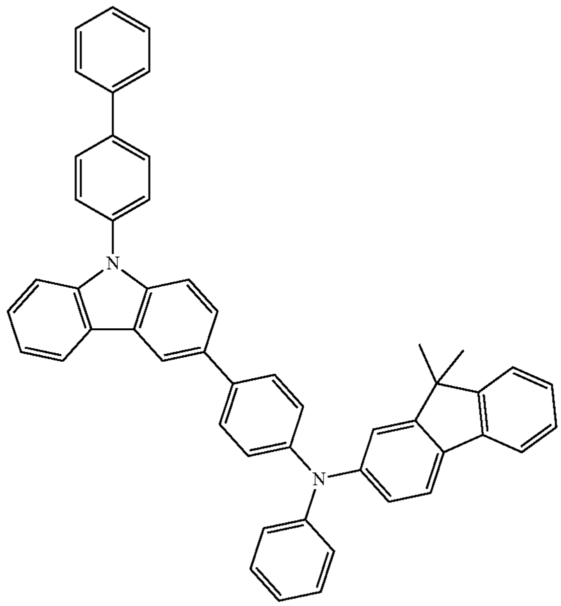
-continued
HT6
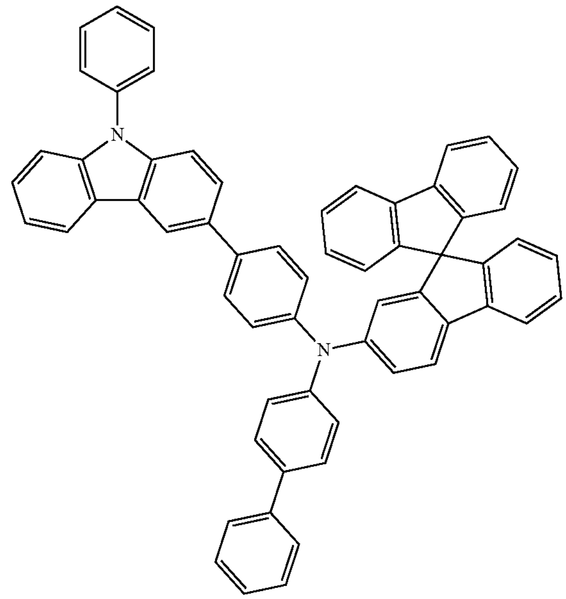
HT5
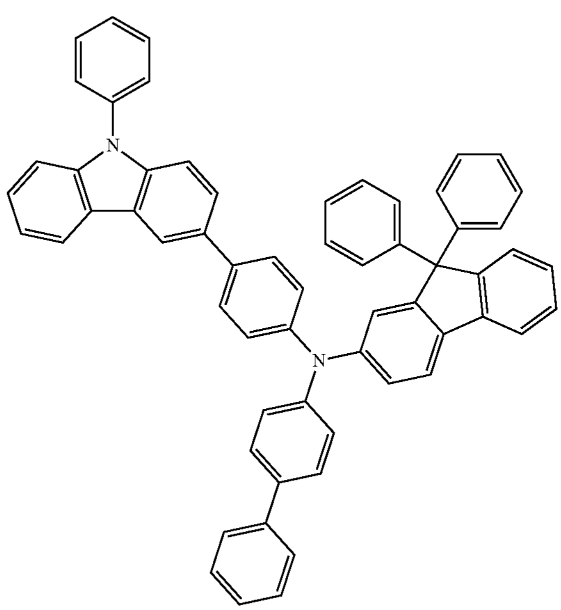
HT7
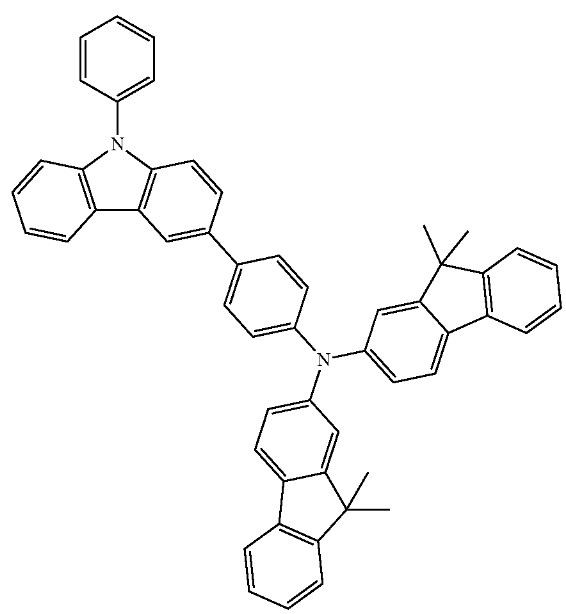

-continued
HT8
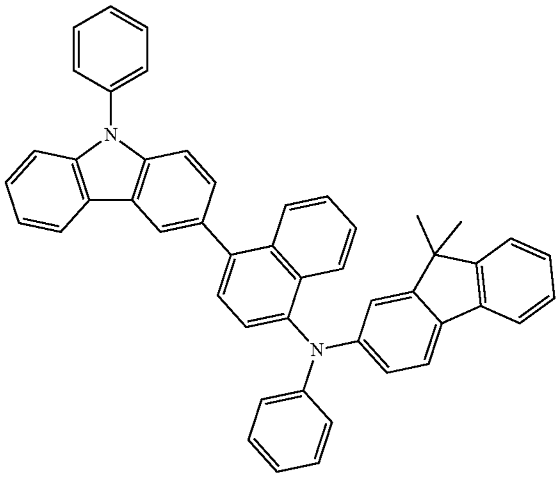
HT9
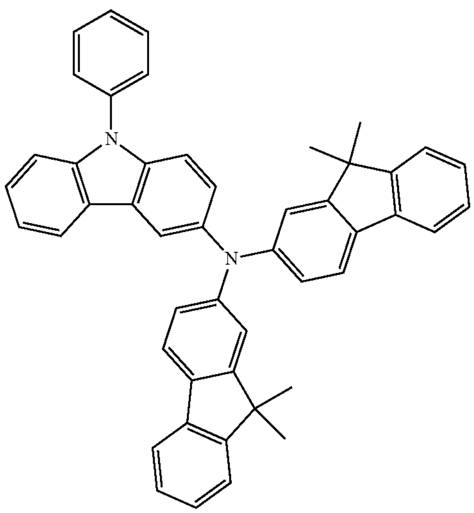
HT10
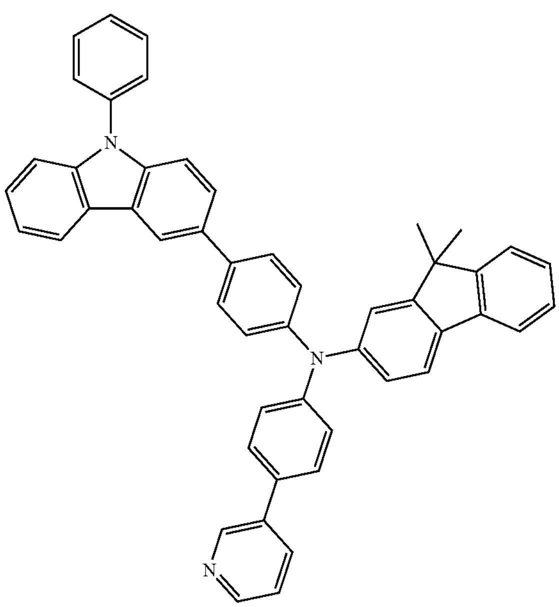
-continued
HT11
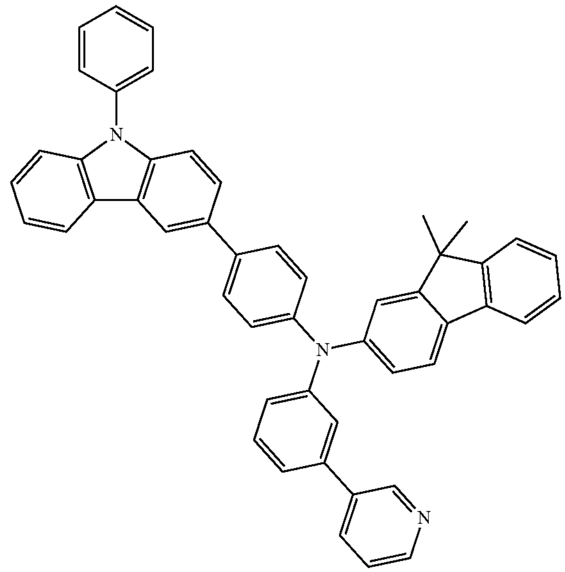
HT12
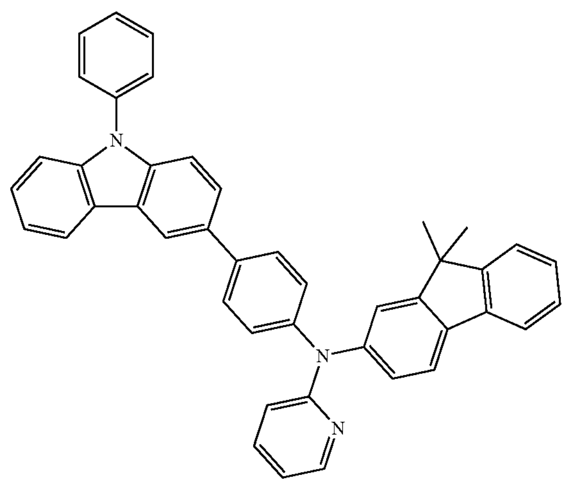
HT13
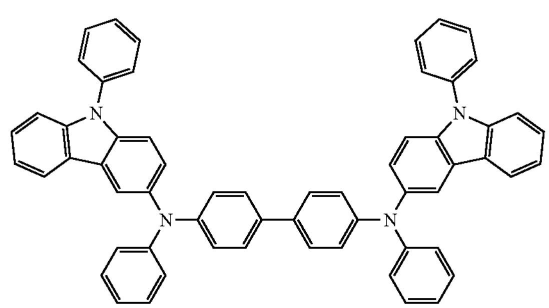

-continued

HT14

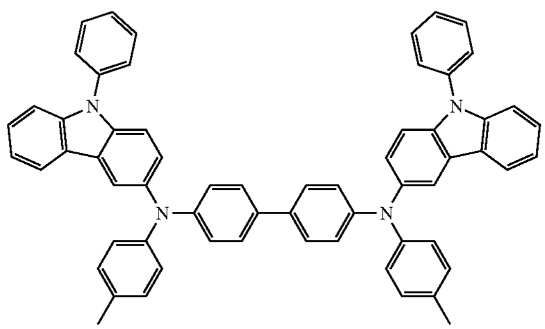

HT15

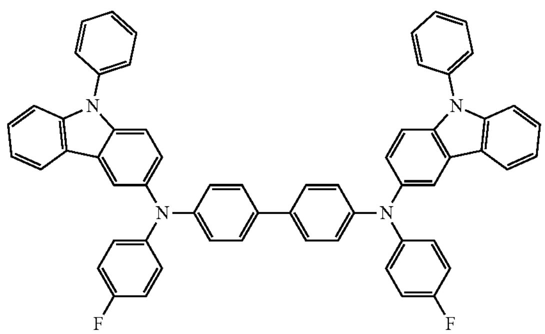

HT16

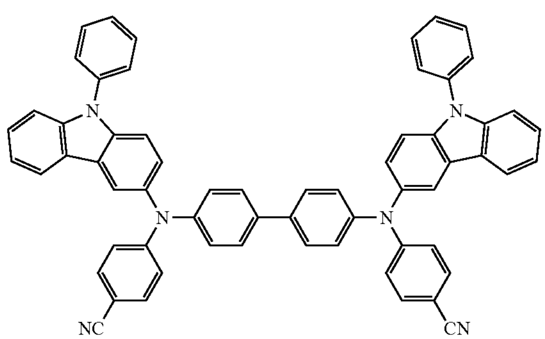

HT17

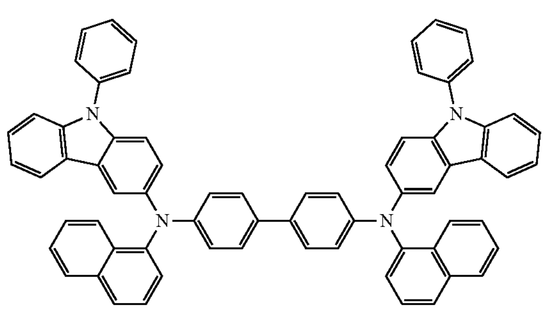

-continued

HT18

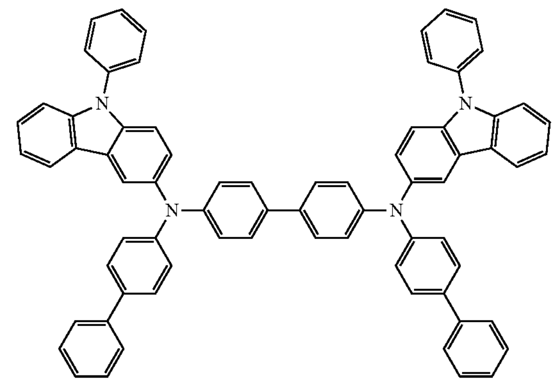

HT19

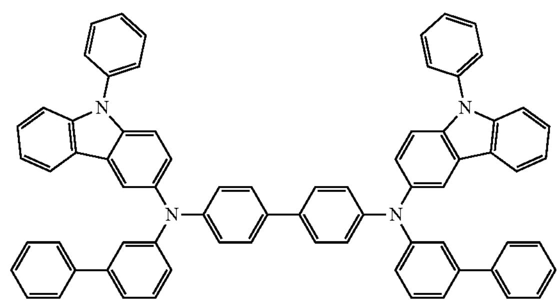

HT20

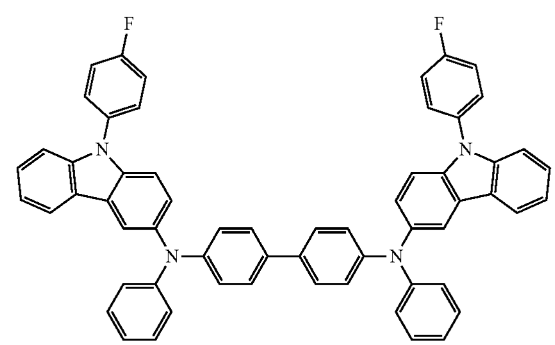

A thickness of the hole transport region may be in a range of about 100 Angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 below, but are not limited thereto.

HT-D1

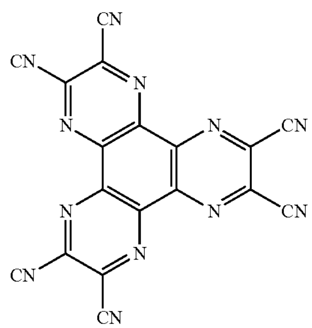

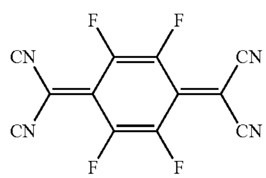

F4-TCNQ

The hole transport region may include a buffer layer.

In an embodiment, the buffer layer may compensate for an optical resonance distance according to a wavelength of light emitted from the emission layer, and thus, efficiency of a formed organic light-emitting device may be improved.

In an embodiment, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

In an embodiment, when the hole transport region includes an electron blocking layer, a material for the electron blocking layer may be selected from materials for the hole transport region described above and materials for a host to be explained later.

However, the material for the electron blocking layer is not limited thereto. For example, when the hole transport region includes an electron blocking layer, a material for the electron blocking layer may be mCP, which will be explained later.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, and Compounds H50 to H52:

TPBi

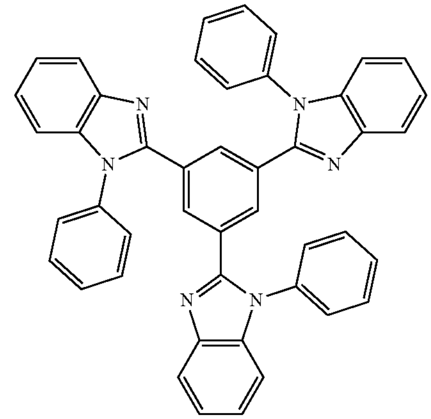

TBADN

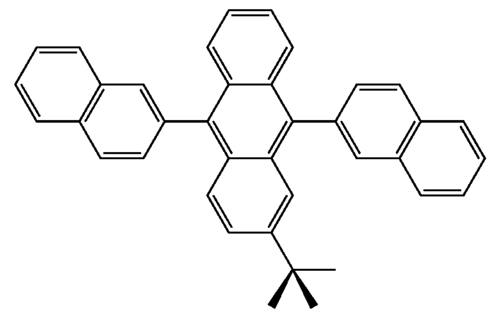

ADN

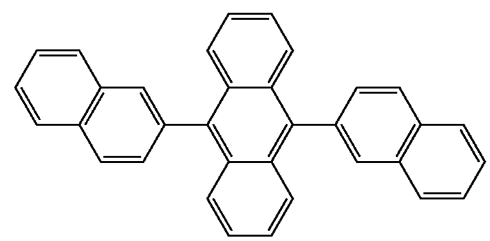

CBP

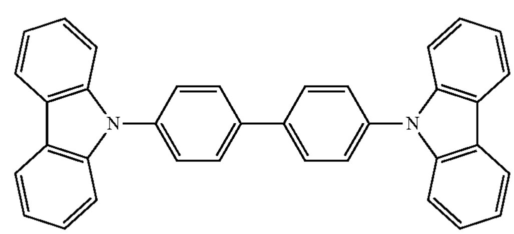

CDBP

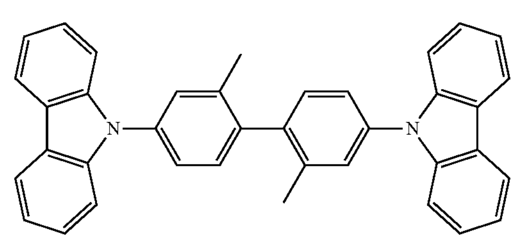

-continued

TCP

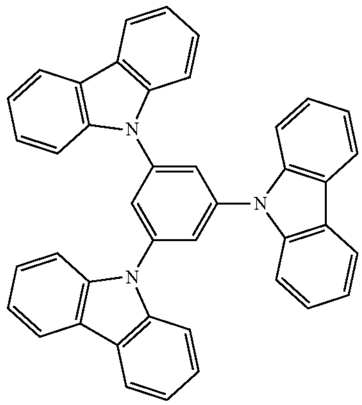

mCP

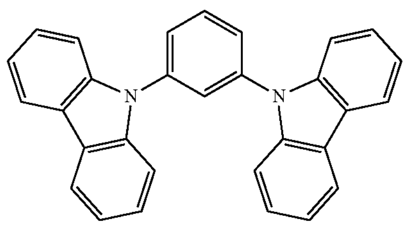

H50

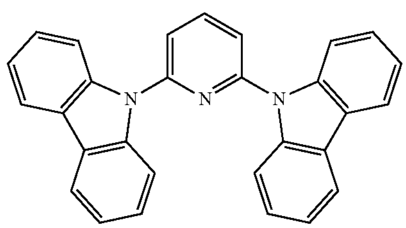

H51

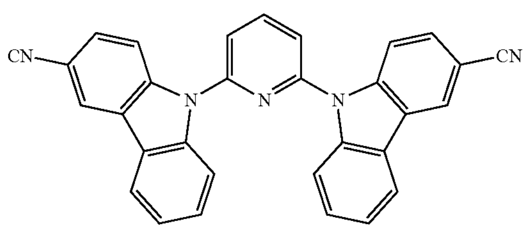

H52

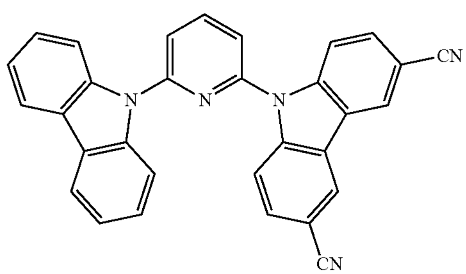

When the organic light-emitting device is a full-color organic light-emitting device, the emission layer may be patterned into a red emission layer, a green emission layer, and a blue emission layer. In an embodiment, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, at least one of BCP, Bphen, and BAlq but embodiments of the present disclosure are not limited thereto.

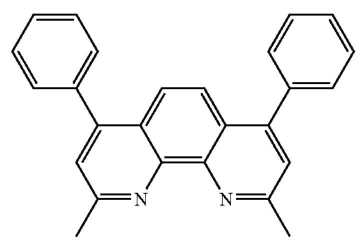

BCP

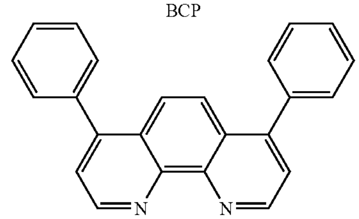

Bphen

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The electron transport layer may further include at least one selected from BCP, Bphen, $Alq_3$, BAlq, TAZ, and NTAZ.

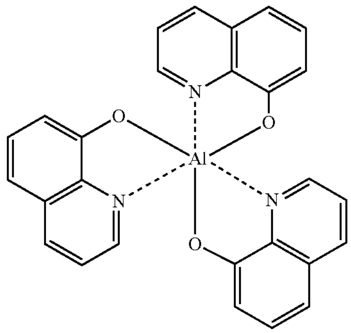
$Alq_3$
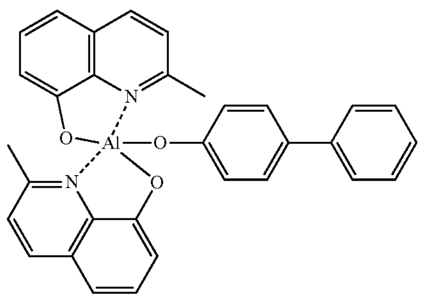
BAlq
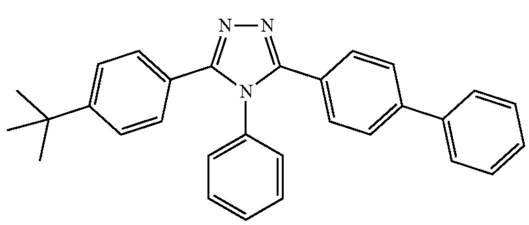
TAZ
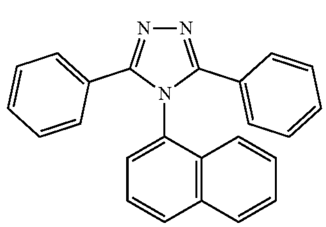
NTAZ
In an embodiment, the electron transport layer may include at least one selected from ET1 to ET25, but are not limited thereto:
ET1
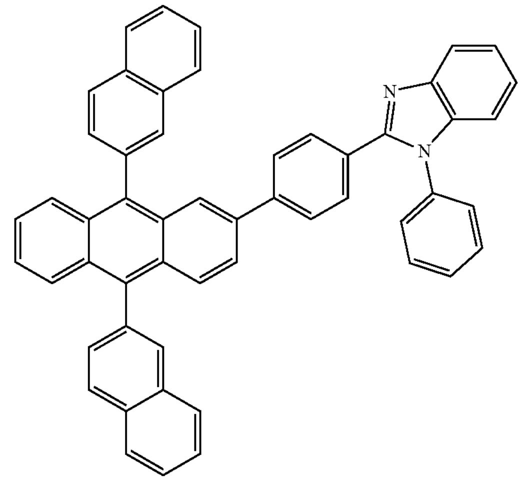
ET2
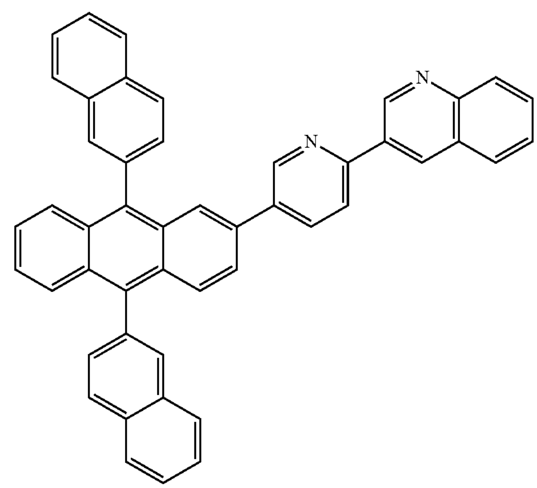
ET3
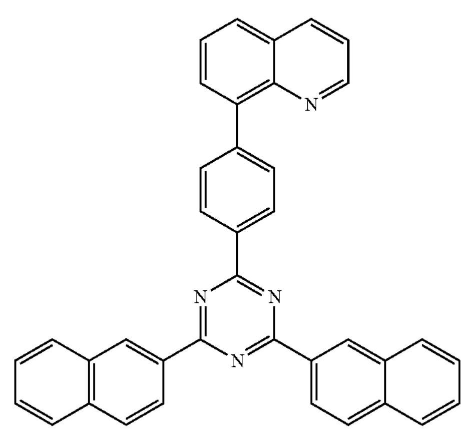

-continued
ET4
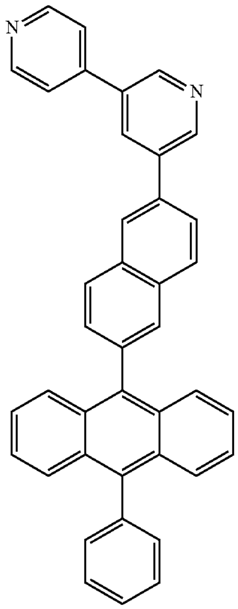
ET5
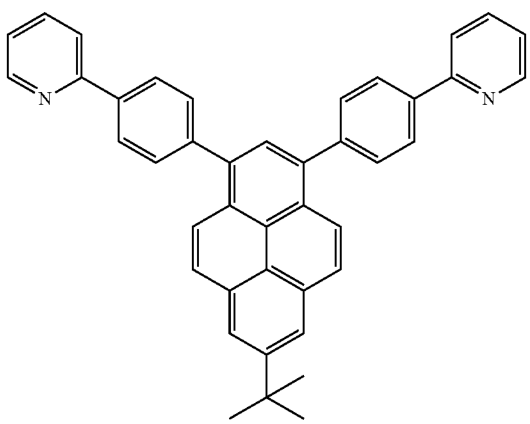
ET6
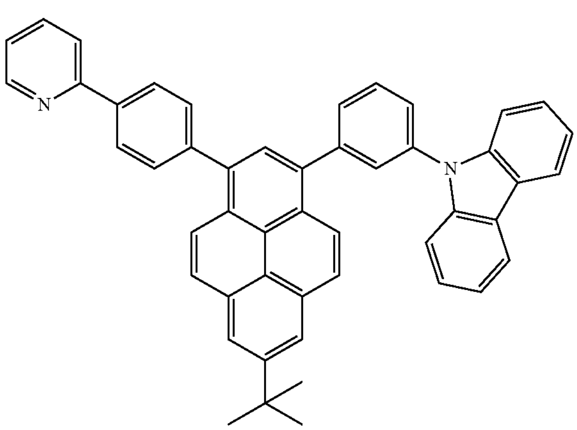
-continued
ET7
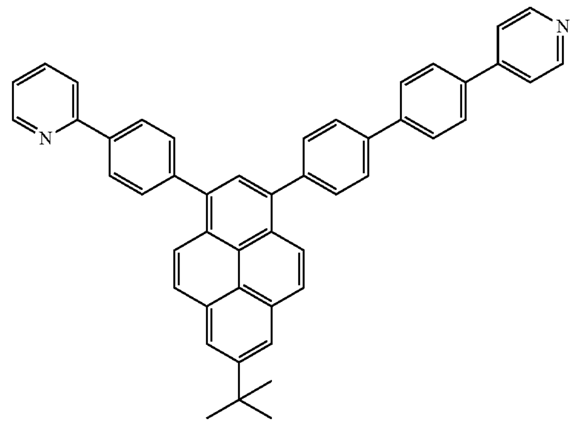
ET8
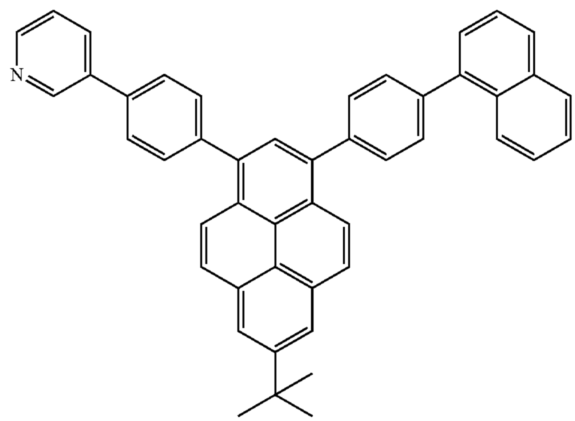
ET9
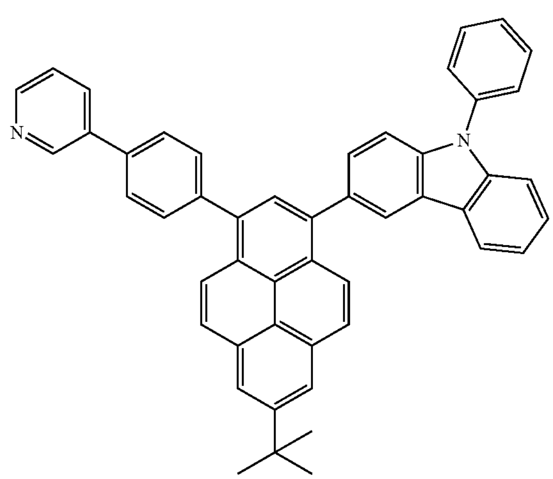

-continued
ET10
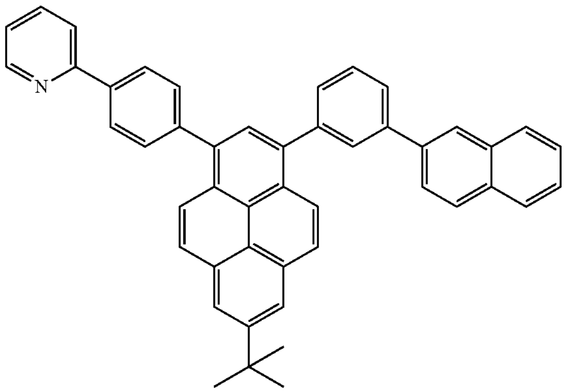
ET11
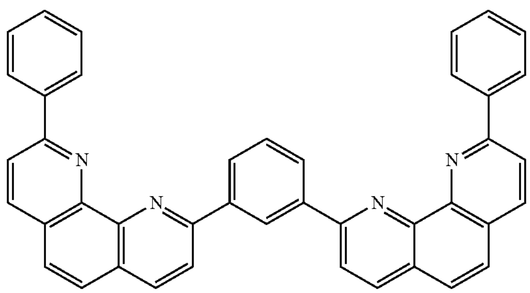
ET12
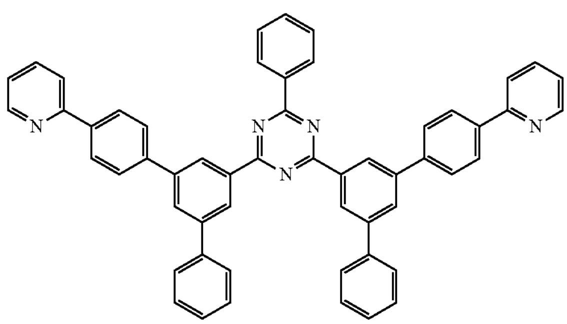
ET13
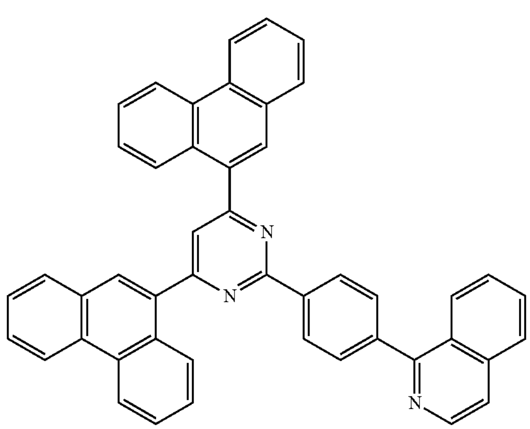
-continued
ET14
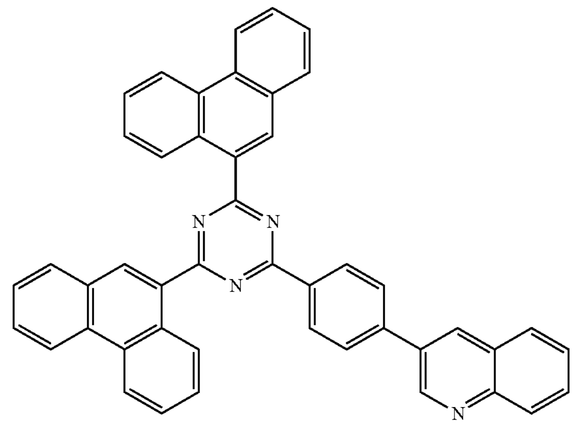
ET15
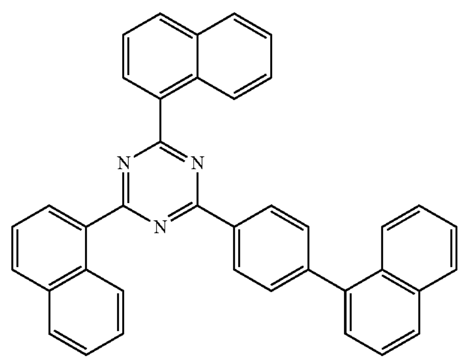
ET16
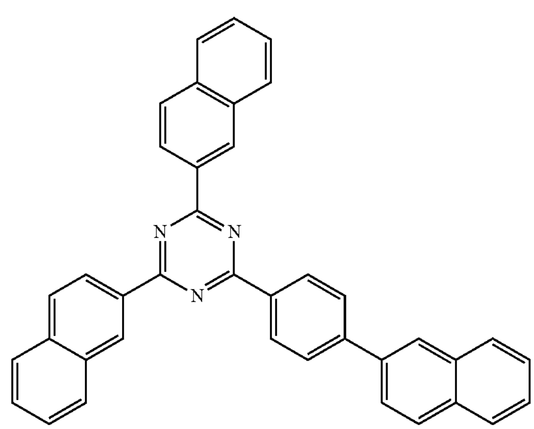

ET17
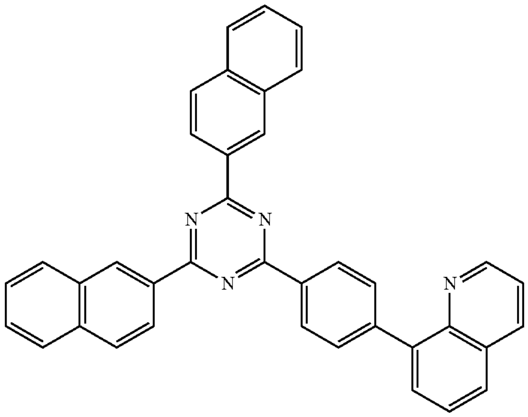
ET18
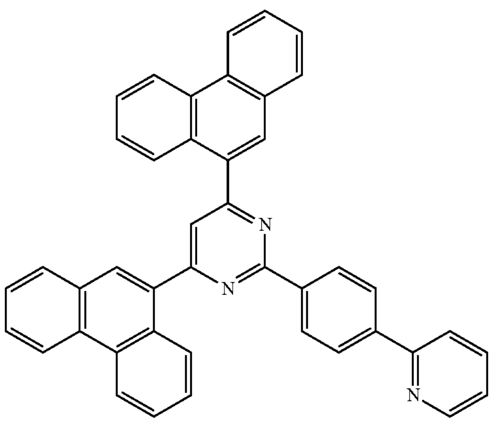
ET19
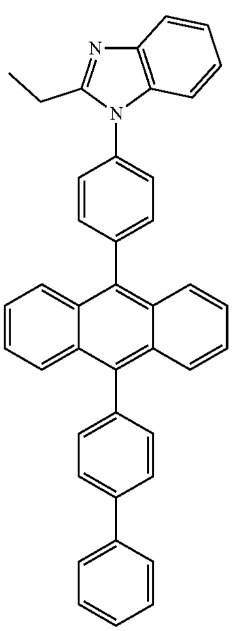
ET20
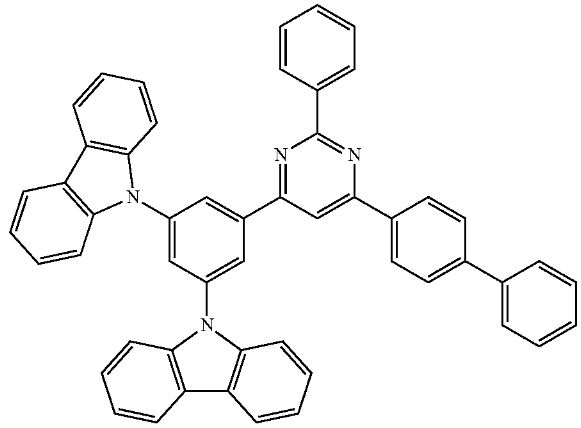
ET21
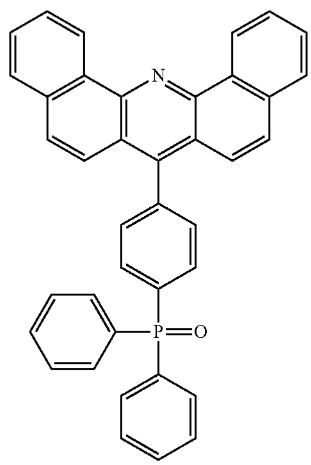
ET22
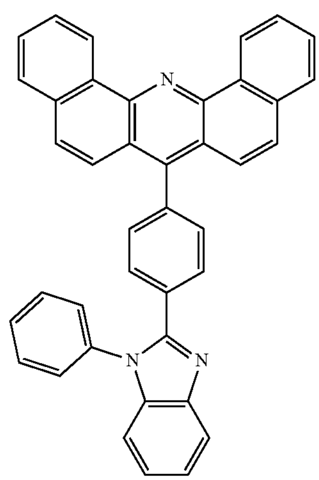

-continued

ET23

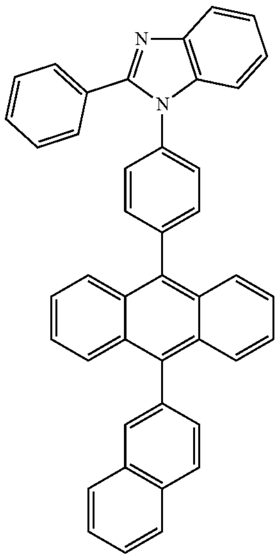

ET24

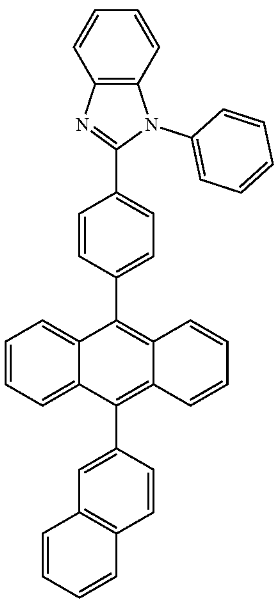

ET25

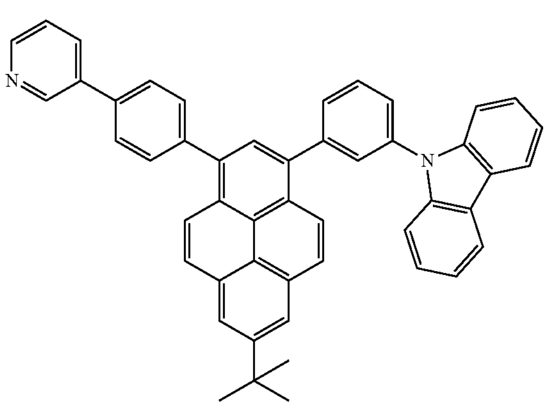

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a $L_1$ complex. The $L_1$ complex may include, for example, Compound ET-D1 (lithium 8-hydroxylquinolate, LiQ) or ET-D2.

ET-D1

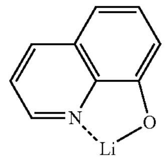

ET-D2

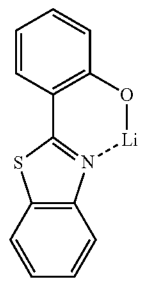

The electron transport region may include an electron injection layer that promotes flow of electrons from the second electrode 19 thereinto.

The electron injection layer may include at least one selected from LiF, NaCl, CsF, $Li_2O$, and BaO.

The thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 19 may be disposed on the organic layer 15. The second electrode 19 may be a cathode. The material for forming the second electrode 19 may be selected from a metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In an embodiment, to manufacture a top-emission type light-emitting device, a transmissive electrode formed using ITO or IZO may be used as the second electrode 19.

Another aspect of the present disclosure provides a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

Hereinbefore, the organometallic compound, the organic light-emitting device as described with reference to the FIGURE, and a diagnostic composition including the organometallic compound have been described, but embodiments of the present disclosure are not limited thereto.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocycldic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has at least one heteroatom selected from N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, Si and S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed with each other, only carbon atoms are used as ring-forming atoms, and having no aromaticity present in the entire molecular structure.

Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed with each other, a heteroatom selected from N, O, P, Si, and S, other than carbon atoms, as a ring-forming atom, and having no aromaticity present in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{60}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group may each independently be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; or —$N(Q_{31})(Q_{32})$, —$Si(Q_{33})(Q_{34})(Q_{35})$, —$B(Q_{36})(Q_{37})$ or —$P(=O)(Q_{38})(Q_{39})$, and $Q_1$ to $Q_9$, $Q_{11}$ to $Q_{10}$, $Q_{21}$ to $Q_{29}$, and $Q_{31}$ to $Q_{39}$, as used herein, may each independently be selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_5$-$C_{60}$ aryl group substituted with at least one selected from a $C_1$-$C_{60}$ alkyl group and a $C_6$-$C_{60}$ aryl group, a $C_5$-$C_{60}$ aryloxy group, a $C_5$-$C_{60}$ arylthio group, a $C_1$-$C_{60}$ heteroaryl group, a monovalent non-aromatic condensed polycyclic group, and a monovalent non-aromatic condensed heteropolycyclic group.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted $C_1$-$C_{30}$ alkyl" refers to a $C_1$-$C_{30}$ alkyl group substituted with $C_6$-$C_{30}$ aryl group, the total number of carbon atoms in the resulting aryl substituted alkylene group is $C_7$-$C_{60}$.

The expressions * and *' as used herein each indicate a binding site to a neighboring atom, unless otherwise stated.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 13)

Synthesis of Compound 13A

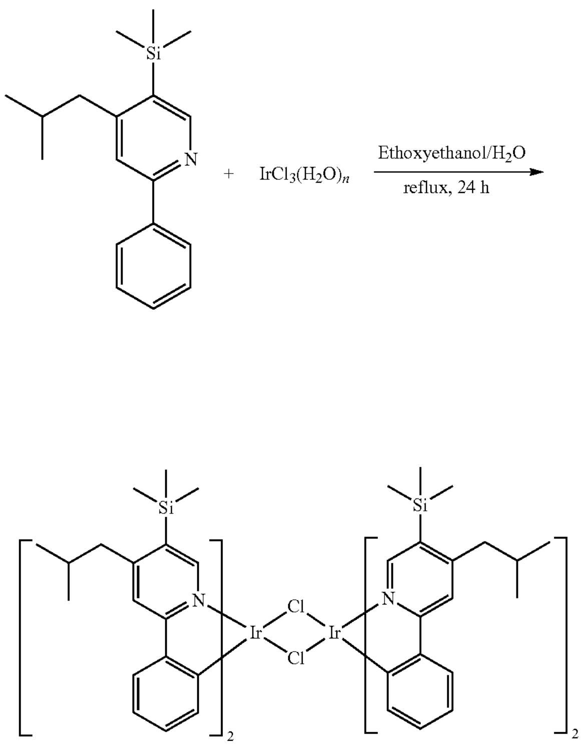

13A 4-isobutyl-2-phenyl-5-(trimethylsilyl)pyridine (8.0 grams (g), 28.2 millimoles (mmol)) and iridium chloride trihydrate (4.4 g, 12.5 mmol) were mixed with 120 mL of ethoxyethanol and 40 mL of distilled water and stirred for 24 hours under reflux, and the reaction mixture was cooled to room temperature. A solid generated therefrom was filtered, separated, and sufficiently washed with water, methanol, and hexane in order. The solid was dried in a vacuum oven to obtain 5.5 g (yield of 55%) of Compound 13A.

Synthesis of Compound 13B

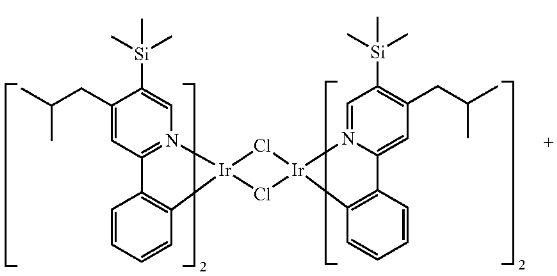

13A

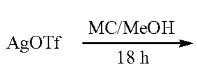

-continued

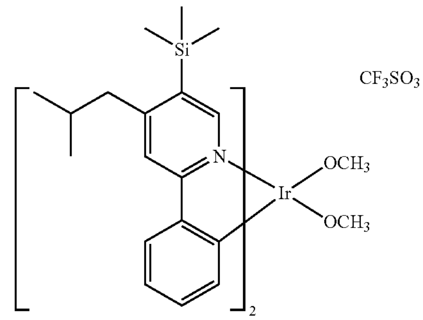

13B

Compound 13A (1.7 g, 1.0 mmol) and 45 mL of methylene chloride were mixed, and AgOTf (0.54 g, 2.1 mmol) was dissolved in 15 mL of methanol and added thereto. Then, the reaction mixture was stirred at room temperature for 18 hours in a state in which light was blocked with an aluminium foil. A solid generated by filtering the reaction mixture by using celite was removed, and a filtrate was evaporated under a reduced pressure to obtain a solid (Compound 13B), which was used for a next reaction without additional purification.

Synthesis of Compound 13

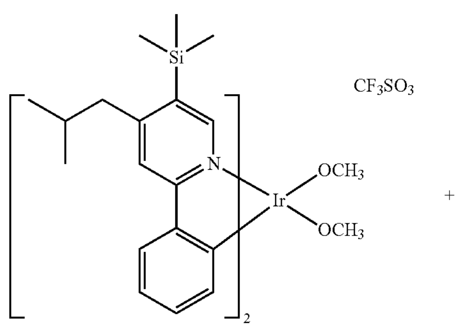

13B

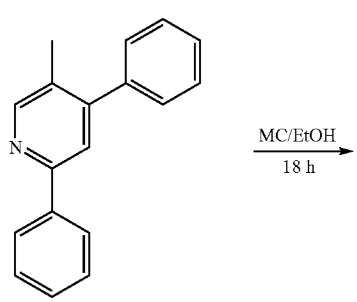

-continued

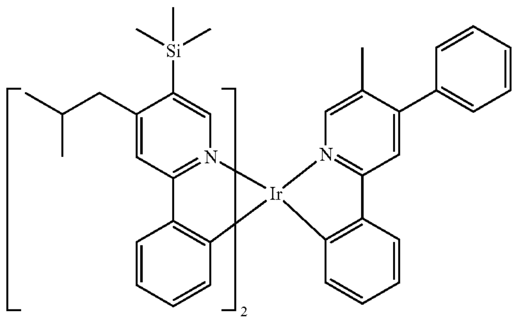

13

Compound 13B (1.8 g, 1.9 mmol) and 5-methyl-2,4-diphenylpyridine (0.6 g, 2.3 mmol) were mixed with 40 mL of ethanol and stirred for 18 hours under reflux, and the reaction mixture was cooled. A mixture obtained therefrom was filtered to obtain a solid.

The solid was sufficiently washed with ethanol and hexane, and column chromatography was performed in a methylene chloride:hexane solvent system to obtain 0.8 g (yield of 41%) of Compound 13. Compound 13 was identified by high resolution mass spectrometry (HRMS) and HPLC analysis.

HRMS (matrix assisted laser desorption ionization (MALDI)) calculated for $C_{54}H_{62}IrN_3Si_2$: m/z 1001.4112, found: 1001.4107.

Synthesis Example 2 (Compound 163)

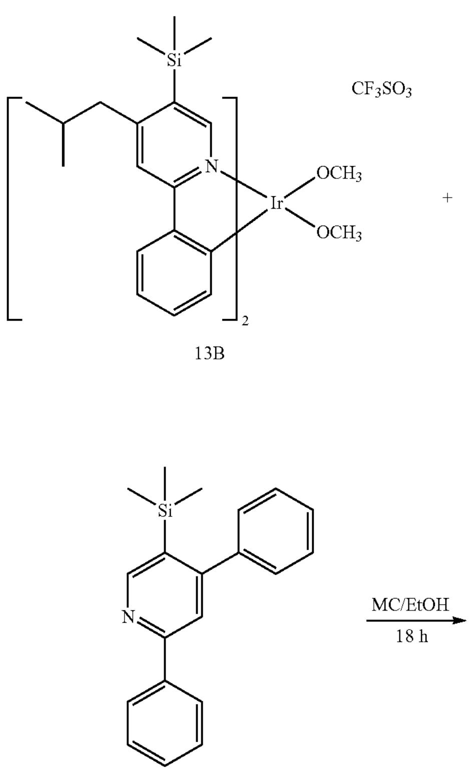

-continued

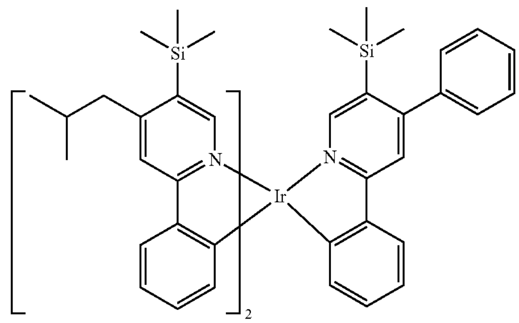

163

0.6 g (yield of 32%) of Compound 163 was obtained in the same manner as used to synthesize Compound 13 of Synthesis Example 1, except that 2,4-diphenyl-5-(trimethylsilyl)pyridine was used instead of 5-methyl-2,4-diphenylpyridine. Compound 163 was identified by HRMS and HPLC analysis.

HRMS (MALDI) calculated for $C_{56}H_{68}IrN_3Si_3$: m/z 1059.4350, found: 1059.4358.

Synthesis Example 3 (Compound 193)

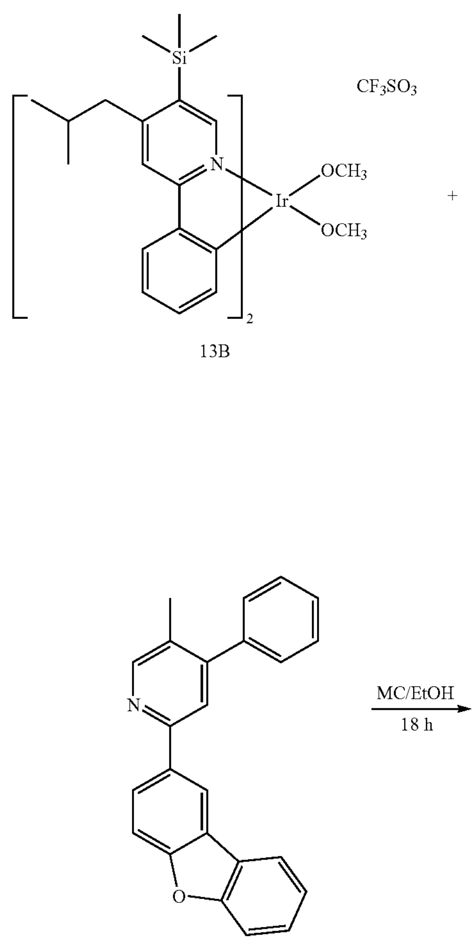

-continued

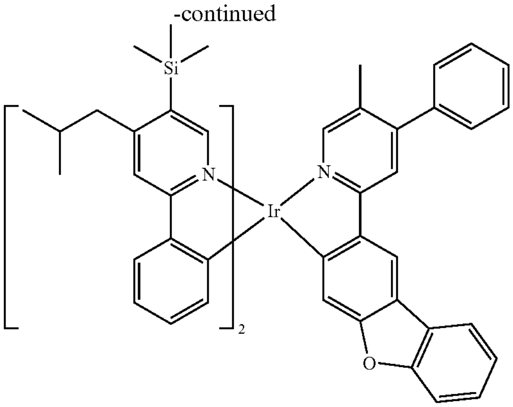

193

0.9 g (yield of 47%) of Compound 193 was obtained in the same manner as used to synthesize Compound 13 of Synthesis Example 1, except that 2-(dibenzo[b,d]furan-2-yl)-5-methyl-4-phenylpyridine was used instead of 5-methyl-2,4-diphenylpyridine. Compound 193 was identified by HRMS and HPLC analysis.

Synthesis Example 4: Synthesis of Compound 358

Synthesis of Compound 358A

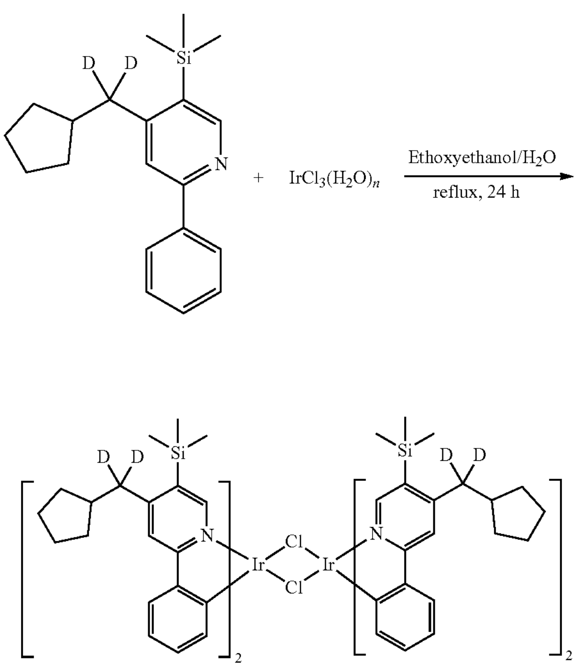

358A 3.2 g (yield of 52%) of Compound 358A was obtained in the same manner as used to synthesize Compound 13A of Synthesis Example 1, except that 4-(cyclopentylmethyl-D2)-2-phenyl-5-(trimethylsilyl)pyridine was used instead of 4-isobutyl-2-phenyl-5-(trimethylsilyl)pyridine. Compound 358A was identified by HRMS and HPLC analysis.

Synthesis of Compound 358B

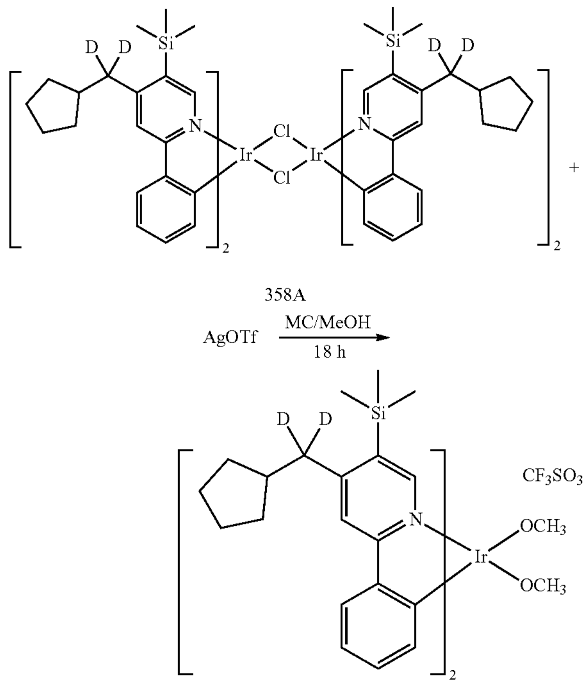

358B

Compound 358B was obtained in the same manner as used to synthesize Compound 13B of Synthesis Example 1, except that Compound 358A was used instead of Compound 13A. Compound 358B was used for a next reaction without additional purification.

Synthesis of Compound 358

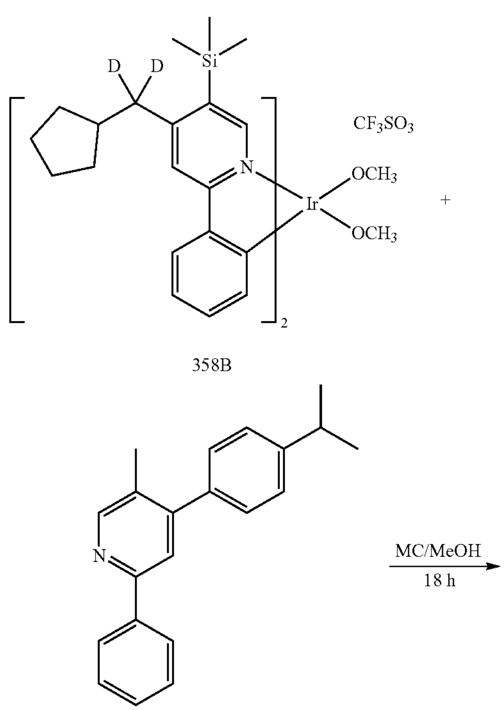

-continued

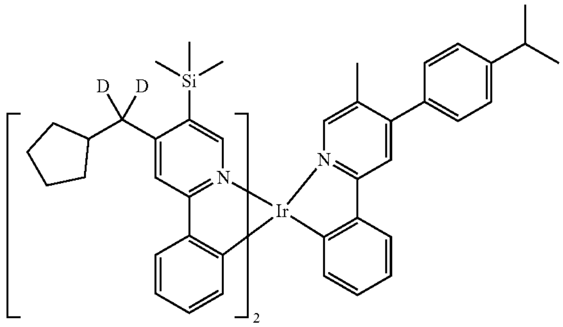

358

0.5 g (yield of 26%) of Compound 358 was obtained in the same manner as used to synthesize Compound 13 of Synthesis Example 1, except that Compound 358B was used instead of Compound 13B, and 4-isopropylphenyl)-5-methyl-2-phenylpyridine was used instead of 5-methyl-2,4-diphenylpyridine. Compound 358 was identified by HRMS and HPLC analysis.

HRMS (MALDI) calculated for $C_{61}H_{68}D_4IrN_3Si_2$: m/z 1099.5145, found: 1099.5152.

Synthesis Example 5: Synthesis of Compound 371

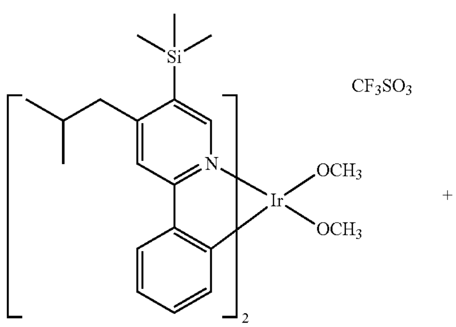

13B

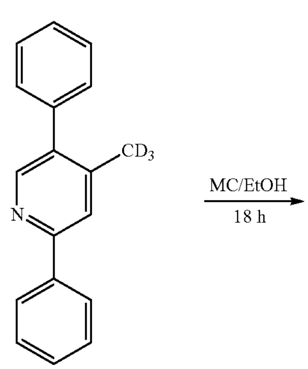

-continued

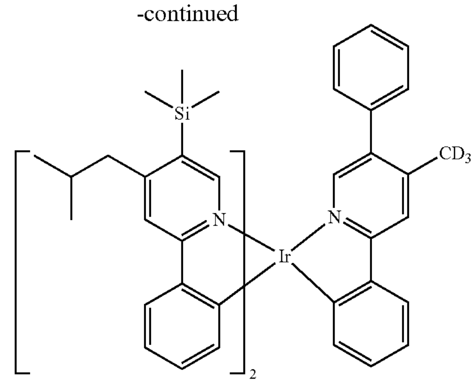

371

0.7 g (yield of 37%) of Compound 371 was obtained in the same manner as used to synthesize Compound 13 of Synthesis Example 1, except that 4-methyl-D3-2,5-diphenylpyridine was used instead of 5-methyl-2,4-diphenylpyridine. Compound 371 was identified by HRMS and HPLC analysis.

HRMS (MALDI) calculated for $C_{60}H_{64}IrN_3Si_2$: m/z 1091.4217, found: 1091.4210.

Example 1

As an anode, a glass substrate, on which ITO/Ag/ITO were respectively deposited to thicknesses of 70 Å/1,000 Å/70 Å, was cut to a size of 50 mm×50 mm×0.5 mm, sonicated with isopropyl alcohol and deionized water each for 5 minutes, and then cleaned by exposure to ultraviolet irradiation and ozone for 30 minutes. Then, the glass substrate was provided to a vacuum deposition apparatus.

N-(2-Naphthyl)-N',N'-bis{4-[2-naphthyl(phenyl)amino]phenyl}-N-phenyl-1,4-benzenediamine (2-TNATA) was vacuum-deposited on the anode to form a hole injection layer having a thickness of 600 Å, and 4,4'-bis[N-(1-naphthyl)-N-phenylamino]biphenyl (NPB) was vacuum-deposited on the hole injection layer to form a hole transport layer having a thickness of 1,350 Å.

Then, 9,9'-(4,4'-Biphenyldiyl)bis(9H-carbazole) (CBP) (host) and Compound 13 (dopant) were co-deposited on the hole transport layer at a weight ratio of 98:2 to form an emission layer having a thickness of 400 Å.

Then, 2,9-Dimethyl-4,7-diphenyl-1,10-phenanthroline (BCP) was vacuum-deposited on the emission layer to form a hole blocking layer having a thickness of 50 Å, $Alq_3$ was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited on the electron injection layer at a weight ratio of 90:10 to form a cathode having a thickness of 120 Å, thereby completing the manufacture of an organic light-emitting device.

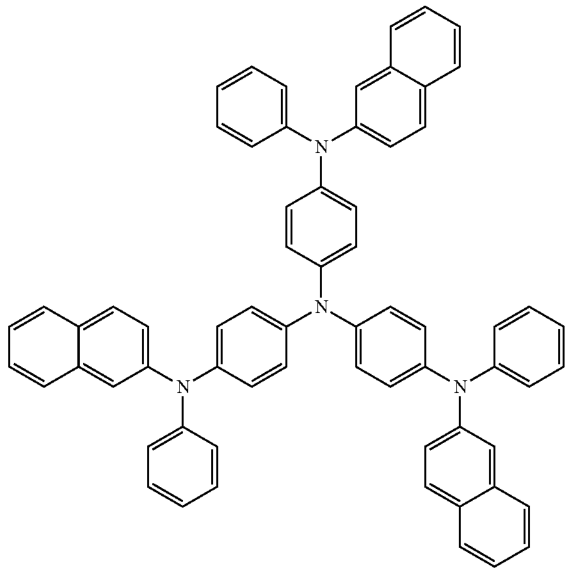

2-TNATA

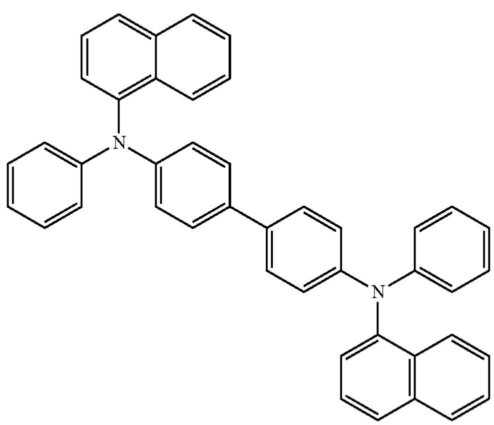

NPB

-continued

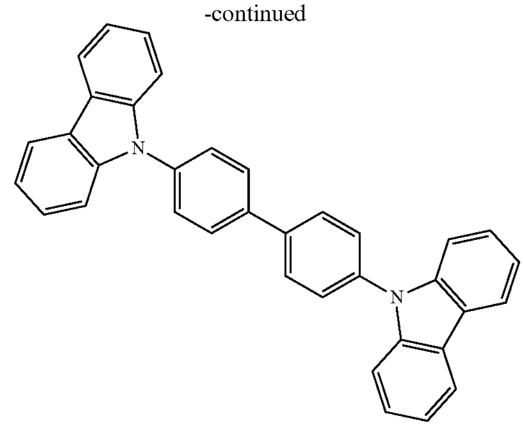

CBP

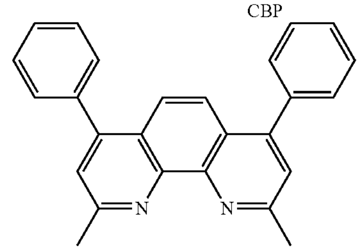

BCP

Examples 2 to 5 and Comparative Examples A and B

Organic light-emitting devices were manufactured in the same manner as in Example 1, except that Compounds shown in Table 2 were each used instead of Compound 13 as a dopant in forming an emission layer.

Evaluation Example 2: Evaluation of Characteristics of Organic Light-Emitting Devices The driving voltage (Volts, V), maximum value (Max EQE) of external quantum efficiency (%), roll-off ratio, full width at half maximum (FWHM) of the main peak of electroluminescence (EL) spectrum (nanometers, nm), maximum emission wavelength (nm), and lifespan ($T_{97}$) of the organic light-emitting devices manufactured according to Examples 1 to 5 and Comparative Examples A and B were evaluated, and results thereof are shown in Table 2. A current-voltage meter (Keithley 2400) and a luminance meter (Minolta Cs-1000A) were used as an evaluation apparatus. The lifespan ($T_{97}$) (at 3,500 nit or 3,500 candela per square meter) indicates an amount of time (hours, hr) that lapsed when luminance was 97% of initial luminance (100%), and was expressed as a relative value (%). The roll-off ratio was calculated by using Equation 20:

$$\text{Roll off ratio}=\{1-(\text{Efficiency(at 3,500 nit)}/\text{Maximum emission efficiency})\}\times 100\% \quad \text{Equation 20}$$

TABLE 2

| | Dopant compound | Driving voltage (V) | Max EQE (%) | Roll-Off ratio (%) | FWHM (nm) | Maximum emission wavelength (nm) | Lifespan (relative value, %) (at 3,500 nit) |
|---|---|---|---|---|---|---|---|
| Example 1 | 13 | 3.9 | 23.9 | 18 | 66 | 522 | 130 |
| Example 2 | 163 | 3.9 | 24.2 | 16 | 65 | 518 | 150 |
| Example 3 | 193 | 3.8 | 22.9 | 19 | 69 | 521 | 118 |
| Example 4 | 358 | 4.0 | 23.8 | 16 | 62 | 516 | 150 |
| Example 5 | 371 | 4.0 | 22.3 | 21 | 68 | 520 | 105 |

TABLE 2-continued
| | Dopant compound | Driving voltage (V) | Max EQE (%) | Roll-Off ratio (%) | FWHM (nm) | Maximum emission wavelength (nm) | Lifespan (relative value, %) (at 3,500 nit) |
|---|---|---|---|---|---|---|---|
| Comparative Example A | A | 4.6 | 17.3 | 28 | 81 | 524 | 47 |
| Comparative Example B | B | 4.5 | 19.4 | 26 | 73 | 519 | 96 |
Dopant compounds:
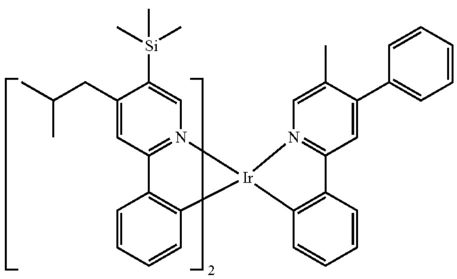
13
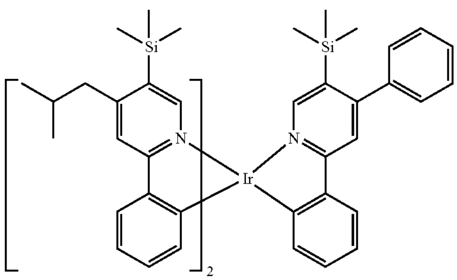
163
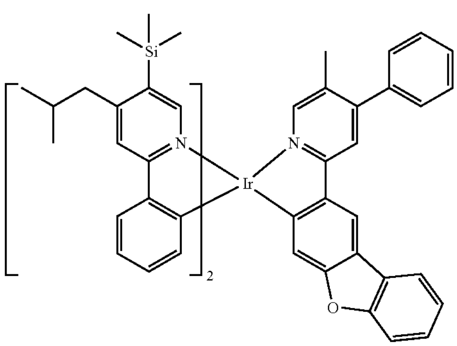
193
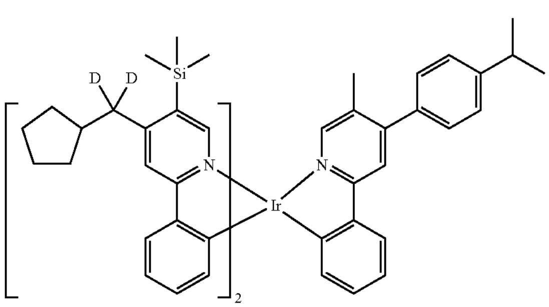
358

TABLE 2-continued

| Dopant compound | Driving voltage (V) | Max EQE (%) | Roll-Off ratio (%) | FWHM (nm) | Maximum emission wavelength (nm) | Lifespan (relative value, %) (at 3,500 nit) |
|---|---|---|---|---|---|---|

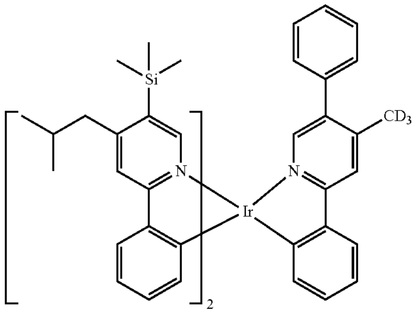

371

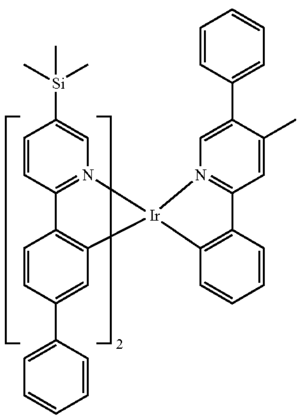

A

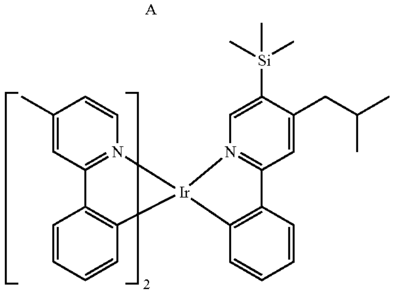

B

From Table 2, it is confirmed that the organic light-emitting devices of Examples 1 to 5 have improved driving voltage, external quantum efficiency, roll-off ratio, and lifespan characteristics, as compared with those of the organic light-emitting devices of Comparative Examples A and B.

Since the organometallic compound has excellent electric characteristics and heat resistance, an electronic device, for example, an organic light-emitting device, which includes the organometallic compound, may have improved driving voltage, current density, efficiency, power, color purity, and/or lifespan characteristics. In addition, because the organometallic compound has excellent phosphorescence characteristics, a diagnostic composition having high diagnostic efficiency may be provided by using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While an embodiment have been described with reference to the FIGURES, it will be understood by those of ordinary skill in the art that various changes in form and details may be made therein without departing from the spirit and scope of the present disclosure as defined by the following claims.

What is claimed is:

1. An organometallic compound represented by Formula 1:

$$M(L_1)_{n1}(L_2)_{n2}, \qquad \text{Formula 1}$$

wherein, in Formula 1,

M is iridium, $L_1$ is a ligand represented by Formula 2A, n1 is 1 or 2, wherein, when n1 is 2, two groups $L_1$ are identical to or different from each other, $L_2$ is a ligand represented by Formula 2B, n2 is 1 or 2, wherein, when n2 is 2, two group $L_2$ are identical to or different from each other, the sum of n1 and n2 is 3, and $L_1$ and $L_2$ are different from each other:

Formula 2A

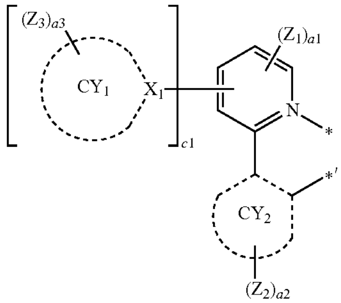

Formula 2B

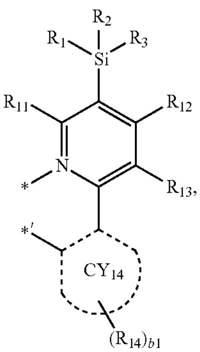

wherein, in Formulae 2A and 2B, $X_1$ is C, ring $CY_1$ is a $C_5$-$C_{30}$ carbocyclic group, ring $CY_2$ is a benzene group, ring $CY_{14}$ is a benzene group, $R_1$ to $R_3$ are each independently a $C_1$-$C_{60}$ alkyl group or a $C_6$-$C_{60}$ aryl group, each independently unsubstituted or substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, and a $C_1$-$C_{10}$ alkyl group, $Z_1$ to $Z_3$ and $R_{11}$ to $R_{14}$ are each independently selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, —$N(Q_1)(Q_2)$, —$Ge(Q_3)(Q_4)(Q_5)$, —$B(Q_6)(Q_7)$, and —$P(=O)(Q_8)(Q_9)$, wherein $R_{12}$ is neither hydrogen nor a methyl group, a1 is an integer from 0 to 3, wherein, when a1 is two or more, two or more groups $Z_1$ are identical to or different from each other, a2, a3, and b1 are each independently an integer from 0 to 20, wherein, when a2 is two or more, two or more groups $Z_2$ are identical to or different from each other, when a3 is two or more, two or more groups $Z_3$ are identical to or different from each other, and when b1 is two or more, two or more groups $R_{14}$ are identical to or different from each other, c1 is an integer from 1 to 4, wherein, when c1 is 2 or more, two or more groups represented by

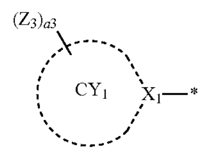

are identical to or different from each other, when a1 is two or more, two or more groups $Z_1$ in the number of c1 are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, when a2 is two or more, two or more groups $Z_2$ in the number of a2 are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, when a3 is two or more, two or more groups $Z_3$ in the number of a3 are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{12}$ and $R_{13}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, when b1 is two or more, two or more groups $R_{14}$ in the number of b1 are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more substituents selected from $Z_1$ and $Z_2$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more substituents selected from $R_{11}$ to $R_{14}$ are optionally linked to form a $C_5$-$C_{30}$ carbocyclic group that is unsubstituted or substituted with at least one of $R_{10a}$ or a $C_1$-$C_{30}$ heterocyclic group that is unsubstituted or substituted with at least one $R_{10a}$, $R_{10a}$ is selected from hydrogen, deuterium, —F, —Cl, —Br, —I, $—SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_7$-$C_{60}$ arylalkyl group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted $C_2$-$C_{60}$ heteroarylalkyl group, a substituted or unsubstituted monovalent non-aromatic condensed polycyclic group, a substituted or unsubstituted monovalent non-aromatic condensed heteropolycyclic group, $—N(Q_1)(Q_2)$, $—Ge(Q_3)(Q_4)(Q_5)$, $—B(Q_6)(Q_7)$, and $—P(=O)(Q_8)(Q_9)$,

* and *' in Formulae 2A and 2B each indicate a binding site to M in Formula 1, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_7$-$C_{60}$ arylalkyl group, the substituted $C_1$-$C_{60}$ heteroaryl group, the substituted $C_1$-$C_{60}$ heteroaryloxy group, the substituted $C_1$-$C_{60}$ heteroarylthio group, the substituted $C_2$-$C_{60}$ heteroarylalkyl group, the substituted monovalent non-aromatic condensed polycyclic group, and the substituted monovalent non-aromatic condensed heteropolycyclic group are each independently selected from:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{11})(Q_{12})$, $—B(Q_{16})(Q_{17})$, and $—P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, or a monovalent non-aromatic condensed heteropolycyclic group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_7$-$C_{60}$ arylalkyl group, a $C_1$-$C_{60}$ heteroaryl group, a $C_1$-$C_{60}$ heteroaryloxy group, a $C_1$-$C_{60}$ heteroarylthio group, a $C_2$-$C_{60}$ heteroarylalkyl group, a monovalent non-aromatic condensed polycyclic group, a monovalent non-aromatic condensed heteropolycyclic group, $—N(Q_{21})(Q_{22})$, $—B(Q_{26})(Q_{27})$, and $—P(=O)(Q_{28})(Q_{29})$; and $—N(Q_{31})(Q_{32})$, $—B(Q_{36})(Q_{37})$, or $—P(=O)(Q_{38})(Q_{39})$; and $Q_1$ to $Q_9$, $Q_{11}$, $Q_{12}$, $Q_{16}$ to $Q_{19}$, $Q_{21}$, $Q_{22}$, $Q_{26}$ to $Q_{29}$, $Q_{31}$, $Q_{32}$, and $Q_{36}$ to $Q_{39}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one selected from a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

2. The organometallic compound of claim 1, wherein, in Formula 2A, ring $CY_1$ is selected from a cyclopentane group, a cyclohexane group, a cycloheptane group, a cyclopentene group, a cyclohexene group, a cycloheptene group, a benzene group, a naphthalene group, an anthracene group, a phenanthrene group, a triphenylene group, a pyrene group, a chrysene group, a cyclopentadiene group, a 1,2,3,4-tetrahydronaphthalene group, and a fluorene group, a 9H-fluorene-9-one group.

3. The organometallic compound of claim 1, wherein, in Formula 2B, $R_1$ to $R_3$ are each independently selected from a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a phenyl group, a biphenyl group, or a naphthyl group, each unsubstituted or substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof.

4. The organometallic compound of claim 1, wherein, in Formulae 2A and 2B, $Z_1$ to $Z_3$ and $R_{11}$ to $R_{14}$ are each independently selected from:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, or a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, and an azadibenzothiophenyl group; and —N($Q_1$)($Q_2$), —Ge($Q_3$)($Q_4$)($Q_5$), —B($Q_6$)($Q_7$), —P(=O)($Q_8$)($Q_9$), or —P($Q_8$)($Q_9$), wherein $R_{12}$ is neither hydrogen nor a methyl group, and $Q_1$ to $Q_9$ are each independently selected from:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; and an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one selected from deuterium, a $C_1$-$C_{10}$ alkyl group, or a phenyl group.

5. The organometallic compound of claim 1, wherein $R_{12}$ in Formula 2B is selected from:

a $C_2$-$C_{20}$ alkyl group or a $C_2$-$C_{20}$ alkoxy group;

a methyl group or a methoxy group, each substituted with at least one selected from a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a naphthyl group, a pyridinyl group, and a pyrimidinyl group;

a methyl group or a methoxy group, each substituted with i) at least one selected from a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a naphthyl group, a pyridinyl group, and a pyrimidinyl group, and ii) at least one deuterium;

a $C_2$-$C_{20}$ alkyl group or a $C_2$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a pyridinyl group, and a pyrimidinyl group; and a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo(1.1.1)pentyl group, a bicyclo(2.1.1)hexyl group, a bicyclo(2.2.1)heptyl group, a bicyclo(2.2.2)octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, and an azadibenzothiophenyl group.

6. The organometallic compound of claim 1, wherein, in Formulae 2A and 2B, $Z_1$ to $Z_3$, $R_{11}$, $R_{13}$, and $R_{14}$ are each independently selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-66, groups represented by Formulae 9-1 to 9-66 wherein at least one hydrogen is substituted with deuterium, groups represented by Formulae 10-1 to 10-249, groups represented by Formulae 10-1 to 10-249 wherein at least one hydrogen is substituted with deuterium, $—N(Q_1)(Q_2)$, and $—Ge(Q_3)(Q_4)(Q_5)$, wherein $Q_1$ to $Q_5$ are each independently the same as in claim 1, and $R_{12}$ in Formula 2B is selected from groups represented by Formulae 9-1 to 9-66, groups represented by Formulae 9-1 to 9-66 wherein at least one hydrogen is substituted with deuterium, groups represented by Formulae 10-1 to 10-249, and groups represented by Formulae 10-1 to 10-249 wherein at least one hydrogen is substituted with deuterium:

9-1
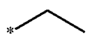

9-2
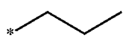

9-3
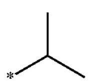

9-4
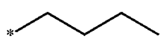

9-5
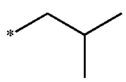

9-6
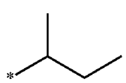

9-7
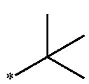

9-8
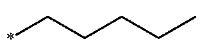

9-9
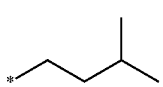

9-10
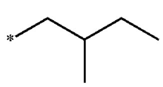

9-11
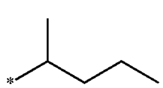

9-12
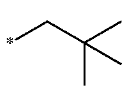

9-13
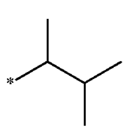

-continued 9-14
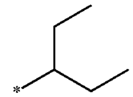

9-15
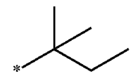

9-16
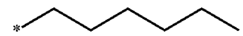

9-17
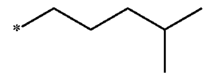

9-18
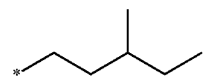

9-19
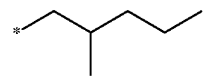

9-20
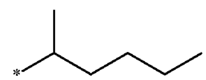

9-21
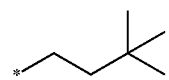

9-22
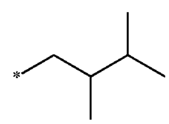

9-23
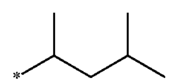

9-24
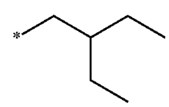

9-25
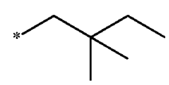

9-26
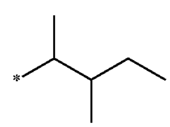

9-27
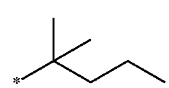

9-28
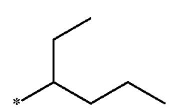

9-29
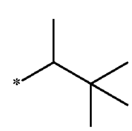

-continued
9-30
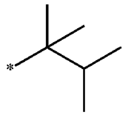
9-31
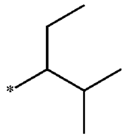
9-32
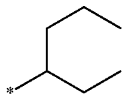
9-33
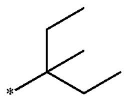
9-34
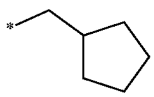
9-35
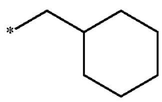
9-36
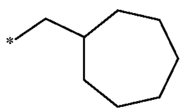
9-37
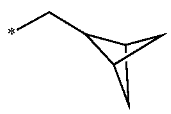
9-38
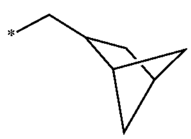
9-39
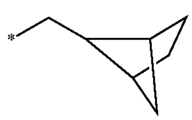
9-40
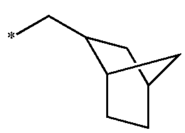
9-41
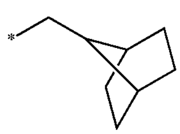
9-42
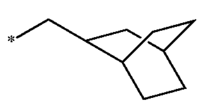
-continued
9-43
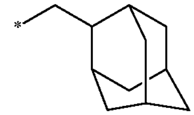
9-44
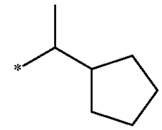
9-45
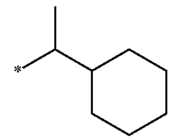
9-46
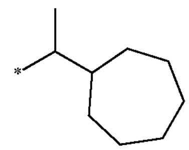
9-47
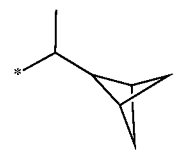
9-48
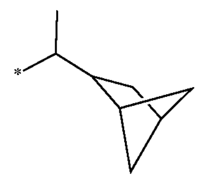
9-49
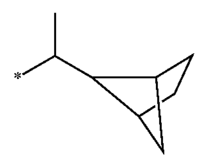
9-50
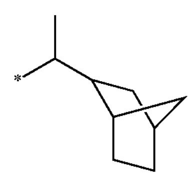
9-51
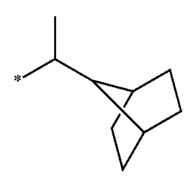
9-52
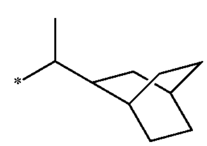

-continued
9-53
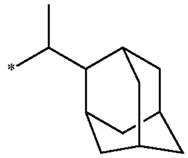
9-54
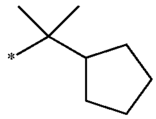
9-55
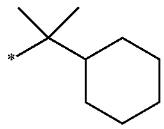
9-56
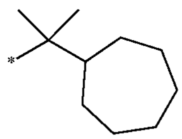
9-57
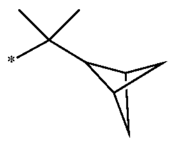
9-58
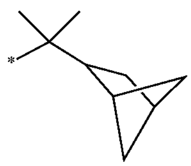
9-59
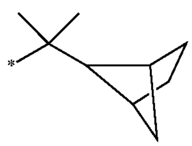
9-60
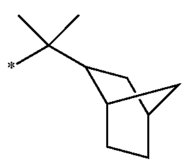
9-61
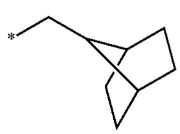
9-62
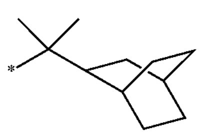
-continued
9-63
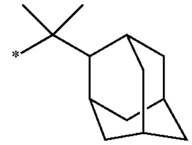
9-64
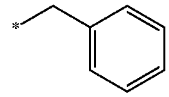
9-65
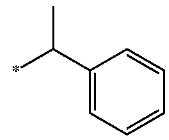
9-66
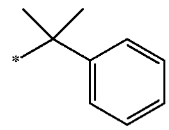
10-1
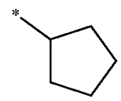
10-2
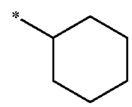
10-3
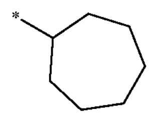
10-4
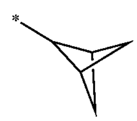
10-5
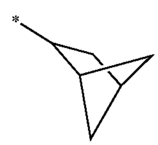
10-6
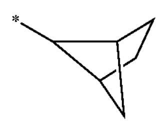
10-7
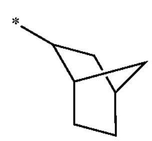
10-8
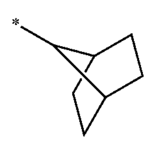

-continued
10-9
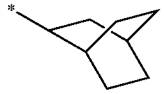
10-10
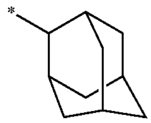
10-11
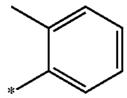
10-12
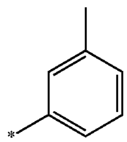
10-13
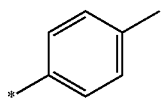
10-14
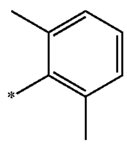
10-15
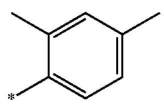
10-16
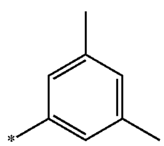
10-17
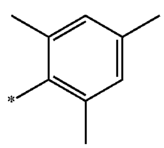
10-18
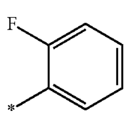
10-19
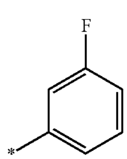
10-20
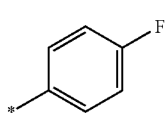
-continued
10-21
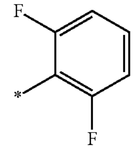
10-22
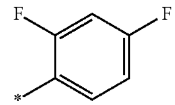
10-23
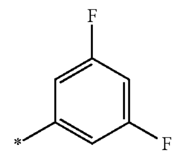
10-24
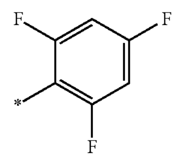
10-25
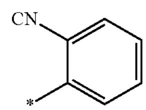
10-26
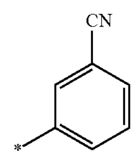
10-27
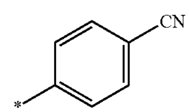
10-28
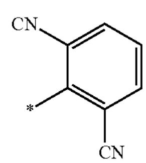
10-29
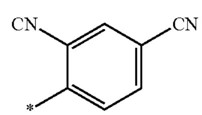
10-30
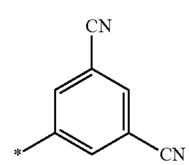
10-31
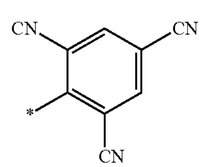

-continued
10-32
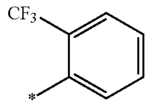
10-33
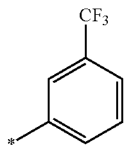
10-34
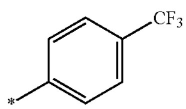
10-35
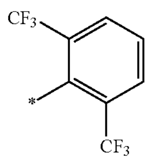
10-36
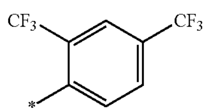
10-37
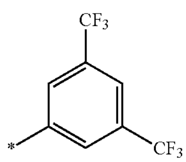
10-38
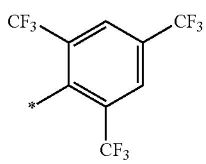
10-39
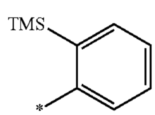
10-40
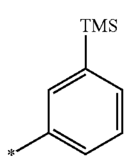
10-41
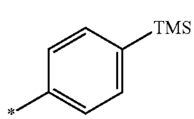
10-42
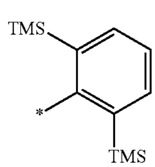
-continued
10-43
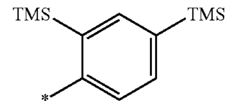
10-44
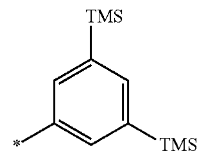
10-45
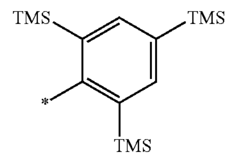
10-46
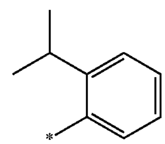
10-47
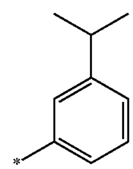
10-48
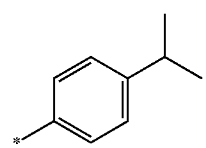
10-49
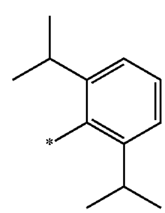
10-50
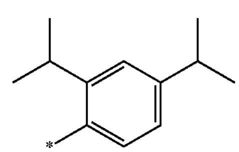
10-51
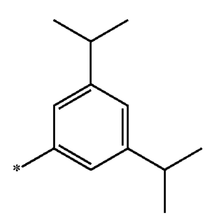

-continued
10-52
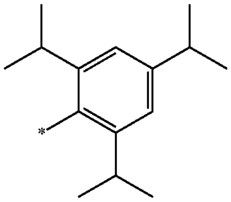
10-53
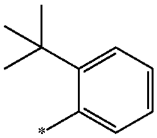
10-54
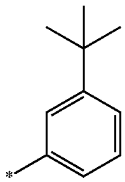
10-55
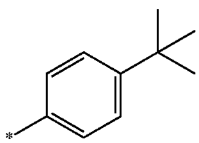
10-56
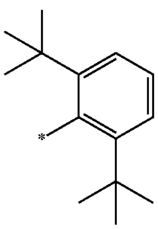
10-57
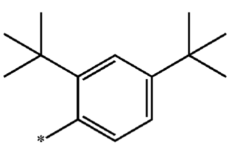
10-58
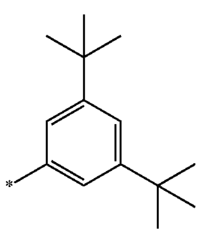
10-59
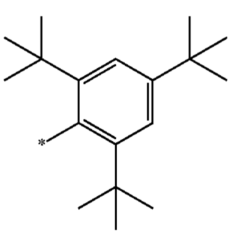
-continued
10-60
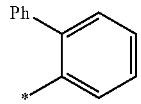
10-61
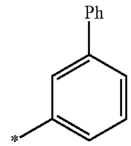
10-62
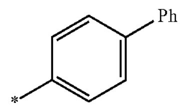
10-63
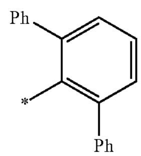
10-64
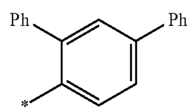
10-65
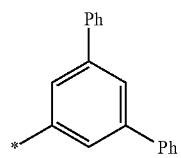
10-66
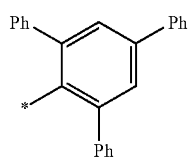
10-67
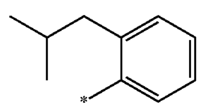
10-68
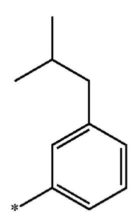
10-69
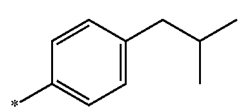

-continued
10-70
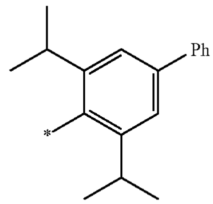
10-71
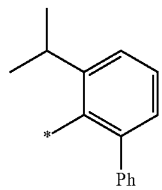
10-72
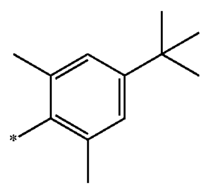
10-73
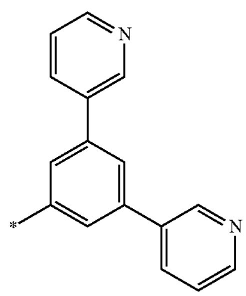
10-74
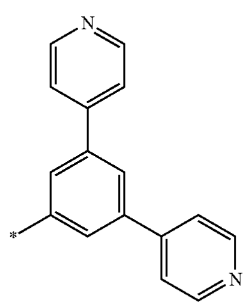
10-75
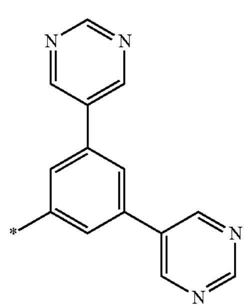
-continued
10-76
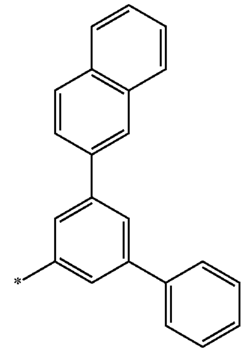
10-77
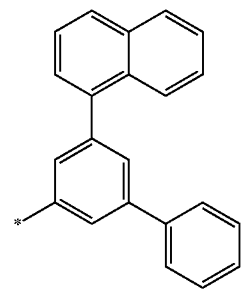
10-78
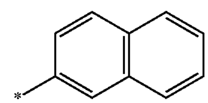
10-79
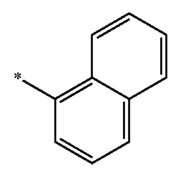
10-80
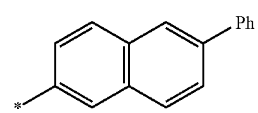
10-81
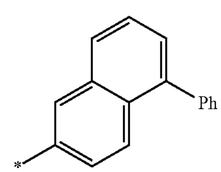
10-82
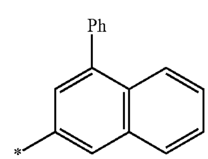
10-83
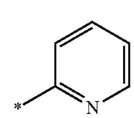
10-84
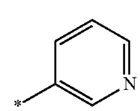

-continued
10-85
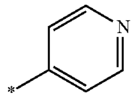
10-86
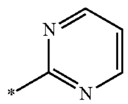
10-87
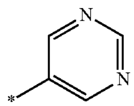
10-88
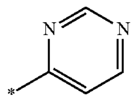
10-89
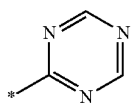
10-90
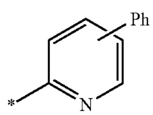
10-91
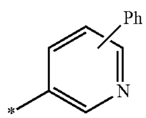
10-92
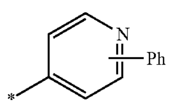
10-93
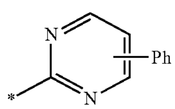
10-94
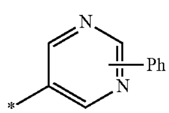
10-95
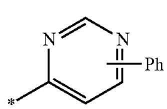
10-96
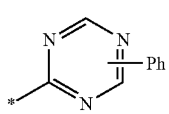
10-97
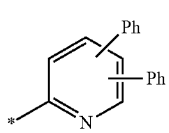
-continued
10-98
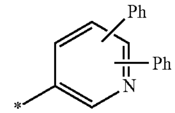
10-99
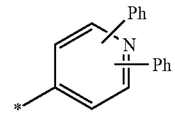
10-100
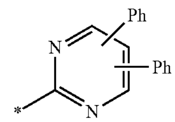
10-101
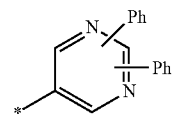
10-102
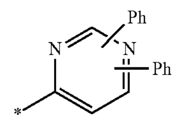
10-103
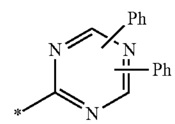
10-104
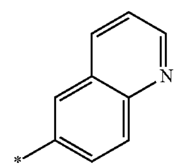
10-105
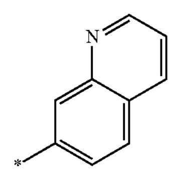
10-106
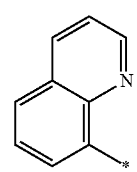
10-107
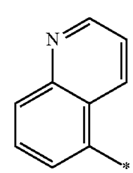

-continued
10-108
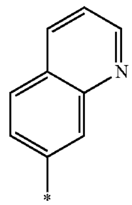
10-109
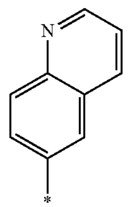
10-110
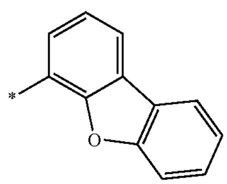
10-111
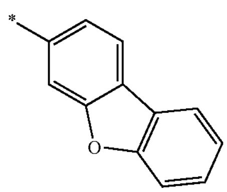
10-112
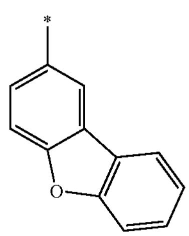
10-113
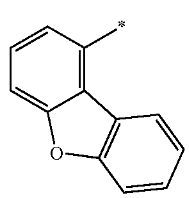
10-114
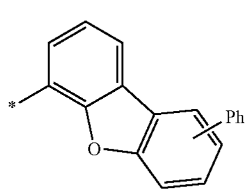
-continued
10-115
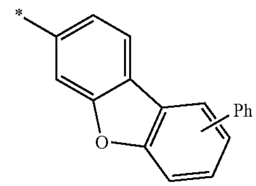
10-116
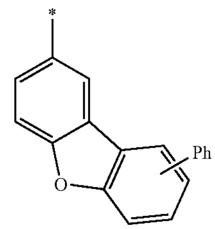
10-117
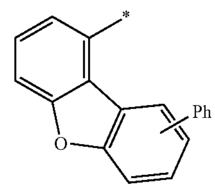
10-118
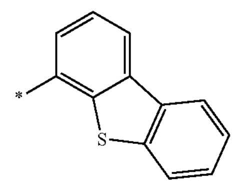
10-119
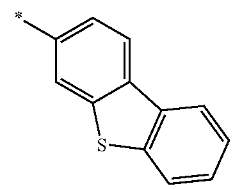
10-120
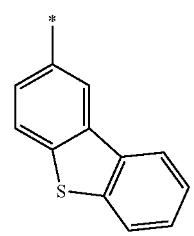
10-121
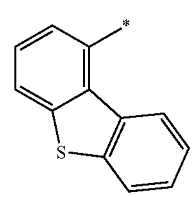
10-122
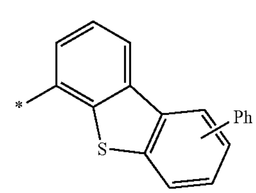

-continued
10-123
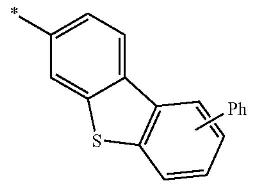
10-124
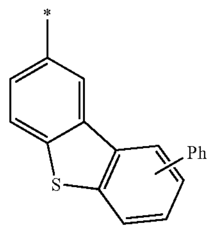
10-125
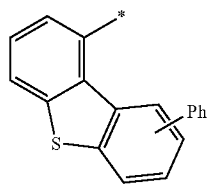
10-126
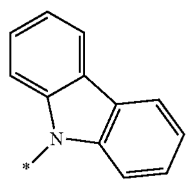
10-127
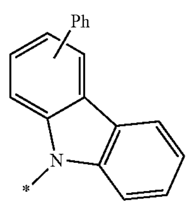
10-128
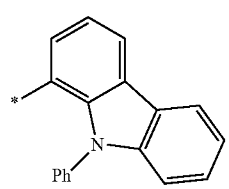
10-129
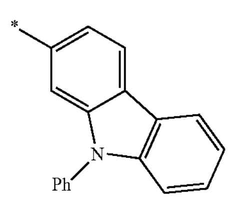
10-130
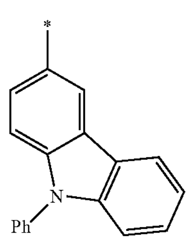
-continued
10-131
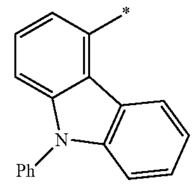
10-132
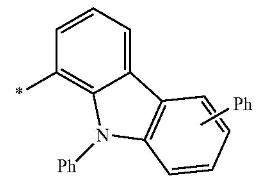
10-133
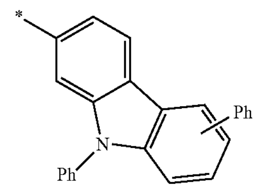
10-134
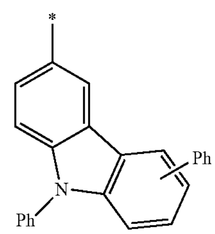
10-135
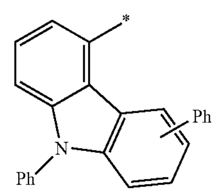
10-136
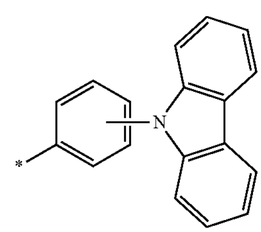
10-137
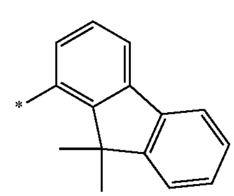
10-138
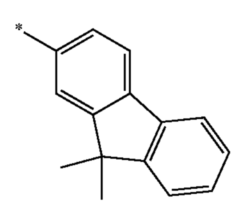

-continued
10-139
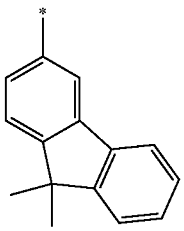
10-140
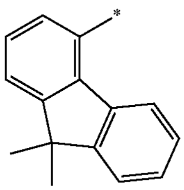
10-141
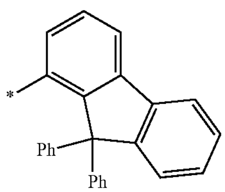
10-142
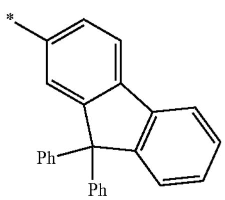
10-143
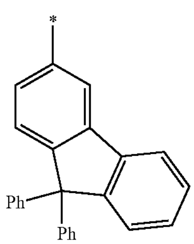
10-144
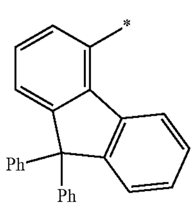
10-145
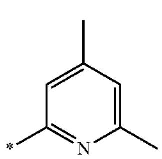
10-146
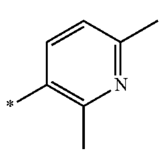
-continued
10-147
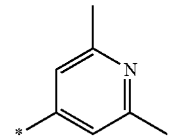
10-148
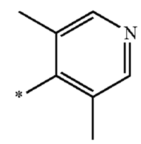
10-149
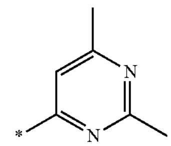
10-150
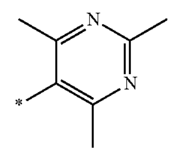
10-151
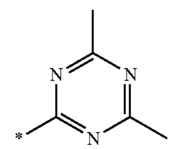
10-152
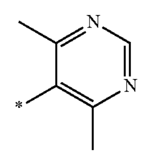
10-153
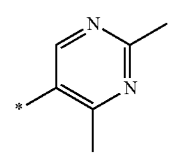
10-154
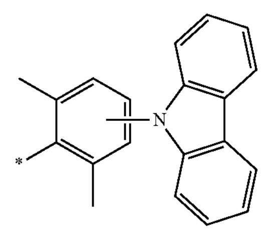
10-155
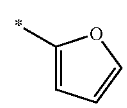
10-156
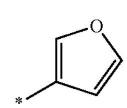
10-157
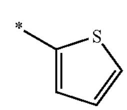

-continued
10-158
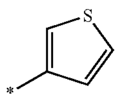
10-159
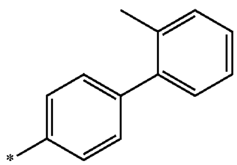
10-160
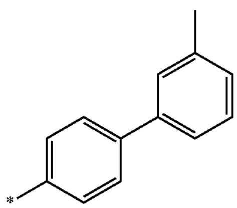
10-161
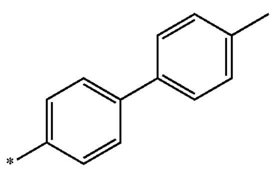
10-162
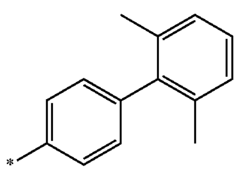
10-163
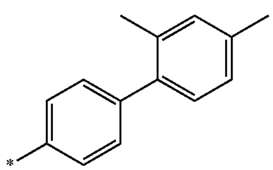
10-164
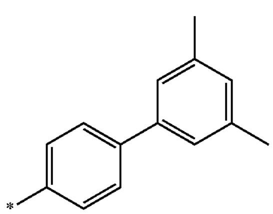
10-165
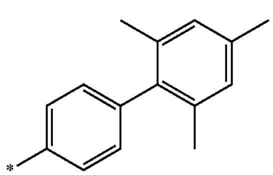
10-166
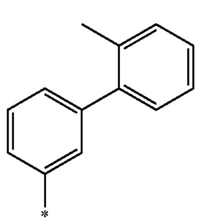
-continued
10-167
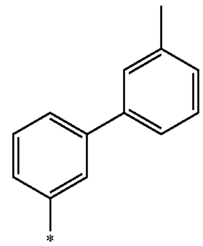
10-168
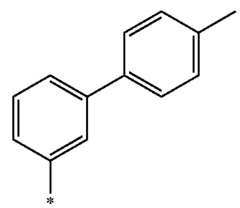
10-169
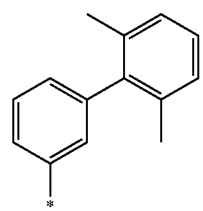
10-170
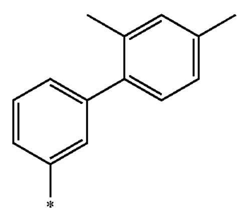
10-171
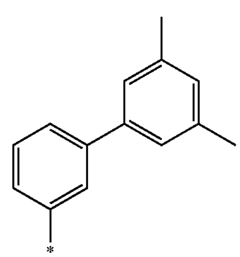
10-172
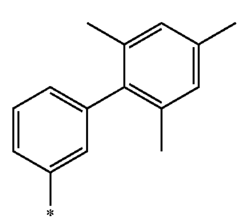
10-173
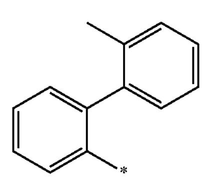

-continued
10-174
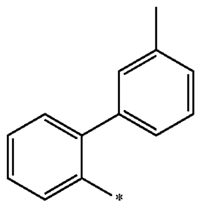
10-175
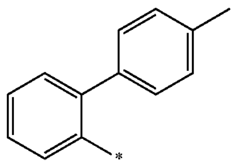
10-176
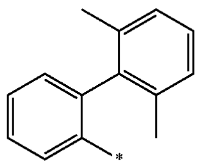
10-177
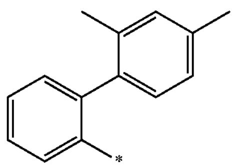
10-178
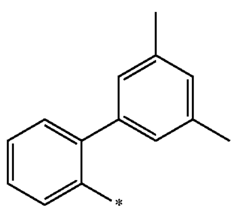
10-179
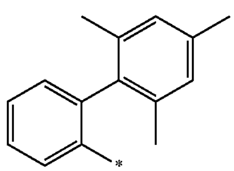
10-180
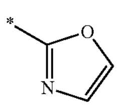
10-181
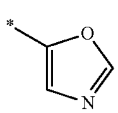
10-182
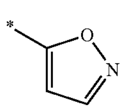
10-183
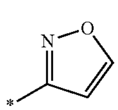
-continued
10-184
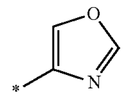
10-185
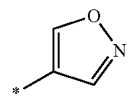
10-186
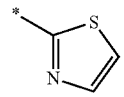
10-187
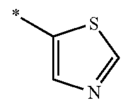
10-188
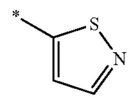
10-189
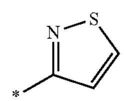
10-190
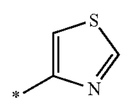
10-191
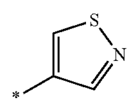
10-192
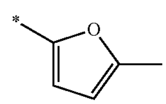
10-193
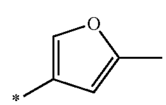
10-194
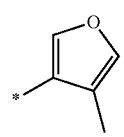
10-195
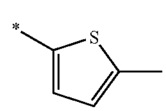
10-196
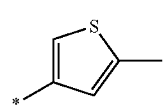
10-197
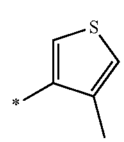

-continued
10-198
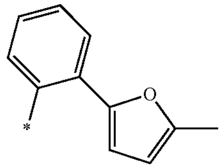
10-199
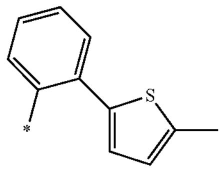
10-200
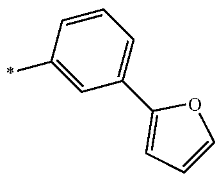
10-201
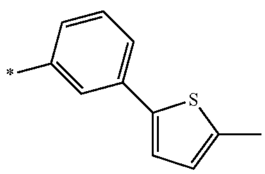
10-202
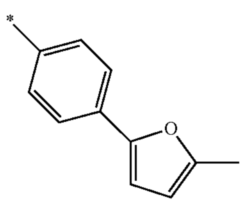
10-203
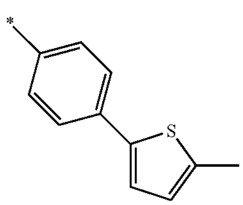
10-204
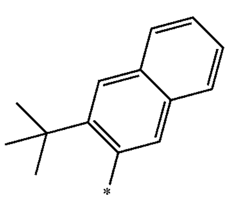
10-205
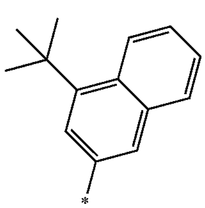
-continued
10-206
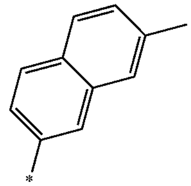
10-207
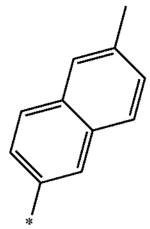
10-208
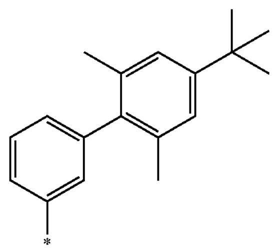
10-209
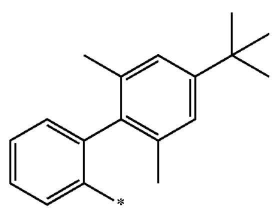
10-210
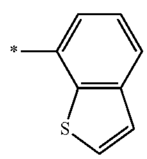
10-211
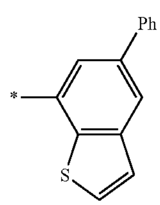
10-212
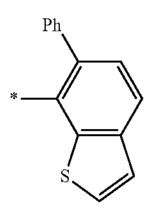

-continued
10-213
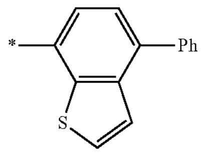
10-214
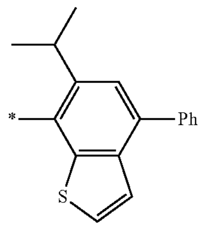
10-215
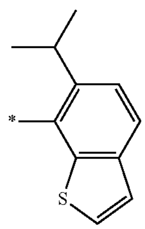
10-216
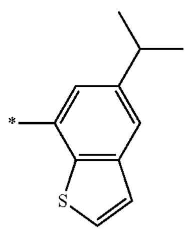
10-217
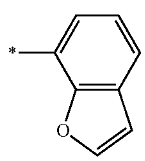
10-218
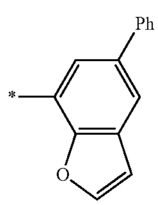
10-219
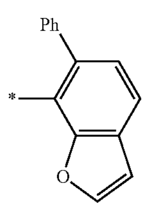
10-220
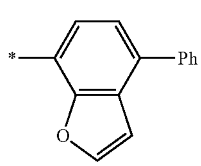
-continued
10-221
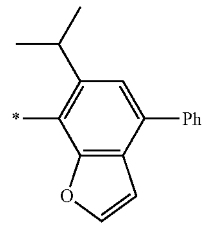
10-222
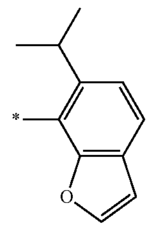
10-223
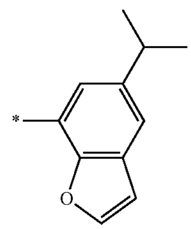
10-224
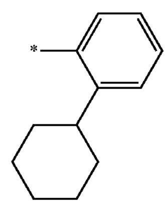
10-225
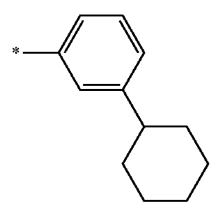
10-226
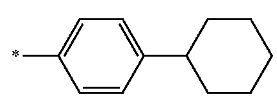
10-227
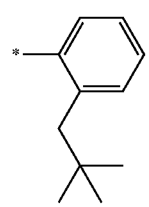
10-228
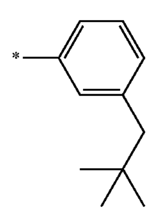

-continued
10-229
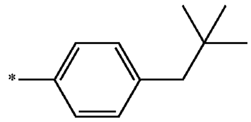
10-230
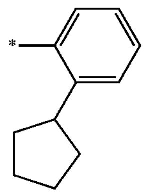
10-231
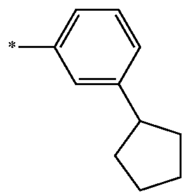
10-232
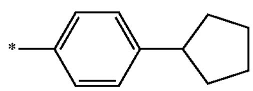
10-233
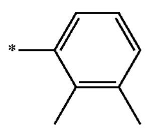
10-234
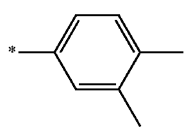
10-235
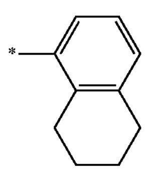
10-236
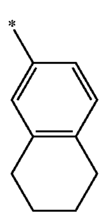
10-237
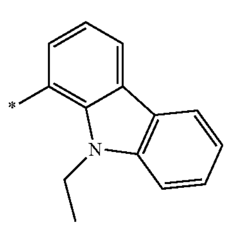
-continued
10-238
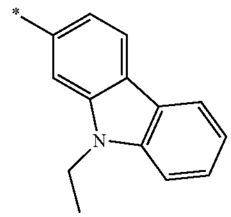
10-239
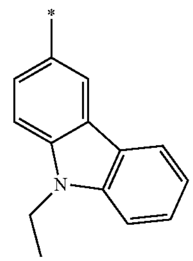
10-240
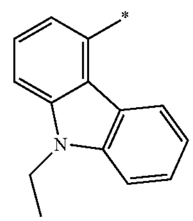
10-241
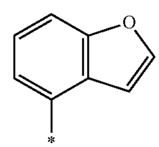
10-242
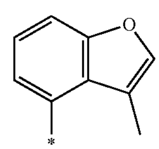
10-243
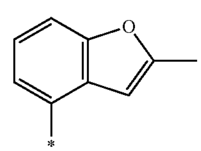
10-244
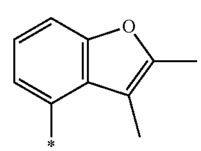
10-245
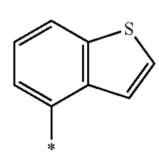
10-246
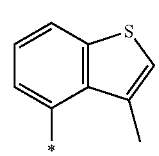

-continued 10-247

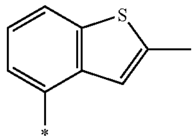

10-248

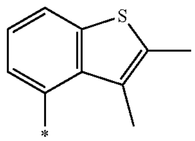

10-249

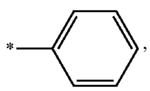

wherein, in Formulae 9-1 to 9-66 and 10-1 to 10-249, * indicates a binding site to a neighboring atom, Ph indicates a phenyl group, and TMS indicates a trimethylsilyl group.

7. The organometallic compound of claim 1, wherein, in Formula 2A, $Z_1$ is selected from hydrogen, deuterium, —F, a cyano group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, —$N(Q_1)(Q_2)$, and —$Ge(Q_3)(Q_4)(Q_5)$, wherein $Q_1$ to $Q_5$ are each independently the same as in claim 1.

8. The organometallic compound of claim 1, wherein c1 in Formula 2A is 1 or 2.

9. The organometallic compound of claim 1, wherein the group represented by

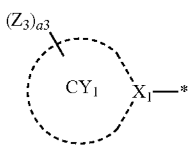

in Formula 2A is a group represented by one selected from Formulae $CY_1(1)$ to $CY_1(13)$:

CY1(1)

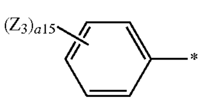

CY1(2)

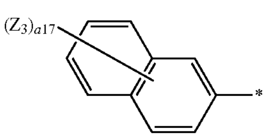

CY1(3)

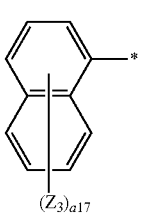

-continued

CY1(4)

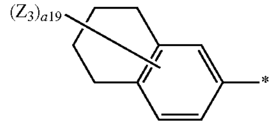

CY1(5)

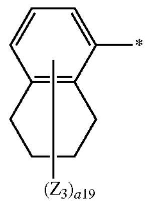

CY1(6)

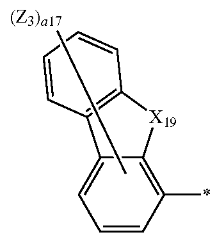

CY1(7)

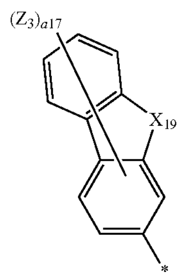

CY1(8)

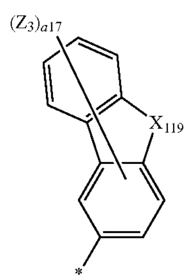

CY1(9)

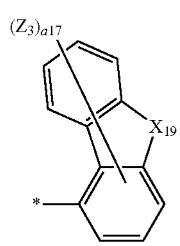

CY1(10)

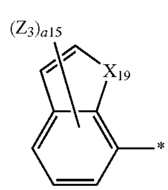

-continued

CY1(11)

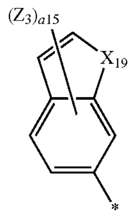

CY1(12)

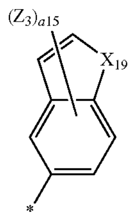

CY1(13)

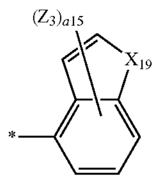

wherein, in Formulae $CY_1(1)$ to $CY_1(13)$, $Z_3$ is the same as described in claim 1, $X_{19}$ is $C(Z_4)(Z_5)$, $Z_4$ and $Z_5$ are each independently the same as described in connection with $Z_3$, a15 is an integer from 0 to 5, a17 is an integer from 0 to 7, a19 is an integer from 0 to 9, and

* indicates a binding site to a neighboring carbon atom.

10. The organometallic compound of claim 1, wherein the group represented by

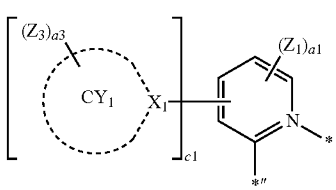

in Formula 2A is a group represented by one selected from Formulae CY1-1 to CY1-56:

CY1-1

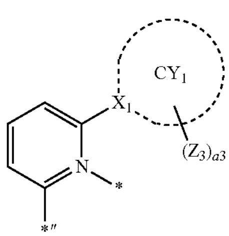

-continued

CY1-2

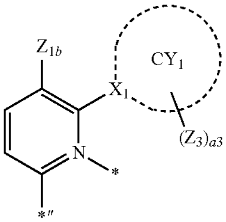

CY1-3

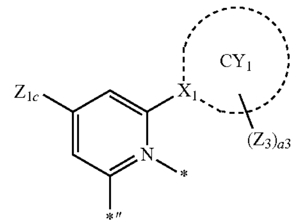

CY1-4

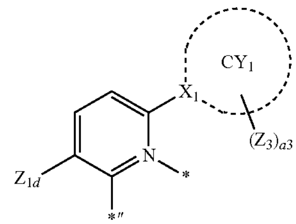

CY1-5

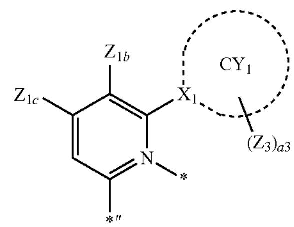

CY1-6

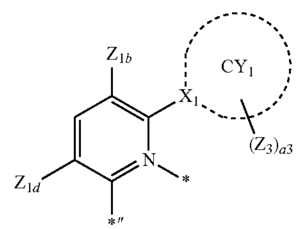

CY1-7

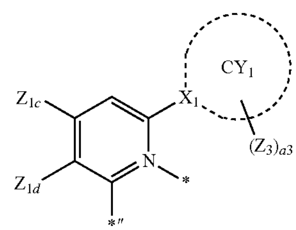

CY1-8

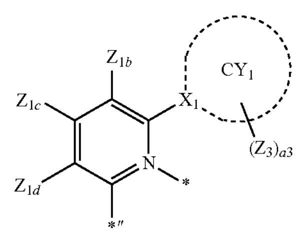

-continued
CY1-9
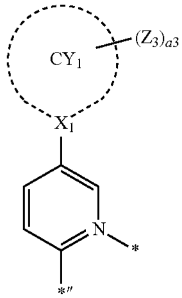
CY1-10
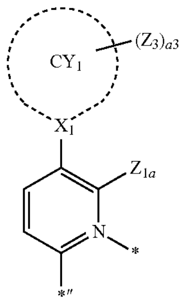
CY1-11
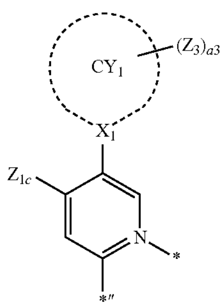
CY1-12
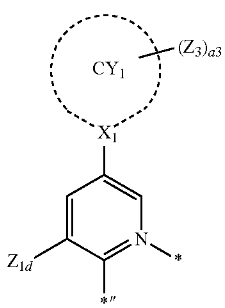
CY1-13
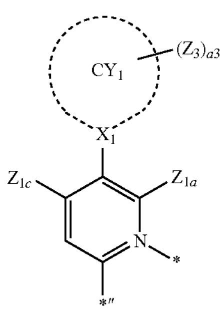
-continued
CY1-14
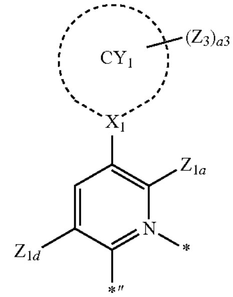
CY1-15
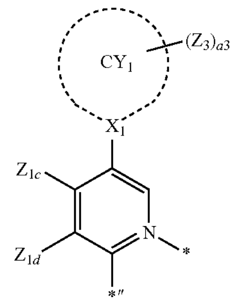
CY1-16
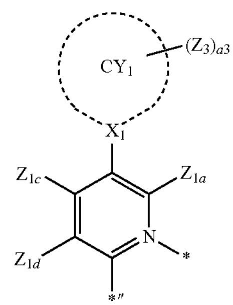
CY1-17
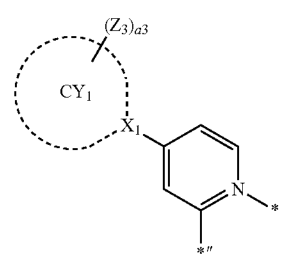
CY1-18
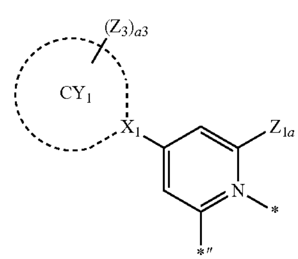

CY1-19
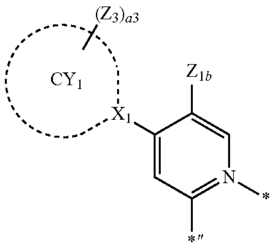
CY1-20
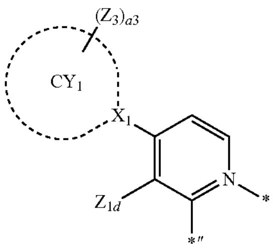
CY1-21
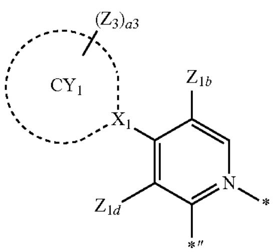
CY1-22
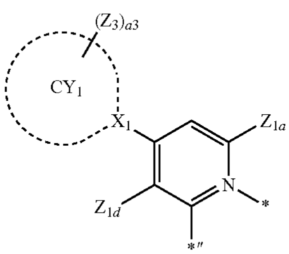
CY1-23
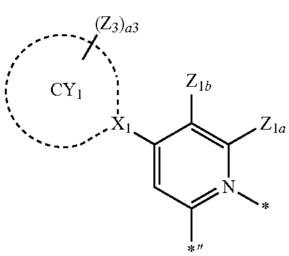
CY1-24
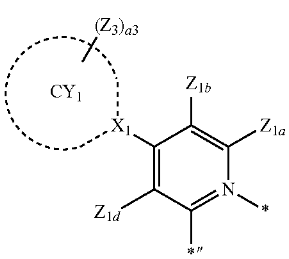
CY1-25
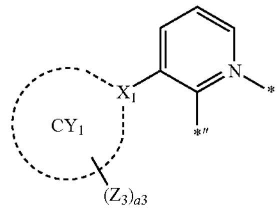
CY1-26
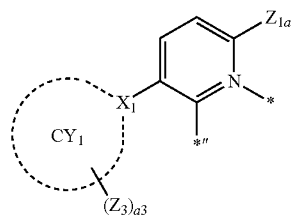
CY1-27
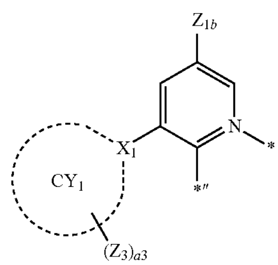
CY1-28
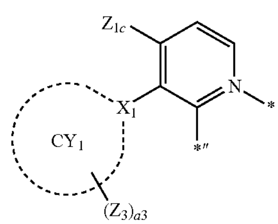
CY1-29
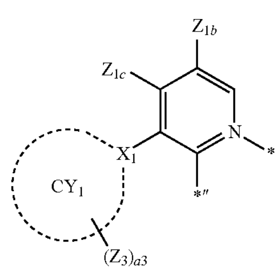
CY1-30
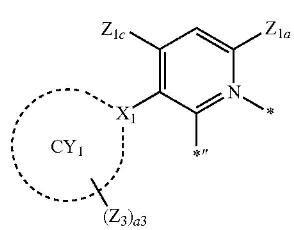

-continued
CY1-31
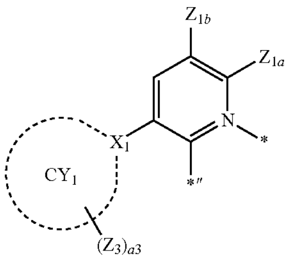
CY1-32
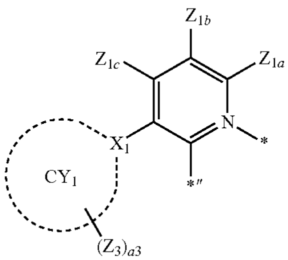
CY1-33
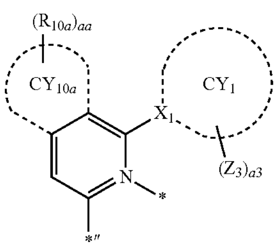
CY1-34
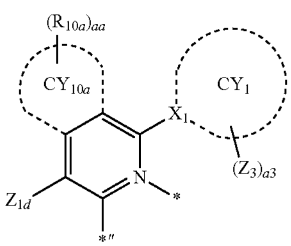
CY1-35
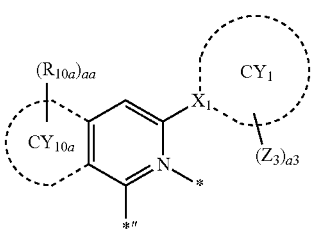
CY1-36
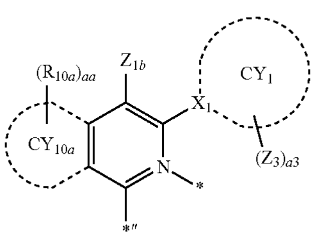
-continued
CY1-37
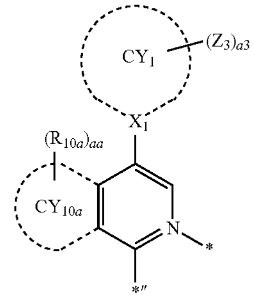
CY1-38
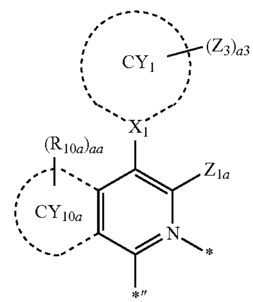
CY1-39
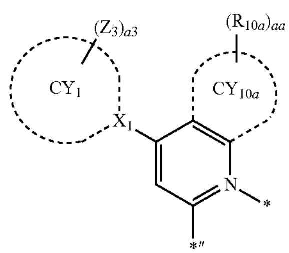
CY1-40
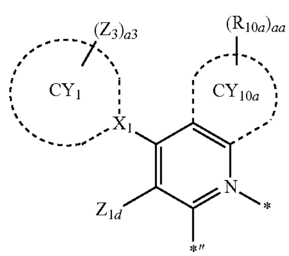
CY1-41
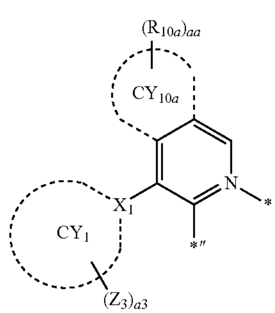

-continued
CY1-42
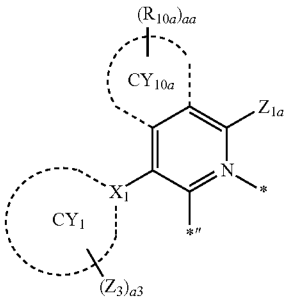
CY1-43
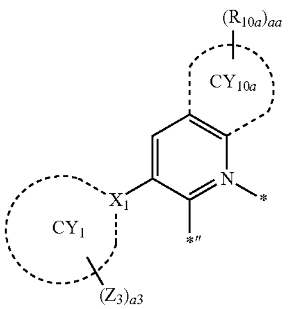
CY1-44
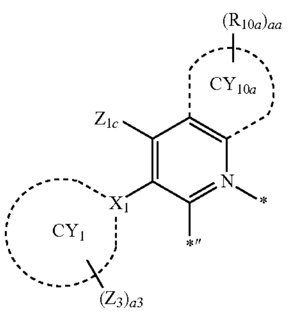
CY1-45
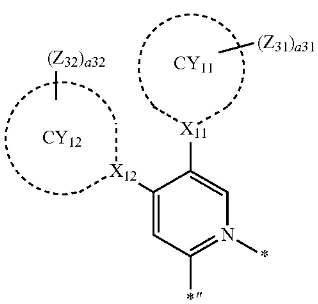
CY1-46
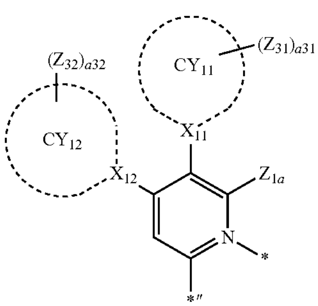
-continued
CY1-47
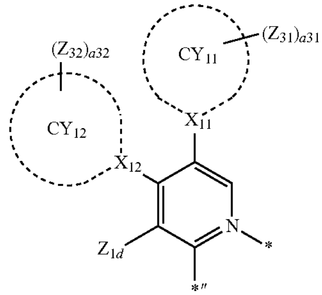
CY1-48
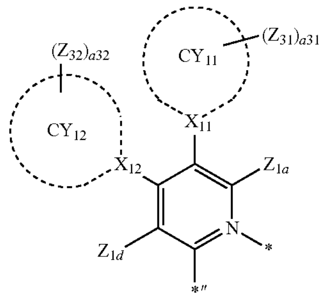
CY1-49
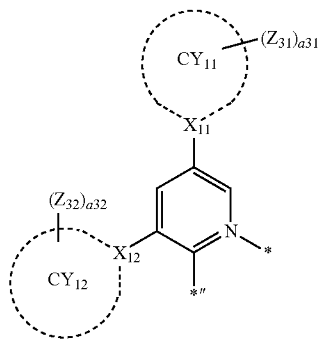
CY1-50
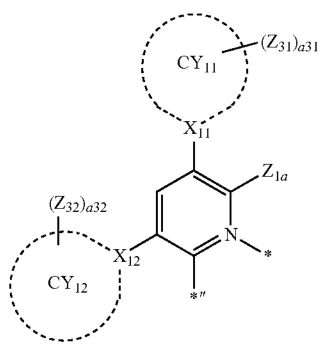
CY1-51
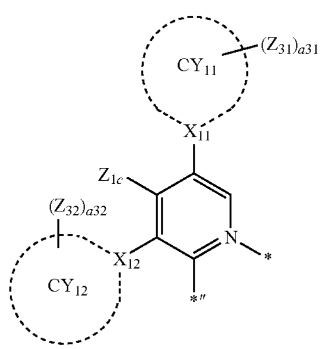

-continued

CY1-52

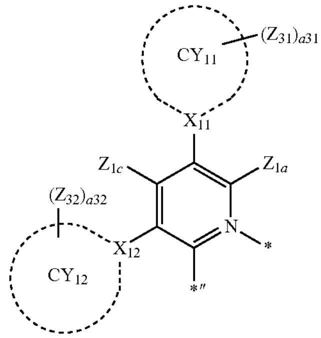

CY1-53

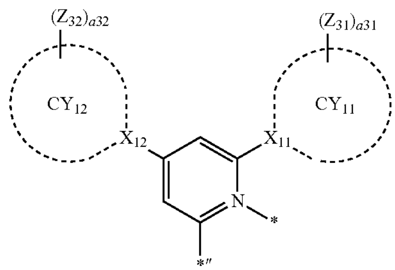

CY1-54

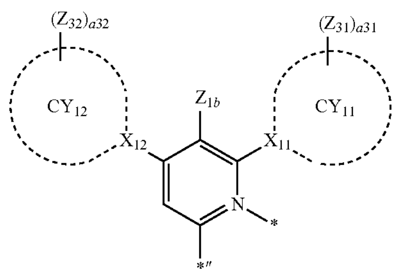

CY1-55

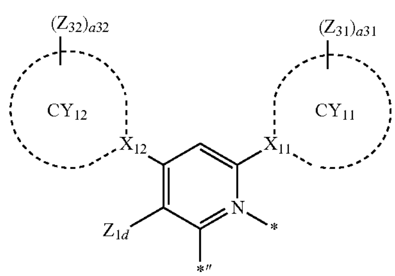

CY1-56

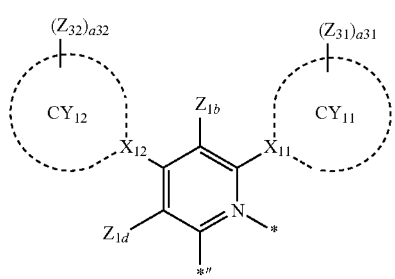

, wherein, in Formulae CY1-1 to CY1-56, $X_1$, ring $CY_1$, $Z_3$, and a3 are each independently the same as described in claim 1, $Z_{1a}$ to $Z_{1d}$ are each independently the same as described in connection with $Z_1$ in claim 1, wherein $Z_{1a}$ to $Z_{1d}$ are not hydrogen, $X_{11}$ and $X_{12}$ are each independently the same as described in connection with $X_1$ in claim 1, ring $CY_{11}$ and ring $CY_{12}$ are each independently the same as described in connection with ring $CY_1$ in claim 1, $Z_{31}$ and $Z_{32}$ are each independently the same as described in connection with $Z_3$ in claim 1, a31 and a32 are each independently the same as described in connection with a3 in claim 1, ring $CY_{10a}$ is a $C_5$-$C_{30}$ carbocyclic group or a $C_1$-$C_{30}$ heterocyclic group, $R_{10a}$ is the same as described in claim 1, aa is an integer from 0 to 10,

* indicates a binding site to M in Formula 1, and

*" indicates a binding site to ring $CY_2$ in Formula 2A.

11. The organometallic compound of claim 1, wherein the group represented by

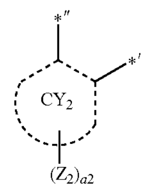

in Formula 2A is a group represented by one selected from Formulae CY2-1, CY2-8 to CY2-CY2-28, CY2-31 to CY2-34, CY2-37 to CY2-40, CY2-44 to CY2-46, CY2-49 to CY2-52, CY2-55 to CY2-58, and CY2-61 to CY2-64:

CY2-1

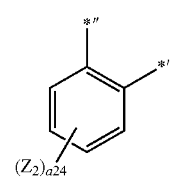

CY2-8

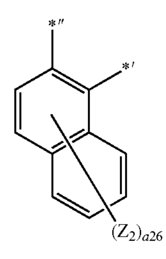

CY2-9

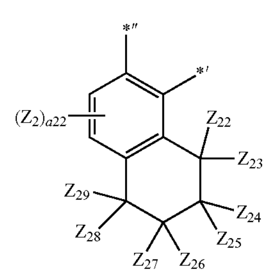

-continued
CY2-10
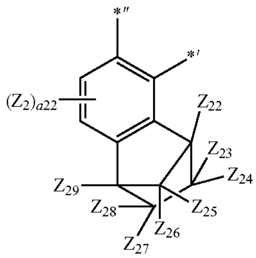
CY2-11
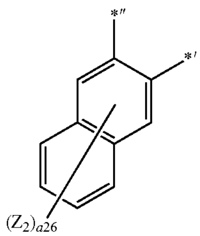
CY2-12
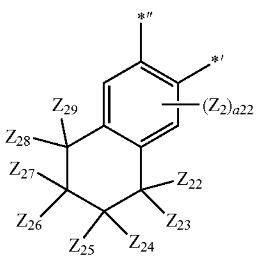
CY2-13
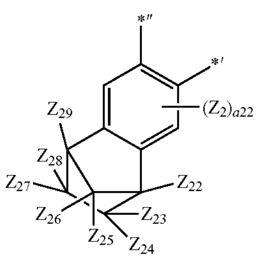
CY2-14
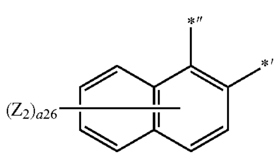
CY2-15
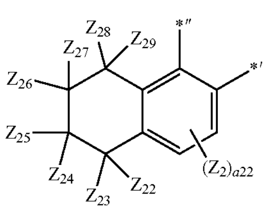
CY2-16
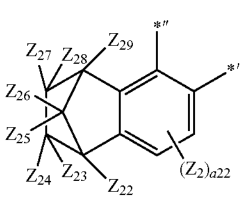
-continued
CY2-17
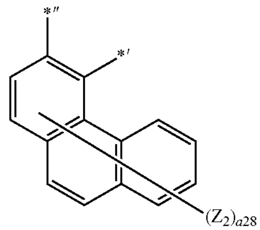
CY2-18
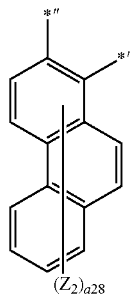
CY2-19
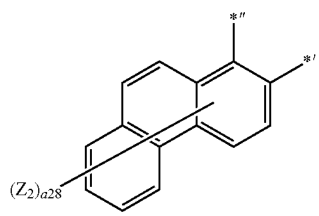
CY2-20
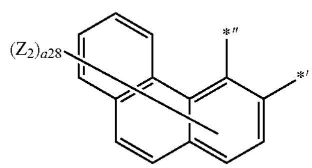
CY2-21
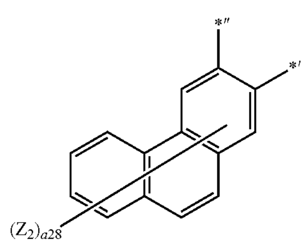
CY2-22
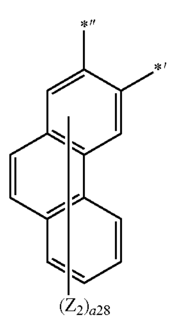

-continued
CY2-23
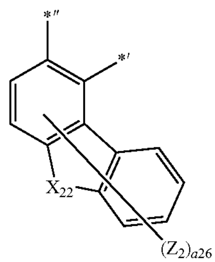
CY2-24
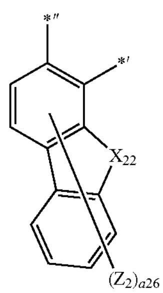
CY2-25
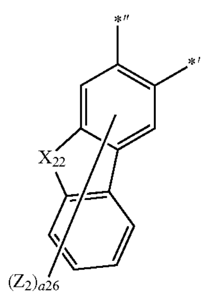
CY2-26
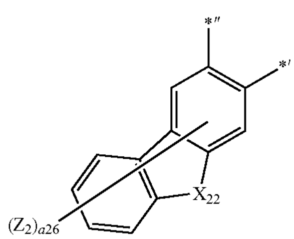
CY2-27
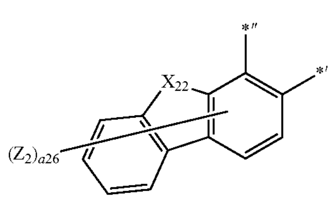
CY2-28
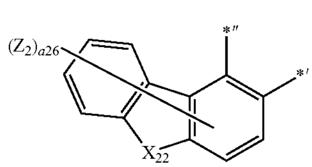
-continued
CY2-29
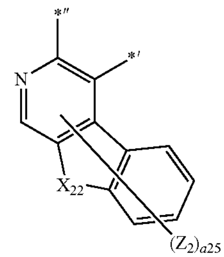
CY2-30
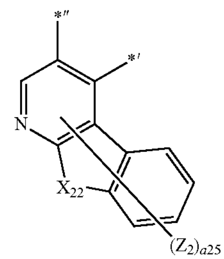
CY2-31
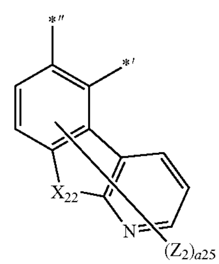
CY2-32
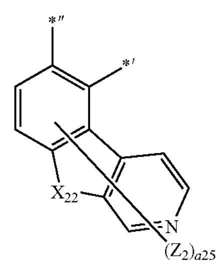
CY2-33
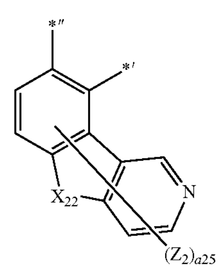
CY2-34
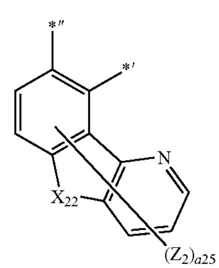

-continued
CY2-37
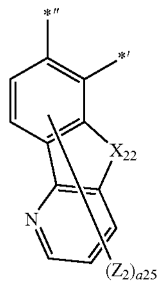
CY2-38
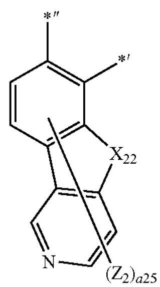
CY2-39
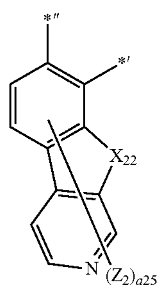
CY2-40
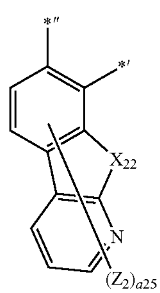
CY2-43
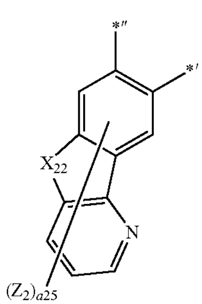
-continued
CY2-44
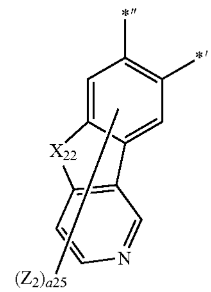
CY2-45
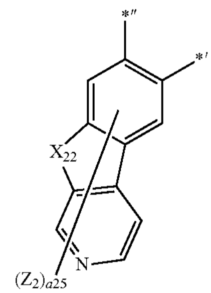
CY2-46
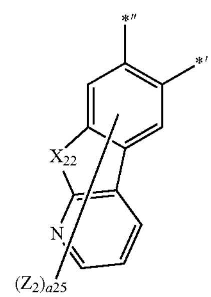
CY2-49
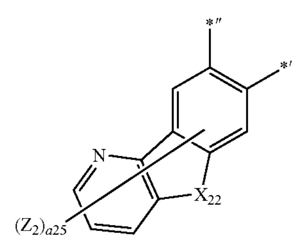
CY2-50
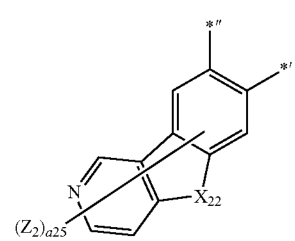
CY2-51
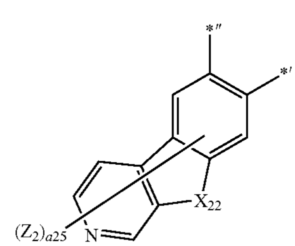

-continued

CY2-52

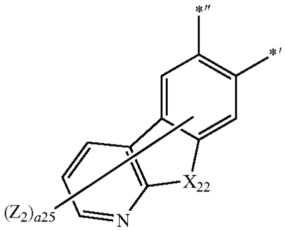

CY2-55

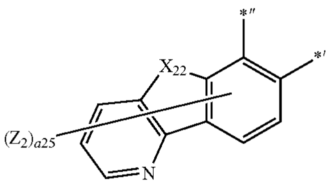

CY2-56

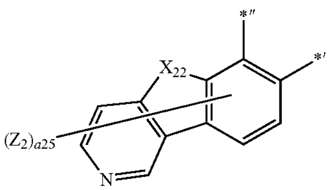

CY2-57

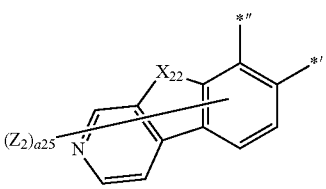

CY2-58

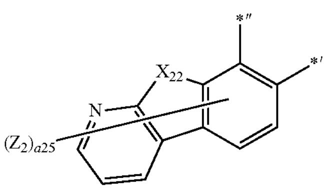

CY2-61

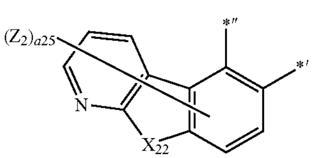

CY2-62

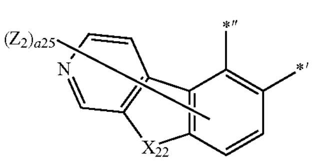

CY2-63

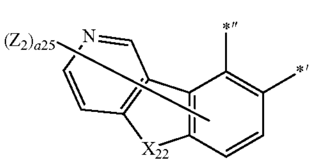

-continued

CY2-64

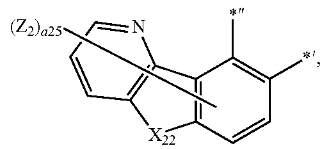

wherein, in Formulae CY2-1, CY2-8 to CY2-CY2-28, CY2-31 to CY2-34, CY2-37 to CY2-40, CY2-44 to CY2-46, CY2-49 to CY2-52, CY2-55 to CY2-58, and CY2-61 to CY2-64, $Z_2$ is the same as described in claim 1, $X_{22}$ is $C(Z_{22})(Z_{23})$, $N(Z_{22})$, O, or S, $Z_{22}$ to $Z_{29}$ are each independently the same as described in connection with $Z_2$ in claim 1, a28 is an integer from 0 to 8, a26 is an integer from 0 to 6, a25 is an integer from 0 to 5, a24 is an integer from 0 to 4, a22 is an integer from 0 to 2,

*" indicates a binding site to a carbon atom of a neighboring pyridine ring in Formula 2A, and

*' indicates a binding site to M in Formula 1.

12. The organometallic compound of claim 1, wherein the group represented by

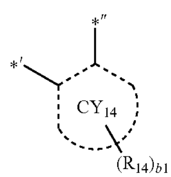

in Formula 2B is a group represented by one selected from Formulae CY14-1, CY14-8 to CY14-28, CY14-31 to CY14-34, CY14-37 to CY14-40, CY14-43 to CY14-46, CY14-49 to CY14-52, CY14-55 to CY14-58, and CY14-61 to CY14-64:

CY14-1

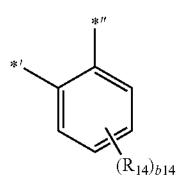

CY14-8

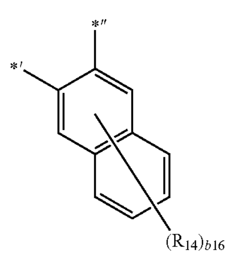

-continued
CY14-9
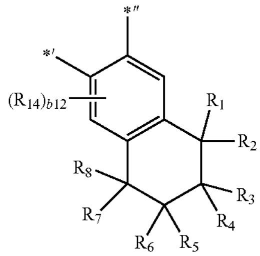
CY14-10
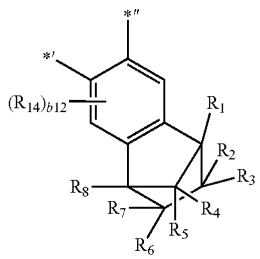
CY14-11
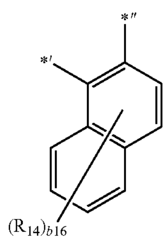
CY14-12
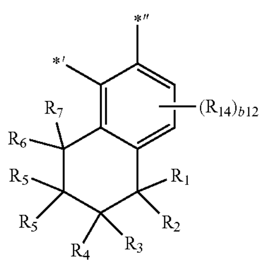
CY14-13
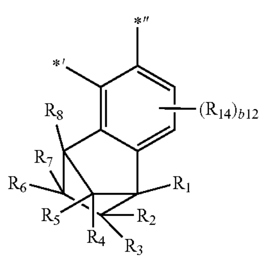
CY14-14
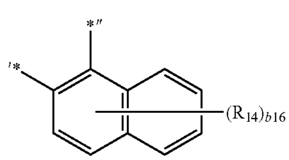
CY14-15
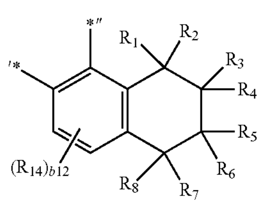
-continued
CY14-16
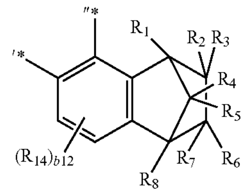
CY14-17
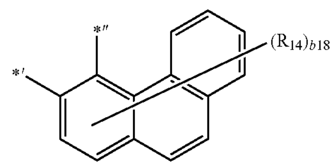
CY14-18
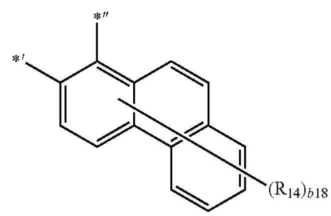
CY14-19
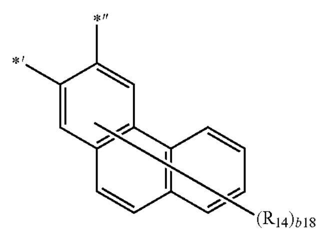
CY14-20
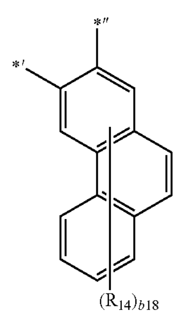
CY14-21
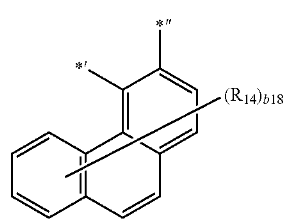

-continued
CY14-22
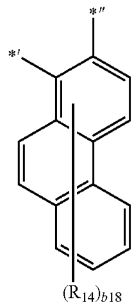
CY14-23
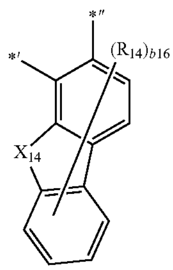
CY14-24
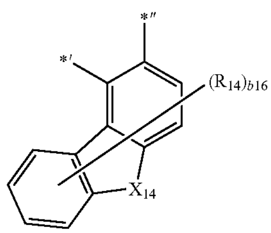
CY14-25
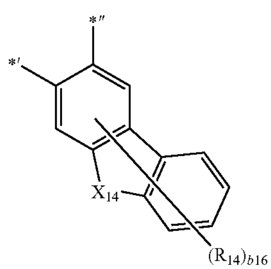
CY14-26
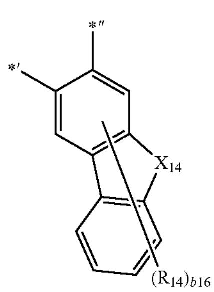
CY14-27
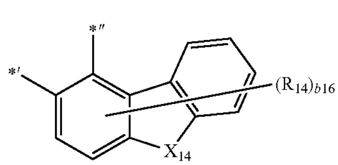
-continued
CY14-28
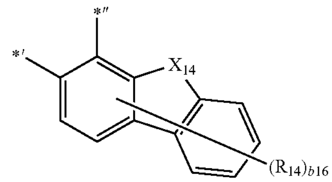
CY14-31
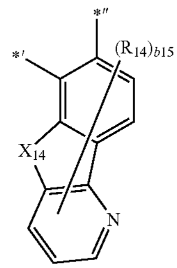
CY14-32
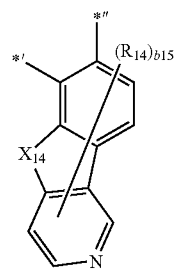
CY14-33
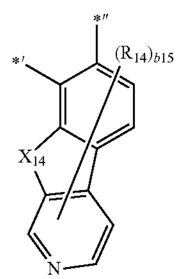
CY14-34
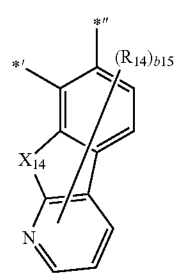
CY14-37
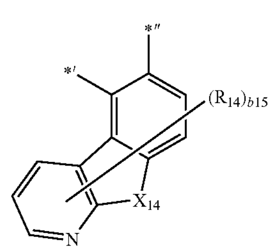

-continued
CY14-38
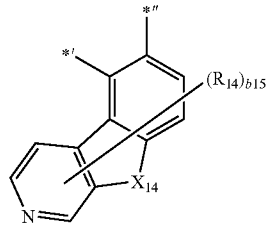
CY14-39
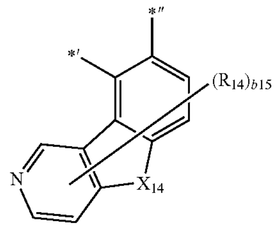
CY14-40
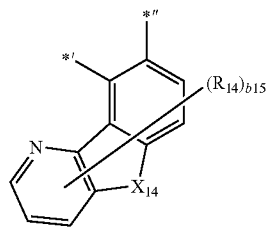
CY14-43
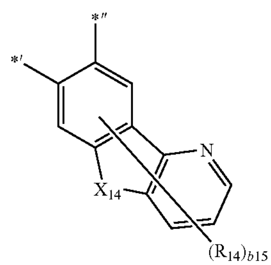
CY14-44
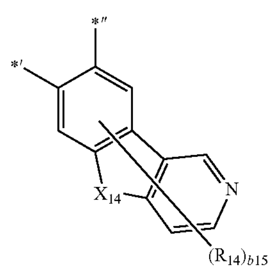
CY14-45
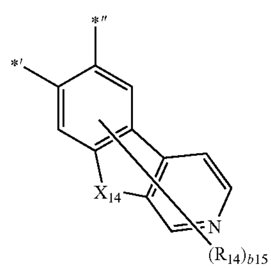
-continued
CY14-46
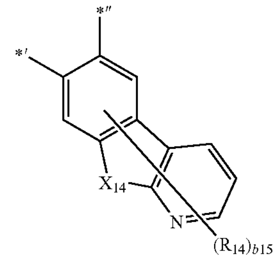
CY14-49
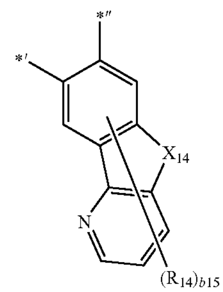
CY14-50
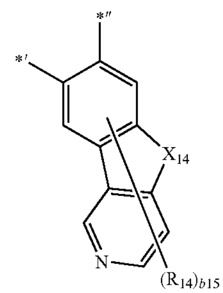
CY14-51
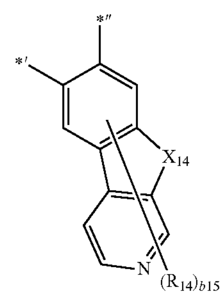
CY14-52
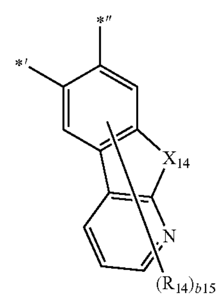

-continued

CY14-55

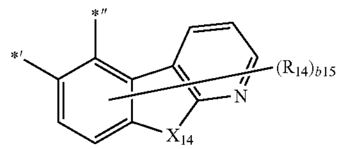

CY14-56

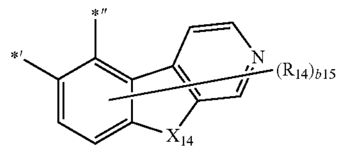

CY14-57

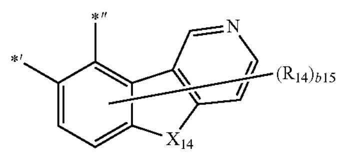

CY14-58

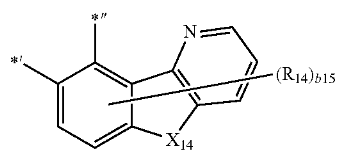

CY14-61

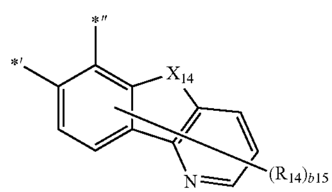

-continued

CY14-62

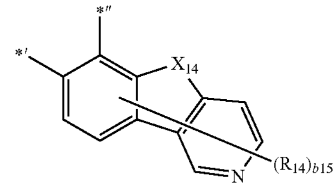

CY14-63

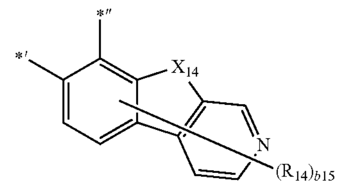

CY14-64

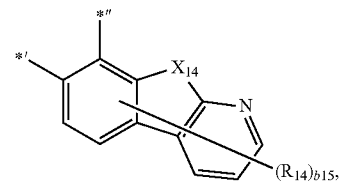

wherein, in Formulae CY14-1, CY14-8 to CY14-28, CY14-31 to CY14-34, CY14-37 to CY14-40, CY14-43 to CY14-46, CY14-49 to CY14-52, CY14-55 to CY14-58, and CY14-61 to CY14-64, $R_{14}$ is the same as described in claim 1, $X_{14}$ is $C(R_1)(R_2)$, $N(R_1)$, O, or S, $R_1$ to $R_8$ are each independently the same as described in connection with $R_{14}$ in claim 1, b18 is an integer from 0 to 8, b16 is an integer from 0 to 6, b15 is an integer from 0 to 5, b14 is an integer from 0 to 4, b12 is an integer from 0 to 2,

*" indicates a binding site to a carbon atom of a neighboring pyridine ring in Formula 2B, and

*' indicates a binding site to M in Formula 1.

13. The organometallic compound of claim 1, wherein the organometallic compound is represented by Formula 1A:

Formula 1A

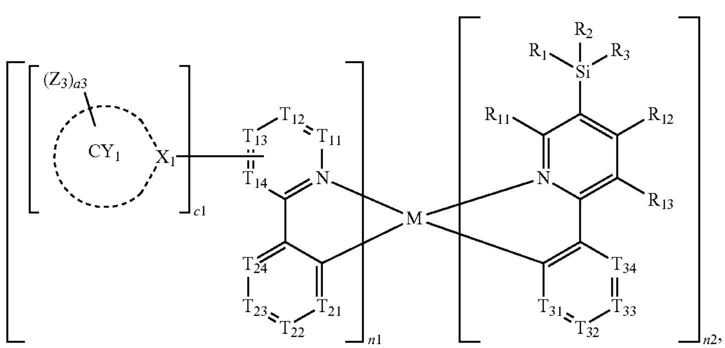

wherein, in Formula 1A,

M, n1, n2, $X_1$, ring $CY_1$, $R_1$ to $R_3$, $Z_3$, $R_{11}$ to $R_{13}$, and c1 are each independently the same as described in claim 1, $T_{11}$ is N, $C(Z_{1a})$, or carbon linked to ring $CY_1$, $T_{12}$ is N, $C(Z_{1b})$, or carbon linked to ring $CY_1$, $T_{13}$ is N, $C(Z_{1c})$, or carbon linked to ring $CY_1$, $T_{14}$ is N, $C(Z_{1d})$, or carbon linked to ring $CY_1$, at least one selected from $T_{11}$ to $T_{14}$ is carbon linked to ring $CY_1$, and $Z_{1a}$ to $Z_{1d}$ are each independently the same as described in connection with $Z_1$ in claim 1, $T_{21}$ is N or $C(Z_{2a})$, $T_{22}$ is N or $C(Z_{2b})$, $T_{23}$ is N or $C(Z_{2c})$, $T_{24}$ is N or $C(Z_{2d})$, and $Z_{2a}$ to $Z_{2d}$ are each independently the same as described in connection with $Z_2$ in claim 1, $T_{31}$ is N or $C(R_{14a})$, $T_{32}$ is N or $C(R_{14b})$, $T_{33}$ is N or $C(R_{14c})$, $T_{34}$ is N or $C(R_{14d})$, and $R_{14a}$ to $R_{14d}$ are each independently the same as described in connection with $R_{14}$ in claim 1, two or more groups $Z_{1a}$ to $Z_{1d}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more groups $Z_{2a}$ to $Z_{2d}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, when a3 is two or more, two or more groups $Z_3$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{12}$ and $R_{13}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more groups $R_{14a}$ to $R_{14d}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, two or more groups $Z_{1a}$ to $Z_{1d}$, $Z_{2a}$ to $Z_{2d}$, $R_{11}$ to $R_{13}$, and $R_{14a}$ to $R_{14d}$ are optionally linked to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$, $R_{10a}$ is the same as described in claim 1, the bonds between N and M are coordinate bonds, and the bonds between C and M are covalent bonds.

14. The organometallic compound of claim 1, wherein the organometallic compound is one selected from Compounds 1 to 102, 104 to 113, 115 to 122, 124 to 133, 135 to 142, 144 to 153, 155 to 156, 158 to 160, 170, 175, 181, 182, 184 to 194, 196 to 199, 220, 281 to 318, 320 to 322, 324 to 334, 336 to 339, 341 to 382, 384 to 394, 396 to 399, 401, 402, 404 to 407, 409 to 412, 414 to 416, and 420:

1

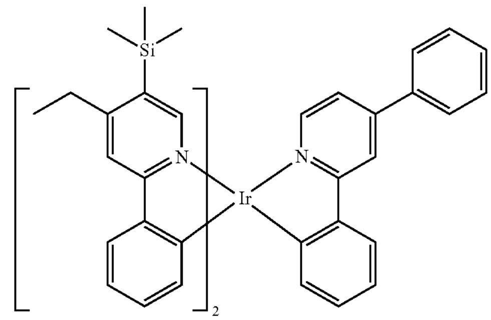

2

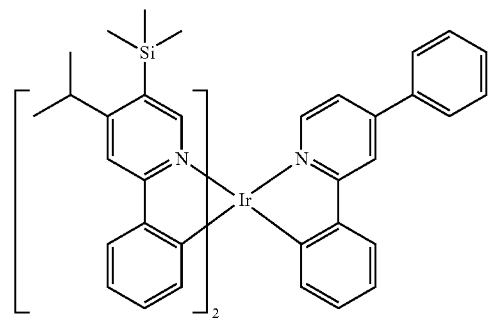

3

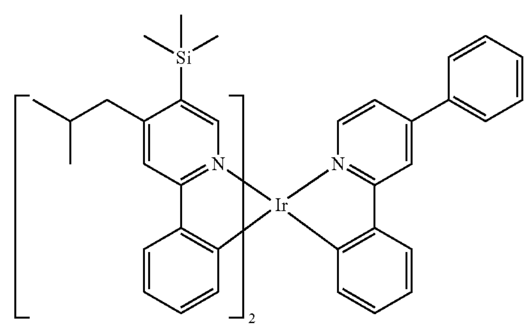

4

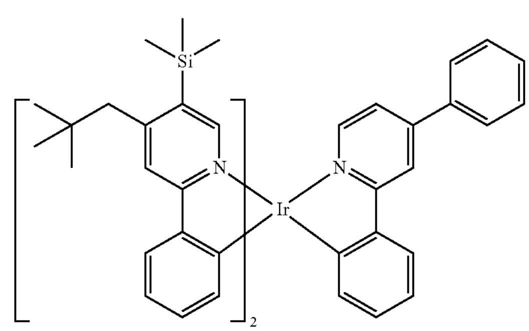

-continued
5
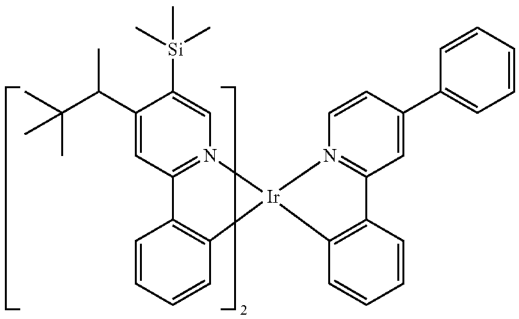
6
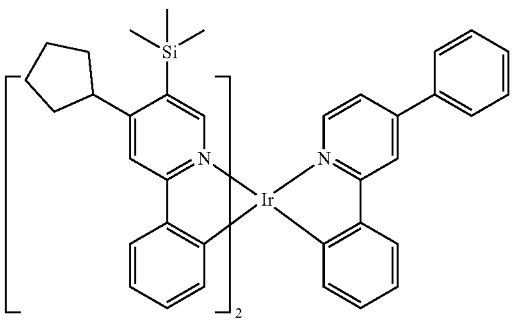
7
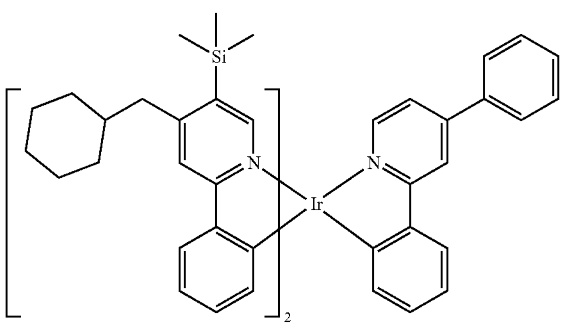
8
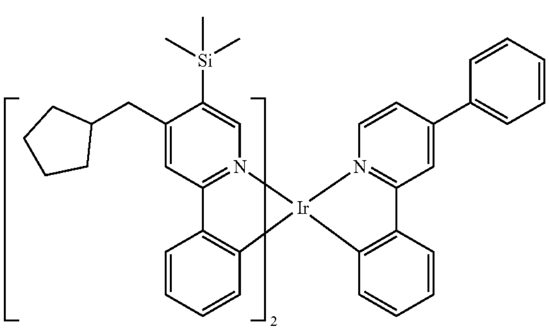
-continued
9
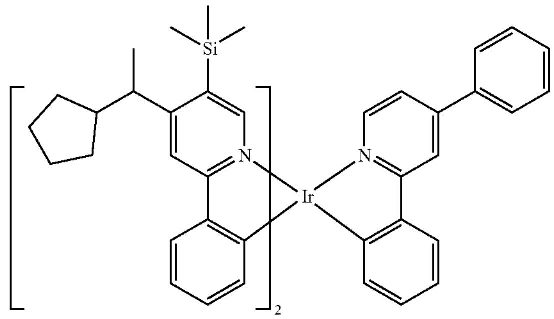
10
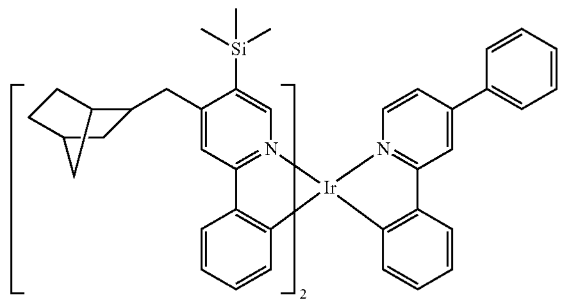
11
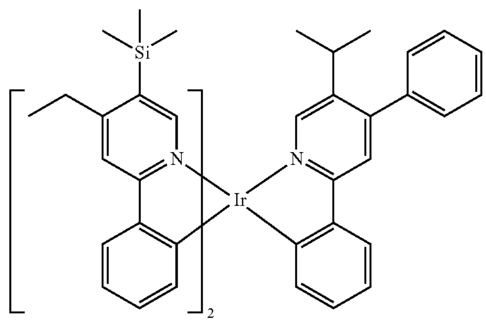
12
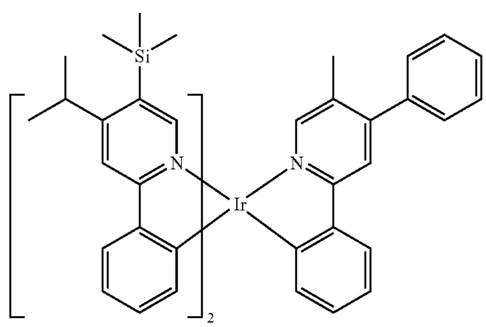
13
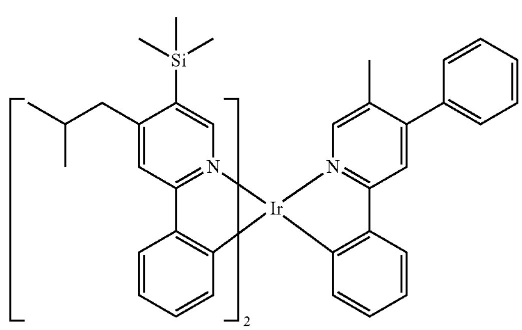

-continued
14
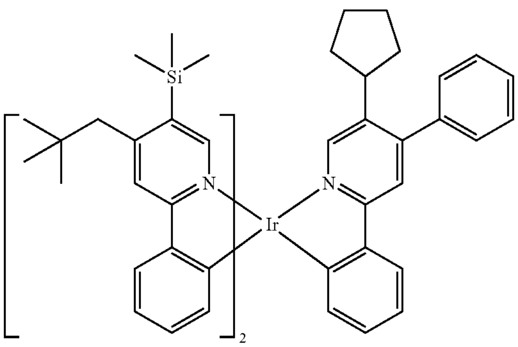
15
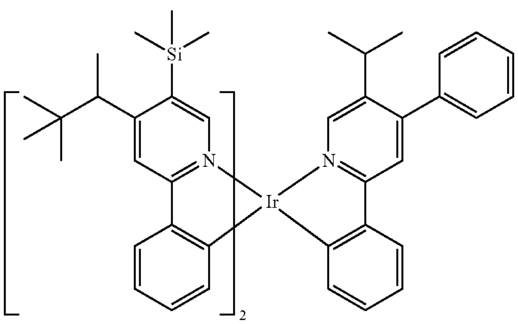
16
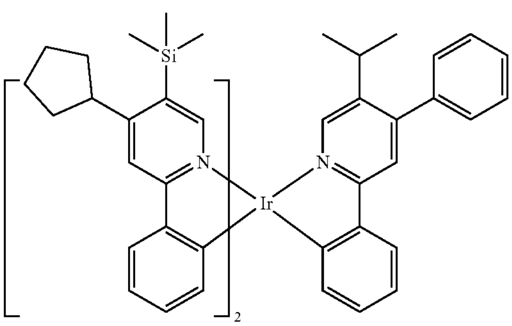
17
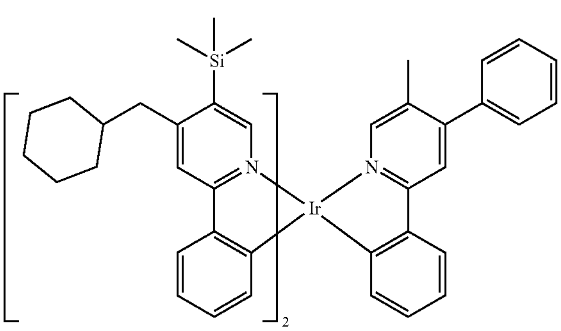
-continued
18
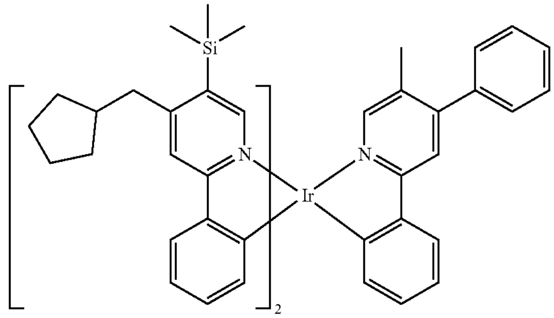
19
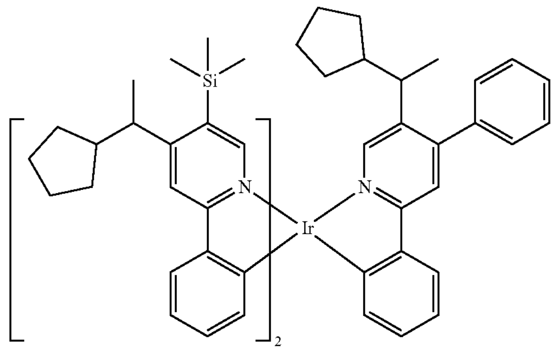
20
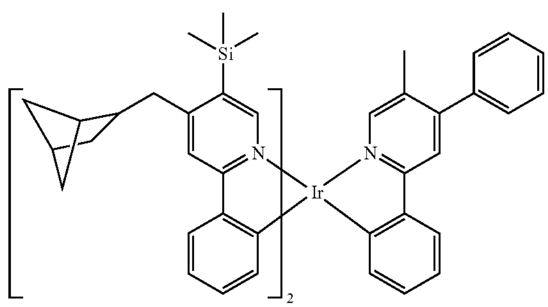
21
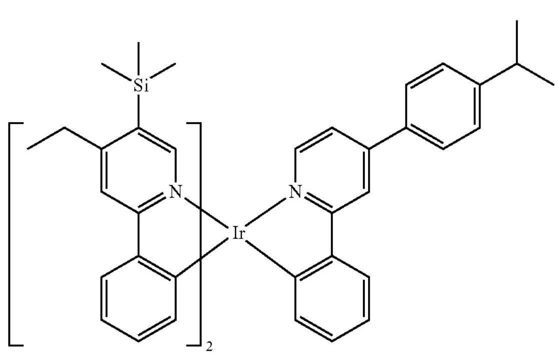

-continued
22
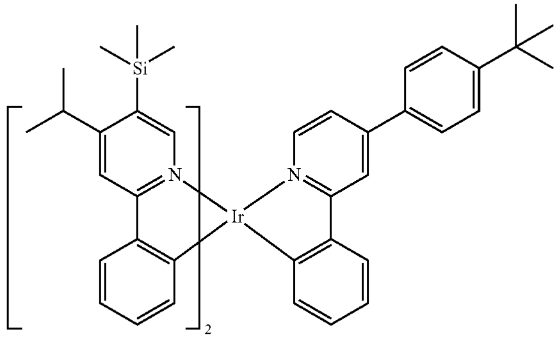
23
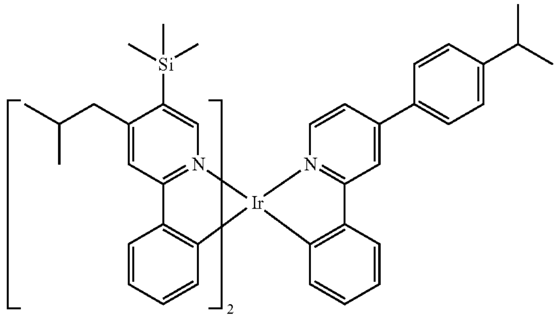
24
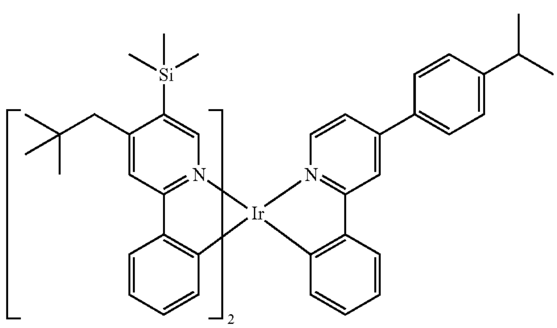
25
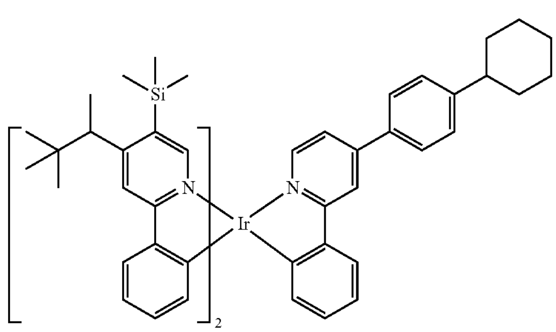
-continued
26
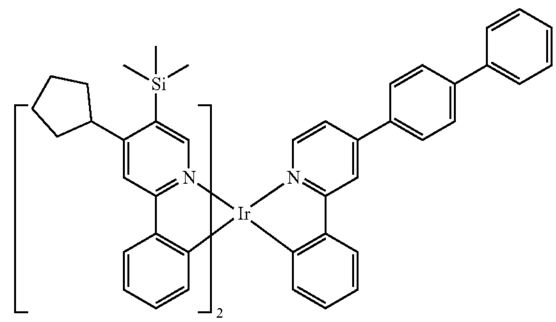
27
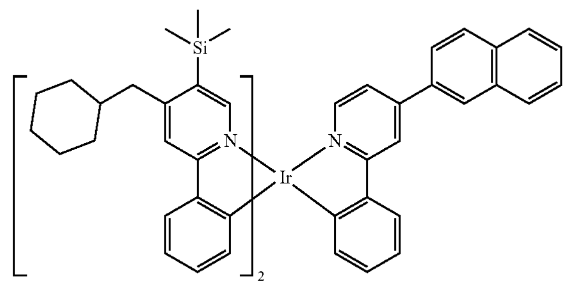
28
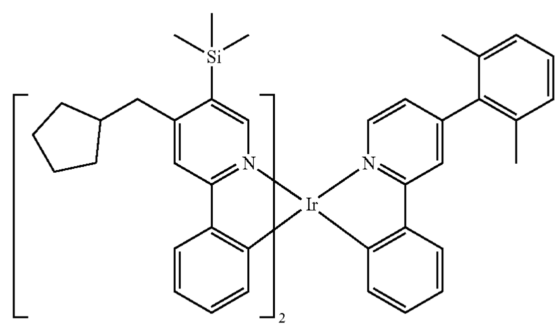
29
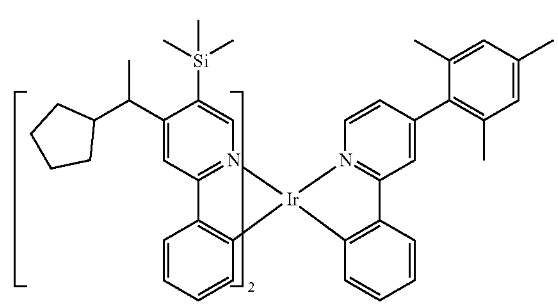
30
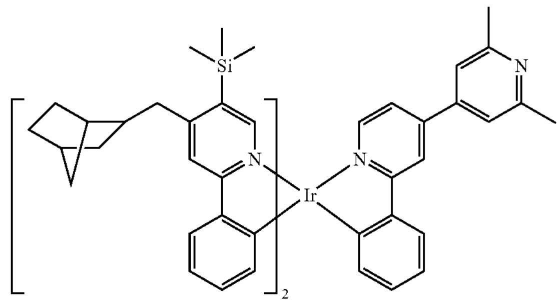

-continued
31
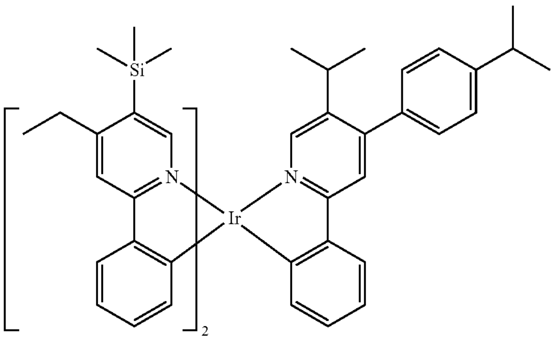
32
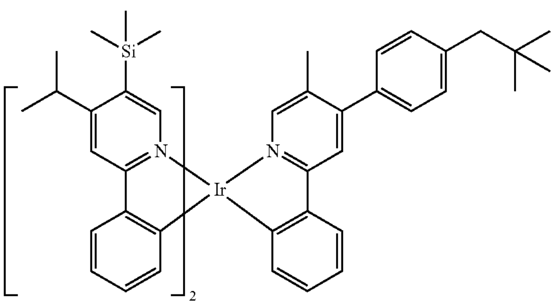
33
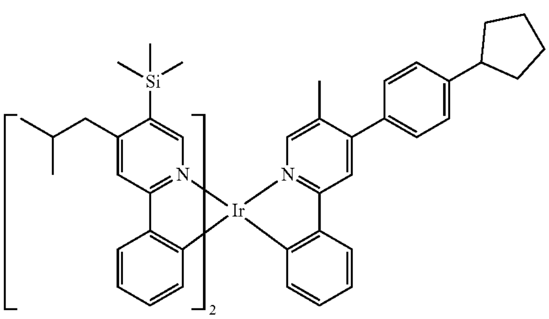
34
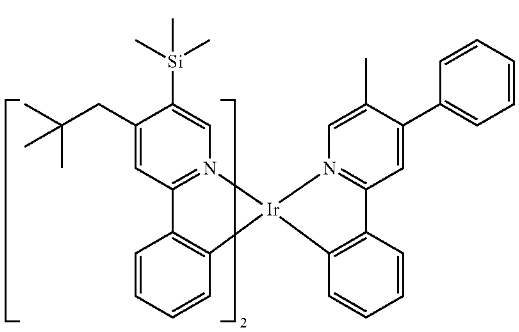
-continued
35
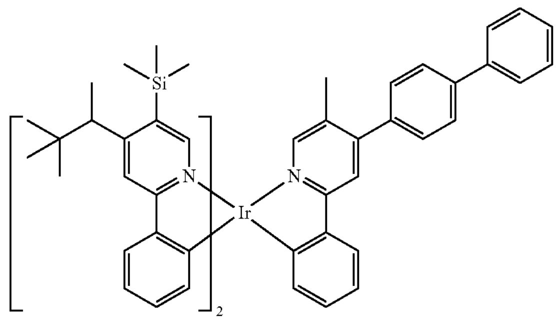
36
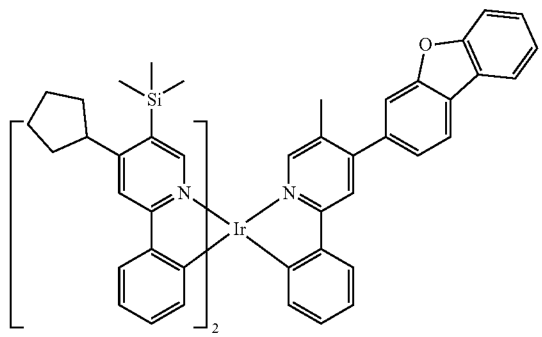
37
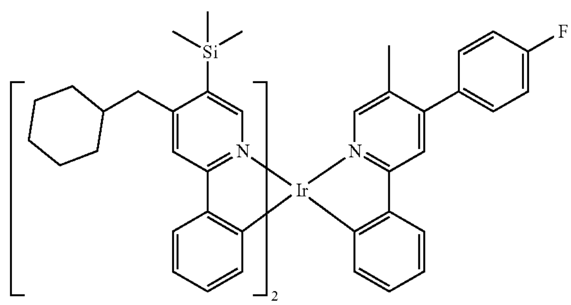
38
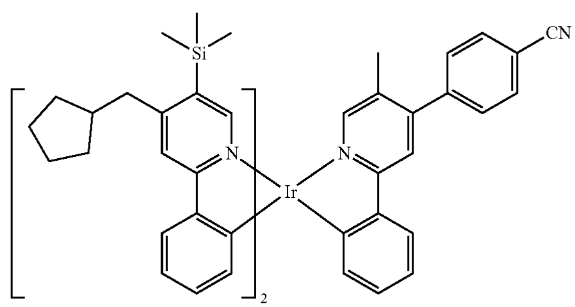

-continued
39
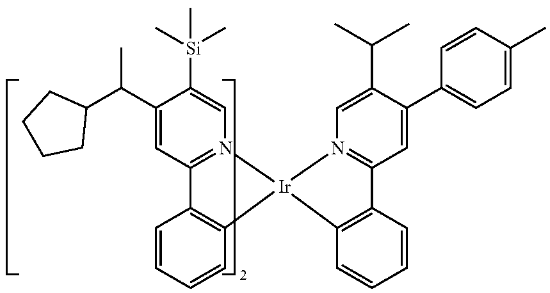
40
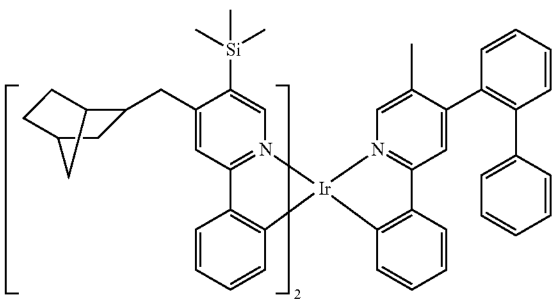
41
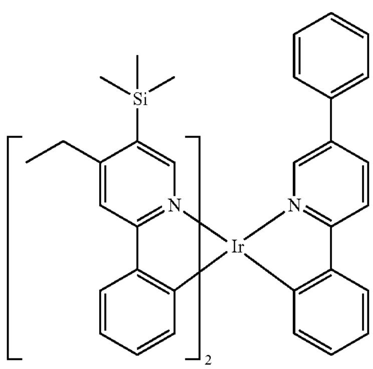
42
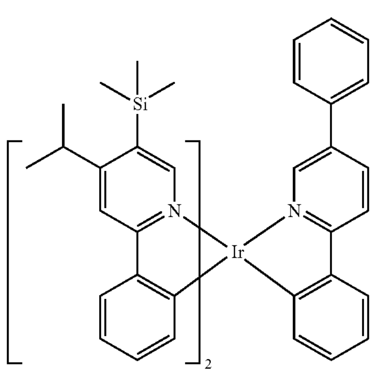
-continued
43
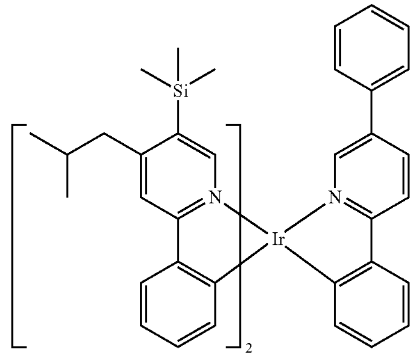
44
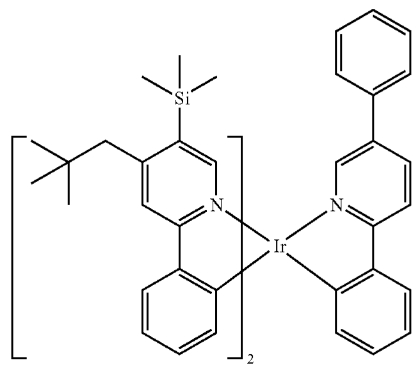
45
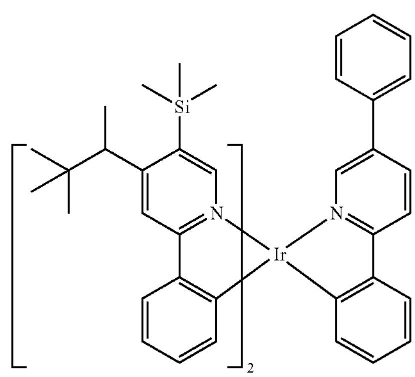
46
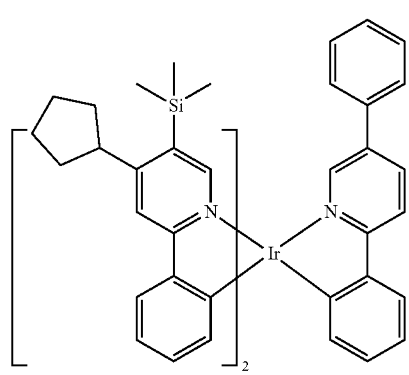

-continued
47
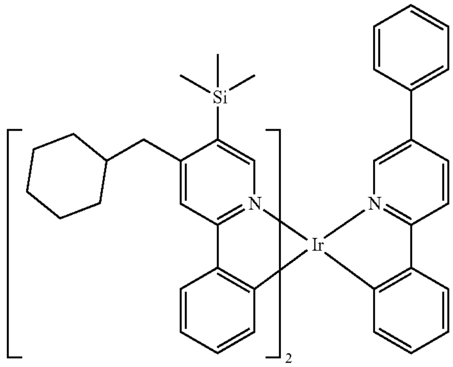
48
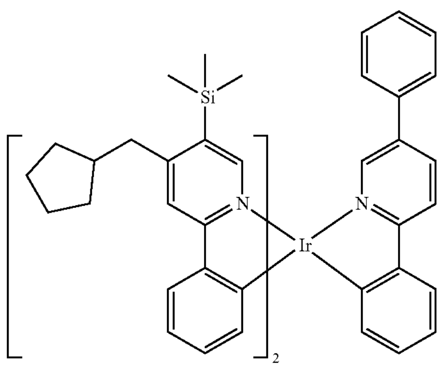
49
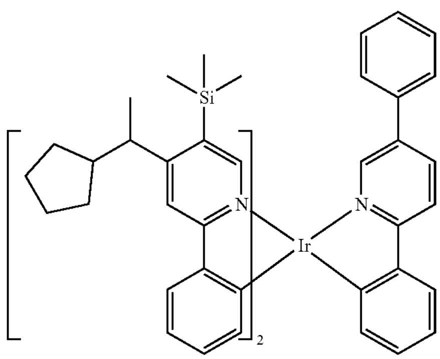
50
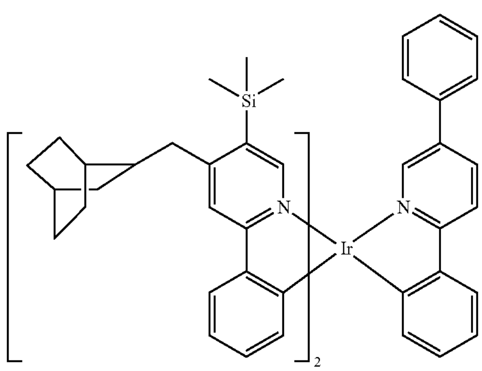
-continued
51
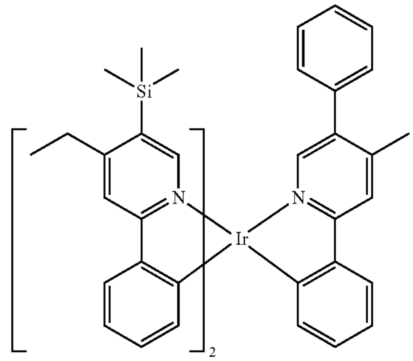
52
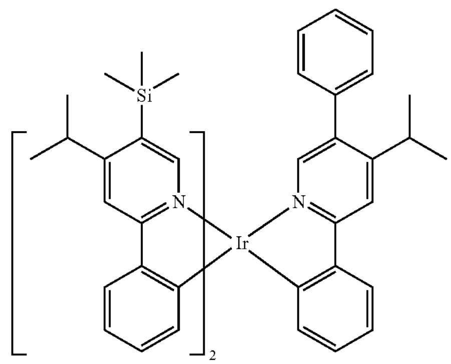
53
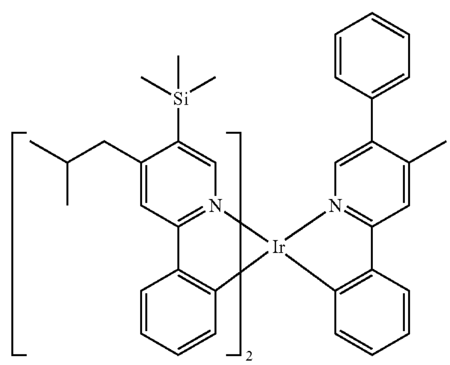
54
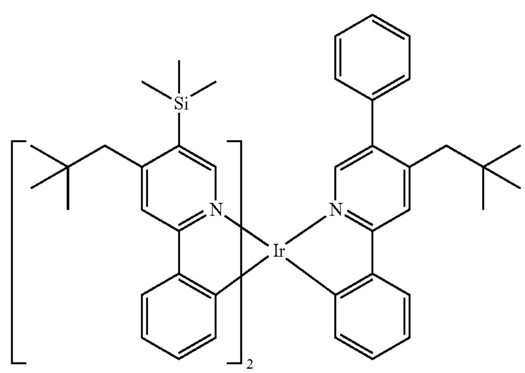

-continued
55
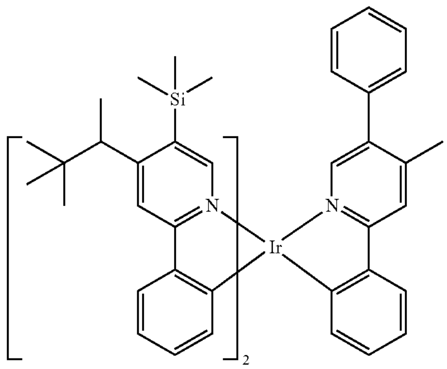
56
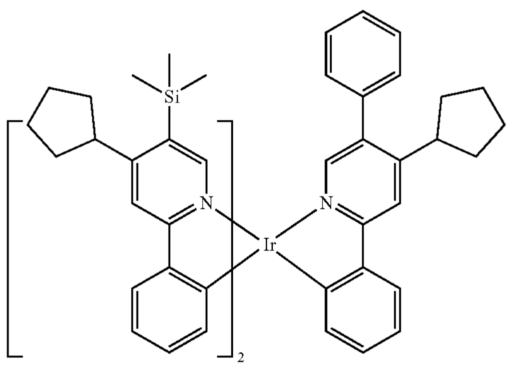
57
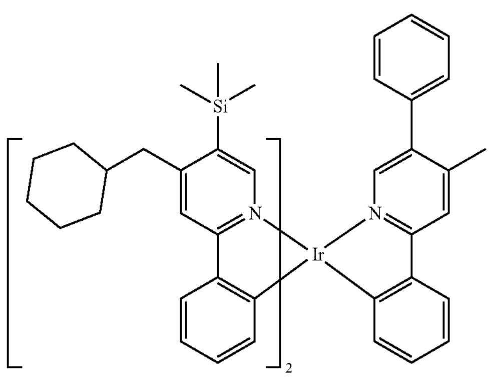
58
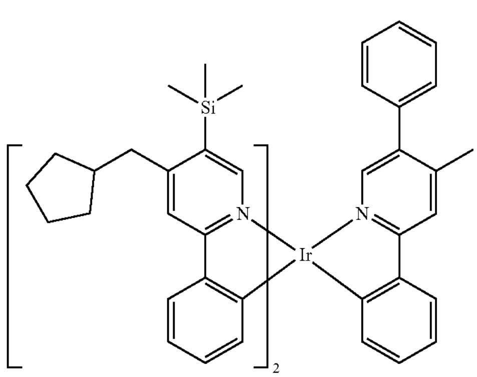
-continued
59
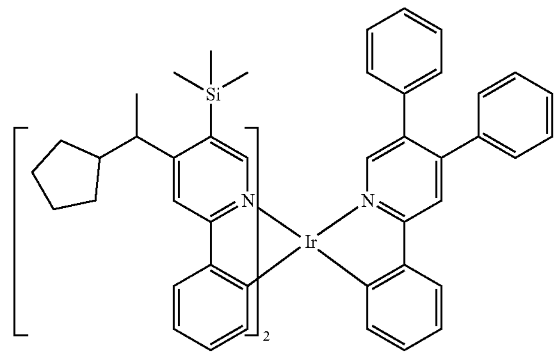
60
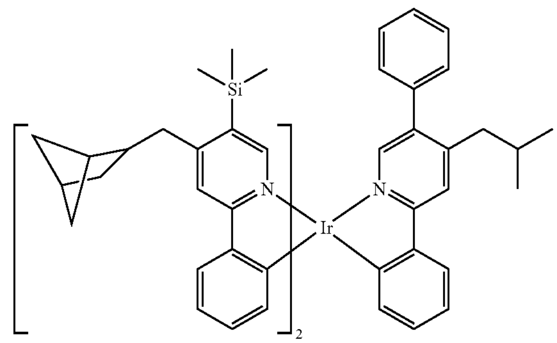
61
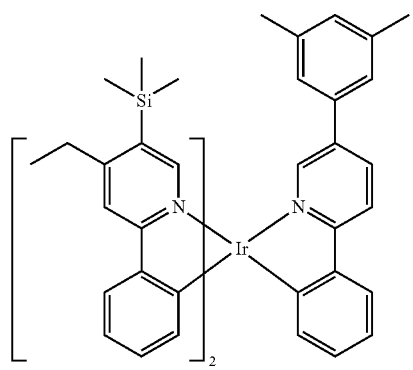
62
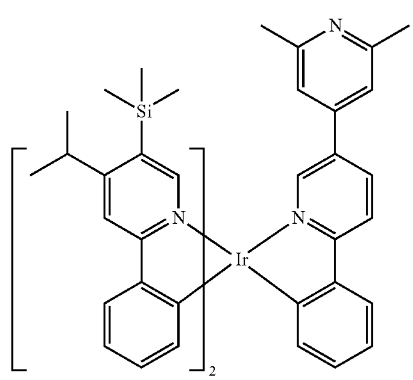

63
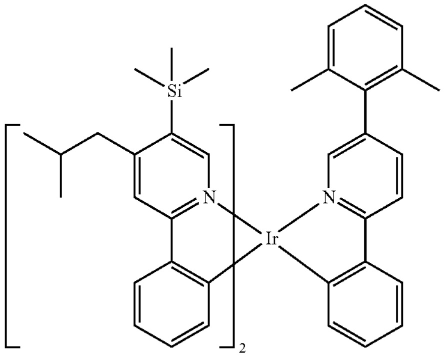
64
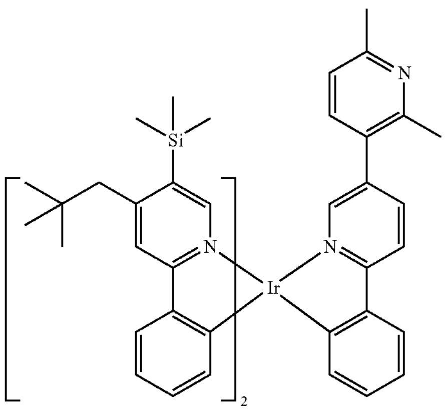
65
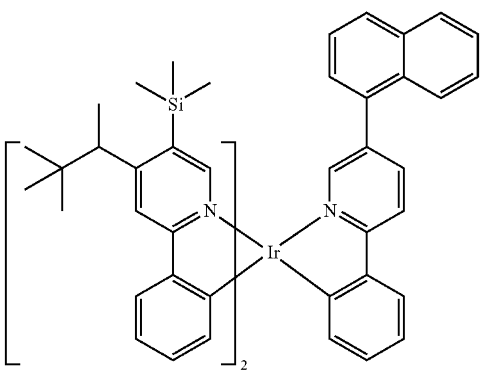
66
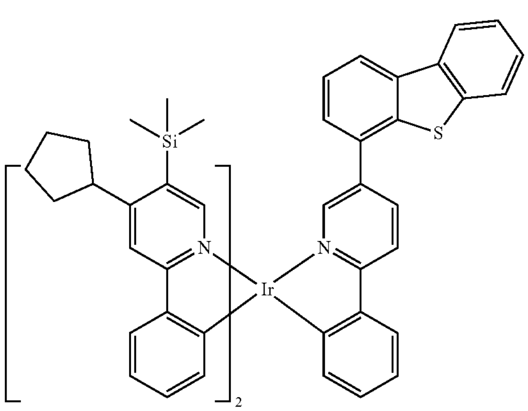
67
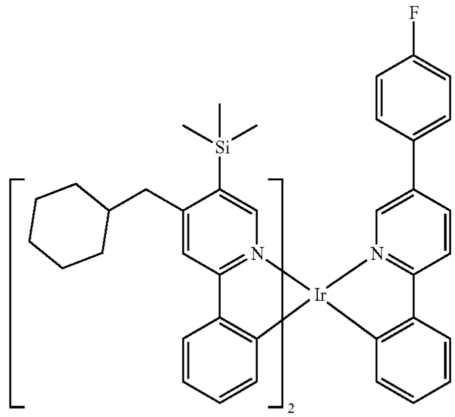
68
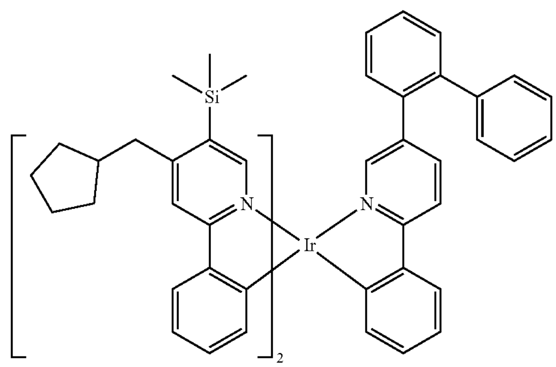
69
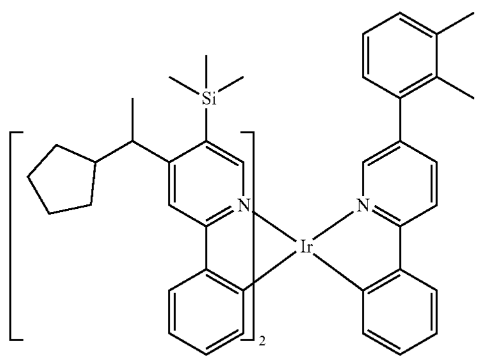
70
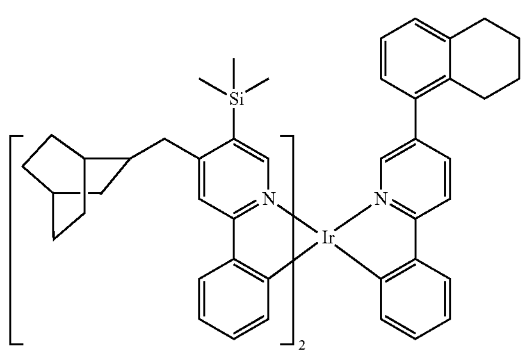

-continued
71
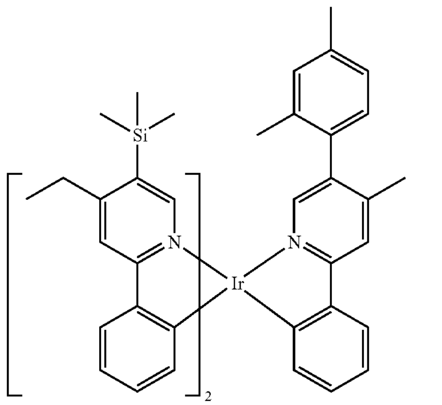
72
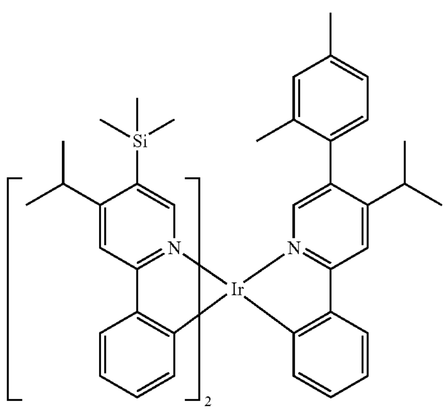
73
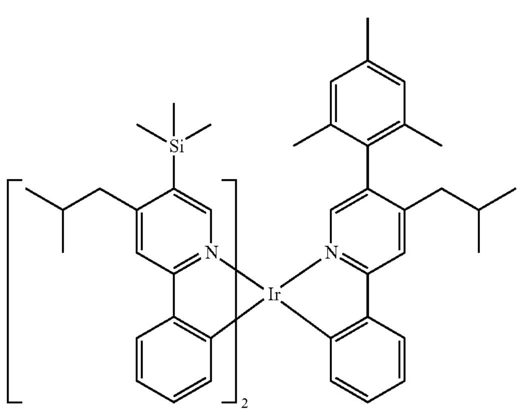
-continued
74
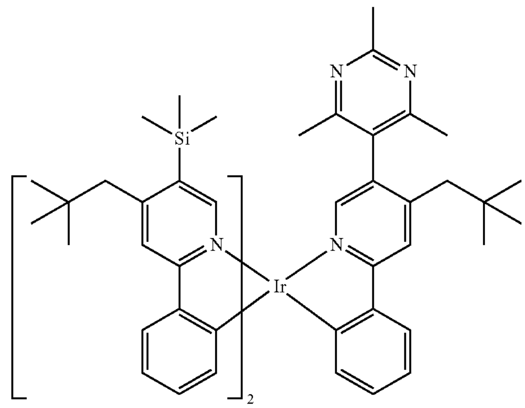
75
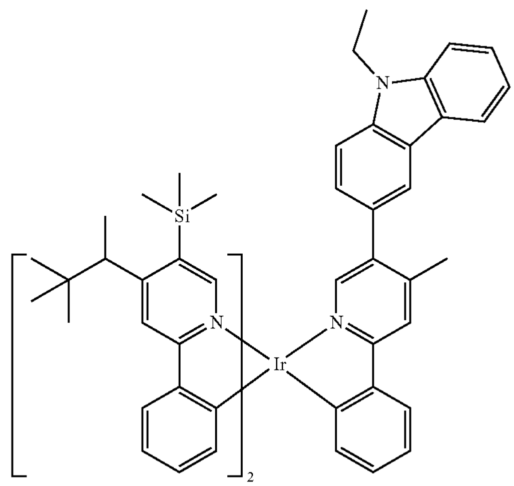
76
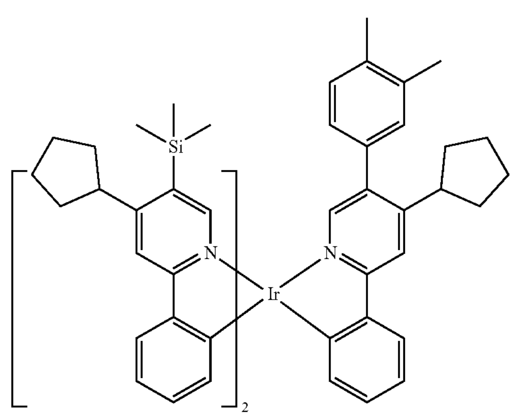

-continued
77
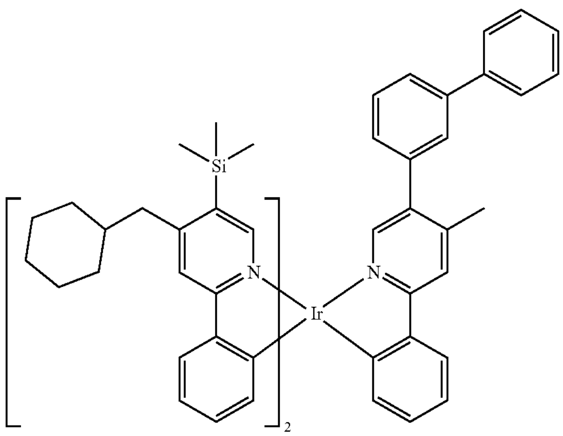
78
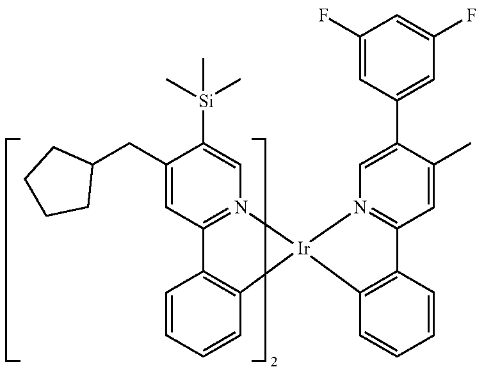
79
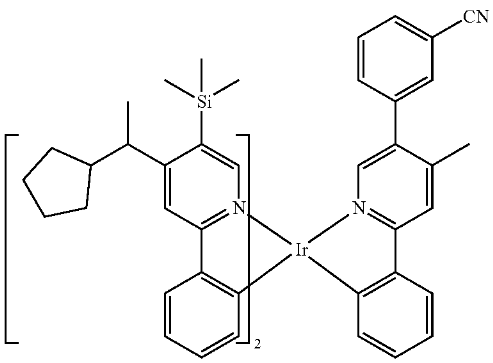
80
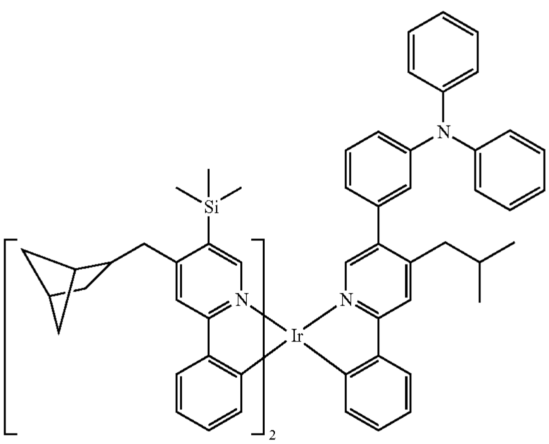
-continued
81
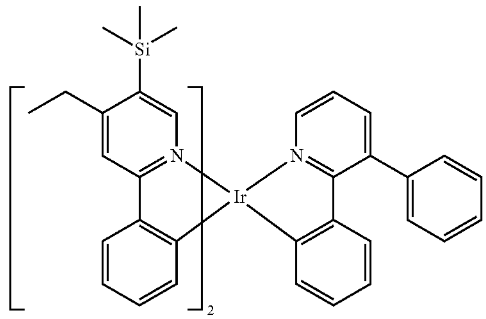
82
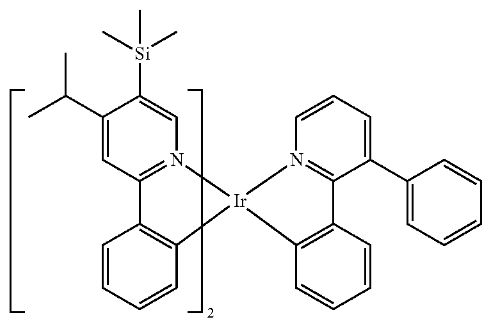
83
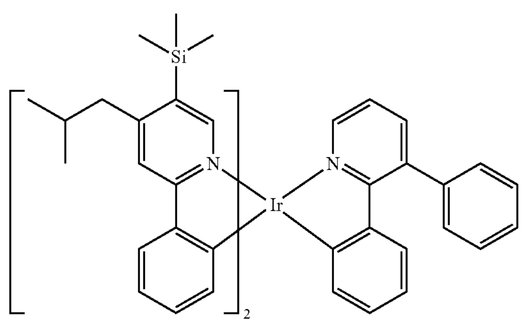
84
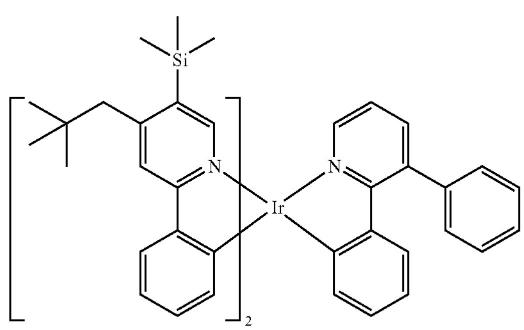

85
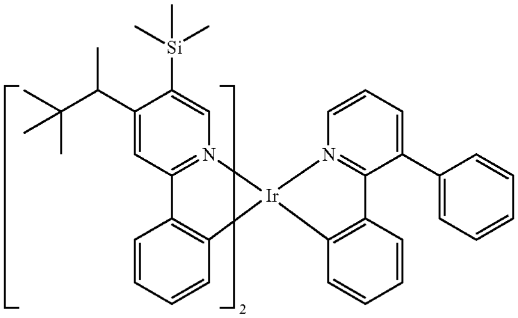
86
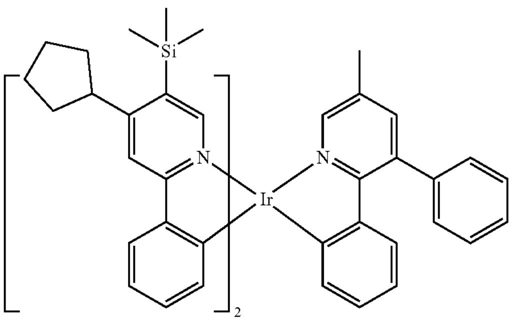
87
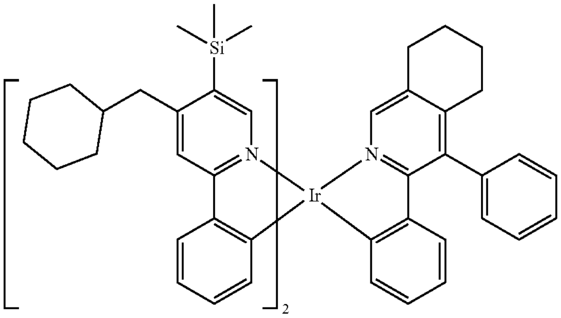
88
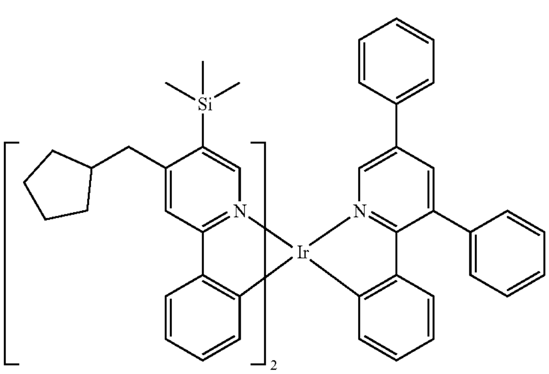
89
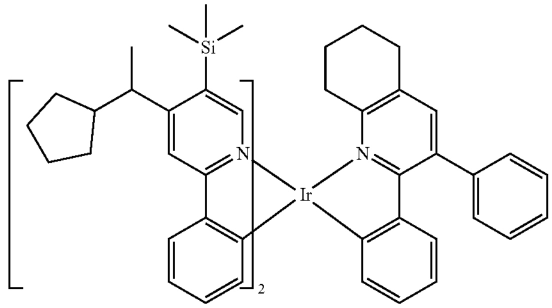
90
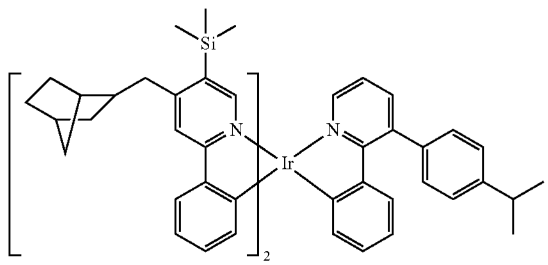
91
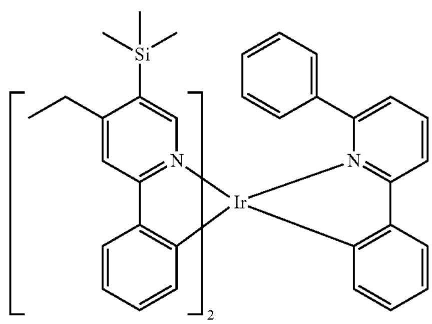
92
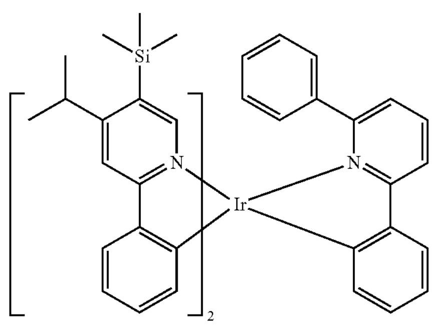
93
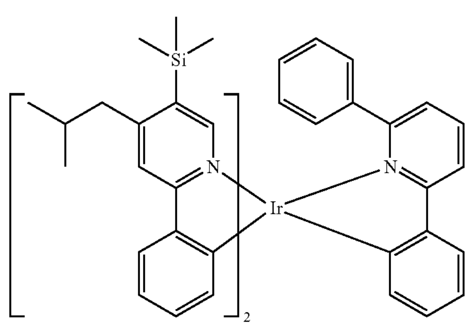

-continued
94
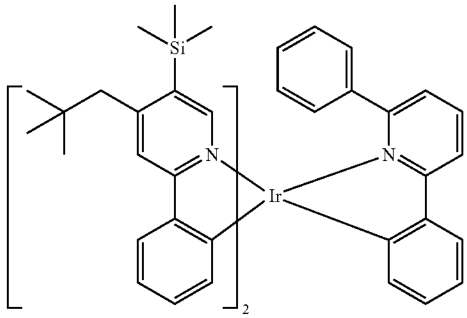
95
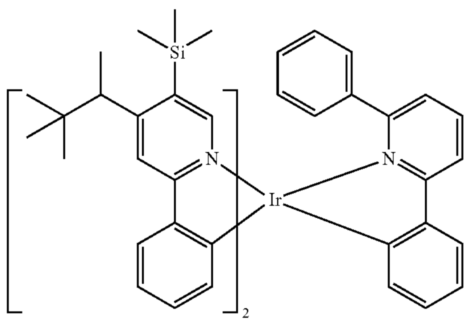
96
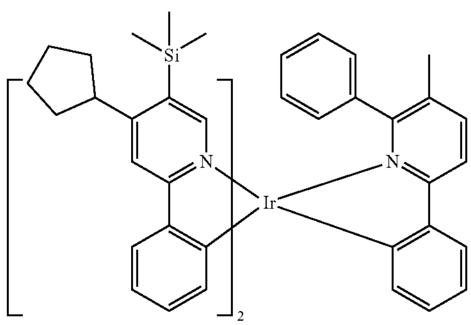
97
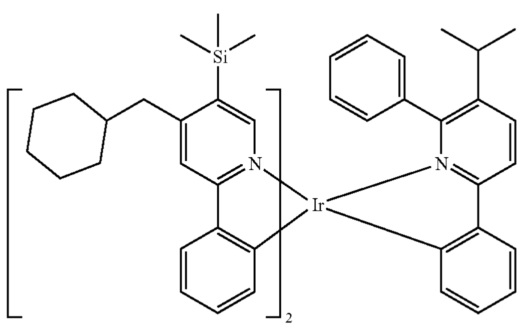
98
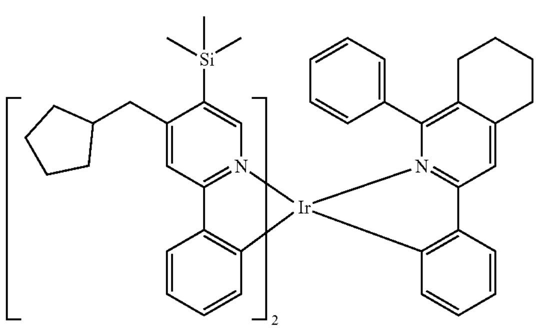
-continued
99
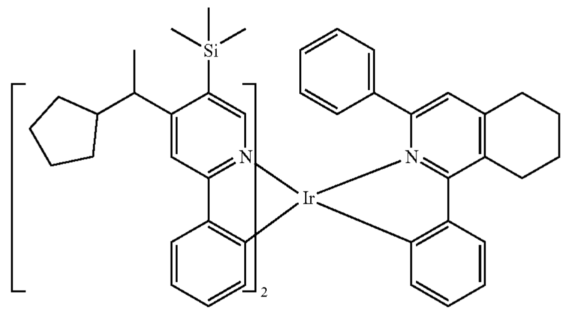
100
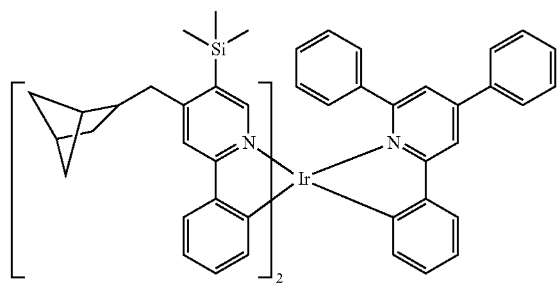
101
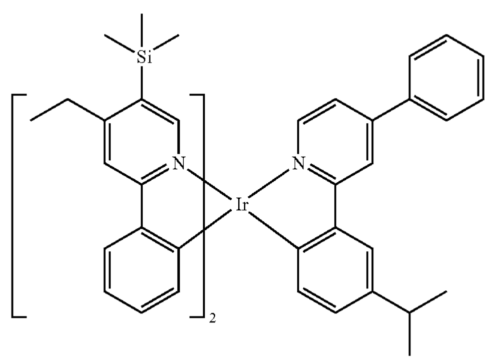
102
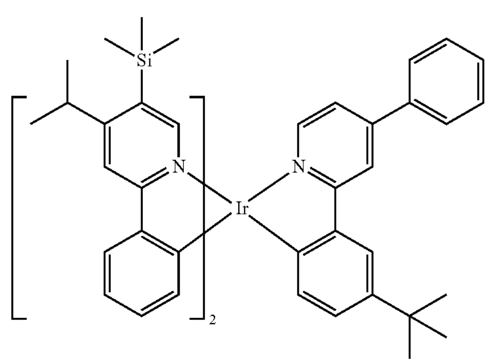

-continued
104
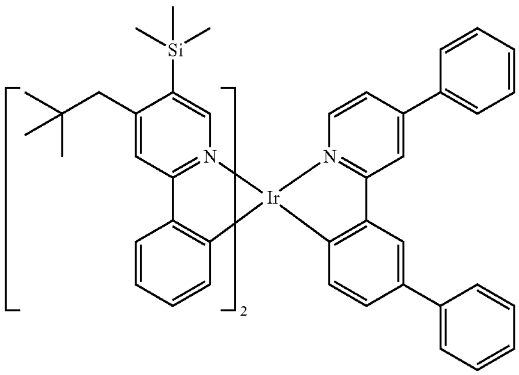
105
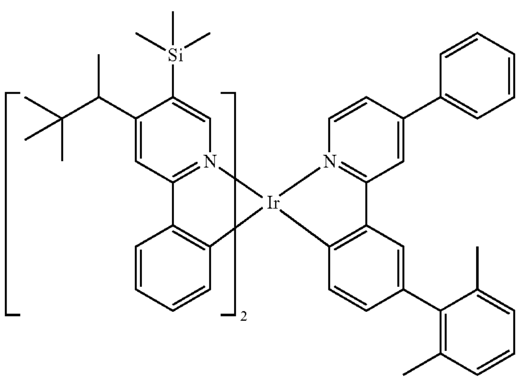
105
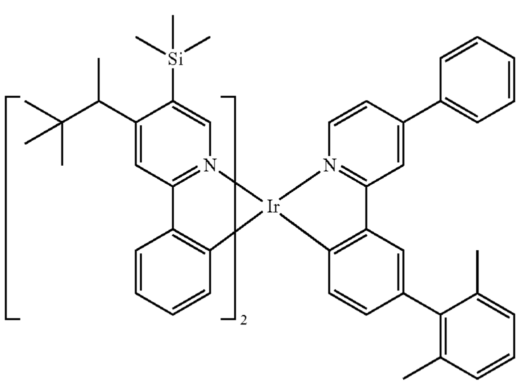
106
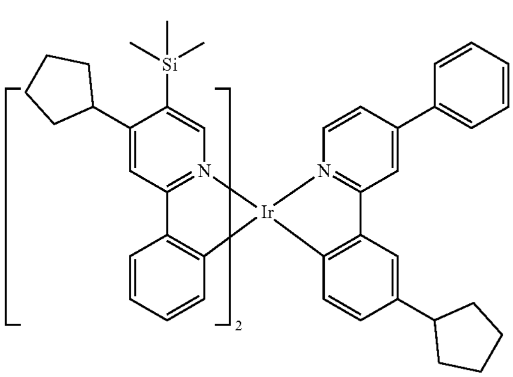
-continued
107
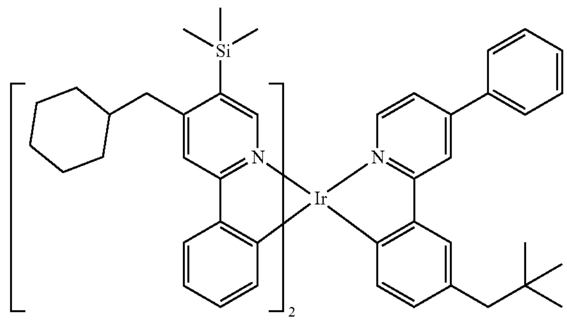
108
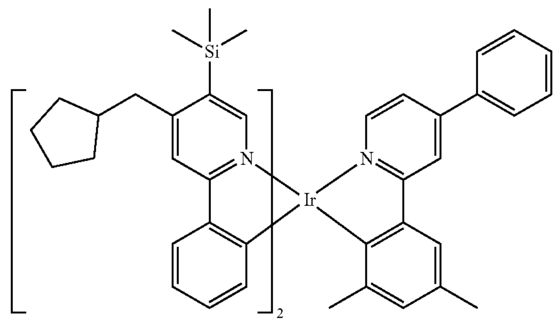
109
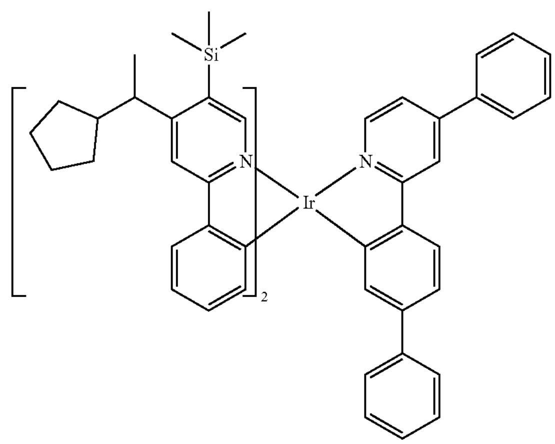
110
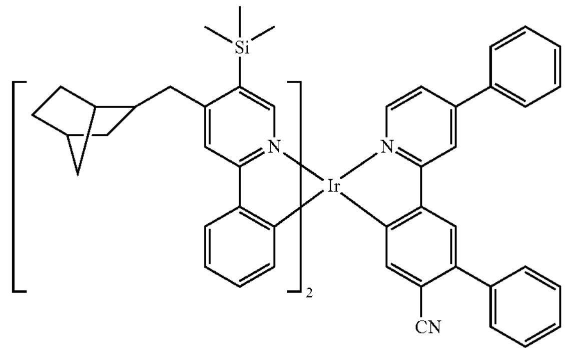

111
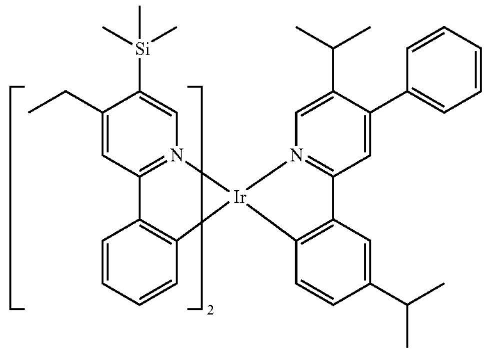
112
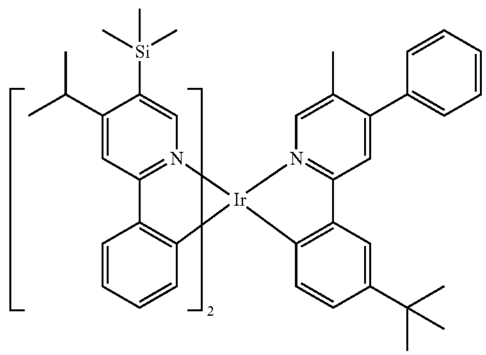
113
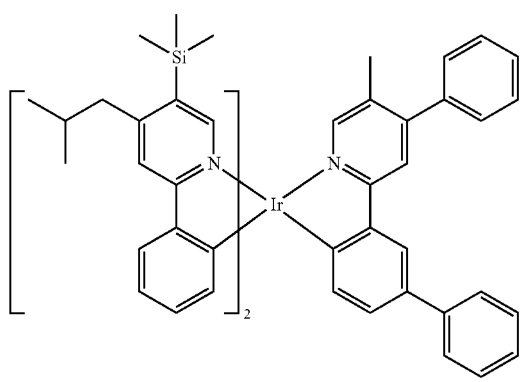
115
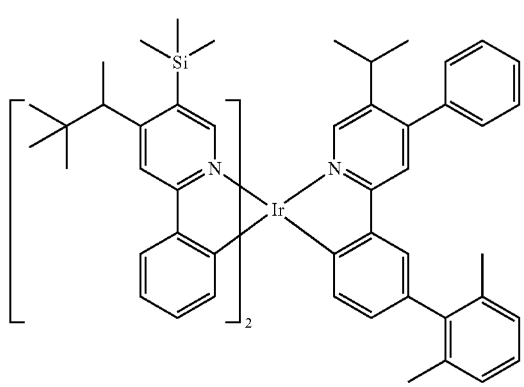
115
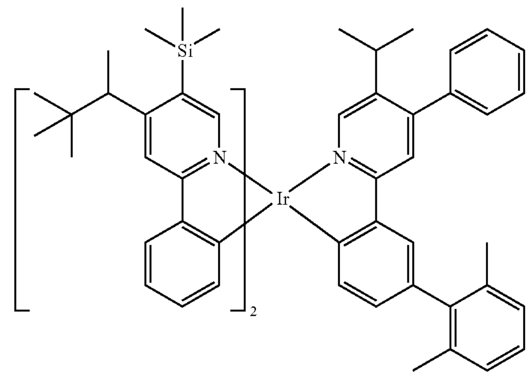
116
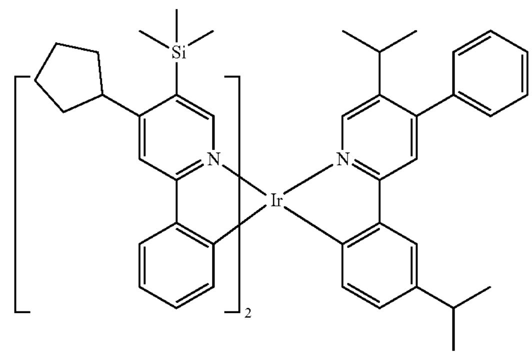
117
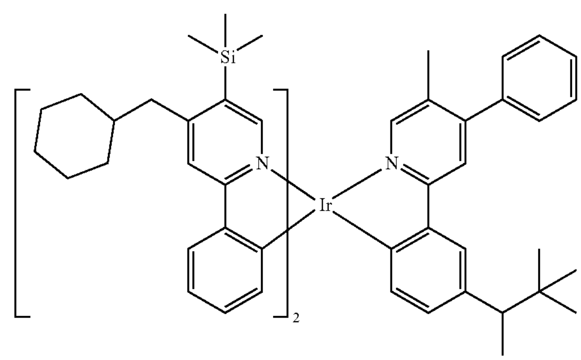
118
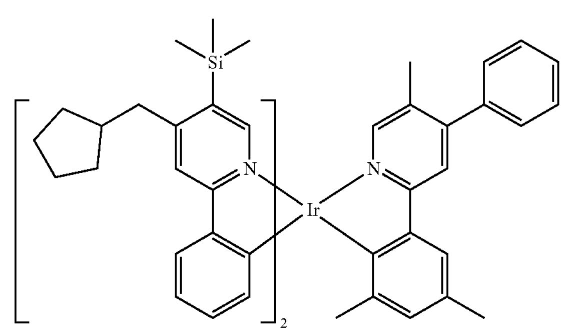

-continued
119
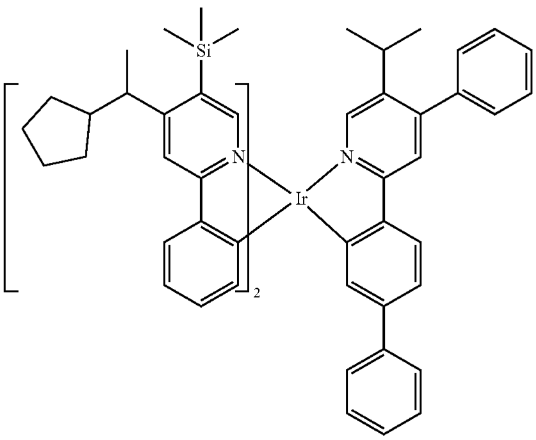
120
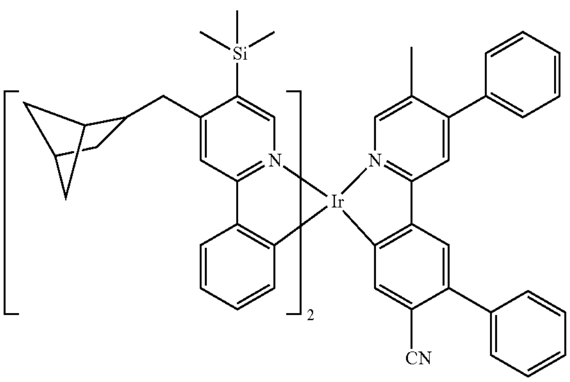
121
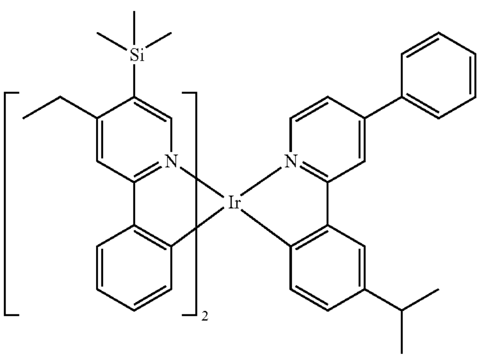
122
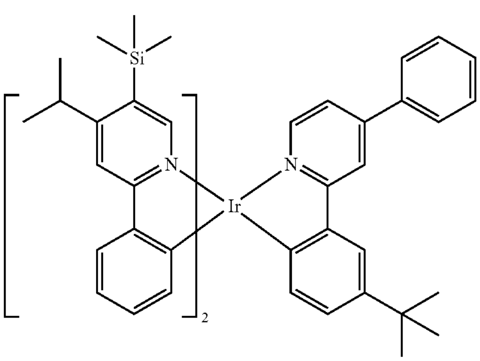
-continued
124
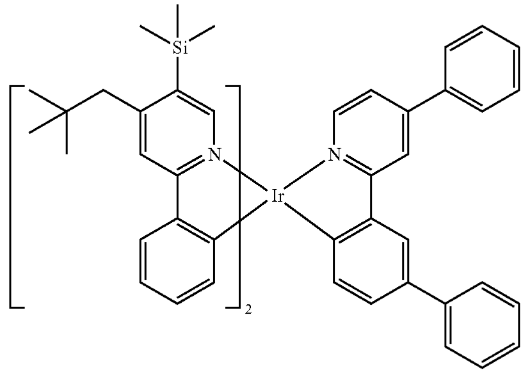
125
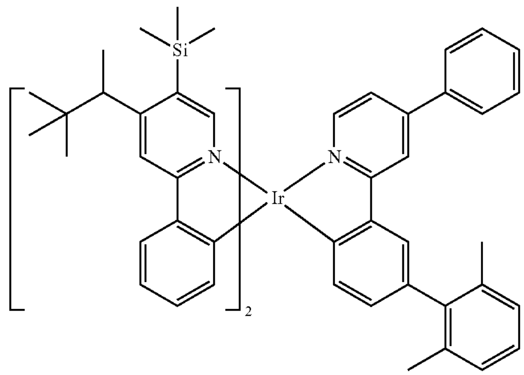
125
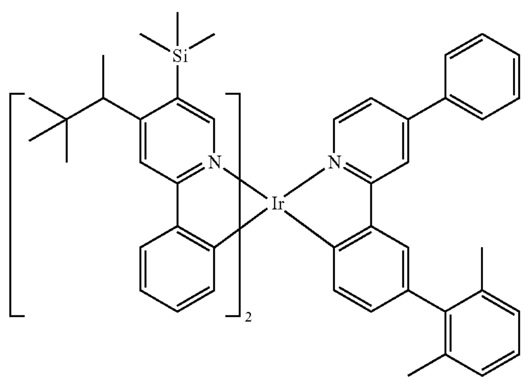
126
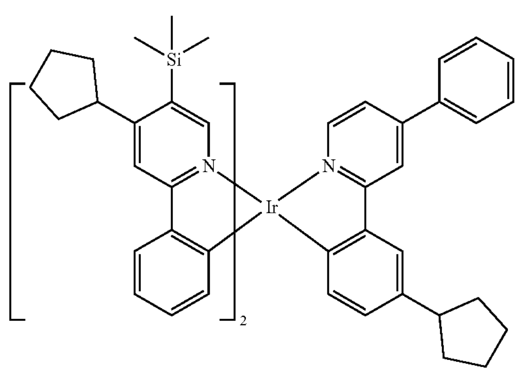

-continued
127
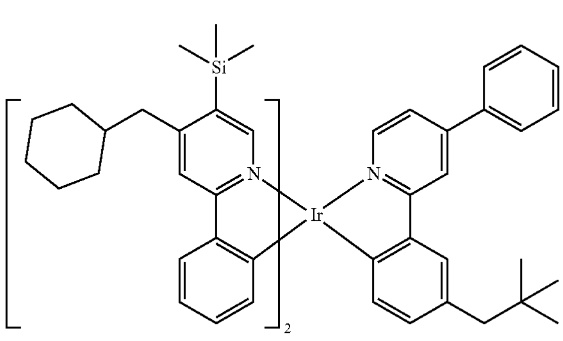
128
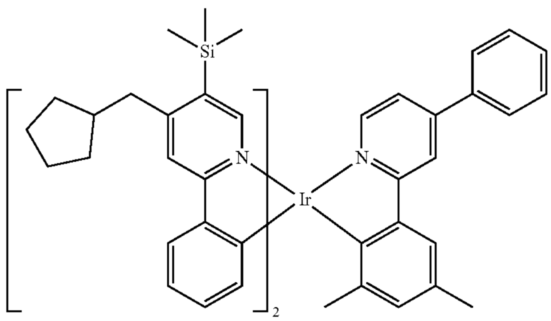
129
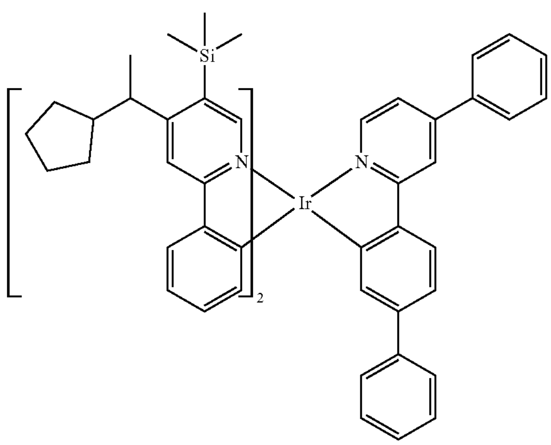
130
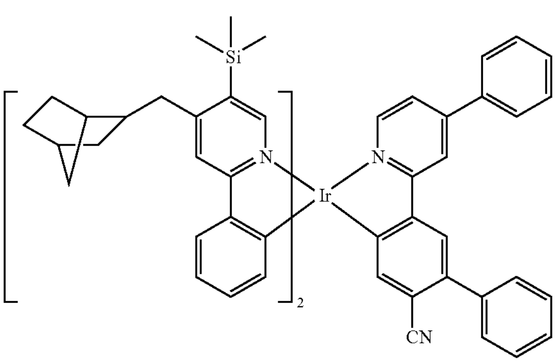
-continued
131
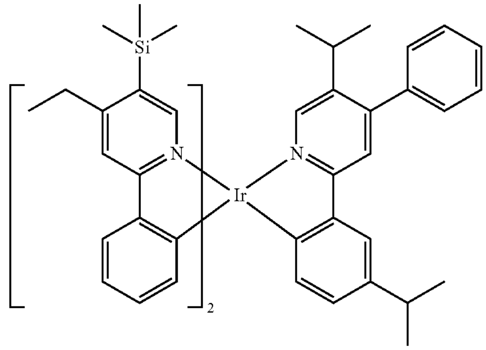
132
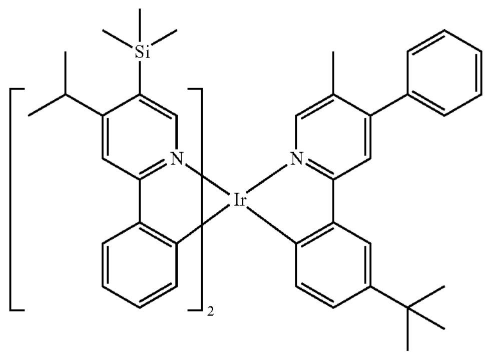
133
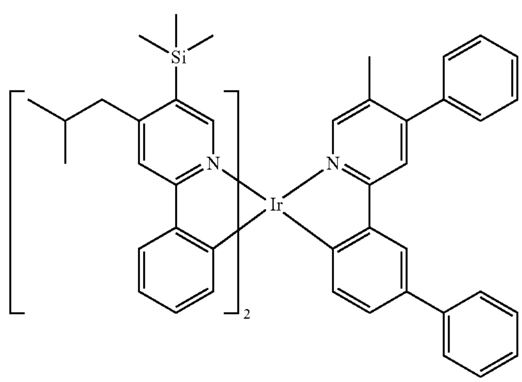
135
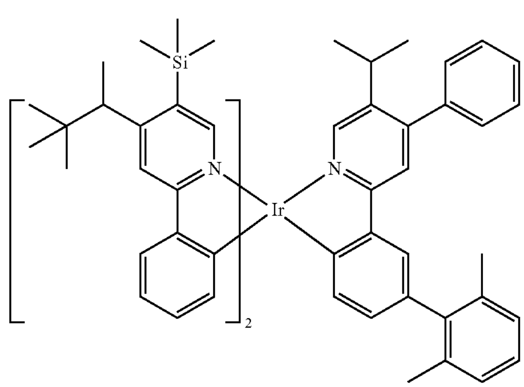

-continued
135
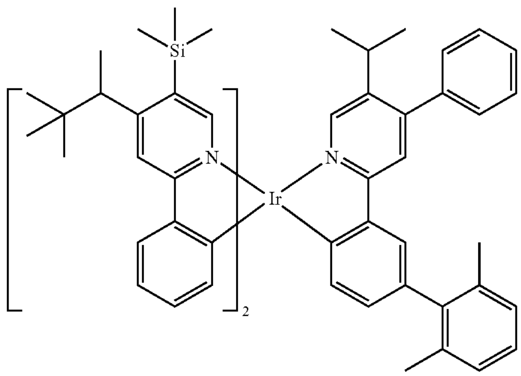
136
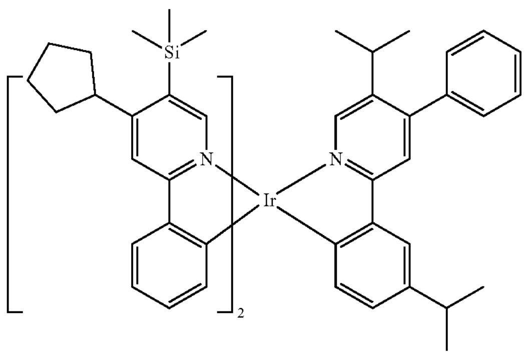
137
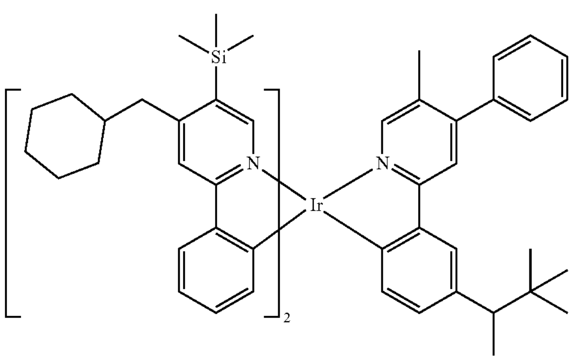
138
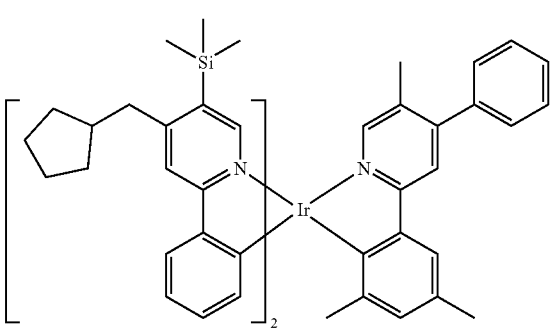
-continued
139
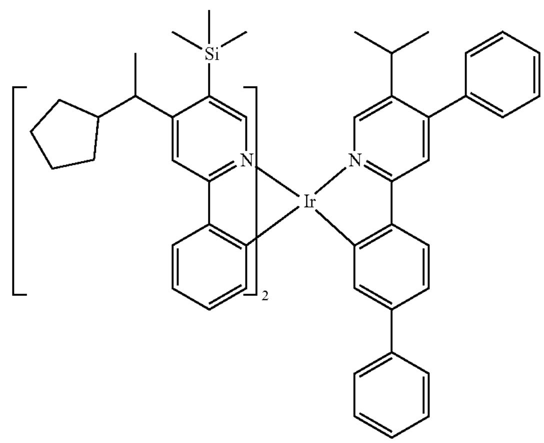
140
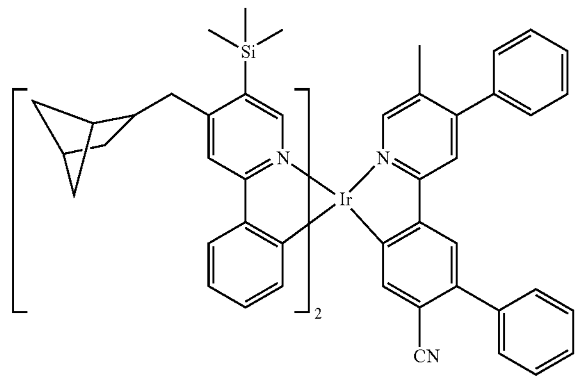
141
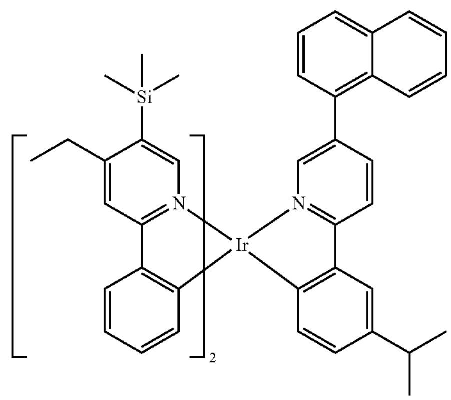
142
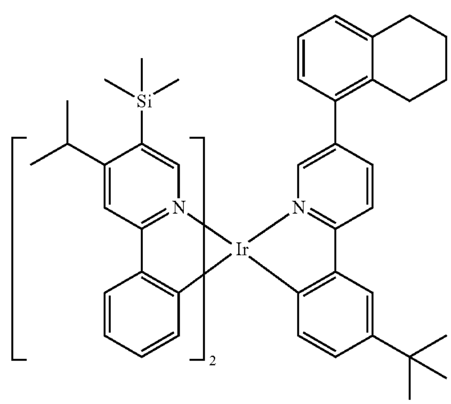

-continued
144
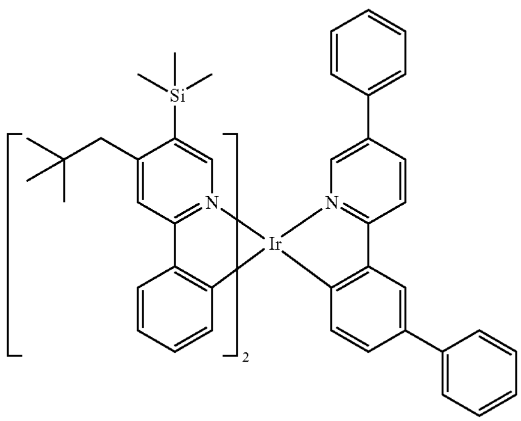
145
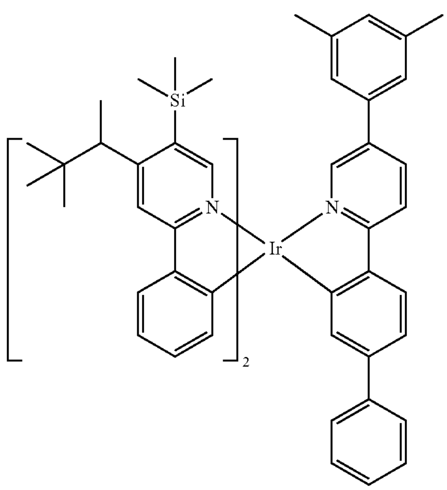
145
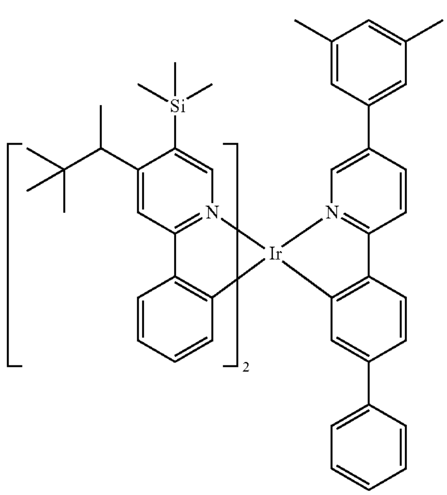
-continued
146
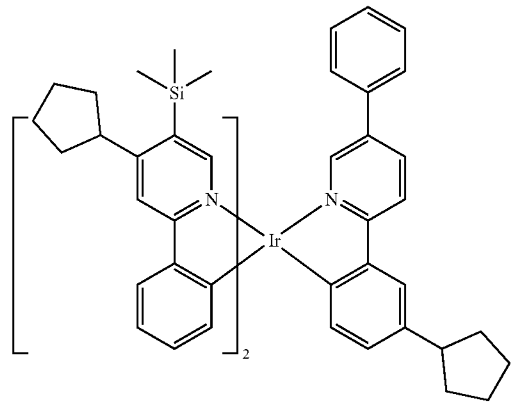
147
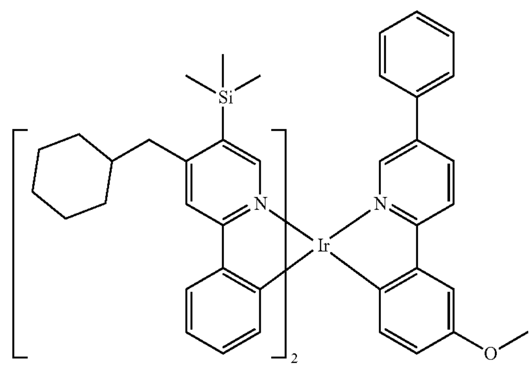
148
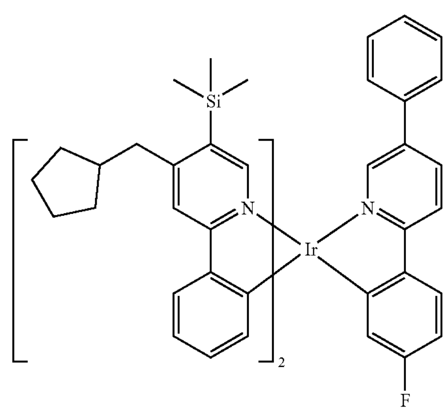
149
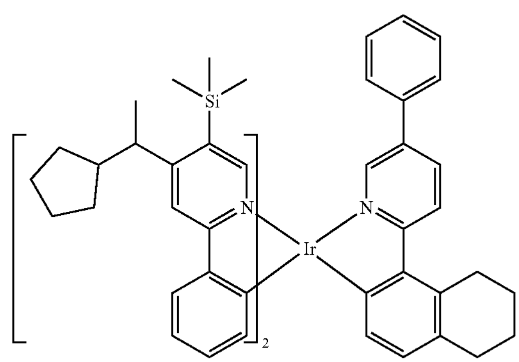

-continued
150
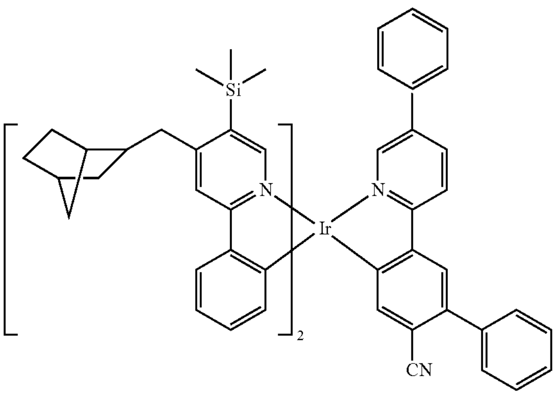
151
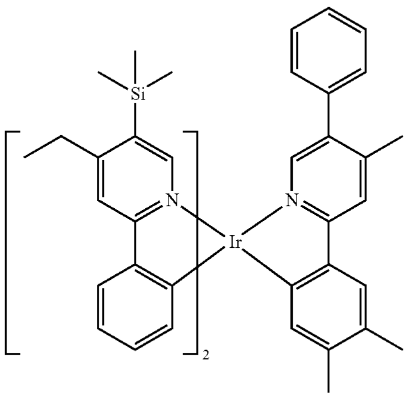
152
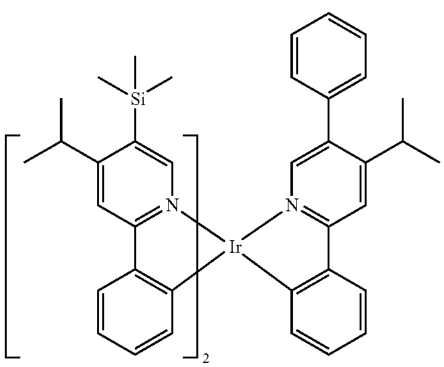
153
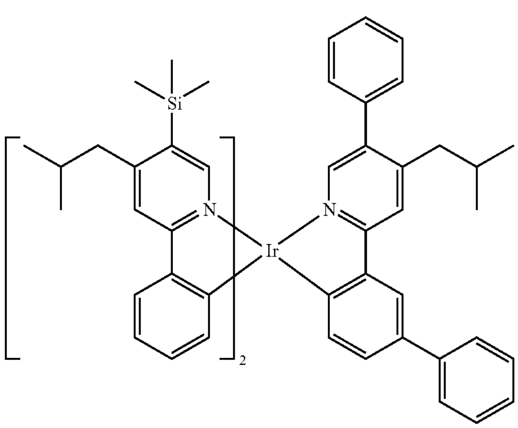
-continued
155
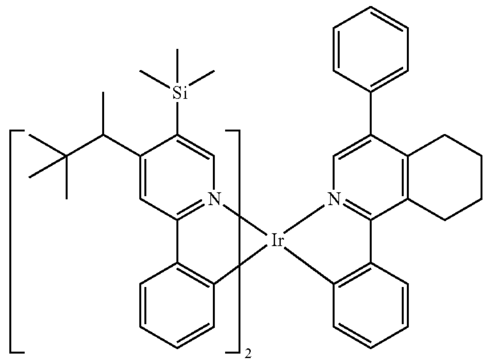
155
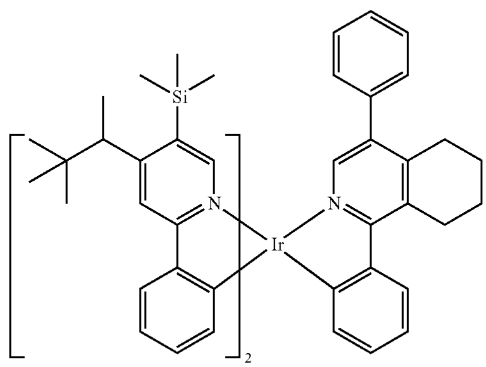
156
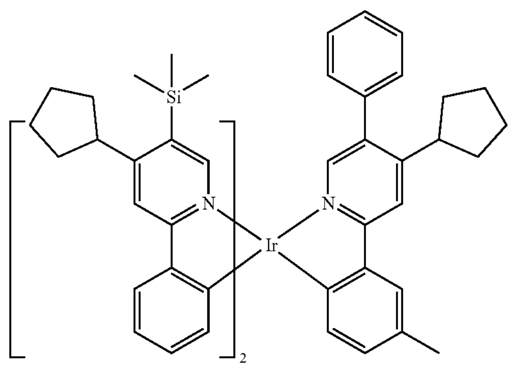
158
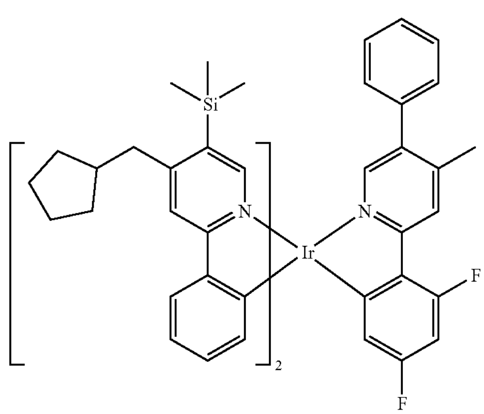

-continued
159
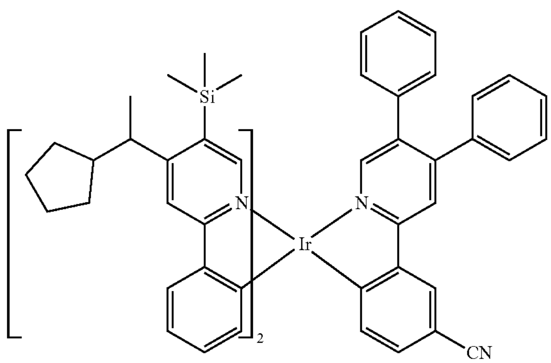
160
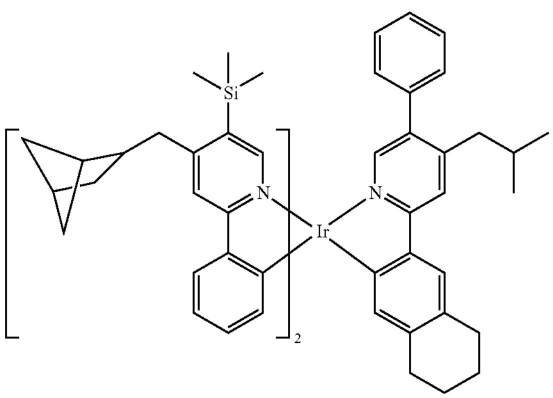
160
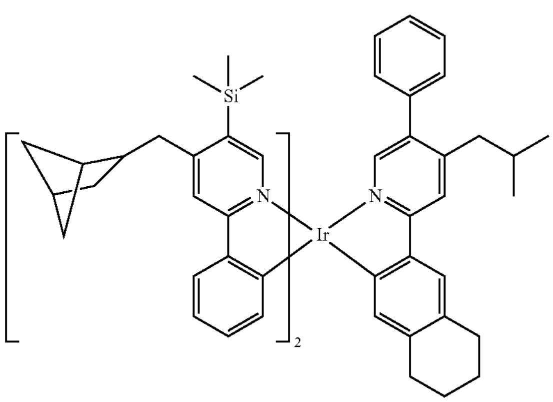
170
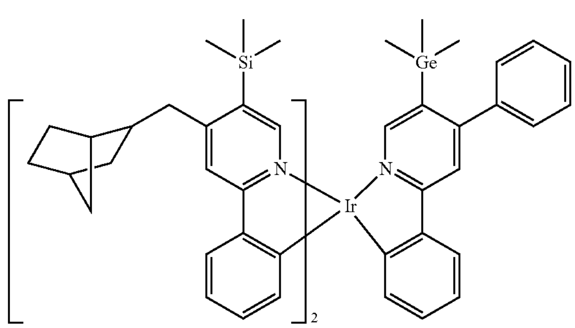
-continued
175
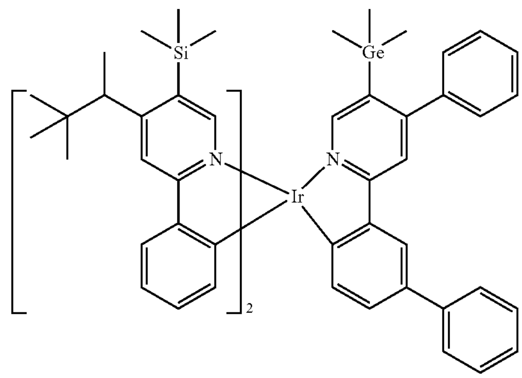
181
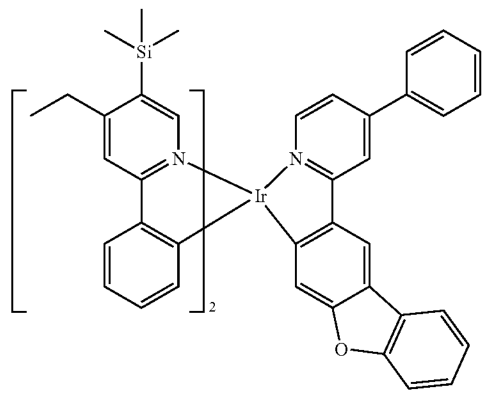
182
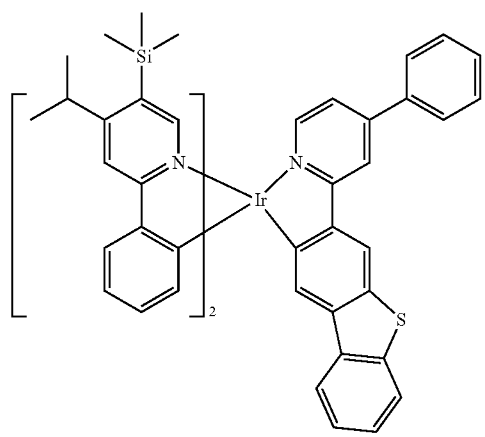
184
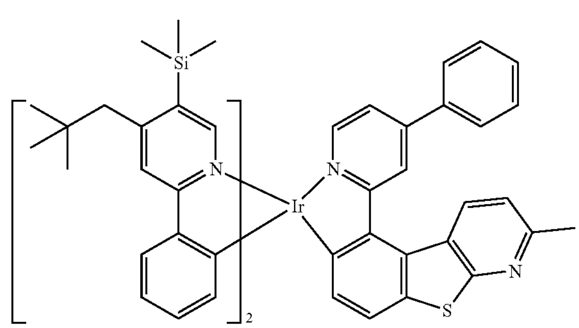

-continued
185
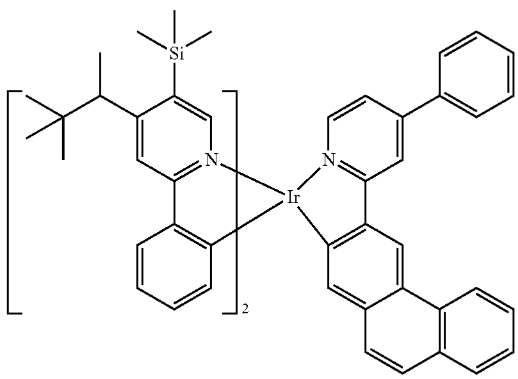
186
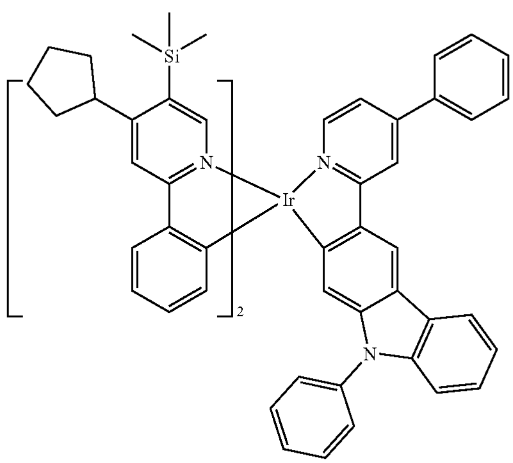
187
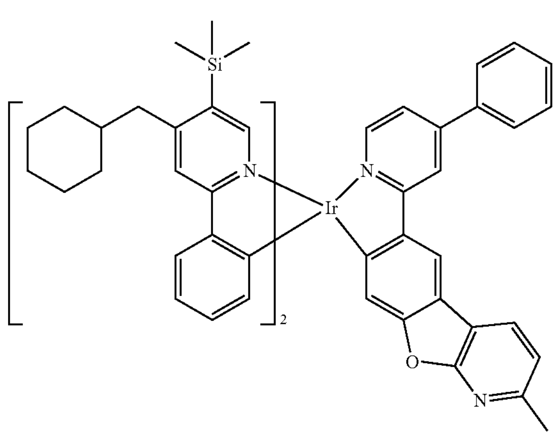
-continued
188
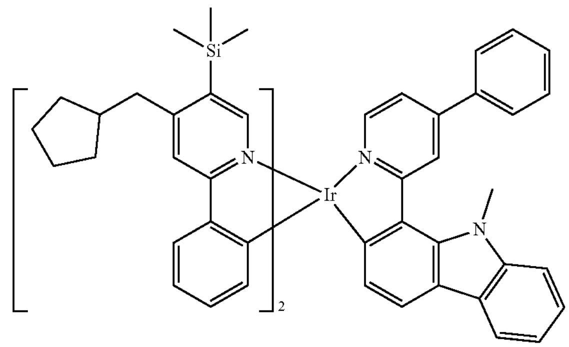
189
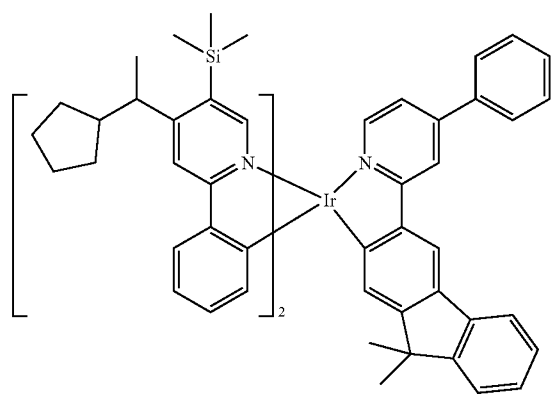
190
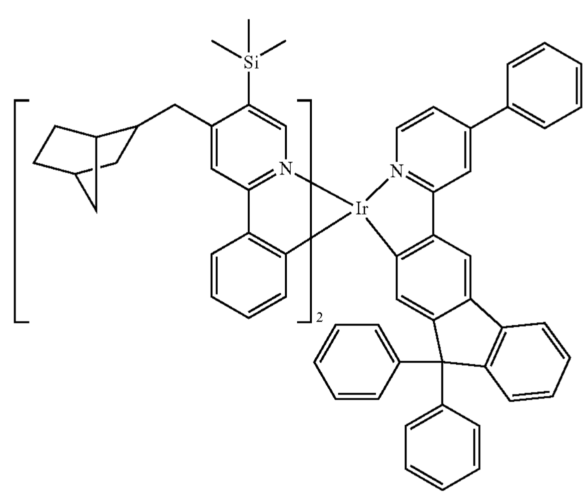

-continued
191
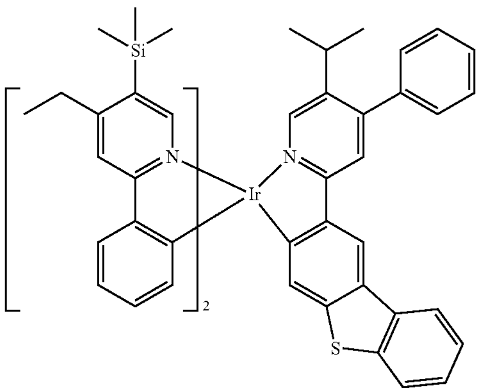
192
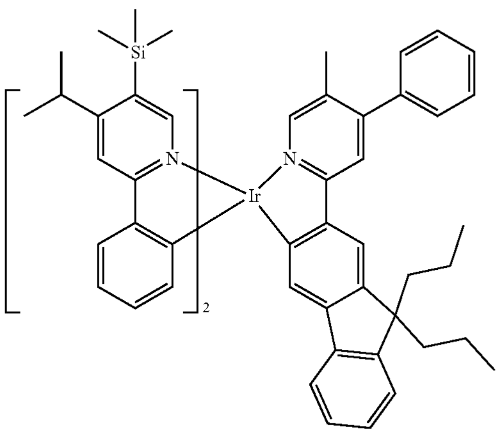
193
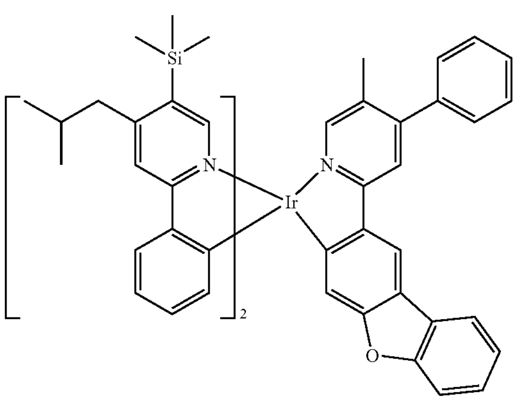
194
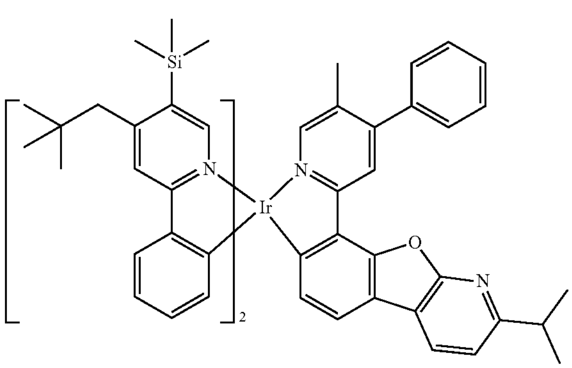
-continued
196
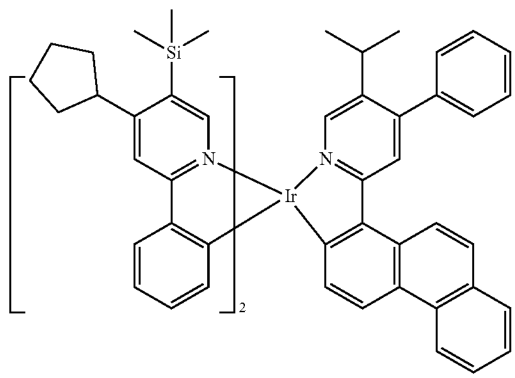
197
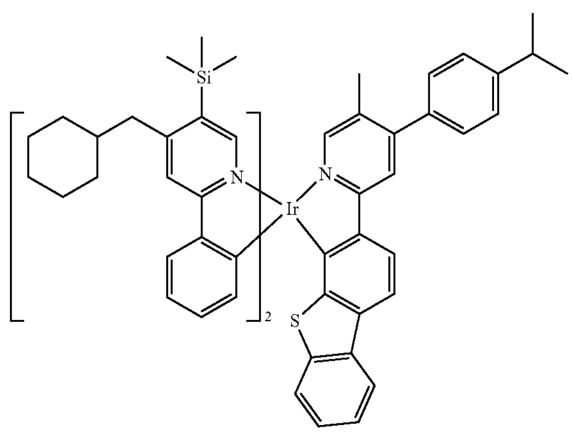
198
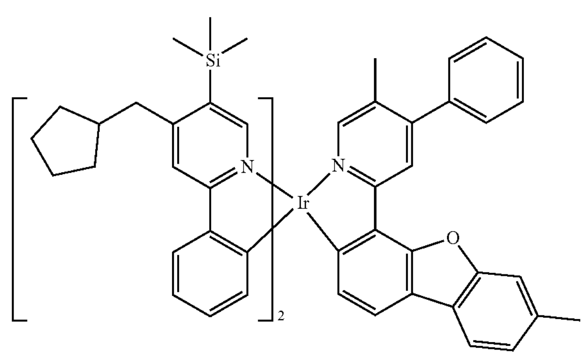

-continued
199
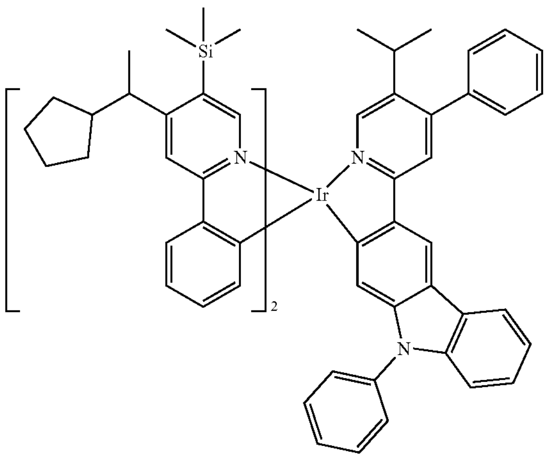
281
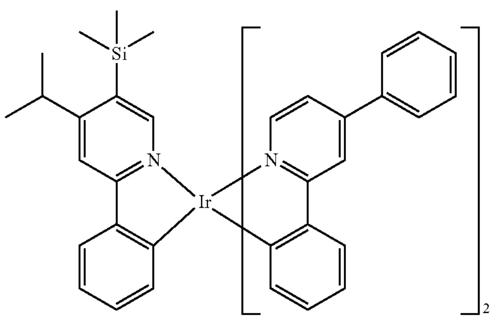
282
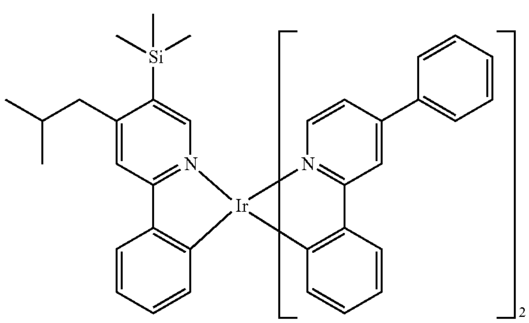
283
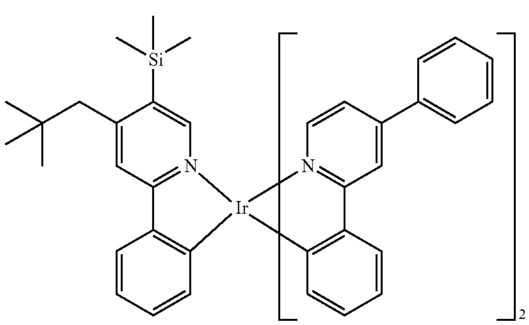
-continued
284
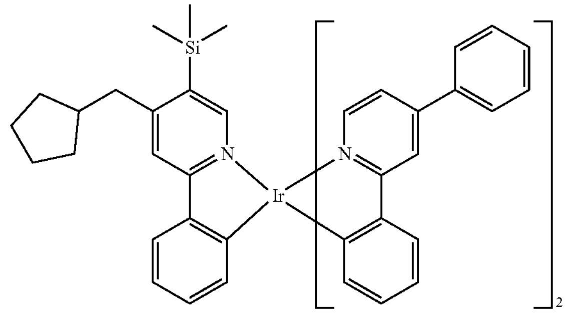
285
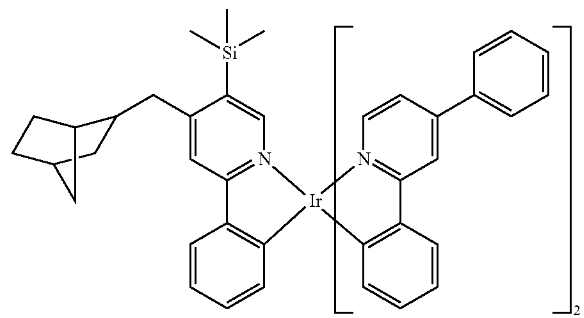
286
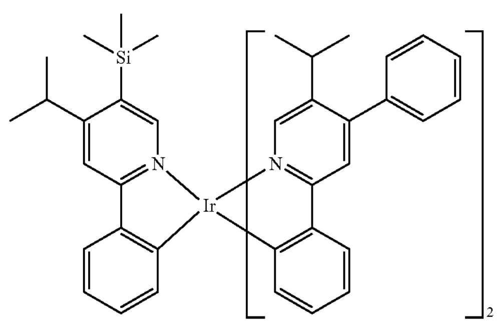
287
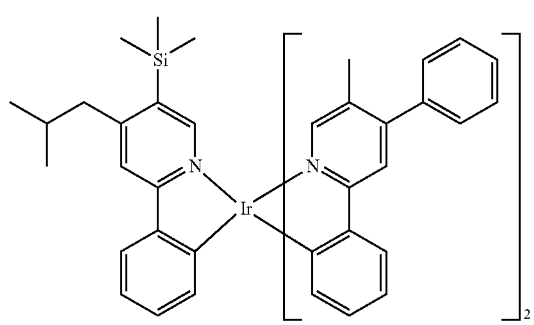

-continued
288
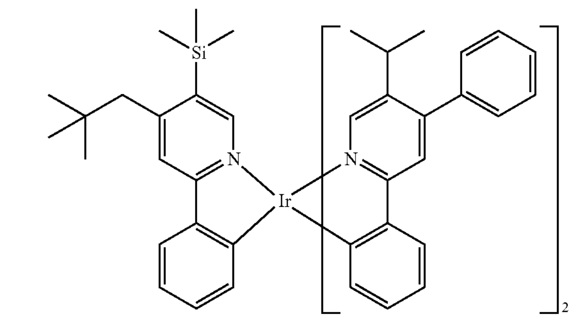
289
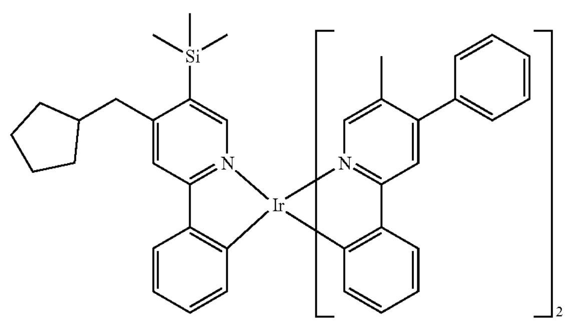
290
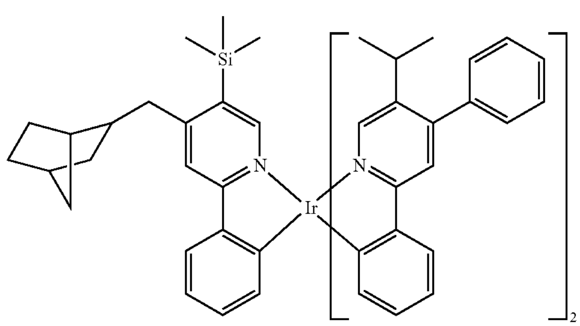
291
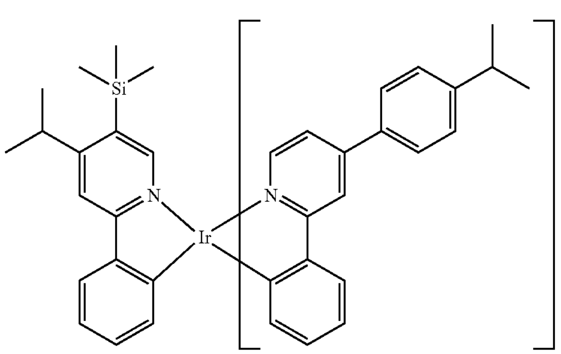
-continued
292
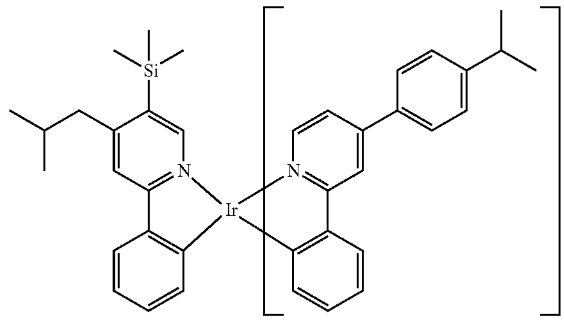
293
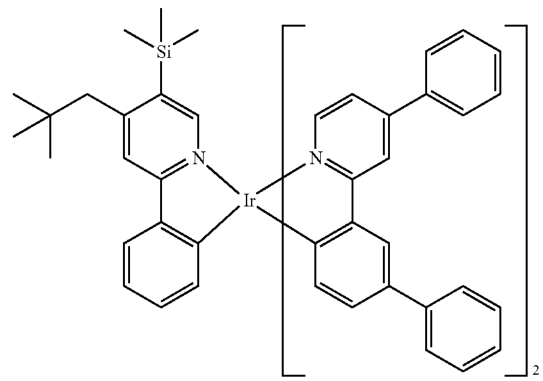
294
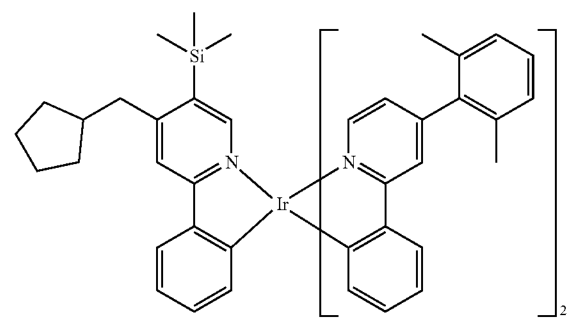
295
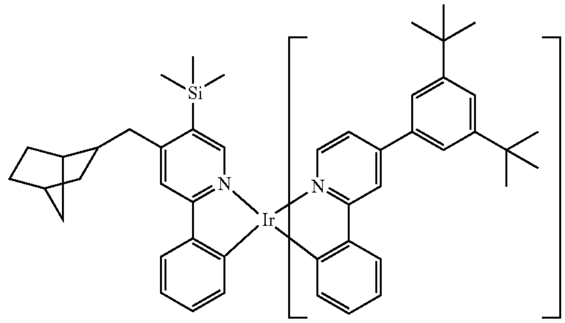

-continued
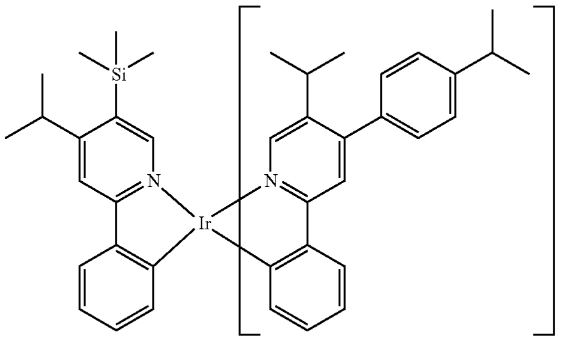
296
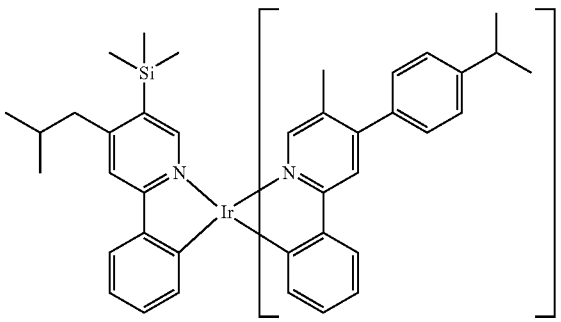
297
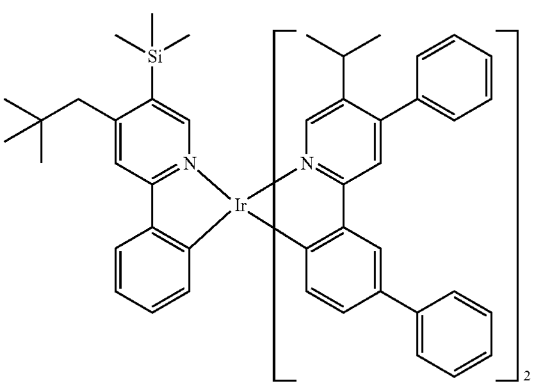
298
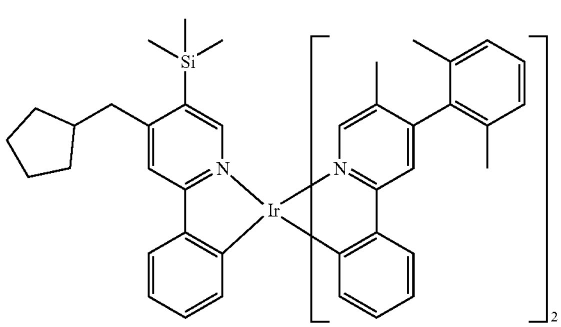
299
-continued
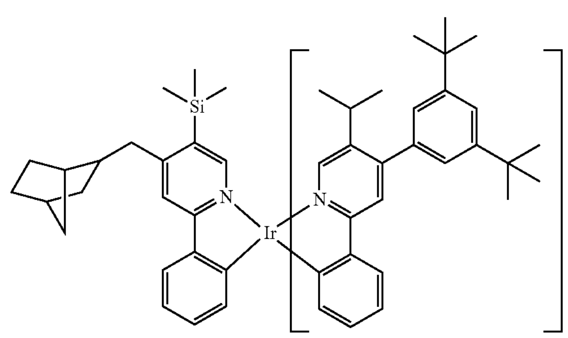
300
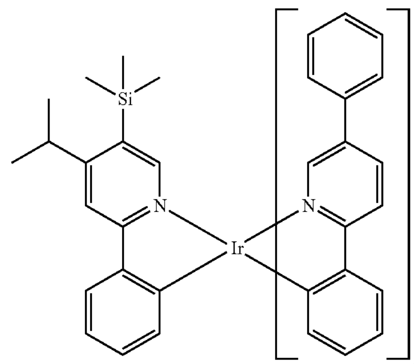
301
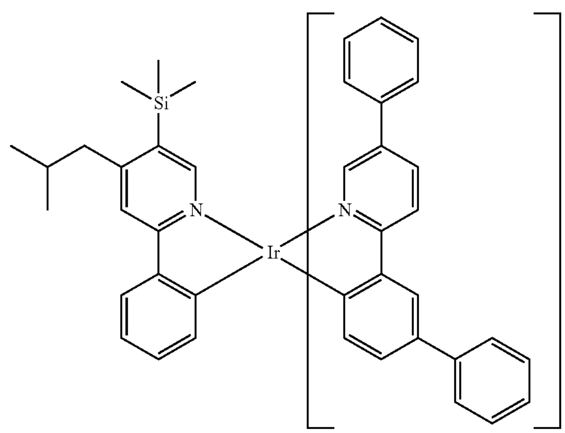
302
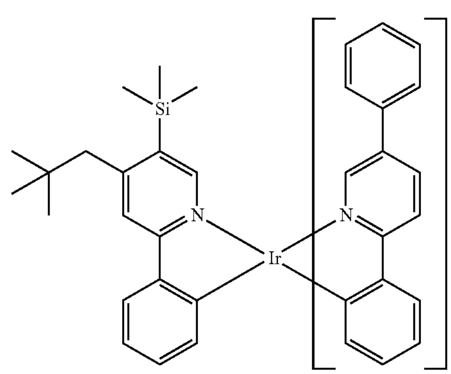
303

304
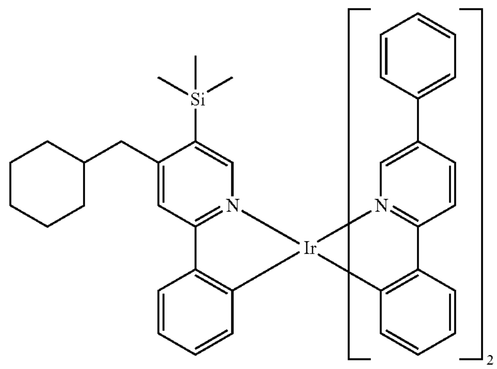
305
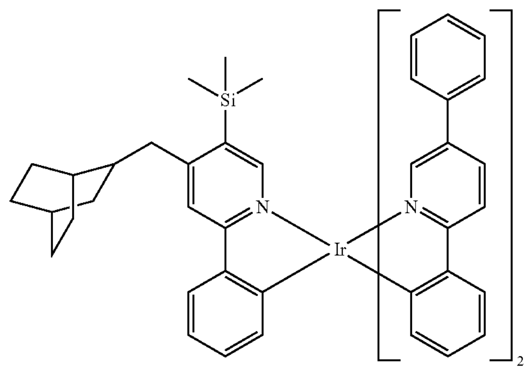
306
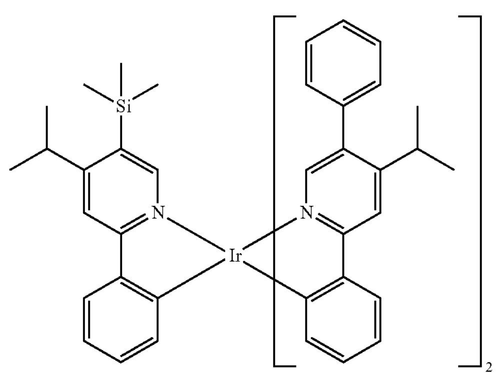
307
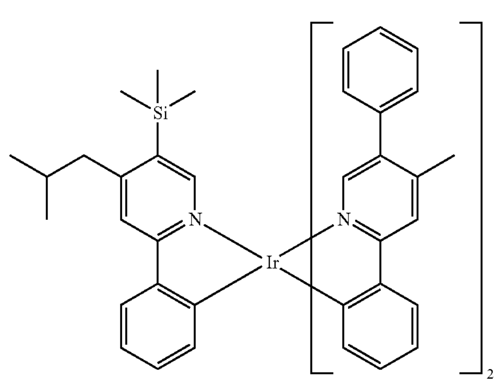
308
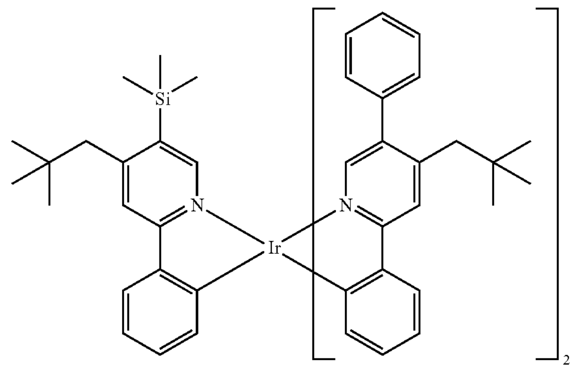
309
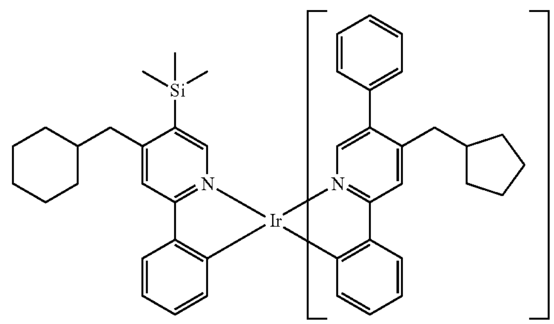
310
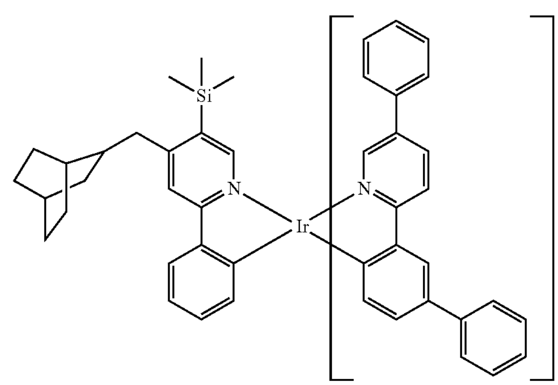
311
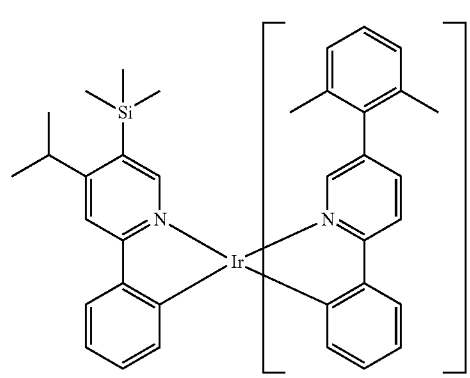

-continued
312
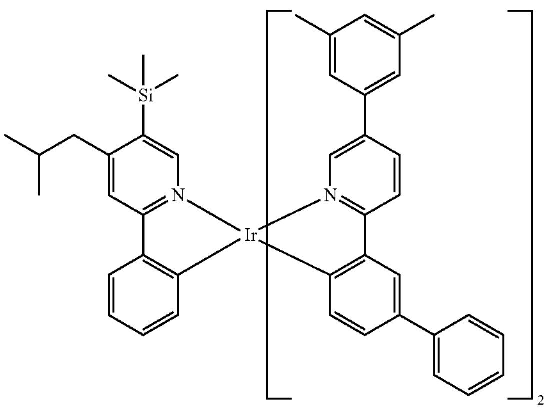
313
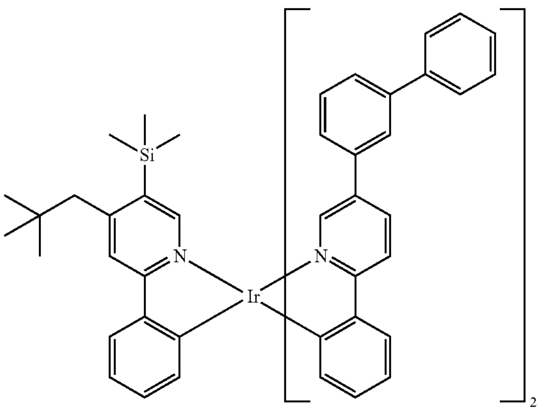
314
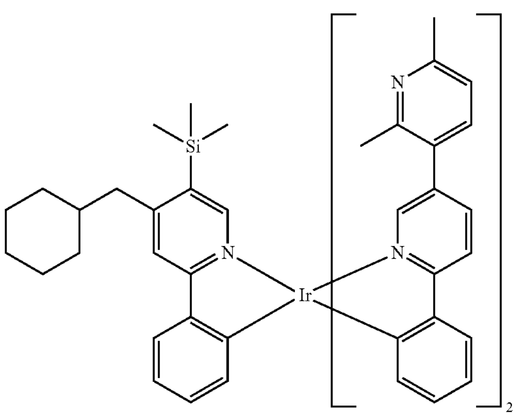
315
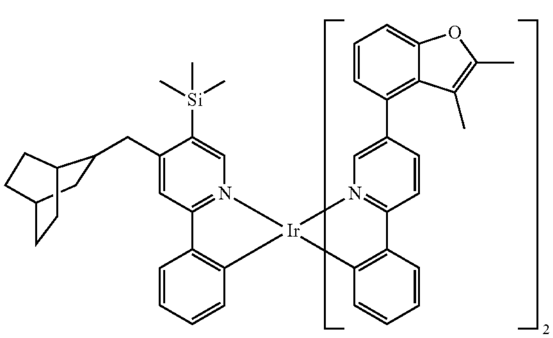
-continued
316
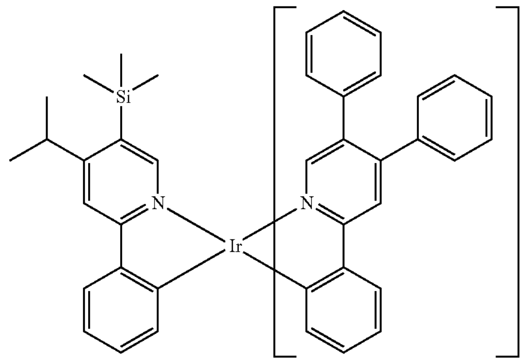
317
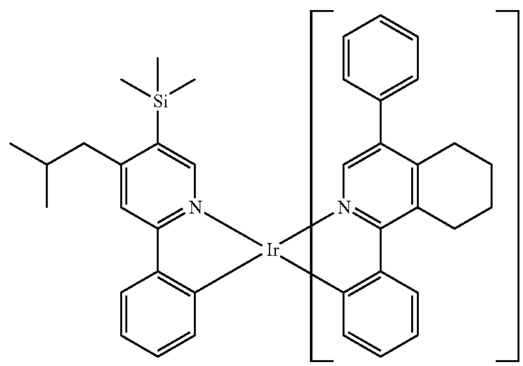
318
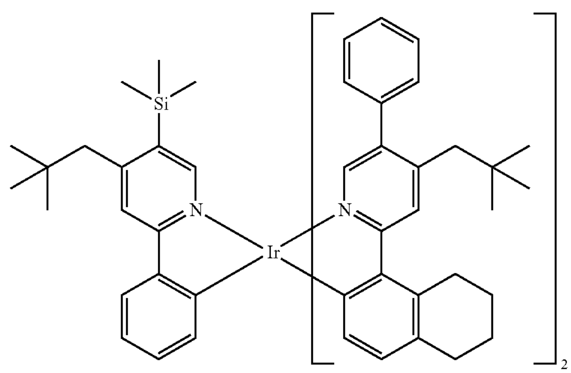
320
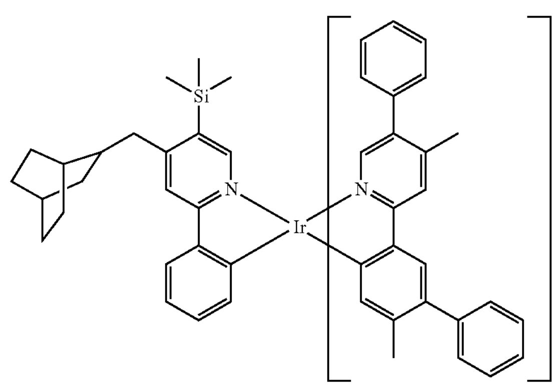

-continued
321
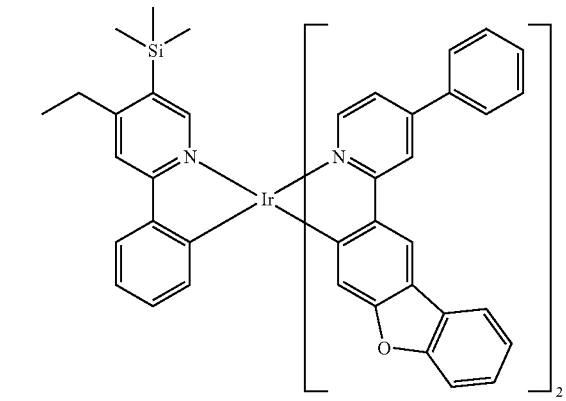
322
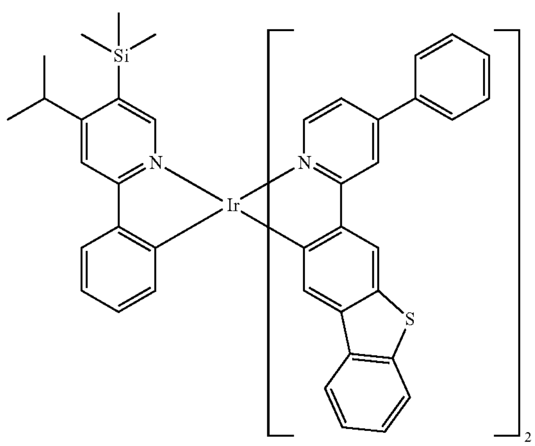
324
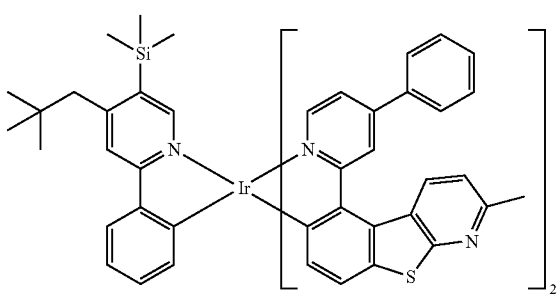
325
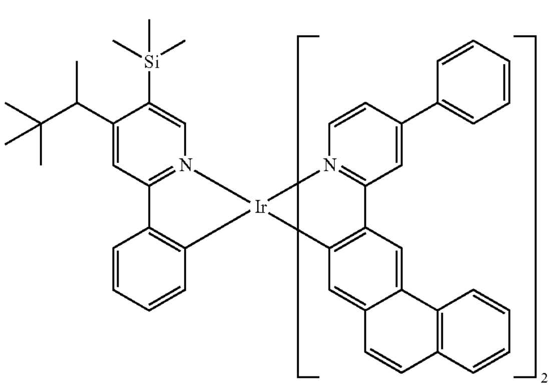
-continued
326
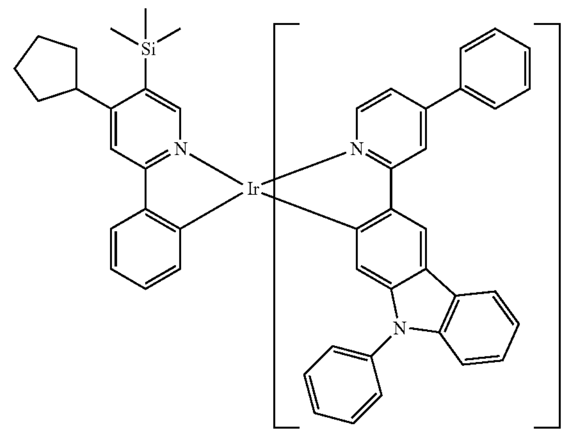
327
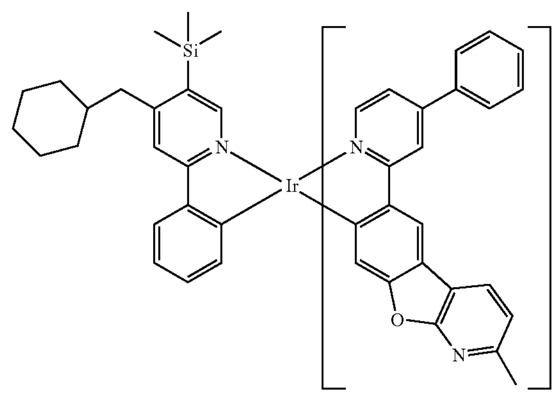
328
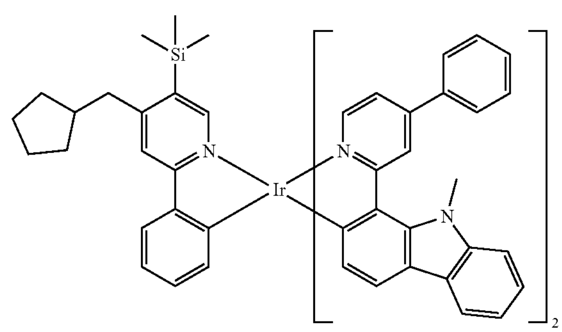
329
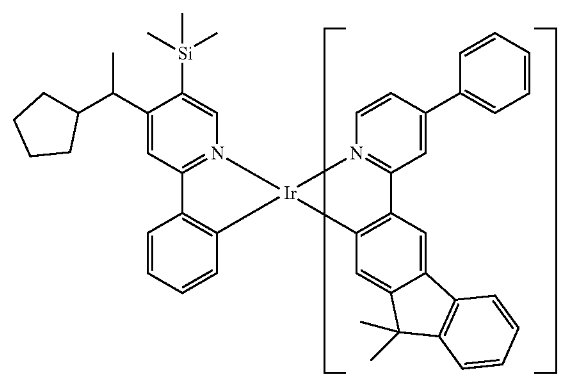

-continued
330
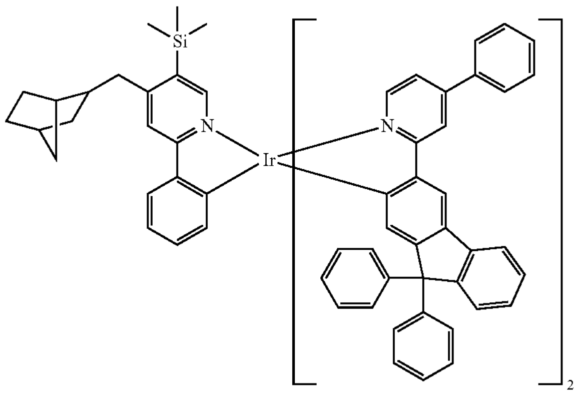
331
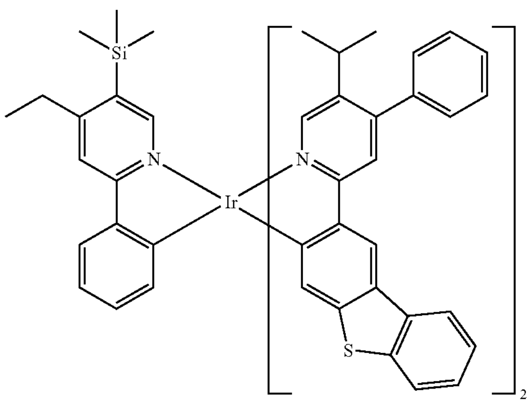
332
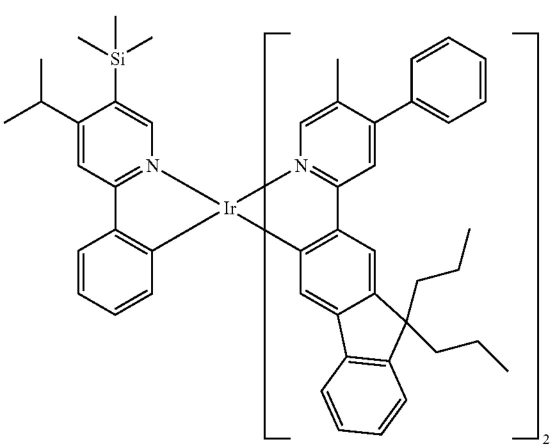
-continued
333
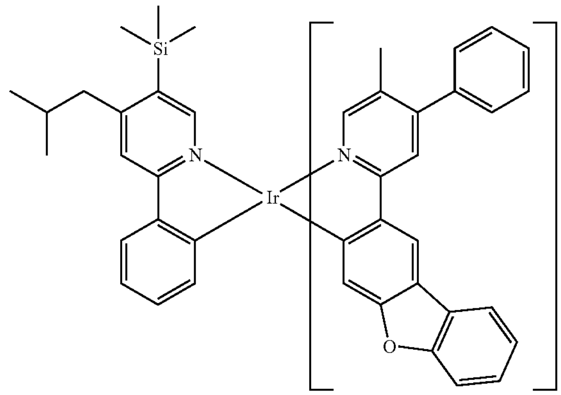
334
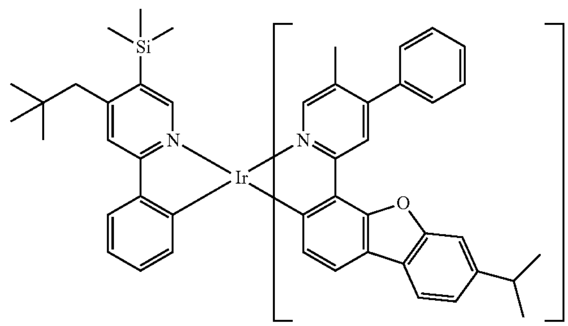
336
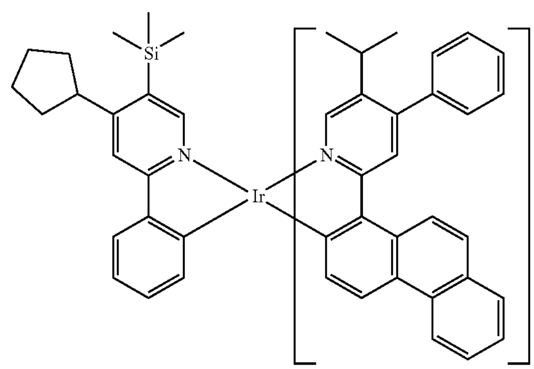
337
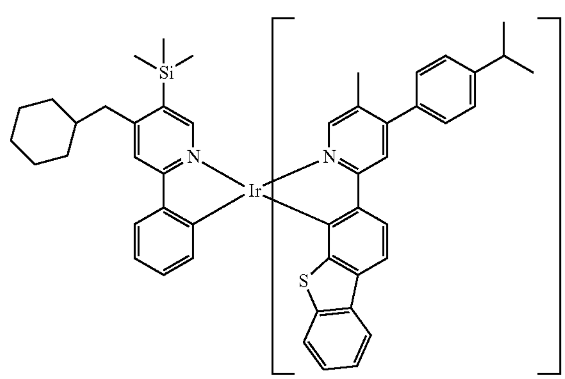

-continued
338
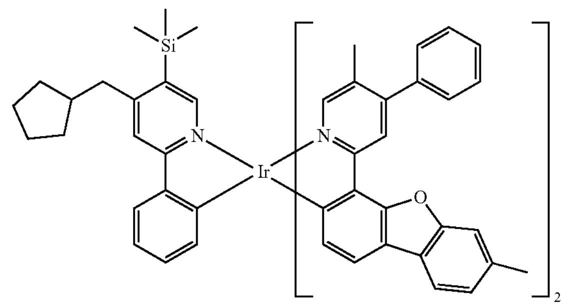
339
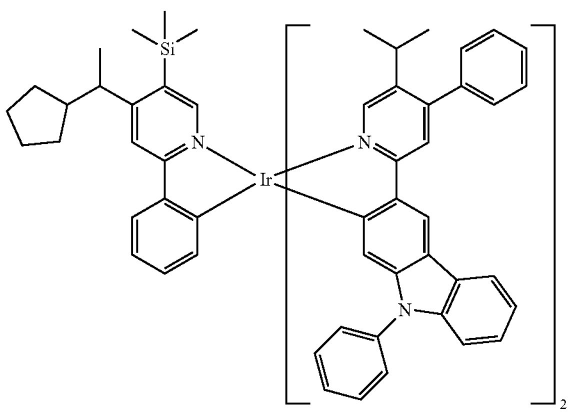
341
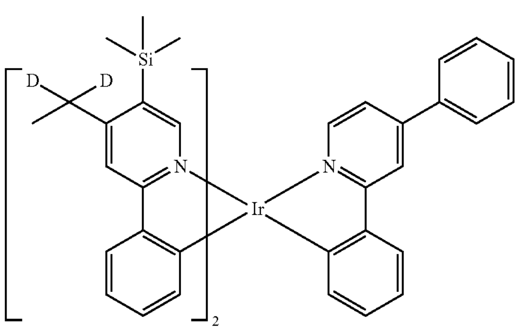
342
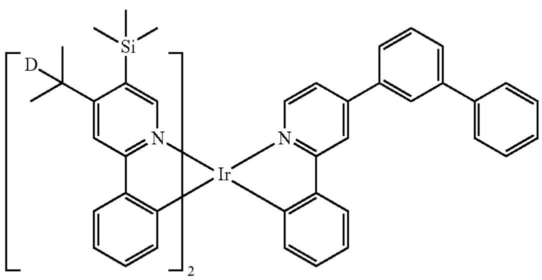
-continued
343
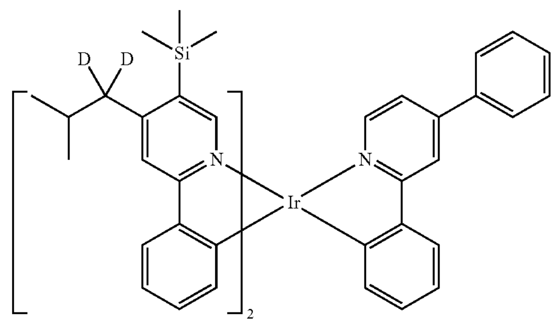
344
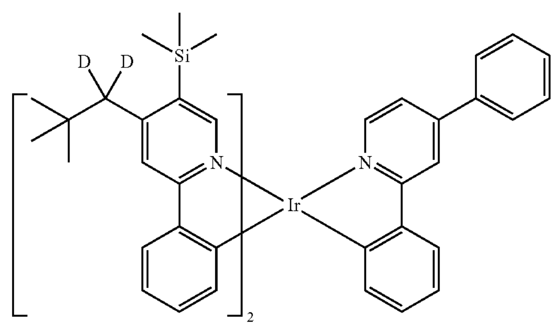
345
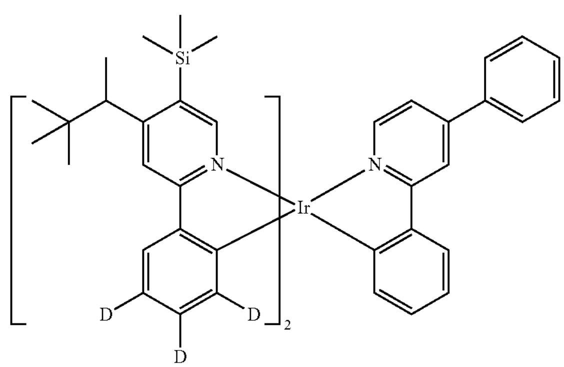
346
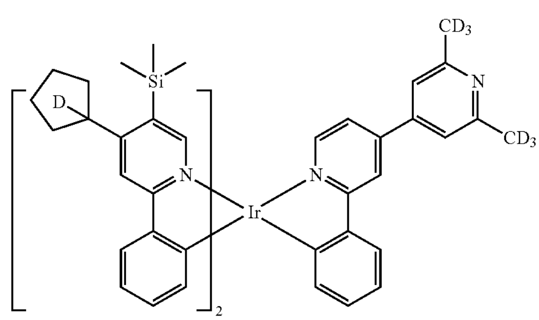

-continued
347
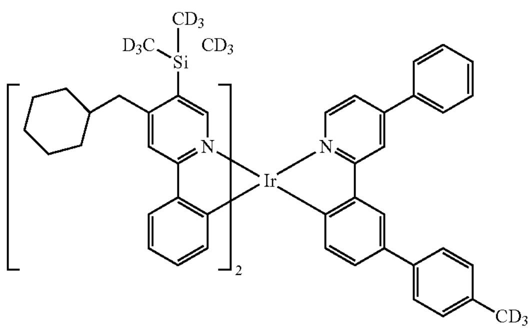
348
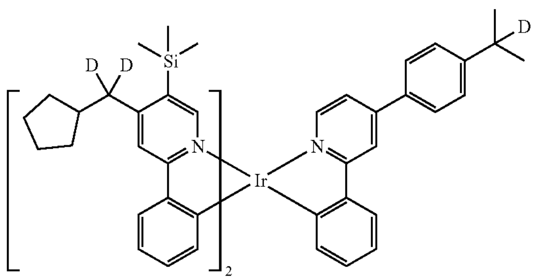
349
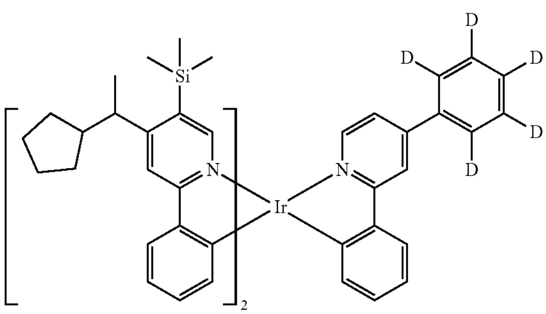
350
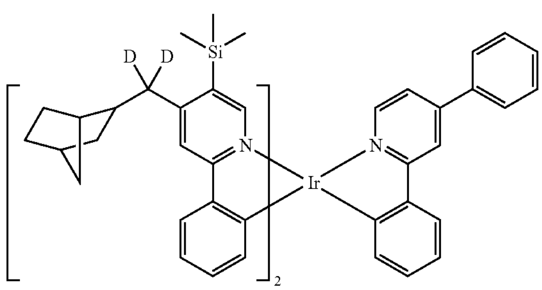
351
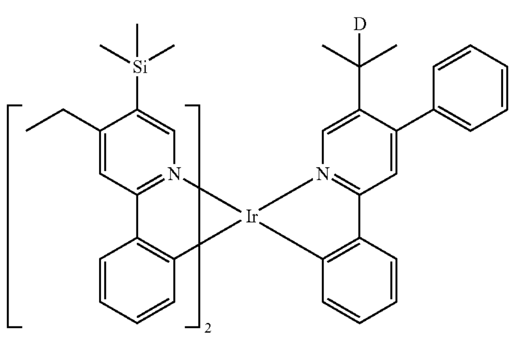
-continued
352
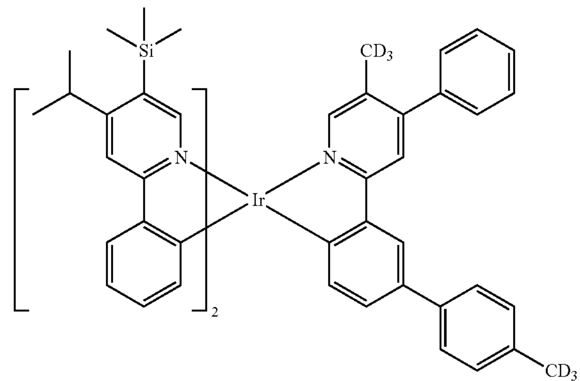
353
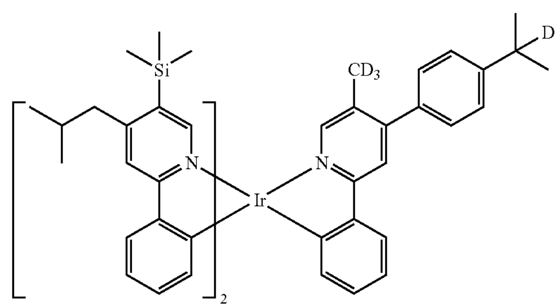
354
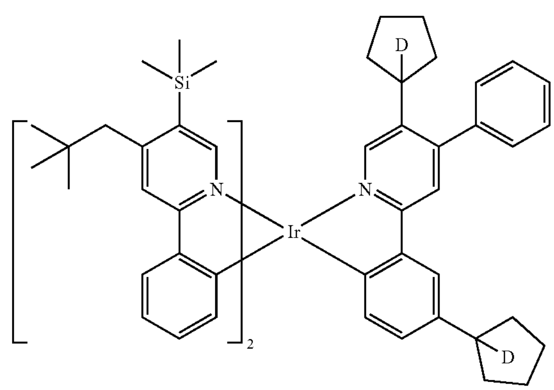
355
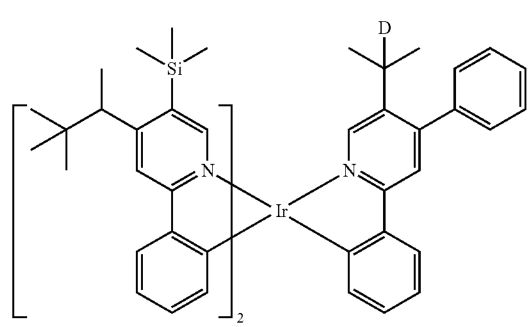

-continued
356
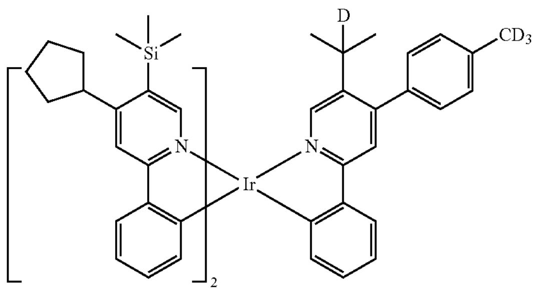
357
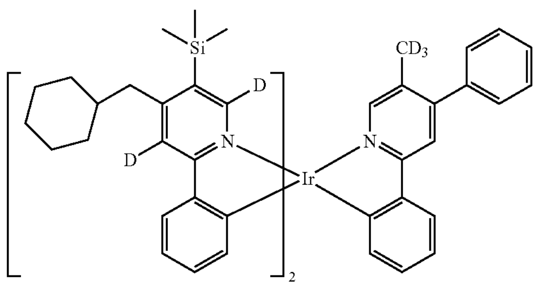
358
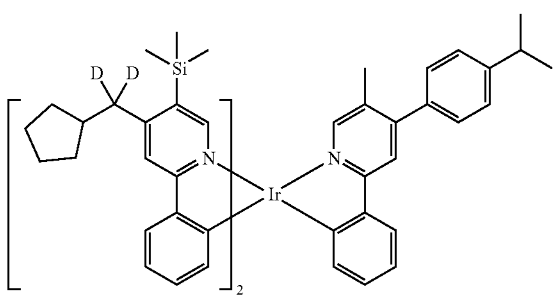
359
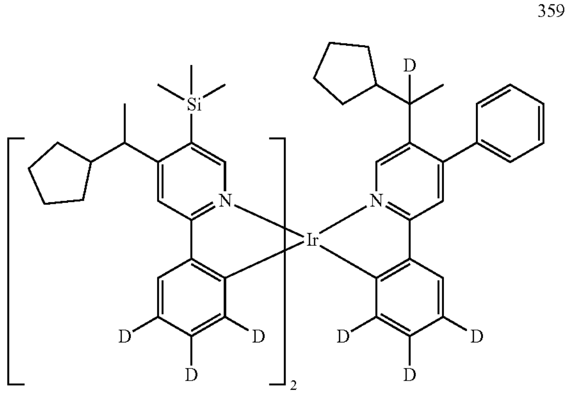
-continued
360
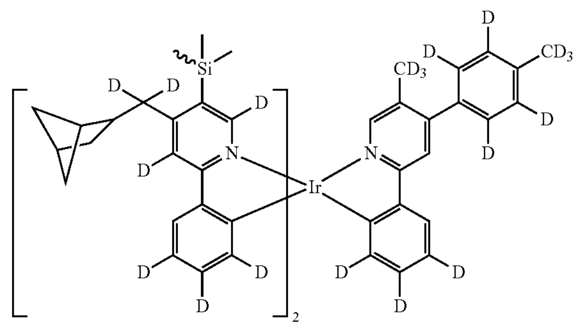
361
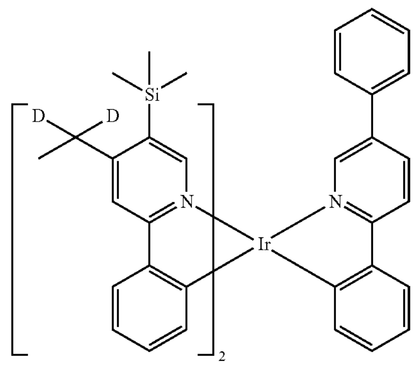
362
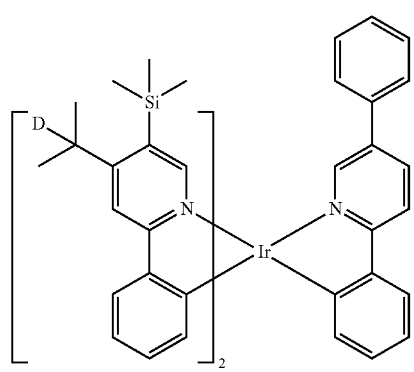
363
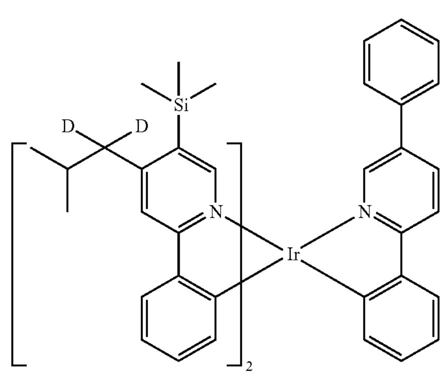

364
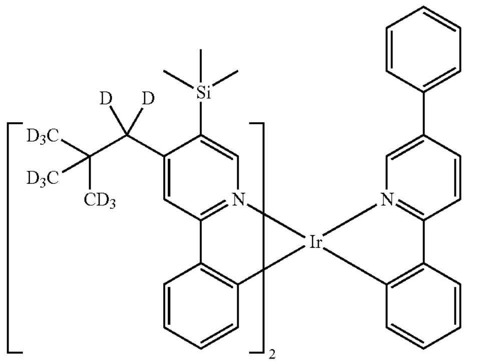
365
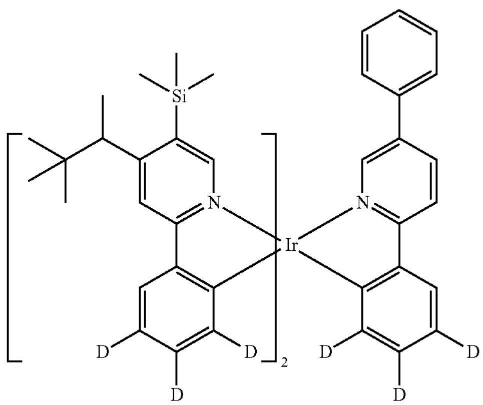
366
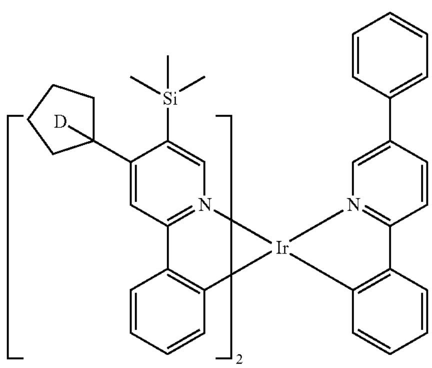
367
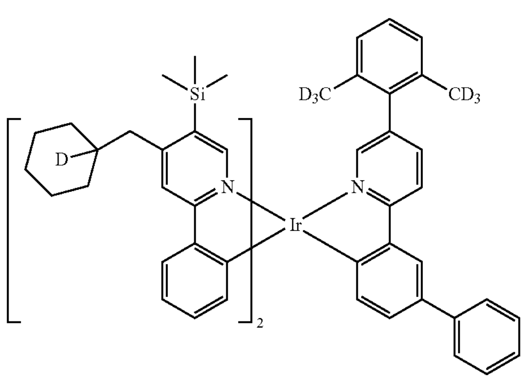
368
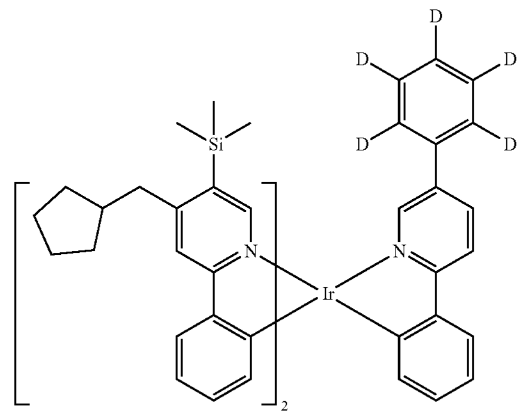
369
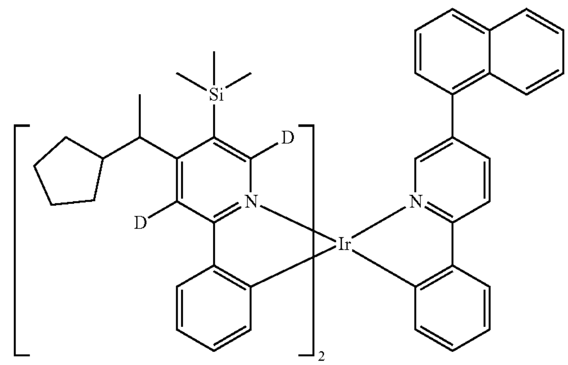
370
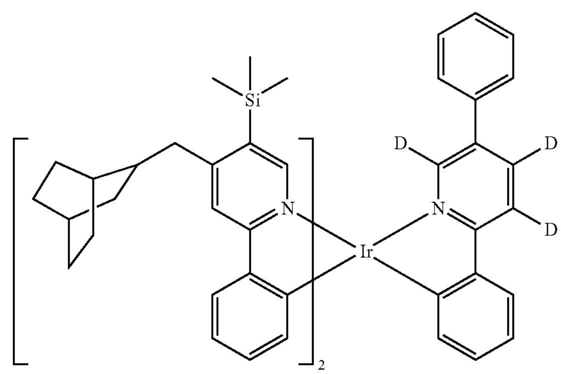
371
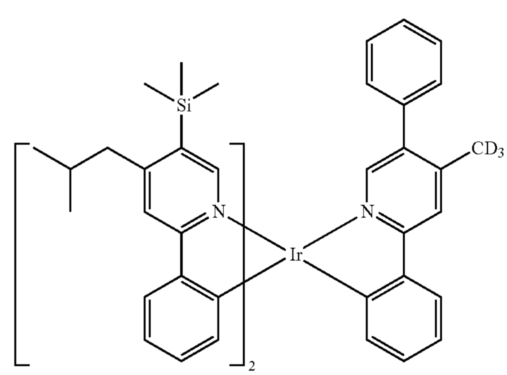

-continued
372
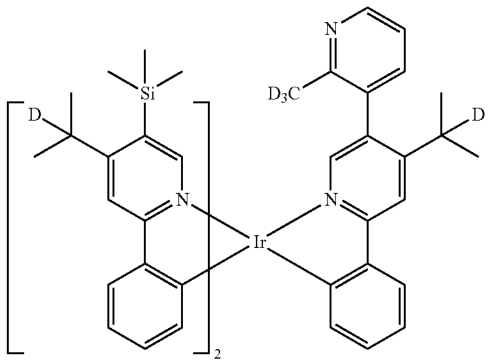
373
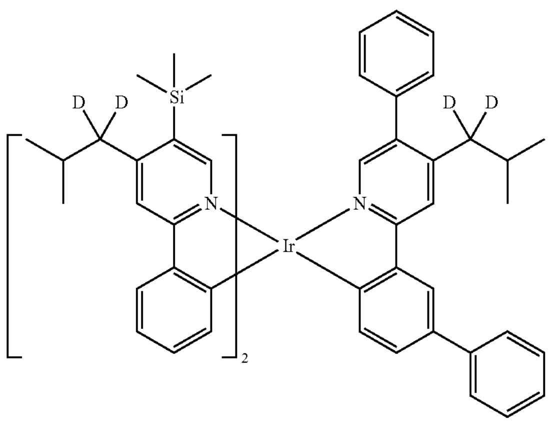
374
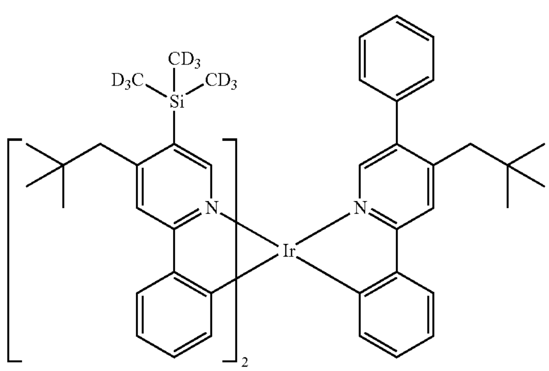
375
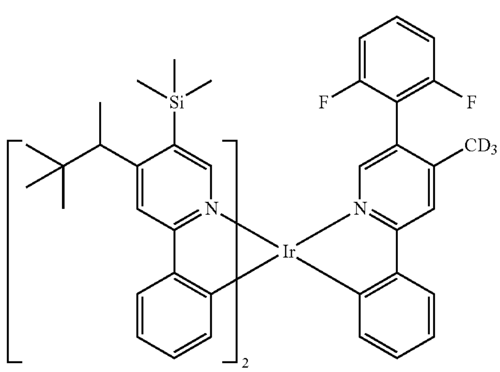
-continued
376
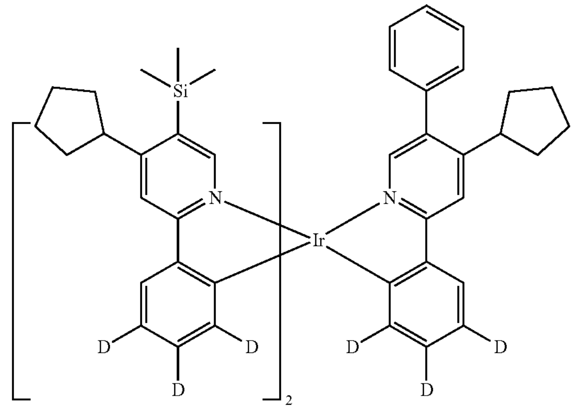
377
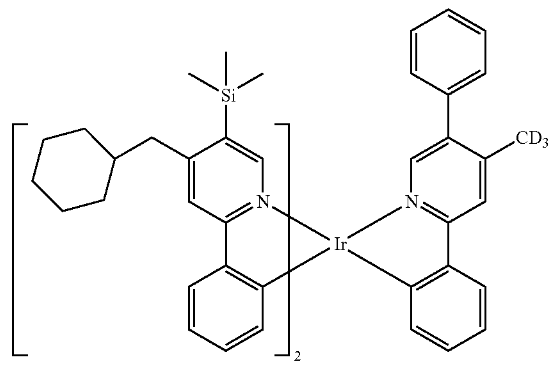
378
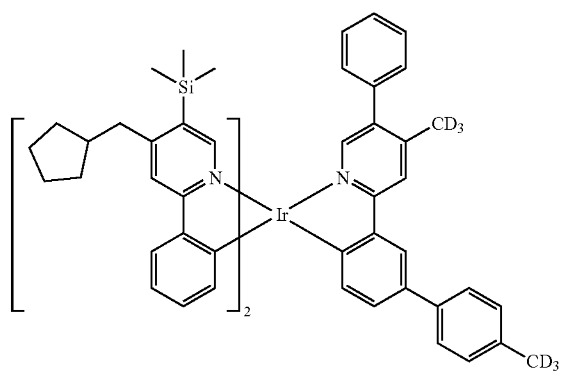
379
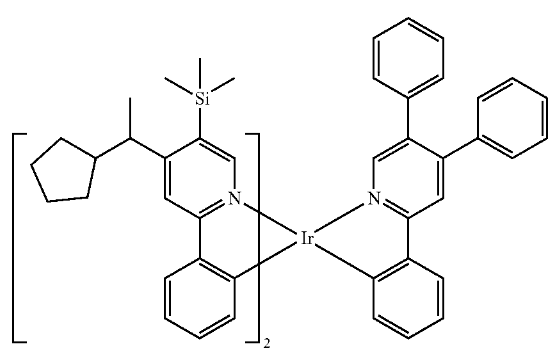

-continued
380
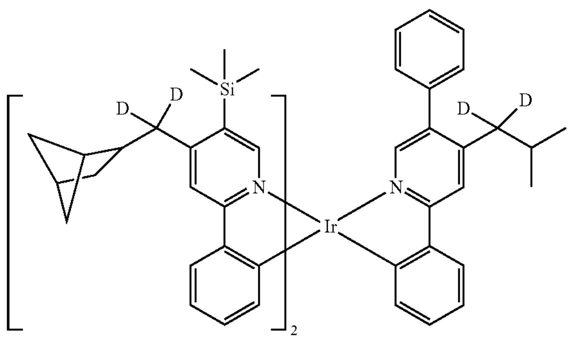
381
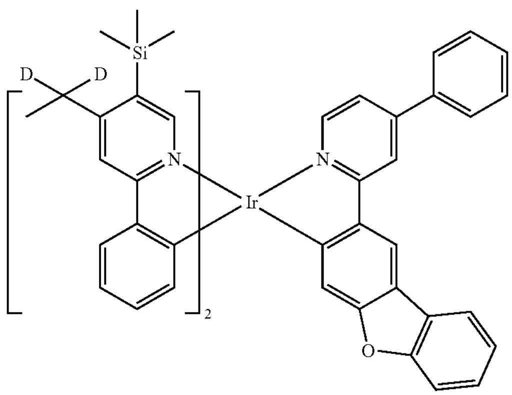
382
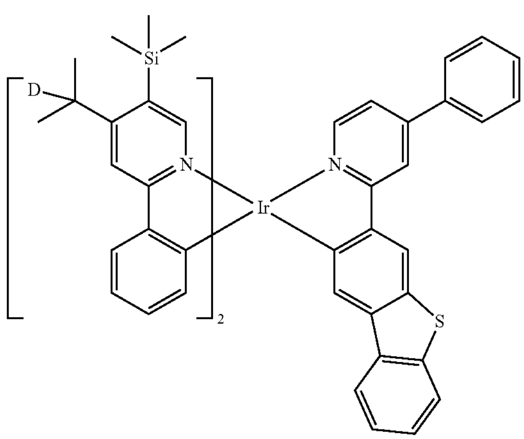
384
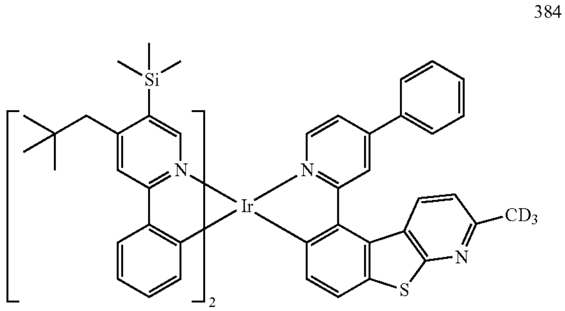
-continued
385
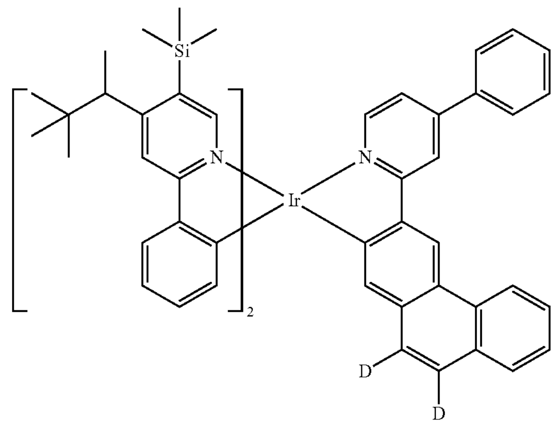
386
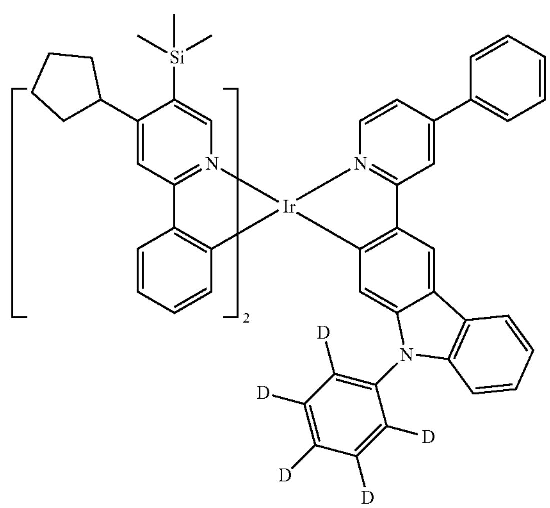
387
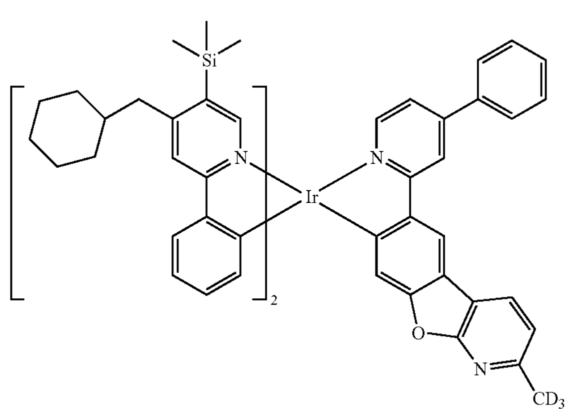

-continued
388
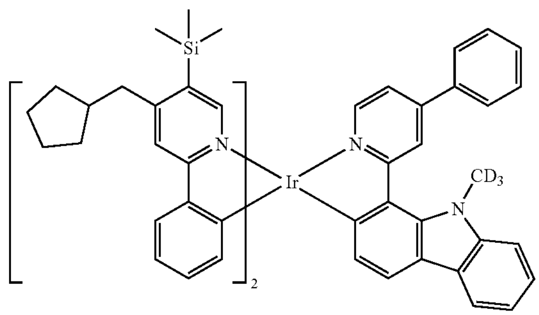
389
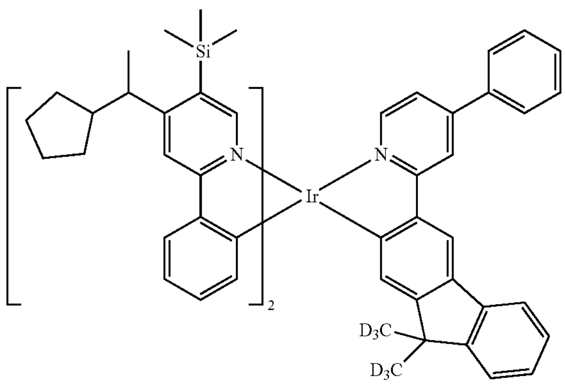
390
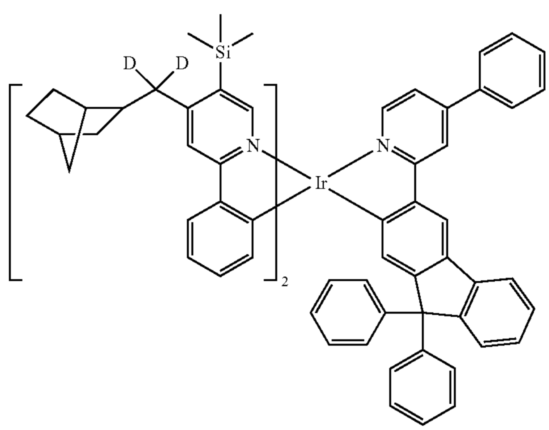
391
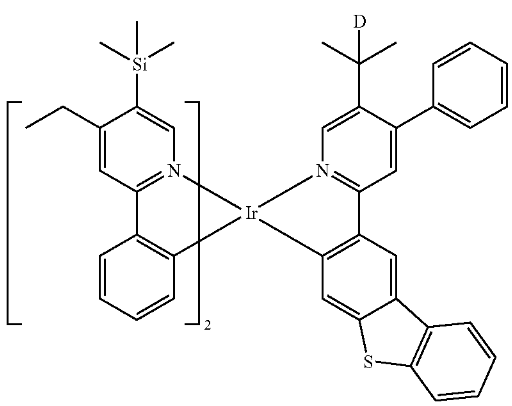
-continued
392
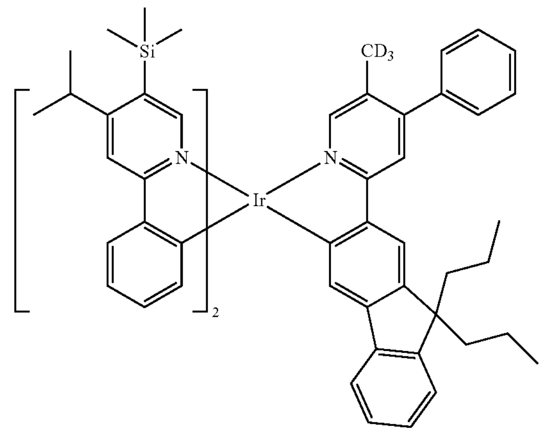
393
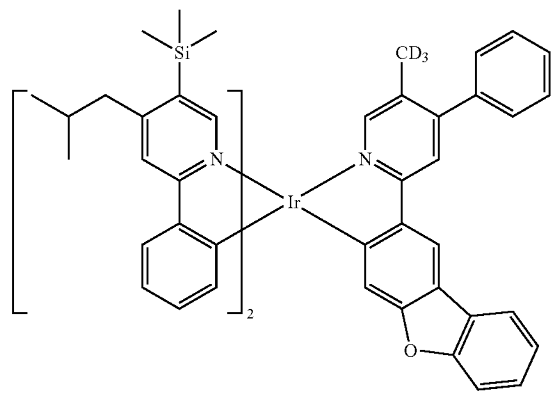
394
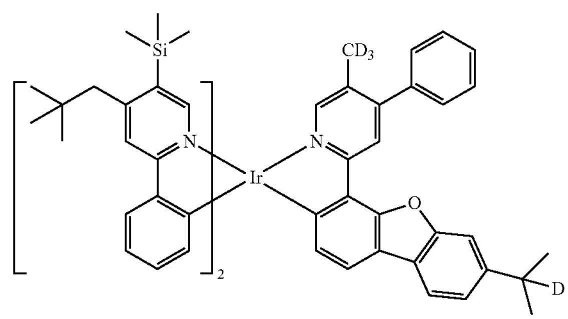
396
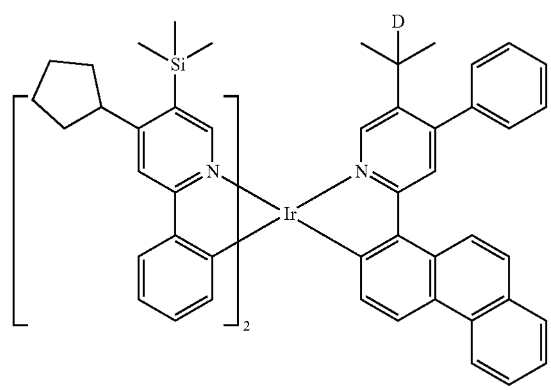

-continued
397
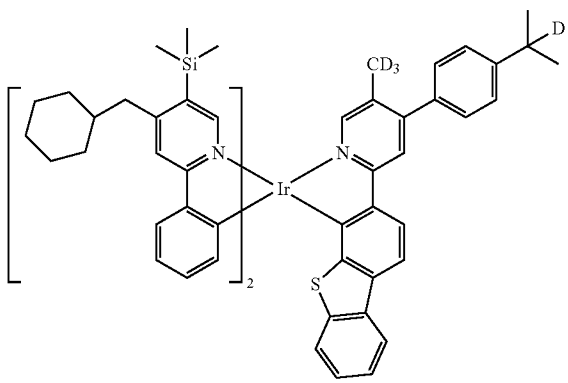
398
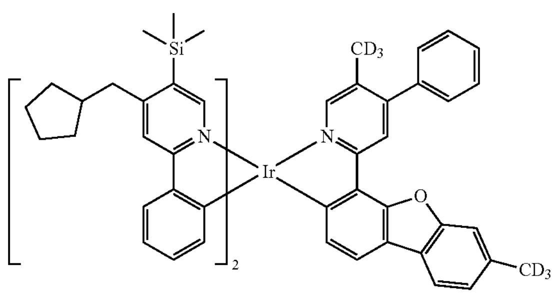
399
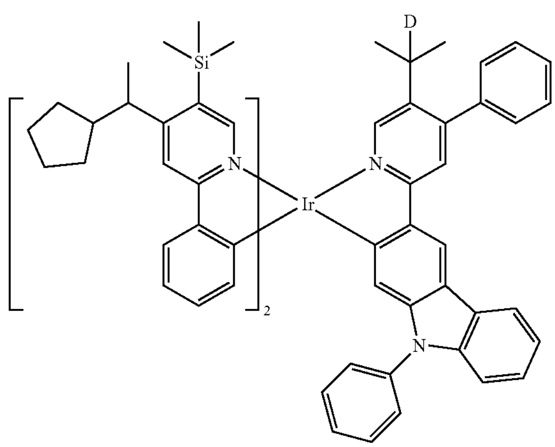
401
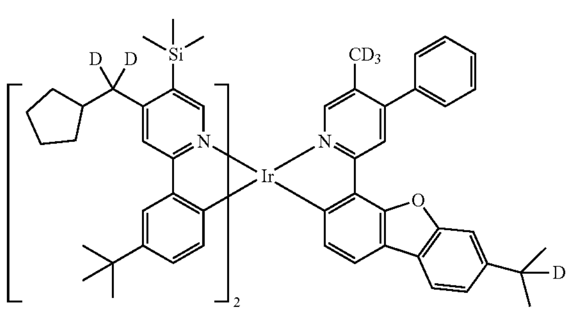
-continued
402
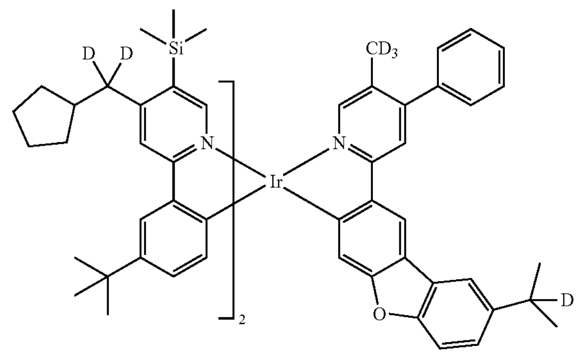
404
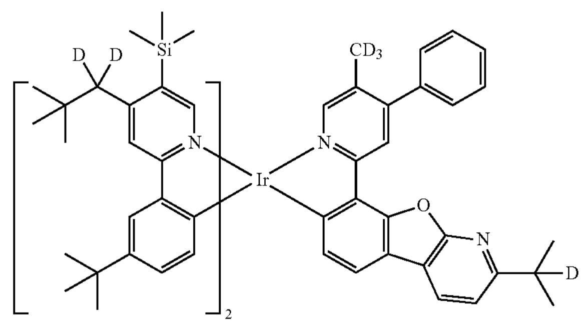
405
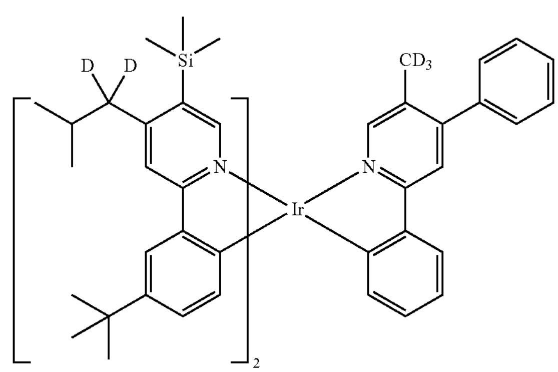
406
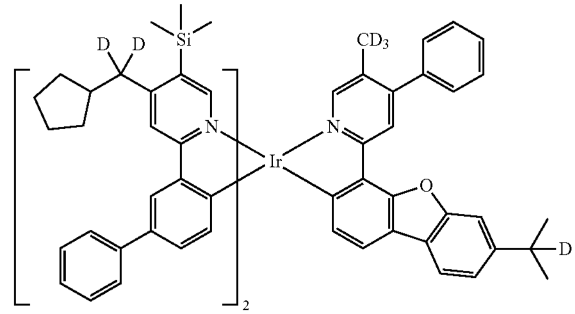

407
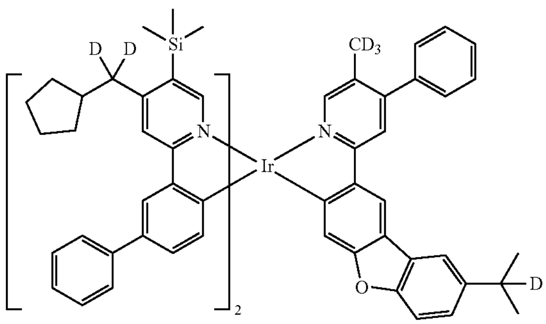
409
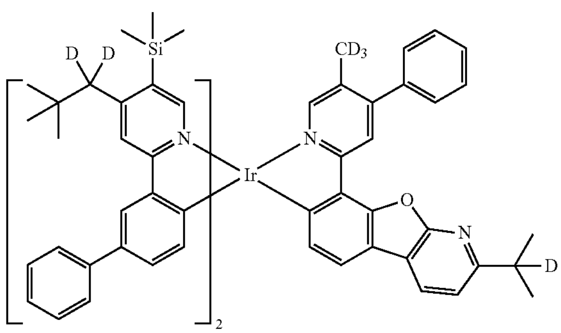
410
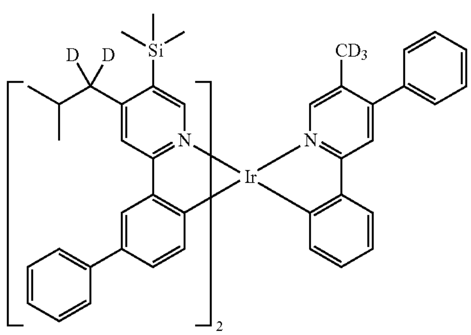
411
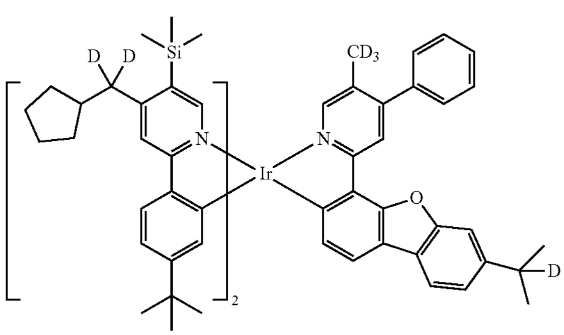
412
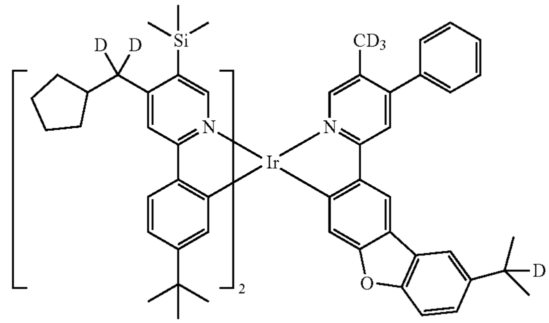
414
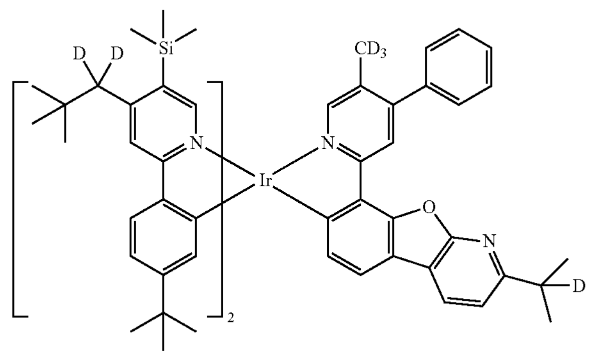
415
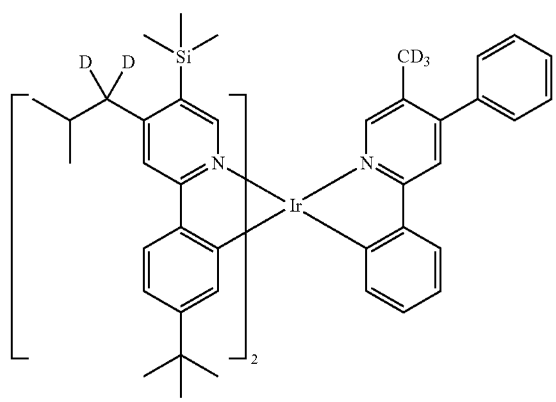
416
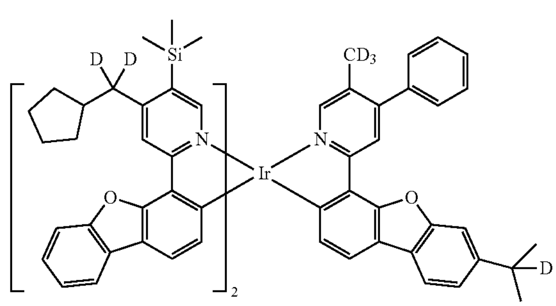

-continued

420

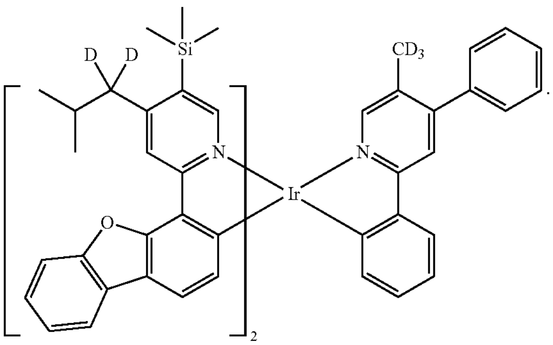

15. An organic light-emitting device comprising:
a first electrode;
a second electrode; and
an organic layer disposed between the first electrode and the second electrode and comprising an emission layer,
wherein the organic layer comprises at least one organometallic compound of claim 1.

16. The organic light-emitting device of claim 15, wherein
the first electrode is an anode,
the second electrode is a cathode,
the organic layer further comprises a hole transport region disposed between the first electrode and the emission layer and an electron transport region disposed between the emission layer and the second electrode,
the hole transport region comprises a hole injection layer, a hole transport layer, an electron blocking layer, a buffer layer, or a combination thereof, and
the electron transport region comprises a hole blocking layer, an electron transport layer, an electron injection layer, or a combination thereof.

17. The organic light-emitting device of claim 15, wherein the emission layer comprises the at least one organometallic compound.

18. The organic light-emitting device of claim 17, wherein the emission layer further comprises a host, and an amount of the host is greater than an amount of the at least one organometallic compound.

19. A diagnostic composition comprising the organometallic compound of claim 1.

* * * * *